(12) United States Patent
Nishi

(10) Patent No.: US 6,906,782 B2
(45) Date of Patent: Jun. 14, 2005

(54) STAGE APPARATUS, SCANNING TYPE EXPOSURE APPARATUS, AND DEVICE PRODUCED WITH THE SAME

(75) Inventor: Kenji Nishi, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/347,688

(22) Filed: Jan. 22, 2003

(65) Prior Publication Data

US 2003/0128348 A1 Jul. 10, 2003

Related U.S. Application Data

(63) Continuation of application No. 09/981,976, filed on Oct. 19, 2001, now abandoned, which is a division of application No. 09/525,732, filed on Mar. 14, 2000, now Pat. No. 6,331,885, which is a continuation-in-part of application No. PCT/JP98/04223, filed on Sep. 18, 1998.

(30) Foreign Application Priority Data

Sep. 19, 1997 (JP) .............................................. 9-273420
Sep. 26, 1997 (JP) .............................................. 9-279500
Oct. 10, 1997 (JP) .............................................. 9-293249
Jul. 27, 1998 (JP) ........................................... 10-226500

(51) Int. Cl.$^7$ ........................ G03B 27/42; G03B 27/58; G03B 27/76
(52) U.S. Cl. ............................. 355/53; 355/72; 355/76
(58) Field of Search .............................. 355/53, 72, 76, 355/77; 269/55, 71; 414/676; 250/491.1, 492; 356/400, 401, 496, 498, 500, 399

(56) References Cited

U.S. PATENT DOCUMENTS

| 4,750,721 A | 6/1988 | Sasada |
| 4,780,617 A | 10/1988 | Umatate et al. |
| 4,924,257 A | 5/1990 | Jain |
| 5,151,749 A | 9/1992 | Tanimoto et al. |
| 5,172,160 A | 12/1992 | Van Eijk et al. |

(Continued)

FOREIGN PATENT DOCUMENTS

| EP | 0 785 571 A2 | 7/1997 |
| EP | 0 951 054 A1 | 10/1999 |
| GB | 2 290 658 A | 1/1996 |
| JP | A-60-123716 | 7/1985 |
| JP | A-61-45988 | 3/1986 |
| JP | A-62-150106 | 7/1987 |
| JP | A-63-47926 | 2/1988 |
| JP | A-2-2299423 | 9/1990 |

(Continued)

OTHER PUBLICATIONS

Research Disclosure, Oct. 1997, "Triangular wafer stage for use in a wafer stepper", p. 737, XP000726871, ISSN: 0374–4353.
J. D. Buckley et al., *Step and Scan: A Systems Overview of a New Lithography Tool*, SPIE, vol. 1088, Optical/Laser Microlithography II (1989), pp. 424–433.

*Primary Examiner*—Rodney Fuller
(74) *Attorney, Agent, or Firm*—Oliff & Berridge PLC

(57) ABSTRACT

An exposure apparatus has a triangular shaped stage which is movable in a two-dimensional plane while holding a substrate. The stage has a reflecting surface provided on a side face of the stage so that the surface extends in a specific direction intersecting Y axis and X axis. An interferometer radiates a beam onto the reflecting surface to measure a position of the stage in a direction perpendicular to the specific direction. Using the measured position and an angle of the specific direction, a calculator can calculate the position of the stage on rectangular coordinate system defined by X and Y axes. The size and weight of the stage can be reduced, and the throughput of the exposure apparatus is improved.

44 Claims, 28 Drawing Sheets

U.S. PATENT DOCUMENTS

| | | |
|---|---|---|
| 5,194,893 A | 3/1993 | Nishi |
| 5,208,497 A | 5/1993 | Ishii et al. |
| 5,220,454 A | 6/1993 | Ichihara et al. |
| 5,227,839 A | 7/1993 | Allen |
| 5,307,207 A | 4/1994 | Ichihara |
| 5,464,715 A | 11/1995 | Nishi et al. |
| 5,473,410 A | 12/1995 | Nishi |
| 5,473,424 A | 12/1995 | Okumura |
| 5,504,407 A | 4/1996 | Wakui et al. |
| 5,506,684 A | 4/1996 | Ota et al. |
| 5,534,970 A | 7/1996 | Nakashima et al. |
| 5,677,758 A | 10/1997 | McEachern et al. |
| 5,691,802 A | 11/1997 | Takahashi |
| 5,715,064 A | 2/1998 | Lin |
| 5,767,948 A | 6/1998 | Loopstra et al. |
| 5,815,246 A | 9/1998 | Sperling et al. |
| 5,933,215 A | 8/1999 | Inoue et al. |
| 5,959,427 A | 9/1999 | Watson |
| 5,969,441 A | 10/1999 | Loopstra et al. |
| 5,969,800 A | 10/1999 | Makinouchi |
| 6,028,376 A | 2/2000 | Osanai et al. |
| 6,246,204 B1 | 6/2001 | Ebihara et al. |

FOREIGN PATENT DOCUMENTS

| | | |
|---|---|---|
| JP | A-196513 | 7/1992 |
| JP | A-4-277612 | 10/1992 |
| JP | A-4-307720 | 10/1992 |
| JP | A-5-40184 | 2/1993 |
| JP | A-5-121294 | 5/1993 |
| JP | A-291019 | 10/1994 |
| JP | A-7-176468 | 7/1995 |
| JP | A-8-203805 | 8/1996 |
| JP | A-8-241845 | 9/1996 |
| JP | A-9-74061 | 3/1997 |
| JP | A-9-190224 | 7/1997 |
| JP | A-9-251955 | 9/1997 |
| JP | A-10-116779 | 5/1998 |
| WO | WO 98/24115 | 6/1998 |
| WO | WO 98/28664 | 7/1998 |
| WO | WO 98/28665 | 7/1998 |
| WO | WO 98/40791 | 9/1998 |

⟨MOVEMENT LENGTH LOAD (mm)⟩

| R VELOCITY (mm/s) | 1000 | 1100 | 1200 | 1300 | 1400 | 1500 | 1600 | 1700 | 1800 | 1900 | 2000 |
|---|---|---|---|---|---|---|---|---|---|---|---|
| ACCELERATION: 3 G, SETTLING: 22 ms | 19.3 | 22.2 | 25.2 | 28.4 | 31.7 | 35.3 | 38.9 | 42.8 | 46.8 | 51.0 | 55.3 |
| ACCELERATION: 4 G, SETTLING: 36 ms | 24.3 | 27.4 | 30.6 | 34.0 | 37.5 | 41.1 | 44.8 | 48.7 | 52.7 | 56.8 | 61.0 |
| ACCELERATION: 4 G, SETTLING: 22 ms | 17.3 | 19.7 | 22.2 | 24.9 | 27.7 | 30.6 | 33.6 | 36.8 | 40.1 | 43.5 | 47.0 |

(B)

⟨EXPOSURE TIME (SECOND/w)⟩

| R VELOCITY (mm/s) | 1000 | 1100 | 1200 | 1300 | 1400 | 1500 | 1600 | 1700 | 1800 | 1900 | 2000 |
|---|---|---|---|---|---|---|---|---|---|---|---|
| ACCELERATION: 3 G, SETTLING: 22 ms | 17.9 | 17.3 | 16.9 | 16.7 | 16.5 | 16.5 | 16.5 | 16.5 | 16.6 | 16.7 | 16.9 |
| ACCELERATION: 4 G, SETTLING: 36 ms | 18.6 | 17.9 | 17.5 | 17.1 | 16.8 | 16.7 | 16.5 | 16.5 | 16.5 | 16.5 | 16.5 |
| ACCELERATION: 4 G, SETTLING: 22 ms | 16.8 | 16.1 | 15.6 | 15.3 | 15.0 | 14.8 | 14.7 | 14.7 | 14.6 | 14.6 | 14.7 |

(A)

MOVEMENT LENGTH LOAD (mm)

(B)

EXPOSURE TIME (SECOND/W)

(A)

(B)

(A)

(B)

US 6,906,782 B2

STAGE APPARATUS, SCANNING TYPE EXPOSURE APPARATUS, AND DEVICE PRODUCED WITH THE SAME

CROSS REFERENCE

This is a Continuation of application Ser. No. 09/981,976 filed Oct. 19, 2001 now abandoned, which in turn is a Divisional of application Ser. No. 09/525,732 filed Mar. 14, 2000 (now U.S. Pat. No. 6,331,885 B1), which is a Continuation of International Application No. PCT/JP98/04223 filed Sep. 18, 1998. The entire disclosure of the prior application(s) is hereby incorporated by reference herein in its entirety.

FIELD OF THE INVENTION

The present invention relates to a scanning type exposure apparatus and a scanning exposure method used when a circuit device such as a semiconductor circuit element and a liquid crystal display element is produced in accordance with a lithography step. In particular, the present invention relates to a scanning type exposure apparatus and an exposure method preferably used to perform scanning exposure with a large mask having a size of not less than 9 inches. The present invention also relates to a device produced with the exposure method.

Especially, the present invention generally includes the following five concepts in order to achieve the common objects of the present invention as described later on. The first concept relates to a scanning exposure method and a scanning exposure apparatus in which a substrate is moved in synchronization with a mask having a large pattern or a plurality of comparted patterns so that the large pattern is transferred to the substrate in a stitching manner, or the plurality of patterns are transferred to an identical area of the substrate in a superimposing or overlay manner. The second concept relates to a stage apparatus, for example, a triangular stage and a scanning exposure apparatus including the same, the stage apparatus having a reflecting mirror extending obliquely with respect to a movement direction of the stage, and an interferometer for transmitting a measuring beam (length-measuring beam) to the reflecting mirror. The third concept relates to an unbalanced load-preventive stage apparatus for supporting a second movable member and a first movable member in a floating manner over a base board respectively, and a scanning exposure apparatus including the stage apparatus. The fourth concept relates to the timing control for the stepping movement (stepping) of a substrate in a direction perpendicular to a scanning direction and the scanning movement of the substrate in the scanning direction when the next comparted area is subjected to scanning exposure after scanning exposure of a certain area comparted on the substrate is completed, in the scanning exposure for synchronously moving a mask and the substrate. The fifth concept relates to the control of the rate of acceleration during movement of a mask or a substrate to shorten the settling time for synchronizing the mask and the substrate during scanning exposure. These concepts are specifically described and explained in the opening of the chapter of "Best Mode for Carrying Out the Invention" of this document.

DESCRIPTION OF THE RELATED ART

At present, in the production site for manufacturing the semiconductor device, a reduction production exposure apparatus, i.e., a so-called stepper, which uses, as a illumination light beam, the i-ray of a mercury lamp having a wavelength of 365 nm, is used to mass-produce circuit devices (for example, 64 M (mega) bit D-RAM) having a minimum line width of about 0.3 to 0.35 $\mu$m. Simultaneously, an exposure apparatus begins to be introduced to mass-produce next-generation circuit devices having a degree of integration of 1 G (giga) bit D-RAM class with a minimum line width of not more than 0.25 $\mu$m.

A prevailing exposure apparatus for producing the next-generation circuit device is a scanning type exposure apparatus based on the step-and-scan manner in which an illumination light beam is an ultraviolet pulse laser beam having a wavelength of 248 nm supplied from a KrF excimer laser light source or an ultraviolet pulse laser beam having a wavelength of 193 nm supplied from an ArF excimer laser light source. A mask or a reticle (hereinafter generally referred to as "reticle") on which a circuit pattern is depicted, and a wafer as a photosensitive substrate are subjected to relative one-dimensional scanning with respect to a projection field of a reduction projection optical system. Thus, the entire circuit pattern on the reticle is transferred to the inside of one shot area on the wafer to perform the scanning exposure operation which is repeated together with the stepping action between shots.

A micro-scan exposure apparatus made by Perkin-Elmer is firstly commercially produced, and it is commercially available as a scanning type exposure apparatus based on the step-and-scan manner, which carries a reduction projection optical system comprising a refraction optical element (lens element) and a reflection optical element (for example, concave mirror). The micro scan exposure apparatus is explained in detail, for example, in SPIE, Vol. 1 1088 pp. 424 to 433. That is, a part of a pattern on a reticle is projected onto a wafer via an effective projection area limited to have a circular arc slit-shaped configuration, while the reticle and the wafer are relatively moved at a velocity ratio in conformity with the projection magnification (¼ reduction). Thus, a shot area on the wafer is subjected to exposure.

Another projection exposure system based on the step-and-scan manner is known, in which an excimer laser beam is used as an illumination light beam to combine a so-called scan-and-stitching method which is a method for limiting an effective projection area of a reduction projection optical system having a circular projection field to be a polygonal configuration (hexagon) so that both ends of the effective projection area are partially overlapped with each other. Such a projection exposure system is disclosed, for example, in Japanese Patent Application Laid-Open No. 2-229422 and U.S. Pat. No. 4,924,254 corresponding thereto. A projection exposure apparatus, which adopts such a scanning exposure system, is also disclosed, for example, in Japanese Patent Application Laid-Open No. 4-196513 and U.S. Pat. No. 5,473,410 corresponding thereto, Japanese Patent Application Laid-Open No. 4-277612 and U.S. Pat. No. 5,194,893 corresponding thereto, and Japanese Patent Application Laid-Open No. 4-307720 and U.S. Pat. No. 5,506,684 corresponding thereto.

A reticle having a size of not more than 6 inches is used for the conventional scanning type exposure apparatus as described above. The device rule is not less than 0.2 $\mu$m L/S (line and space). Therefore, the scanning exposure has been performed by using a projection optical system having a projection magnification of ¼.

However, in the case of the scanning type exposure apparatus based on the step-and-scan manner, the exposure is performed while moving a reticle stage and a wafer stage at predetermined scanning velocities. Therefore, it is necessary to perform, before the start of the exposure, the pre-scanning (acceleration until arrival at the target velocity (scanning velocity during the exposure)+settling operation until convergence of the velocity to the target velocity within a predetermined error range after completion of the acceleration). In the case of the scanning type exposure apparatus based on the step-and-scan manner, when the pattern on the reticle is successively transferred to a plurality of shot areas (hereinafter appropriately referred to as "shots") on the wafer, the exposure is successively performed for the next shot by alternately scanning the reticle (reciprocating scanning) in ordinary cases in order to improve the throughput. For this reason, it is necessary to perform the following operation. That is, after completion of the transfer of the reticle pattern to one shot, the reticle is further moved from the exposure end point by the same distance as the movement distance during the pre-scanning before the start of the exposure to return the reticle to the scanning start position for the next shot exposure (over-scanning). Therefore, when the exposure is performed for a shot area having a size equivalent to a shot size for a full field exposure apparatus based on, for example, the step-and-repeat system, there is a possibility that the throughput is lowered as compared with the full field exposure apparatus, due to the pre-scanning and the over-scanning to be performed before and after the scanning exposure (exposure based on the scanning).

In addition to the pre-scanning and the over-scanning, the scanning type exposure apparatus also requires the operation, i.e., the so-called stepping for moving the exposure area of the wafer to the next shot (another shot adjacent to the one shot described above in the non-scanning direction).

The movement operation of the wafer between the shots has been hitherto performed in accordance with the following procedures (1) to (3). (1) After completion of the exposure, the wafer stage (substrate stage) is once moved to the same coordinate position in the scanning direction as that of the scanning start position for the next shot. After that, (2) the stepping is performed in the non-scanning direction up to the scanning start position for the next shot. (3) The scanning is started for the exposure for the next shot. Therefore, the wafer has been moved along a ]-shaped route.

The improvement of the throughput (process ability) is one of the most important tasks for the exposure apparatus. In order to necessarily achieve the improvement, the rate of acceleration or deceleration of the reticle during the scanning exposure is, for example, 0.5 G→4 G which is large. The maximum velocity is also large, i.e., 350 mm/s→1500 mm/s. Accordingly, the rate of acceleration, the rate of deceleration, and the maximum velocity of the wafer stage during the scanning exposure have the magnitude proportional to 1/n of the projection magnification. Therefore, it is necessary that the movement distance during the pre-scanning and during the over-scanning, which is required before and after the exposure, is extended corresponding thereto. However, the scanning exposure is not performed during the period corresponding to the movement distance during the pre-scanning and during the over-scanning. The elongation of the distance causes an inconvenience such that the throughput is reversely deteriorated.

A stage disposed on the wafer side, which has been used in the conventional scanning type exposure apparatus described above, is a rectangular XY stage which is movable in the two-dimensional plane (XY plane). The position on the XY coordinate system on the XY stage has been measured with interferometers for perpendicularly radiating length-measuring beams respectively onto reflecting surfaces (also referred to as "movement mirrors") provided along orthogonal two sides of the XY stage. In recent years, there is such a tendency that the wafer size is increased from 8 inches to 12, 14, and 14 inches. Accordingly, there is such a tendency that the wafer stage for holding the wafer has a large size and a heavy weight. It is necessary that the length-measuring axis of the interferometer is not deviated from the reflecting surface of the movement mirror even when the movement distance is increased during the pre-scanning and during the over-scanning described above. Therefore, the movement mirror becomes to have a large size. Accordingly, there is such a tendency that the wafer stage necessarily has a large size and a heavy weight. The large size and the heavy weight of the wafer stage as described above necessarily deteriorate the response performance in the positional control for the wafer stage. For this reason, the settling time is prolonged, resulting in such an inconvenience that the throughput is reversely deteriorated although the rate of acceleration, the rate of deceleration, and the maximum velocity are originally increased in order to improve the throughput.

In order to measure the rotation of the stage from a viewpoint to improve the positional control accuracy for the wafer stage, a plurality of length-measuring beams are used for the interferometer. The interferometer, which has two or more length-measuring axes, is gradually used for the positional control for the wafer stage. A so-called double-path interferometer is now available in order to avoid any trouble in the length measurement with the interferometer, which would be otherwise caused by any rotation of the wafer stage. Any of the arrangements, i.e., the plurality of the length-measuring axes of the interferometer and the double-path interferometer necessarily results in the elongation of the length of the movement mirror. There is such a tendency that the stage has a larger size and a heavier weight. It has been feared that the large size of the wafer stage brings about the inconvenience such as the increase in movement area of the wafer stage, and consequently the increase in installation area for the apparatus (increase in foot print). The inconvenience, which is involved in the large size of the stage as described above, is not limited to the exposure apparatus, and it may be caused in a similar manner in apparatuses and equipment provided with any positioning movement stage.

The recent device rule is not more than 0.2 $\mu$m L/S. In order to transfer such a pattern onto the wafer sufficiently accurately, the KrF excimer laser or the ArF excimer laser is used as the illumination light source. However, the device rule will be certainly decreased in future. Those having been contrived as candidates for the next-generation exposure apparatus capable of responding to such a device rule include, for example, the X-ray exposure apparatus and the EB exposure apparatus (electron beam exposure apparatus). However, there is such a background that it is difficult to introduce such an apparatus due the problems that the technical hurdle is high, and the throughput is remarkably low as compared with the optical exposure apparatus.

The flatness technique is also introduced into the device, and the difference in height of the pattern and the thickness of the resist become extremely thin. Therefore, it has been tried that the double exposure method, in which the depth of focus is increased by performing the exposure twice for an identical wafer, is used for the KrF or the ArF exposure apparatus to perform the exposure up to 0.1 $\mu$m L/S. However, it is necessary for the double exposure method that the exposure process is performed several times by using a plurality of reticles. Therefore, the time, which is required for the exposure process, is twice or more as compared with the conventional apparatus, resulting in such an inconvenience that the throughput is greatly deteriorated.

On the contrary, it is doubtless that the use of the double exposure method for the KrF or ArF exposure apparatus to realize the exposure up to 0.1 μm L/S is a hopeful choice to develop the next-generation machine aimed at the mass-production of 256 M bit to 4 G bit DRAM. It is an urgent task to develop a new technique in order to improve the throughput which is the worst drawback of the double exposure method that is the bottleneck for this purpose.

FIG. 29(A) shows a plan view of a reticle stage RST' of a conventional scanning type exposure apparatus including a rectangular illumination slit section ST (hatched section) in an effective field of a projection optical system PL, which has approximately the same slit length in the longitudinal direction as the pattern length of a reticle R6 in the non-scanning direction. The apparatus includes a movement mirror 158 composed of a plane mirror which is provided at the first end in the non-scanning direction orthogonal to the scanning direction (arrow Y) of the reticle stage RST' to extend in the scanning direction. A movement mirror 159, which is composed of a corner cube, is provided at a central portion of the first end in the scanning direction. An interferometer 157X, which radiates two-axis length-measuring beams RIX onto the movement mirror 158 and which receives reflected light beams therefrom, is used to measure the position of the reticle stage RST' in the non-scanning direction. An interferometer 157Y, which radiates a length-measuring beam RIY onto a movement mirror 159 and which receives a reflected light beam therefrom, is used to measure the position of the reticle stage RST' in the scanning direction. In this arrangement, a so-called double-path structure is adopted as follows. That is, the corner cube is used as the movement mirror 159 which measures the position in the scanning direction (scan direction). The length-measuring beam RIY, which is radiated from the interferometer 157Y onto the movement mirror 159, is successively reflected by the movement mirror 159, a reflecting mirror 160, and the movement mirror 159. The returning light beam from the movement mirror 159 returns in the opposite direction along substantially the same optical path as that of the incident optical path. This arrangement is adopted because it is intended that the length can be accurately measured in the scanning direction even when there is any in-plane rotation of the reticle stage RST'. In this case, there is little discrepancy in the scanning direction between the optical path of the radiating light beam from the interferometer 157Y and the optical path of the returning light beam. In other words, although the displacement (=2×L×θ) occurs on the reflecting mirror 160, there is no discrepancy between the returning light flux and the reference light flux on the light-receiving plane even when L is long, because the light returns along the identical optical path. As for the non-scanning direction, the amount of discrepancy 2Lθ between the returning light flux and the reference light flux can be made to be not more than a predetermined value by decreasing the distance L1 of the length-measuring beam RIX as short as possible.

The stitching technique for the large area exposure based on the use of the 9-inch reticle described above and the execution of the double exposure to improve DOF are conceived to be hopeful means in order that the exposure (hereinafter appropriately referred to as "next-generation exposure") is realized up to 0.1 μm L/S with the double exposure method for the scanning type exposure apparatus which uses the exposure light source of the KrF excimer laser or the ArF excimer laser, and the throughput is improved during such a process. That is, in such a case, no time is required to exchange the reticle. Therefore, it is conceived that the throughput can be improved as compared with the double exposure method and the stitching based on the use of the conventional exposure apparatus.

FIG. 29(B) shows a plan view of a reticle stage RST which is directed to the case of realization of the next-generation exposure with a 9-inch reticle R9. FIG. 29(B) illustrates a state in which a pattern area P of the 9-inch reticle R9 is divided into divided pattern areas P1, P2 each having an area of 100 mm×200 mm and adjoining in the non-scanning direction. The length of each of the divided pattern areas P1, P2 in the non-scanning direction is approximately the same as the slit length in the longitudinal direction of a rectangular illumination slit section st (hatched section) in an effective field of a projection optical system PL. In FIG. 29(B), in addition to a movement mirror (reflecting surface) 158X which measures the position in the non-scanning direction, a movement mirror 158Y' for measuring the position in the scanning direction is also a plane mirror, because it is necessary to move the reticle stage RST in the non-scanning direction as well in order to perform the exposure for the respective divided pattern areas P1, P2.

However, in the case of FIG. 29(B), the following inconvenience arises. That is, when the reticle stage RST is rotated in response to the angle of rotation of the wafer, or when the rotational direction is corrected on the side of the reticle stage RST after the reticle R9 is loaded on the reticle stage RST, then length-measuring beams RIX, RIY from interferometers 157X, 157Y are not radiated vertically onto any one of the movement mirror 158X and the movement mirror 158Y'. It is feared that the measurement of the position of the reticle stage RST may be incorrect or difficult, because of the following reason. That is, in the case of FIG. 29(B), the plane mirror is used for any one of the movement mirrors in the scanning direction and the non-scanning direction. The lengths L2, L3 of the length-measuring beams RIX, RIY are long corresponding to the fact that the movement distance (stroke) of the reticle stage RST is long as compared with the conventional apparatus. It is feared that the reflected light beams (returning light beams) from the movement mirror 158X and the movement mirror 158Y' are greatly inclined. In such a case, the following relationships are given, i.e., beam width<displacement (=2×L2×θ) of optical axis of length-measuring beam on light-receiving surface, beam width<displacement (=2×L3×θ) of optical axis of length-measuring beam on light-receiving surface. It is difficult to control the rotation on the side of the reticle stage RST.

If the plane mirror has a long length, it is extremely laborious to perform the accurate machining, which has caused the increase in cost as well.

The present invention has been achieved in order to dissolve the inconveniences involved in the conventional technique as described above, a first object of which is to provide a scanning type exposure apparatus and a scanning exposure method which make it possible to realize highly accurate exposure based on the use of a fine pattern with a high throughput.

A second object of the present invention is to provide a scanning type exposure apparatus and a scanning exposure method which are preferably used for multiple exposure.

A third object of the present invention is to provide a stage apparatus which makes it possible to realize a small size and a light weight of a stage.

A fourth object of the present invention is to provide an exposure apparatus which is provided with a stage having a small size and a light weight.

A fifth object of the present invention is to provide an exposure method which makes it possible to realize a small size and a light weight of a stage of an exposure apparatus.

A sixth object of the present invention is to provide a method for producing a novel scanning type exposure apparatus.

A seventh object of the present invention is to provide microdevices with an exposure apparatus and an exposure method of the present invention.

SUMMARY OF THE INVENTION

According to an aspect A of the present invention, there is provided a scanning type exposure apparatus for transferring a pattern on a mask to a substrate via a projection optical system (PL) by synchronously moving the mask (R) and the substrate (W); the scanning type exposure apparatus comprising a mask stage (RST) arranged on a side of an object plane of the projection optical system; a substrate stage (WST) arranged on a side of an image plane of the projection optical system; a plurality of corner cubes (31Y1, 31Y2, 31Y3) provided on the mask stage and arranged in a second direction perpendicular to a first direction in which the mask is synchronously moved; and a first interferometer (30Y) which radiates a length-measuring beam (IY) to the mask stage in the first direction, and receives the length-measuring beam reflected by one of the plurality of corner cubes selected depending on a position of the mask stage in the second direction.

According to the exposure apparatus, the plurality of corner cubes are arranged on the mask stage in the second direction (non-scanning direction) perpendicular to the first direction (scanning direction) in which the mask is synchronously moved. The length-measuring beam is radiated in the first direction toward the mask stage. The apparatus further comprises the first interferometer which receives the length-measuring beam reflected by one of the plurality of corner cubes selected depending on the position of the mask stage in the second direction. Therefore, the position of the mask stage in the first direction can be managed by the aid of the first interferometer on the basis of the reflected light beam from one of the plurality of corner cubes selected depending on the position of the mask stage in the second direction. Therefore, when the position of the mask stage in the second direction is located at a position at which any one of the plurality of mirrors is selected, the substrate stage is moved in the first direction in synchronization with the mask stage while managing the position of the mask stage in the first direction by using the first interferometer. Thus, the pattern on the mask can be transferred onto the substrate via the projection optical system. The pattern on a plurality of partial areas on the mask or a plurality of areas on the mask can be transferred onto the substrate via the projection optical system without exchanging the mask. In this arrangement, the position of the mask stage in the first direction is measured by the aid of the corner cubes to which the length-measuring beam is radiated from the first interferometer. Therefore, even when the rotation of the mask stage is controlled in the same manner as in the conventional technique prior to the synchronous movement (or during the synchronous movement) of the mask stage and the substrate stage, the returning light flux from the corner cube is always superimposed on the reference light flux from the side of the fixed mirror. Accordingly, the position of the mask stage in the first direction (scanning direction) can be accurately managed during the scanning exposure. Therefore, when a large mask is used, the throughput can be improved by realizing the exposure over a large area by means of the stitching. Further, the control of the rotation of the mask stage makes it possible to perform the highly accurate exposure. When the multiple exposure such as the double exposure is performed, it is possible to improve the throughput and improve the exposure accuracy owing to the improvement in focal depth, because it is unnecessary to exchange the mask.

In this international application, the term "corner cube" means a reflecting member which has at least two reflecting surfaces, wherein the angle formed by the two reflecting surfaces is determined to be the right angle. The corner cube is also referred to as "corner reflector" or "corner cube reflector". The present applicant has disclosed an exposure apparatus based on the use of the corner cube in Japanese Patent Application Laid-Open No. 62-150106 (and United States patent application corresponding thereto). The disclosure of the above-mentioned patent documents is incorporated herein by reference so long as the domestic laws of the countries designated in this application permit the incorporation.

In the scanning type exposure apparatus according to the aspect A, it is desirable that the apparatus further comprises a driving control system (33, 80) which reciprocates the mask stage (RST) in the first direction at least once and moving the mask stage in the second direction during the reciprocating movement in order to transfer the pattern on the mask (R) to the substrate (W); wherein two of the plurality of corner cubes (31Y1, 31Y2, 31Y3) are arranged and separated from each other by a distance corresponding to an amount of movement of the mask stage in the second direction. In this arrangement, in order to transfer the pattern on the mask to the substrate, the driving control system is used to reciprocate the mask stage in the first direction at least once. During the reciprocating movement, the mask stage is moved in the second direction. However, the two of the plurality of corner cubes are arranged and separated from each other by the distance corresponding to the amount of the movement. Therefore, the position of the mask stage is reliably managed by the first interferometer at any position before and after the movement. The pattern in a different area on the mask can be transferred to an identical area or a different area on the substrate during the one time of the reciprocating movement of the mask stage. Also in this arrangement, it is unnecessary to exchange the mask. It is unnecessary that the spacing distance between the two corner cubes in the second direction is the same as the movement amount of the mask stage in the second direction. It is enough to provide such a distance that the length-measuring beam of the first interferometer is radiated onto the two corner cubes respectively before and after the movement of the mask stage.

According to an aspect B of the present invention, there is provided a scanning type exposure apparatus for transferring a pattern formed on a mask to a substrate via a projection optical system (PL), while relatively moving the mask (R) and the substrate (W) in a first direction in synchronization with each other; the scanning type exposure apparatus comprising a mask stage (RST) which is two-dimensionally movable while holding the mask; a substrate stage (WST) which is movable in the first direction while holding the substrate; a first reflecting surface (84a) provided on the mask stage and extending in the first direction; a plurality of corner cubes (31Y1, 31Y2, 31Y3) provided on the mask stage and arranged at predetermined spacing distances in a second direction perpendicular to the first direction; a first interferometer (30Y) which measures a position of the mask stage in the first direction by radiating a length-measuring beam (IY) in the first direction onto one of the plurality of corner cubes depending on a position of the mask stage in the second direction, and receives a reflected light beam therefrom; and a second interferometer (30X1) which measures a position of the mask stage in the second direction by radiating a length-measuring beam (IX1) in the second direction onto the first reflecting surface, and receiving a reflected light beam therefrom.

According to the apparatus of the aspect B, the position of the mask stage in the second direction is measured by the second interferometer. The length-measuring beam in the first direction is radiated from the first interferometer to one of the plurality of corner cubes depending on the measured position. The reflected light beam therefrom is received, and thus the position of the mask stage in the first direction is measured by the first interferometer. Therefore, the pattern in a plurality of partial areas on the mask or a plurality of areas on the mask can be transferred to the substrate via the projection optical system without changing the mask. The position of the mask stage in the first direction (scanning direction) can be accurately managed during the scanning exposure. Therefore, the throughput can be improved by realizing the exposure over a large area by means of the stitching based on the use of a large size mask. Further, the control of the rotation of the mask stage makes it possible to perform the highly accurate exposure. When the multiple exposure such as the double exposure is performed, it is possible to improve the throughput and improve the exposure accuracy owing to the improvement in depth of focus, because it is unnecessary to exchange the mask as well.

The phrase "arranged at predetermined spacing distances in a second direction" is intended to include not only a case in which the plurality of corner cubes are arranged at predetermined spacing distances on an identical straight line in the second direction, but also a case in which the position coordinate component in the second direction mutually differs for the plurality of corner cubes. For example, if the positions of two corner cubes are represented by X–Y coordinates of (X1–Y1), (X2–Y2) respectively provided that the first direction resides in the X-axis and the second direction resides in the Y-axis, it is enough that X1≠X2 is given, and it is allowable that Y1=Y2 or Y1≠Y2 is given. The predetermined spacing distance may be a preset arbitrary spacing distance. That is, it is allowable that the mask stage is rectangular, and the two corner cubes are arranged on the side surface of the stage extending in the second direction. Alternatively, it is allowable that one of the corner cubes is arranged on the side surface of the stage, and the other is arranged in the plane of the stage.

A variety of arrangements are conceived for the plurality of corner cubes. It is also preferable that the plurality of corner cubes (31Y1, 31Y2) are provided corresponding to a plurality of areas (P1, P2) arranged on the mask in the second direction respectively. In such a case, when the pattern in any area is transferred, the first position of the mask stage can be correctly managed with the first interferometer by using the corner cube corresponding to the concerning area.

In this arrangement, it is desirable that the plurality of corner cubes further include a corner cube (31Y3) arranged at a central portion of the mask in the second direction. Such an arrangement is preferred for any of the ordinary exposure based on the use of an ordinary mask (reticle) having a single pattern area formed on the mask, the multiple exposure such as the double exposure based on the use of a mask having a plurality of pattern areas arranged on the mask, and the stitching. Further, it is possible to realize the multiple exposure without exchanging the mask.

It is preferable that the apparatus according to the aspect B further comprises a reset unit (33) for resetting the first interferometer (30Y) in accordance with position information in the second direction of the mask stage (RST). In this arrangement, the first interferometer can be reset in accordance with the position information in the second direction of the mask stage at the instant at which the length-measuring axis of the first interferometer hits any of the corner cubes during the movement of the mask stage in the second direction. The term "reset" herein not necessarily means the fact that the measured value of the interferometer is returned to the zero point. It is intended that the restoration may be performed to a predetermined value other than zero.

It is desirable that the apparatus according to the aspect B further comprises a third interferometer (30X2) which radiates a length-measuring beam (IX2) in the second direction onto the mask stage (RST) from a side opposite to the second interferometer (30X1); the mask stage further has a second reflecting surface (84b) parallel to the first reflecting surface (84a) onto which the length-measuring beam from the third interferometer is radiated; and the apparatus further comprises a calculating unit (33) for calculating the position of the mask stage in the second direction on the basis of at least one of measured values of the second and third interferometers. In this arrangement, the position of the mask stage in the second direction is calculated on the basis of at least one of the measured values of the second and third interferometers. Therefore, the calculating unit can calculate the position of the mask stage in the second direction with the measured value of any one of the second and third interferometers at which the length-measuring beam is shorter up to each reflecting surface. Accordingly, the measured value is less affected by the rotation of the mask stage. It is possible to more accurately determine the position of the mask stage in the second direction as well. If the length of the length-measuring beam is approximately identical from the second and third interferometers to the respective reflecting surfaces, the calculating unit can make accurate determination owing to the averaging effect by determining the position of the mask stage in the second direction on the basis of ½ of the difference between the second and third interferometers.

It is also preferable that the calculating unit (33) determines the position of the mask stage in the second direction on the basis of one of or both of the measured values of the second and third interferometers in accordance with information on an area (P1, P2) on the mask (R) located opposingly to a projection field of the projection optical system (PL), the information being one of position information on the mask stage (RST) in the second direction.

It is also preferable for the apparatus according to the aspects A and B that a predetermined fiducial mark (Mr1, Mr2) is arranged on the substrate stage (WST), and the apparatus further comprises a measuring unit (50, 110) which measures a positional relationship between the mask (R) and the substrate stage (WST) with the fiducial mark in order to reset the first interferometer (30Y) depending on the position of the mask stage (RST) in the second direction. In this arrangement, when the first interferometer is reset depending on the position of the mask stage in the second direction with the measuring unit, the fiducial mark is used to measure the positional relationship between the mask and the substrate stage. Therefore, there is no inconvenience which would be otherwise caused such that the overlay-accuracy between the mask and the substrate is deteriorated even when the mask stage is moved in the second direction to perform exposure for a different area on the mask.

It is also preferable that the apparatus according to the aspects A and B further comprises a first pedestal (16) which supports the projection optical system (PL); a second pedestal (26, 28) which arranges the mask stage (RST) thereon; a vibration-preventive apparatus (20) which supports the first pedestal; and a frame (72) which is provided on a-floor to arrange the vibration-preventive apparatus thereon, and the frame having an actuator (74R, 74L) which applies a force corresponding to a reaction force generated by movement of the mask stage, to the mask stage or the second pedestal. In this arrangement, the force, which corresponds to the reaction force generated by the movement of the mask stage, is applied by the actuator to the mask stage or the second pedestal. Therefore, it is possible to prevent the first pedestal from transmission of the vibration during the acceleration and deceleration of the mask stage via the second pedestal. In this case, it is desirable that the apparatus further comprises a base plate for placing the vibration-preventive apparatus thereon; and an elastic member for connecting the base plate and the frame, because of the following reason. That is, such an arrangement makes it possible to avoid the mutual transmission of vibration between the first pedestal and the frame by the aid of the elastic member.

It is desirable for the apparatus according to the aspects A and B that an extension line of the length-measuring beam of the first interferometer (30Y) intersects an optical axis of the projection optical system (PL), because of the following reason. That is, in this arrangement, the position of the mask stage in the first direction can be correctly measured without producing the so-called Abbe error.

It is desirable for the apparatus according to the aspect B that the second interferometer (30X1) radiates two length-measuring beams (Ix11, IX12) onto the first reflecting surface (84a) in the second direction, and an extension line of one of the two length-measuring beams intersects an optical axis of the projection optical system (PL). In this arrangement, the position of the mask stage in the second direction can be correctly measured without involving the so-called Abbe error by using the length-measuring beam having the extension line which intersects the optical axis of the projection optical system. It is possible to independently measure the position with the two length-measuring beams, and it is possible to measure the rotation of the mask stage on the basis of the obtained result.

In the apparatus according to the aspect B, it is a matter of course that a movement mirror composed of a plane mirror may be provided on the mask stage, and its reflecting surface may be utilized as the first reflecting surface (84a). However, it is desirable that the first reflecting surface (84a) is formed on a side surface of the mask stage (RST), because of the following reason. That is, such an arrangement makes it possible to allow the mask stage to have a light weight corresponding thereto.

According to an aspect C of the present invention, there is provided a scanning exposure method for transferring a pattern formed on a mask to a substrate, while relatively moving a mask stage (RST) which holds the mask (R) and a substrate stage (WST) which holds the substrate (W) in a predetermined first direction in synchronization with each other, the method comprising a first scanning exposure step of transferring a pattern in a first area (P1) on the mask to a predetermined area on the substrate, while radiating a length-measuring beam (IX1) onto a first reflecting surface (84a) provided on the mask stage to extend in the first direction and receiving a reflected light beam therefrom to manage a position of the mask stage in a second direction, and radiating a length-measuring beam (IY) onto a first corner cube (31Y1) provided on the mask stage and receiving a reflected light beam therefrom to manage a position of the mask stage in the first direction; and a second scanning exposure step of transferring a pattern in a second area (P2) adjoining the first area in the second direction on the mask to the predetermined area on the substrate, while radiating the length-measuring beam onto the first reflecting surface and receiving a reflected light beam therefrom to manage the position of the mask stage in the second direction, and radiating the length-measuring beam (IY) onto a second corner cube (31Y2) different from the first corner cube provided on the mask stage and receiving a reflected light beam therefrom to manage the position of the mask stage in the first direction.

According to this method, in the first scanning exposure step, the pattern in the first area on the mask is transferred to the predetermined area on the substrate, while managing the position of the mask stage in the second direction on the basis of the reflected light beam of the length-measuring beam from the first reflecting surface, and managing the position of the mask stage in the first direction on the basis of the reflected light beam of the length-measuring beam from the first corner cube. Accordingly, the position of the mask stage is accurately managed in the first scanning exposure step even when any rotation or the like exists in the mask stage. In the second scanning exposure step, the pattern in the second area adjoining the first area in the second direction on the mask is transferred to the predetermined area on the substrate, while managing the position of the mask stage in the second direction on the basis of the reflected light beam of the length-measuring beam from the first reflecting surface, and managing the position of the mask stage in the first direction on the basis of the reflected light beam of the length-measuring beam from the second corner cube which is different from the first corner cube. Accordingly, the position of the mask stage is accurately managed in the second scanning exposure step even when any rotation or the like exists in the mask stage. Therefore, the throughput can be improved even when the stitching or the double exposure is realized by using a large mask without exchanging the mask. Further, the control of the rotation of the mask stage makes it possible to improve the overlay accuracy, and improve the exposure accuracy owing to the improvement in depth of focus.

According to an aspect D of the present invention, there is provided a method for producing a scanning type exposure apparatus for transferring a pattern on a mask to a substrate via a projection optical system (PL) by synchronously moving the mask (R) and the substrate (W), the method comprising:

providing the projection optical system (PL);

providing a mask stage (RST) arranged on a side of an object plane of the projection optical system;

providing a substrate stage (WST) arranged on a side of an image plane of the projection optical system;

providing a plurality of corner cubes (31Y1, 31Y2, 31Y3) on the mask stage to be arranged in a second direction perpendicular to a first direction in which the mask is synchronously moved; and providing a first interferometer (30Y) which radiates a length-measuring beam (IY) to the mask stage in the first direction, and receives the length-measuring beam reflected by one of the plurality of corner cubes selected depending on a position of the mask stage in the second direction. It is desirable that the method further comprises providing a driving control system (33, 80) for reciprocating the mask stage (RST) in the first direction at least once and moving the mask stage in the second direction during the reciprocating movement in order to transfer the pattern on the mask (R) to the substrate (W), wherein two of the plurality of corner cubes (31Y1, 31Y2, 31Y3) are arranged and separated from each other by a distance corresponding to an amount of movement of the mask stage in the second direction.

According to an aspect E of the present invention, there is provided a method for producing a scanning type exposure apparatus for transferring a pattern formed on a mask to a substrate via a projection optical system (PL), while relatively moving the mask (R) and the substrate (W) in a first direction in synchronization with each other, the method comprising:

providing the projection optical system (PL);

providing a mask stage (RST) which is two-dimensionally movable while holding the mask;

providing a substrate stage (WST) which is movable in the first direction while holding the substrate;

providing a first reflecting surface (84a) on the mask stage to extend in the first direction;

providing a plurality of corner cubes (31Y1, 31Y2, 31Y3) on the mask stage to be arranged at predetermined spacing distances in a second direction perpendicular to the first direction;

providing a first interferometer (30Y) which measures a position of the mask stage in the first direction by radiating a length-measuring beam (IY) in the first direction onto one of the plurality of corner cubes depending on a position of the mask stage in the second direction, and receiving a reflected light beam therefrom; and providing a second interferometer (30X1) which measures a position of the mask stage in the second direction by radiating a length-measuring beam (IX1) in the second direction onto the first reflecting surface, and receiving a reflected light beam therefrom. In this method, it is desirable that the plurality of corner cubes are provided corresponding to a plurality of areas arranged on the mask in the second direction respectively.

According to an aspect F of the present invention, there is provided a scanning exposure method for transferring a pattern on a mask onto a substrate by reciprocatively moving the mask (R) in a first direction to irradiate, with an illumination light beam, first and second areas (P1, P2) respectively arranged in a second direction perpendicular to the first direction on the mask, and moving the substrate (W) in synchronization with the movement of the mask; the method comprising driving a mask stage in the first direction on the basis of an output of an interferometer (30Y) which radiates a length-measuring beam to a first mirror (31Y1) provided on the mask stage (RST) which holds the mask in order to irradiate the first area (P1) on the mask with the illumination light beam; and driving the mask stage in the first direction while radiating the length-measuring beam of the interferometer onto a second mirror (31Y2) which is different from the first mirror provided on the mask stage in order to irradiate the second area (P2) on the mask with the illumination light beam.

According to the method of the aspect F, when the first area on the mask is irradiated with the illumination light beam, the mask stage is driven in the first direction on the basis of the output of the interferometer which radiates the length-measuring beam onto the first mirror provided on the mask stage which holds the mask. When the second area on the mask is irradiated with the illumination light beam, the mask stage is driven in the first direction while radiating the length-measuring beam of the interferometer onto the second mirror which is different from the first mirror provided on the mask stage. Therefore, in each of the two cases, i.e., when the first area is subjected to the transfer and when the second area is subjected to the transfer, the mask stage is driven in the first direction while managing the position of the mask stage in the first direction by means of the identical interferometer, and the substrate is driven in synchronization with the mask stage. Accordingly, the first area and the second area on the mask are transferred onto the substrate. According to this invention, a short reflecting surface (for example, a plane mirror) can be used without using a single long reflecting surface (plane mirror), as the mirror to measure the position of the mask stage in the first direction (scanning direction). Therefore, the cost can be reduced correspondingly thereto. In this arrangement, a corner cube may be used for the first mirror and the second mirror. In this arrangement, the position of the mask stage in the first direction is measured by the aid of the corner cube onto which the length-measuring beam is radiated from the interferometer. Accordingly, the returning light flux from the corner cube is always overlapped with the reference light flux from the side of the fixed mirror, even when the rotation of the mask stage is controlled in the same manner as in the conventional technique prior to the synchronous movement (or during the synchronous movement) of the mask stage and the substrate stage in the first direction. Therefore, it is possible to correctly manage the position of the mask stage in the first direction (scanning direction) during the scanning exposure. Therefore, it is possible to realize the multiple exposure such as the double exposure and the large area exposure based on the stitching by using a large mask, and thus it is possible to improve the throughput. Further, it is possible to perform the highly accurate exposure by controlling the rotation of the mask stage.

In the method according to the aspect F, it is also preferable that the second area (P2) on the mask is overlay-transferred to a comparted area (for example, S1) on the substrate (W) to which the first area (P1) on the mask (R) is transferred to form a combined pattern of a first pattern in the first area and a second pattern in the second area in the comparted area in this arrangement, the double exposure can be realized without changing the mask. It is possible to improve the throughput and improve the exposure accuracy owing to the improvement of the depth of focus.

In the method according to the aspect F, it is also preferable that in order to successively transfer the pattern on the mask (R) to a plurality of comparted areas (S1, S2, S3, . . . ) on the substrate (W), the first area (P1) on the mask is successively transferred to the plurality of comparted areas, the mask is moved in the second direction, and then the second area (P2) on the mask is successively transferred to the plurality of comparted areas. In this arrangement, before the second area (P2) on the mask (R) is transferred to the plurality of comparted areas (S1, S2, S3, . . . ), it is allowable to change the intensity distribution of the illumination light beam, i.e., at least one of the shape and the size of the illumination source (for example, secondary light source) for radiating the illumination light beam. In this arrangement, even when the illumination condition suitable for the exposure differs between the pattern in the first area and the pattern in the second area on the mask, it is possible to set the appropriate illumination condition in conformity with the respective patterns. Accordingly, the exposure accuracy is further improved.

In the method according to the aspect F, it is also preferable that the mask stage is moved obliquely with respect to the first direction during deceleration of the mask stage (RST) (or before the velocity component of the mask stage in the first direction becomes zero) after the first area (P1) on the mask (R) is irradiated with the illumination light beam. By doing so, when the pattern in the second area is transferred onto the substrate continuously to the transfer of the pattern in the first area, the mask stage is moved not along the ]-shaped route but along a route shorter than it. Therefore, it is possible to improve the throughput owing to the reduction of the movement time.

In the method according to the aspect F, it is also preferable that the mask stage (RST) is accelerated in a direction intersecting the first and second directions to allow the second area on the mask to approach the illumination light beam before the second area (P2) on the mask (R) is irradiated with the illumination light beam. Alternatively, it is also preferable that the acceleration of the mask stage in the first direction is started before the stepping operation of the mask stage in the second direction is completed, or before the velocity component of the mask stage in the second direction becomes zero after the first area (P1) on the mask is irradiated with the illumination light beam. In view of the throughput, it is preferable that the movement is controlled such that the movement locus of the mask stage is parabolic (or U-shaped).

In the method according to the aspect F, it is desirable that the mask stage (RST) is driven without any stop between illumination of the illumination light beam onto the first area (P1) on the mask (R) and illumination of the illumination light beam onto the second area (P2) on the mask. In this arrangement, the mask stage is not stopped. Therefore, the time required to move the mask stage is approximately the shortest.

In the method according to the aspect F, it is desirable that a substrate stage (WST) which holds the substrate is driven without any stop between first scanning exposure for transferring the first area (P1) on the mask (R) to a first comparted area on the substrate (W) and second scanning exposure for transferring the second area (P2) on the mask to a second comparted area adjacent to the first comparted area on the substrate, because of the following reason. That is, in this arrangement, the movement locus of the substrate stage is not necessarily the shortest. However, the substrate stage is not stopped, and hence the time required for the movement (stepping) of the substrate stage between adjoining areas is approximately the shortest. Especially, in the stitching, when the mask stage is driven without any stop, and the substrate stage is driven without any stop, then the time, which ranges from the completion of the first scanning exposure to the start of the second scanning exposure, is the shortest.

In the method according to the aspect F, it is desirable that the substrate stage (WST) is accelerated in a direction intersecting the first and second directions before the second scanning exposure. In this arrangement, the substrate stage is accelerated while travelling obliquely with respect to the first and second directions.

In the method according to the aspect F, it is also preferable that the mask includes first and second masks arranged in the second direction, a first pattern in the first area is formed on the first mask, and a second pattern in the second area is formed on the second mask. In other words, a plurality of masks may be placed on the mask stage, because of the following reason. That is, even in the case of the plurality of masks, the inventions described above function as they are when the patterns on the respective masks are successively transferred onto the substrate.

According to an aspect G of the present invention, there is provided a scanning exposure method for transferring a pattern on a mask onto a substrate by reciprocatively moving the mask (R) in a first direction to irradiate, with an illumination light beam, first and second areas (P1, P2) respectively arranged in a second direction perpendicular to the first direction on the mask, and moving the substrate (W) in synchronization with the movement of the mask; wherein the mask is moved without any stop between illumination of the illumination light beam onto the first area on the mask and illumination of the illumination light beam onto the second area on the mask. According to this aspect, the movement locus of the mask is not necessarily the shortest. However, the mask is not stopped, and hence the movement time of the mask is approximately the shortest from the completion of the transfer of the pattern in the first area to the start of the transfer of the pattern in the second area on the mask.

According to an aspect H of the present invention, there is provided a scanning exposure method for transferring a circuit pattern onto a substrate (W), comprising a first step of moving a mask having first and second divided patterns of the circuit pattern in a first direction to irradiate the first divided pattern with an illumination light beam, and moving the substrate in synchronization with the movement of the mask to transfer the first divided pattern to a comparted area (for example, S1) on the substrate; and a second step of moving the mask in the first direction, i.e., in the direction opposite to that used in the first step to irradiate the second divided pattern with the illumination light beam, and moving the substrate in synchronization with the movement of the mask to transfer the second divided pattern to the comparted area. According to this aspect, it is possible to realize the double exposure in which the first divided pattern and the second divided pattern on the mask are transferred in an overlay manner to the identical comparted area on the substrate only by reciprocating the substrate once during the one-time of the reciprocating movement of the mask. As a result, the circuit pattern, which is composed of the first divided pattern and the second divided pattern, is accurately transferred.

In this method, it is desirable that the mask is moved between the first step and the second step so that at least one of a velocity component in the first direction and a velocity component in a second direction perpendicular thereto is not zero.

According to an aspect I of the present invention, there is provided a stage apparatus comprising a first movable member (WST) which is movable in a two-dimensional plane while holding a substrate (W); a first reflecting surface (60a) which is provided on the first movable member (WST) to extend in a direction intersecting a predetermined first axis (Y axis) and a second axis (X axis) perpendicular thereto in the two-dimensional plane; a first interferometer (76X1) which measures a position of the first movable member in a third axis direction by perpendicularly radiating a length-measuring beam onto the first reflecting surface and receiving a reflected light beam therefrom; and a calculating unit (78) which calculates a position coordinate on a rectangular coordinate system defined by the first axis and the second axis of the first movable member, on the basis of a measured value obtained by the first interferometer.

According to the stage apparatus of the present invention, the first movable member is provided with the first reflecting surface which extends in the direction intersecting the predetermined first axis and the second axis perpendicular thereto in the two-dimensional plane. The first interferometer measures the position in the third axis direction which is the direction of the length-measuring beam, of the first movable member by perpendicularly radiating the length-measuring beam onto the first reflecting surface and receiving the reflected light beam therefrom. For example, the interferometer is reset when the length-measuring beam of the first interferometer is firstly radiated onto the first reflecting surface so that the stage position at this time is determined to be the origin position (0, 0) of the rectangular coordinate system defined by the first axis (Y axis) and the second axis (X axis). The position (X, Y) after the movement of the stage can be calculated from the movement distance in the third axis direction measured by the first interferometer and the angle of intersection of the first reflecting surface with respect to the first axis or the second axis. That is, the calculating unit can be used to calculate the position coordinate of the first movable member on the rectangular coordinate system defined by the first axis and the second axis only with the measured value obtained by the first interferometer. It is enough that only the first reflecting surface in the direction intersecting the coordinate axis of the rectangular coordinate system is provided on the first movable member. Therefore, the number of interferometers and the number of reflecting surfaces can be decreased, and the stage apparatus having the simple system can be realized, as compared with the illustrative conventional apparatus in which reflecting mirrors are provided on a movable member respectively in the orthogonal axis direction on the perpendicular coordinate system, and the position of the movable member in the orthogonal axis direction is measured by using a plurality of interferometers respectively. It is also possible to simplify the measurement of the position of the substrate, and consequently the control of the position. The degree of freedom is improved for the arrangement of the reflecting surface. Consequently, the degree of freedom of the design is improved for the shape of the first movable member which holds the substrate. As a result, it is unnecessary to use a rectangular stage having, for example, a square or oblong configuration, as the first movable member. For example, when the reflecting surface is arranged obliquely on such a rectangular stage, it is possible to eliminate portions disposed outside the reflecting surface. Therefore, it is possible to realize a small size and a light weight of the stage which is movable two-dimensionally while holding the first movable member, i.e., the substrate.

In this aspect, it is also preferable that the stage apparatus further comprises a second reflecting surface (60b) which is provided on the first movable member (WST) to extend in the second axis direction; and a second interferometer (76Y) which measures a position of the first movable member in the first axis direction by perpendicularly radiating a length-measuring beam onto the second reflecting surface and receiving a reflected light beam therefrom; wherein the calculating unit (78) calculates a position coordinate of the first movable member in the second axis direction on the basis of the measured value obtained by the first interferometer. For example, the position of the first movable member in the first axis direction is measured by using the second interferometer, and the position of the first movable member in the second axis direction can be determined by using the first interferometer and the calculator. In this arrangement, it is necessary that the second reflecting surface is necessarily arranged perpendicularly to the first axis. However, the arrangement of the first reflecting surface is free to some extent. It is possible to realize a small size of the first movable member, i.e., the stage which is movable two-dimensionally while holding the substrate.

It is also preferable that the calculating unit (78) calculates at least one of the position in the first axis direction and the position in the second axis direction of the first movable member (WST) on the basis of both of the measured value obtained by the first interferometer (76X1) and the measured value obtained by the second interferometer (76Y). In this arrangement, the measurement is performed in the first axis direction with the measured value obtained by the second interferometer (76Y) to determine the difference between the obtained result and the measurement result in the first axis direction of the first interferometer (76X1), in accordance with which it is possible to correct any measurement error in the second axis direction concerning the first interferometer (76X1). Accordingly, it is possible to perform the measurement in the first axis direction and the second axis direction while allowing the stage to have a small size.

It is also preferable that the stage apparatus further comprises a third reflecting surface (60c) which is provided on the first movable member (WST), which intersects the first axis and the second axis perpendicular thereto in the two-dimensional plane, and which extends in a direction different from that of the first reflecting surface; and a third interferometer (76X2) which measures a position of the first movable member in a fourth axis direction by perpendicularly radiating a length-measuring beam onto the third reflecting surface and receiving a reflected light beam therefrom; wherein the calculating unit (78) calculates a position of the first movable member in the second axis direction on a stage coordinate system defined by the first axis and the second axis on the basis of measured values obtained by the first and third interferometers.

That is, the position of the first movable member in the first axis direction is measured by using the second interferometer. The position in the second axis direction can be determined by means of the calculation on the basis of the measured values obtained by the first and third interferometers which measure the positions in the respective directions of the first movable member from the direction different from that of the first axis. The first, second, and third reflecting surfaces can be arranged in a triangular configuration. As a result, it is possible to allow the first movable member itself to have a shape of rectangular configuration. Therefore, it is possible for the first movable member to realize a considerably small size and a considerably light weight while maintaining the high rigidity as compared with the conventional rectangular stage.

It is also preferable for the stage apparatus that the first interferometer (76X1) radiates two length-measuring beam having respective length-measuring axes onto the first reflecting surface (60a) to make mutual separation in a direction perpendicular to the two-dimensional plane, and receives respective reflected light beams therefrom in order to measures the position of the first movable member in the third axis direction for each of the length-measuring axes; and the calculating unit (78) also calculates inclination of the first movable member (WST) with respect to the two-dimensional plane on the basis of the measured value obtained by the first interferometer.

It is also preferable for the stage apparatus that the first interferometer (76X1) radiates two length-measuring beam having respective length-measuring axes separated in a direction parallel to the two-dimensional plane onto the first reflecting surface (60a), and receives respective reflected light beams therefrom in order to measure the position of the first movable member in the third axis direction for each of length-measuring axes; and the calculating unit (78) also calculates rotation of the first movable member (WST) in the two-dimensional plane on the basis of the measured value obtained by the first interferometer.

It is also preferable for the stage apparatus that the second interferometer (76Y) radiates three length-measuring beam having respective length-measuring axes onto the second reflecting surface so that incoming points into the second reflecting surface (60b) are not arranged on an identical straight line on the second reflecting surface, and receives respective reflected light beams therefrom, in order to measure the position of the first movable member (WST) in the first axis direction for the respective length-measuring axes; and the calculating unit (78) also calculates rotation of the first movable member in the two-dimensional plane and inclination of the first movable member with respect to the two-dimensional plane on the basis of the measured value obtained by the second interferometer.

It is also preferable for the stage apparatus that a reflecting mirror is arranged on the first movable member, and its reflecting surface is used as the first reflecting surface. However, it is desirable that the first reflecting surface (60a) is formed on an end surface or a side wall of the first movable member (WST), because of the following reason. That is, such an arrangement facilitates the realization of a light weight of the first movable member. Further, it is possible to narrow the width of the first movable member in the direction perpendicular to the substrate. Furthermore, it is also preferable that the first movable member (WST) has a substantially triangular configuration, and the second reflecting surface (60b) is formed on an end surface of the first movable member.

When the first movable member of the stage apparatus has the substantially triangular configuration, it is also preferable that the stage apparatus further comprises a driving unit for making driving movement in a direction perpendicular to the two-dimensional plane in response to an output of at least one of first, second, and third interferometers, provided in the vicinity of at least one corner of three corners. In this arrangement, at least one point of predetermined three points in the vicinity of the respective apex angles of the first movable member is driven by the driving unit in the direction perpendicular to the two-dimensional plane in response to at least one output of the first, second, and third interferometers. That is, the inclination of the first movable member (substrate) with respect to the two-dimensional plane is adjusted. In this procedure, the inclination is adjusted by driving the portion in the vicinity of the three apex angles far from the position of the center of gravity of the first movable member. Therefore, it is possible to obtain the high control response (tilt driving control response).

It is also preferable for the stage apparatus that each of the interferometers (76X1, 76Y, 76X2) radiates three length-measuring beam having respective length-measuring axes onto the corresponding reflecting surface (60a, 60b, 60c) so that their incoming points are not arranged on an identical straight line, and receives reflected light beams therefrom, in order to measure a position of the first movable member (WST) in a direction of each of length-measuring axes for each of the length-measuring axes; and the calculating unit (78) calculates rotation of the first movable member (WST) in the two-dimensional plane and inclination with respect to the two-dimensional plane using a measured value or measured values obtained by the length-measuring axis or the length-measuring axes of arbitrary one of, or arbitrary two of, or three of the first, second, and third interferometers.

In this arrangement, it is also preferable that the first movable member (WST) includes a second plate (52) movable in the two-dimensional plane, a leveling drive mechanism (58) carried on the second plate (52), and a first plate (TB) supported by the leveling drive mechanism which holds the substrate (W); the first, second, and third reflecting surfaces are provided on the first plate (TB); the leveling drive mechanism (58) includes three actuators (ZACX1, ZACY, ZACX2) which support the first plate at different three points substantially on extension lines of the respective length-measuring axes of the first, second, and third interferometers, the actuators being capable of making driving movement independently in a direction perpendicular to the two-dimensional plane at respective support points; the calculating unit (78) calculates inclination of the first, second, and third reflecting surfaces with respect to the two-dimensional plane by using the measured values obtained by the first, second, and third interferometers respectively; and the stage apparatus further comprises an actuator control unit (56) for controlling the three actuators in accordance with a calculation result obtained by the calculating unit. In this arrangement, the actuators can be independently controlled in accordance with the tilt angle of the corresponding reflecting surface measured by each of the interferometers. Therefore, the inclination can be adjusted reliably and efficiently. In this arrangement, when the first plate (TB) has a regular triangular configuration, it is desirable that the three actuators are arranged in the vicinity of apexes of the regular triangle of the first plate. By doing so, it is possible to obtain the high tilt drive control response.

It is also preferable that the stage apparatus further comprises a base board (22); and a second movable member (38) which arranges the first movable member (WST) thereon, the second movable member being arranged on the base board and relatively movable with respect the base board and the first movable member respectively; wherein the second movable member is moved in response to a reaction force generated by movement of the first movable member, because of the following reason. That is, when the foregoing arrangement is adopted, the unbalanced load, which is brought about by the movement of the center of gravity of the first movable member, can be canceled by the movement of the center of gravity of the second movable member. Thus, it is possible to retain the center of gravity of the entire stage apparatus at a predetermined position.

In this arrangement, it is desirable that the stage apparatus further comprises a driving system (44) capable of driving the second movable member (38) provided on the base board (22) at a predetermined response frequency; and a control unit (78) for controlling a position of the second movable member at a response frequency of not more than several Hz by the aid of the driving system, because of the following reason. That is, when the foregoing arrangement is adopted, for example, if the base board is inclined, the position can be controlled at the response frequency of not more than several Hz so that the second movable member is not moved freely due to its self-weight.

According to an aspect J of the present invention, there is provided a scanning type exposure apparatus for exposing a substrate by transferring a pattern formed on a mask onto the substrate, the apparatus comprising:

a stage apparatus including a substrate stage (WST) which is movable in a two-dimensional plane while holding the substrate, a first reflecting surface which is provided on the substrate stage to extend in a direction intersecting a predetermined first axis and a second axis perpendicular thereto in the two-dimensional plane, a first interferometer which measures a position of the substrate stage in a third axis direction by perpendicularly radiating a length-measuring beam onto the first reflecting surface and receiving a reflected light beam therefrom, and a calculating unit which calculates a position coordinate on a rectangular coordinate system defined by the first axis and the second axis of the substrate stage (WST), on the basis of a measured value obtained by the first interferometer;

a mask stage (RST) which holds the mask (R); and a stage control system (33, 78, 80) which relatively moves the mask stage (RST) and the substrate stage (WST) of the stage apparatus in synchronization with each other in a direction of the first axis (Y direction). The scanning type exposure apparatus is characterized in that the pattern formed on the mask is transferred to the substrate (W) on the substrate stage during the relative movement of the mask stage and the substrate stage effected by the stage control system. Accordingly, a triangular substrate stage, which is considerably small as compared with the conventional rectangular stage, can be used as the substrate stage as described above. Therefore, the position control response performance is improved for the substrate stage. It is possible to shorten the synchronous settling time for the mask stage and the substrate stage during the relative movement in the first axis direction effected by the stage control system. As a result, it is possible to improve the throughput.

In the aspect J, it is preferable that each of the first and third interferometers (76X1, 76X2) is an interferometer having two axes; and the apparatus further comprises a projection optical system (PL) having an optical axis which is orthogonal to the mask (R) and the substrate (W) respectively, and an alignment optical system (ALG) provided separately from the projection optical system. In this case, it is desirable that the respective length-measuring axes of the first and third interferometers are set so that a point of intersection obtained by extending one of the length-measuring axes (RIX11, RIX21) of each of the first and third interferometers is substantially coincident with a center of the projection optical system, and a point of intersection obtained by extending the respective remaining length-measuring axes (RIX12, RIX22) is substantially coincident with a center of the alignment optical system, because of the following reason. That is, in this arrangement, the position of the substrate can be managed in a state in which the so-called Abbe error does not exist during any of the exposure and the alignment. Thus, it is possible to improve the overlay accuracy.

It is desirable for the scanning type exposure apparatus according to the aspect J that rate of acceleration, maximum velocity, and settling time of the substrate stage (WST) during the exposure are determined so that any one of the length-measuring axes of the first, second, and third interferometers (76RIX1, RIY, RIX2) is not deviated from the corresponding reflecting surface of the first, second, and third reflecting surfaces (60a, 60b, 60c) during the scanning exposure for peripheral areas of the substrate (W), because of the following reason. That is, in this arrangement, the reflecting surface can be set within a range of the three side surfaces of the substrate stage. Therefore, the balance of the substrate stage is improved, and it is possible to enhance the rigidity thereof.

It is desirable for the scanning type exposure apparatus according to the aspect J that a fiducial mark (FM) and a sensor (KES) for performing predetermined measurement in relation to exposure process with the measured values of the first, second, and third interferometers are arranged at predetermined positions on the substrate stage (WST) at which any one of the length-measuring axes of the first, second, and third interferometers (76RIX1, RIY, RIX2) is not deviated from the corresponding reflecting surface of the first, second, and third reflecting surfaces (60a, 60b, 60c), because of the following reason. That is, in this arrangement, it is unnecessary to extend the reflecting surface, for example, for the measurement of the base line based on the use of the fiducial mark, and for the measurement of the image formation characteristics and the measurement of the radiation amount based on the use of the sensor. Therefore, this arrangement also results in the realization of a light weight of the substrate stage.

The scanning type exposure apparatus according to the aspect J may be constructed such that each of the interferometers radiates three length-measuring beam having respective length-measuring axes which are not arranged on an identical straight line on each of the reflecting surfaces onto the corresponding reflecting surface respectively, and receives reflected light beams therefrom, in order to measure a position of the substrate stage in a direction of each of the length-measuring axes for each of the length-measuring axes; and the calculating unit calculates rotation of the substrate stage in the two-dimensional plane and inclination with respect to the two-dimensional plane by using a measured value or measured values obtained by the length-measuring axis or the length-measuring axes of any arbitrary one of, or arbitrary two of, or three of the first, second, and third interferometers. Alternatively, the scanning type exposure apparatus according to the aspect J may be constructed such that the substrate stage includes a second plate movable in the two-dimensional plane, a leveling drive mechanism carried on the second plate, and a first plate supported by the leveling drive mechanism which holds the substrate;

the first, second, and third reflecting surfaces are provided on the first plate;

the leveling drive mechanism includes three actuators which support the first plate at different three points substantially on extension lines of the respective length-measuring axes of the first, second, and third interferometers, the actuators driving the first plate independently in a direction perpendicular to the two-dimensional plane at respective support points;

the calculating unit calculates inclination of the first, second, and third reflecting surfaces with respect to the two-dimensional plane using the measured values obtained by the first, second, and third interferometers respectively; and the stage apparatus further comprises an actuator control unit for controlling the three actuators in accordance with a calculation result obtained by the calculating unit. In the arrangements described above, it is preferable that the mask stage (RST) is rotatable in the two-dimensional plane. In this arrangement, it is also preferable that the calculating unit (78) calculates a rotation discrepancy amount of the substrate stage (WST) in the two-dimensional plane on the basis of the measured value obtained by the second interferometer (RIY); and the stage control system (33, 78, 80) controls rotation of the mask stage so that the rotation discrepancy amount is corrected. By doing so, it is unnecessary to hold the rotation control mechanism on the side of the substrate stage. Therefore, it is possible to realize a light weight of the stage apparatus corresponding thereto.

The scanning type exposure apparatus according to the aspect J may further comprises a base board; a second movable member which arranges the substrate stage thereon, the second movable member being arranged on the base board and movable relative to each of the base board and the substrate stage; a driving system capable of driving the second movable member provided on the base board at a predetermined response frequency; and a control unit for controlling a position of the second movable member at a response frequency of not more than several Hz by the aid of the driving system; wherein the second movable member is moved in response to a reaction force generated by movement of the substrate stage. In this arrangement, it is allowable that the substrate stage (WST) has a weight which is not more than 1/9 of a weight of the second movable member (38); and the control unit (78) varies a response frequency of the second movable member before exposure or alignment and the other response frequencies. Accordingly, when the exposure or the alignment, which requires the accuracy of the position control of the substrate stage, is performed, the response frequency of the second movable member is lowered to such an extent that the response is incapable during the acceleration or deceleration of the substrate stage. By doing so, the unbalanced load, which would be otherwise caused by the movement of the center of gravity of the substrate stage, can be canceled by the aid of the movement of the center of gravity of the second movable member. Further, the distance of the movement of the second movable member in the opposite direction can be made to be not more than 1/10. The position control can be performed by increasing the response frequency of the second movable member during the driving operation other than the exposure and the alignment described above. As a result, it is possible to decrease the foot print. Further, in this arrangement, it is also preferable that the scanning type exposure apparatus further comprises a position-measuring unit (45) for monitoring a two-dimensional position of the second movable member (38); wherein the control unit (78) corrects the position of the second movable member to a predetermined position on the basis of a measurement result obtained by the position-measuring unit during movement of the substrate stage (WST) other than exposure and alignment.

According to an aspect σ of the present invention, there is provided a scanning exposure apparatus for exposing a photosensitive substrate with a pattern by synchronously moving a mask formed with the pattern and the photosensitive substrate across an area onto which an energy beam is radiated, the apparatus comprising:

a mask stage which is movable while placing the mask thereon;

a substrate stage which is movable while placing the photosensitive substrate thereon, the substrate stage having, on a side wall, at least first, second, and third reflecting surfaces, and the first to third reflecting surfaces or extension lines thereof forming a triangle; and an interferometer system which radiates length-measuring beams to the first to third reflecting surfaces respectively. The triangle for forming the first to third reflecting surfaces may be a regular triangle. Those usable as the energy beam may include light beams having an arbitrary wavelength such as visible light, ultraviolet light, and X-ray, electromagnetic wave, and particle beams such as those composed of electrons.

According to an aspect K of the present invention, there is provided a stage apparatus comprising a base board (22); a first movable member (WST) which is movable relative to the base board (22) and holds a substrate; a second movable member (38) which arranges the first movable member thereon, the second movable member being arranged on the base board and being movable relative to the base board and the first movable member respectively; and a driving unit (42) provided on the second movable member, for moving the first movable member in a two-dimensional plane; wherein the second movable member is moved in accordance with a reaction force generated by the movement of the first movable member.

According to the stage apparatus of the aspect K, the unbalanced load, which is brought about by the movement of the center of gravity of the first movable member, can be canceled by the aid of the movement of the center of gravity of the second movable member. Therefore, the center of gravity of the entire apparatus can be maintained at a predetermined position. In this arrangement, it is also preferable that the driving unit (42) includes a linear actuator for driving the first movable member on the second movable member; and the first movable member (WST) and the second movable member (38) are supported in a non-contact manner by the second movable member and the base board respectively.

It is also preferable for the stage apparatus according to the aspect K that the first movable member (WST) has a first reflecting surface (60a) which extends in a direction intersecting first and second axes respectively orthogonal to one another in the two-dimensional plane, a second reflecting surface (60b) which extends in the second axis direction, and a third reflecting surface (60c) which is arranged substantially symmetrically to the first reflecting surface with respect to the first axis; and the apparatus further comprises three interferometers (76X1, 76X2, 76Y) which radiate length-measuring beams to the first, second, and third reflecting surfaces respectively. In this arrangement, it is possible to adopt an isosceles triangular first movable member. Therefore, the stage apparatus of the present invention can have a small size as compared with the conventional substrate stage.

It is also preferable for the stage apparatus according to the aspect K that the first movable member (WST) includes a first plate (TB) for placing the substrate (W) thereon; a driving mechanism (58) for moving the first plate in a direction perpendicular to the two-dimensional plane, and inclining the first plate relatively with respect to the two-dimensional plane; and a second plate for placing the driving mechanism thereon.

In the stage apparatus according to the aspect K, the first movable member may include a plurality of movable sections (WST1, WST2) as described in the second embodiment of the present invention. The arrangement of the plurality of movable sections on the second movable member is significant as follows. That is, when any one of the movable sections is driven by the driving unit, then the second movable member is moved in accordance with the reaction force of the driving force, and the unbalanced load, which is caused by the movement of the center of gravity of the movable section, can be canceled by the movement of the center of gravity of the second movable member. As a result, it is possible to maintain the center of gravity of the entire stage apparatus at a predetermined position. Similarly, when the plurality of movable sections are simultaneously driven by the driving unit, the second movable member is moved in accordance with the reaction force corresponding to the combined force of the driving force so that the unbalanced load, which is caused by the movement of the center of gravity of the plurality of movable sections, is canceled by the movement of the center of gravity of the second movable member. As a result, it is possible to maintain the center of gravity of the entire stage apparatus at a predetermined position. Therefore, it is unnecessary to perform any operation which would be otherwise performed such that the operation of the movable sections is mutually adjusted so that the operation of a certain movable section functions as disturbance on the other movable section. Therefore, the load on the control is mitigated. Further, it is possible to maintain the high position control performance for the respective movable sections.

It is desirable for the stage apparatus according to the aspect K that a mass of the first movable member (WST) is not more than about 1/5 of a mass of the second movable member (38); and the apparatus further comprises a second driving unit (44, 78) for driving the second movable member at a low response frequency on the base board (22). In this arrangement, the unbalanced load, which is brought about by the movement of the center of gravity of the first movable member, can be canceled by the movement of the center of gravity of the second movable member. Further, during this process, the distance of the movement of the second movable member in the opposite direction can be made to be not more than 1/10. The second movable member is driven on the base board by the second driving unit at the low response frequency of such a degree that the second movable member is incapable of making response to the reaction force during the acceleration or deceleration of the first movable member. Therefore, the second movable member can be driven without affecting the movement of the first movable member.

According to an aspect L of the present invention, there is provided a scanning type exposure apparatus comprising the stage apparatus according to the aspect K, the scanning type exposure apparatus further comprising a mask stage (RST) which holds a mask (R); a projection optical system (PL) having an optical axis perpendicular to the mask (R) and the substrate (W) respectively; a first pedestal (16) which supports the projection optical system and suspends the base board (22) thereby; and a vibration-preventive apparatus (20) which supports the first pedestal; wherein a pattern on the mask is transferred onto the substrate via the projection optical system by synchronously moving the mask and the substrate by the aid of the mask stage and the stage apparatus. Accordingly, the unbalanced load, which is brought about by the movement of the center of gravity of the first movable member for the substrate, for example, during the transfer of the mask pattern, can be canceled by the movement of the center of gravity of the second movable member. Therefore, the load on the vibration-preventive apparatus is mitigated. The distortion of the first pedestal section, which would be otherwise caused by the unbalanced load, can be suppressed to the minimum. As a result, it is possible to improve the positioning accuracy for the mask and the substrate.

It is also preferable that the scanning type exposure apparatus further comprises a second pedestal (26, 28) for placing the mask stage thereon; and a frame (72) provided on a floor on which the vibration-preventive apparatus (20) is arranged, and the frame having an actuator which applies a force corresponding to a reaction force generated by movement of the mask stage, to the mask stage or the second pedestal. In this arrangement, the force, which corresponds to the reaction force generated by the movement of the mask stage, is applied to the mask stage or the second pedestal by the aid of the actuator. Therefore, the first pedestal can be prevented from transmission of the vibration via the second pedestal during the acceleration or deceleration of the mask stage. In this arrangement, it is also preferable that the actuator for moving the mask stage is also used as the actuator which applies the force to the second pedestal. In this case, it is desirable that the apparatus further comprises a base plate (BS) for placing the vibration-preventive apparatus (20) thereon; and an elastic member (70) for connecting the base plate and the frame (72), because of the following reason. That is, in this arrangement, it is possible to avoid the mutual transmission of the vibration between the first pedestal and the frame, by the aid of the elastic member.

It is also preferable for the exposure apparatus according to the aspect L that the first movable member (WST) has a first reflecting surface (70a) which extends in a direction intersecting a scanning direction for the substrate (W) and a non-scanning direction orthogonal thereto respectively on the two-dimensional plane, a second reflecting surface (70b) which extends in the non-scanning direction, and a third reflecting surface (70c) which is arranged substantially symmetrically to the first reflecting surface in relation to the scanning direction; and the apparatus further comprises three sets of interferometers (76X1, 76X2, 76X3) which radiate length-measuring beams to the first, second, and third reflecting surfaces respectively. In this arrangement, it is possible to adopt an isosceles triangular first movable member, and hence it is possible to realize a small size as compared with the conventional substrate stage. Therefore, it is possible to further decrease the foot print. The improvement in the response performance for the position control of the first movable member shortens the synchronous settling time for the mask and the substrate, and it is possible to improve the throughput thereby. In this case, the overlay accuracy is improved owing to the improvement in positioning accuracy.

It is desirable that the exposure apparatus according to the aspect L further comprises a position-measuring unit (45) for detecting a relative position of the second movable member (38) with respect to the base board (22); and a second driving unit (44, 78) for positioning the second movable member at a predetermined point on the base board on the basis of an output of the position-measuring unit during operation other than exposure operation for the substrate (W) and alignment operation. In this arrangement, the second driving unit positions the second movable member at the predetermined point on the base board on the basis of the output of the position-measuring unit during the operation other than the exposure operation for the substrate and the alignment operation. As a result, it is possible to further decrease the foot print.

According to an aspect M of the present invention, there is provided a scanning type exposure apparatus for transferring a pattern on a mask (R) onto a substrate by synchronously moving the mask (R) and the substrate (W), the apparatus comprising a substrate stage (WST) which places the substrate thereon, the substrate stage having a first reflecting surface (60a) extending in a direction intersecting a first direction in which the substrate is synchronously moved and a second direction perpendicular thereto respectively, and a second reflecting surface (60b) extending in the second direction; and first and second interferometers (76X1, 76X2) which radiates length-measuring beams onto the first and second reflecting surfaces respectively.

It is also preferable that the exposure apparatus according to the aspect M further comprises a projection optical system (PL) having an optical axis substantially perpendicular to the mask and the substrate respectively; wherein the first and second interferometers are arranged such that their length-measuring axes make intersection at the optical axis of the projection optical system respectively. In this arrangement, it is preferable that the apparatus further comprises an off-axis alignment sensor (ALG) which radiates a light beam onto a mark on the substrate; wherein the first interferometer (76X1) has the first length-measuring axis (RIX11) which intersects the optical axis of the projection optical system (PL), and the second length-measuring axis (RIX12) which intersects a detection center of the off-axis alignment sensor.

In this arrangement, it is desirable that the second interferometer (76Y) radiates two length-measuring beams separated from each other in the second direction, onto the second reflecting surface (60b); and the detection center of the off-axis alignment sensor (ALG) is determined by the two length-measuring beams, and it is arranged on the length-measuring axis of the second interferometer passing through the optical axis of the projection optical system (PL). In this arrangement, it is also preferable that the substrate stage (WST) has a third reflecting surface (60c) which is arranged substantially symmetrically to the first reflecting surface (60a) in relation to the first direction; and the apparatus further comprises a third interferometer (76X2) which radiates a length-measuring beam onto the third reflecting surface. In this arrangement, it is desirable that the third interferometer (76X2) has a third length-measuring axis (RIX21) which intersects the optical axis of the projection optical system, and a fourth length-measuring axis (RIX22) which intersects the detection center of the off-axis alignment sensor.

According to an aspect N of the present invention, there is provided an exposure method for transferring a pattern on a mask onto a photosensitive substrate by synchronously moving the mask (R) and the photosensitive substrate (W), wherein exposure operation of the photosensitive substrate (W) is performed while controlling a position of the photosensitive substrate (W) with a length-measuring beam directed in a direction different from a non-scanning direction, with respect to at least the non-scanning direction, of a synchronous movement direction for the photosensitive substrate (W) and the non-scanning direction perpendicular thereto. Accordingly, the position is controlled with the length-measuring beam in the direction different from the non-scanning direction, concerning at least the non-scanning direction. That is, the position is controlled in the non-scanninq direction with the length-measuring beam in the direction which obliquely intersects the scanning direction. Therefore, any stage having any shape can be adopted for the stage for the photosensitive substrate, provided that the stage includes the reflecting surface in the direction perpendicular to the length-measuring beam. It is unnecessary to use a rectangular stage having, for example, a square or oblong configuration. The degree of freedom is improved for the design of the shape of the stage. As a result, it is possible to realize a small size of the stage for the photosensitive substrate.

According to an aspect O of the present invention, there is provided a method for producing a stage apparatus, comprising:

providing a first movable member which is movable in a two-dimensional plane while holding a substrate;

providing a first reflecting surface which is provided on the first movable member to extend in a direction intersecting a predetermined first axis and a second axis perpendicular thereto in the two-dimensional plane;

providing a first interferometer which measures a position of the first movable member in a third axis direction by perpendicularly radiating a length-measuring beam onto the first reflecting surface and receiving a reflected light beam therefrom; and providing a calculating unit for calculating a position coordinate on a rectangular coordinate system defined by the first axis and the second axis of the first movable member, on the basis of a measured value obtained by the first interferometer.

According to an aspect P of the present invention, there is provided a method for producing a scanning type exposure apparatus which exposes a substrate by transferring a pattern formed on a mask onto the substrate, the method comprising:

producing a stage apparatus by providing a substrate stage which is movable in a two-dimensional plane while holding the substrate, a first reflecting surface which is provided on the substrate stage to extend in a direction intersecting a predetermined first axis and a second axis perpendicular thereto in the two-dimensional plane, a first interferometer which measures a position of the substrate stage in a third axis direction by perpendicularly radiating a length-measuring beam onto the first reflecting surface and receiving a reflected light beam therefrom, and a calculating unit which calculates a position coordinate on a rectangular coordinate system defined by the first axis and the second axis of the substrate stage, on the basis of a measured value obtained by the first interferometer respectively;

providing a mask stage which holds the mask; and providing a stage control system which relatively moves the mask stage and the substrate stage in synchronization with each other in a direction of the first axis, wherein:

the scanning type exposure apparatus is operated such that the pattern formed on the mask is transferred to the substrate on the substrate stage during relative movement of the mask stage and the substrate stage effected by the stage control system.

According to an aspect Q of the present invention, there is provided a method for producing a stage apparatus, comprising:

providing a base board;

providing a first movable member which is movable relative to the base board and holds a substrate;

arranging, on the base board, a second movable member which arranges the first movable member thereon, the second movable member being movable relative to the base board and the first movable member respectively; and providing a driving unit on the second movable member, the driving unit moving the first movable member in a two-dimensional plane, wherein:

the stage apparatus is constructed such that the second movable member is moved in accordance with a reaction force generated by the movement of the first movable member.

According to an aspect R of the present invention, there is provided a method for producing a scanning type exposure apparatus, comprising:

producing a stage apparatus by providing a base board; a first movable member which is movable relative to the base board and holds a substrate; a second movable member which arranges the first movable member thereon, the second movable member being arranged on the base board and being movable relative to the base board and the first movable member respectively; and a driving unit which is provided on the second movable member and moves the first movable member in a two-dimensional plane respectively;

whereby the second movable member is moved in accordance with a reaction force generated by the movement of the first movable member;

providing a mask stage which holds a mask;

providing a projection optical system having an optical axis perpendicular to the mask and the substrate respectively;

providing a first pedestal which supports the projection optical system and suspends the base board thereby; and providing a vibration-preventive apparatus which supports the first pedestal, wherein:

the scanning type exposure apparatus is operated such that a pattern on the mask is transferred onto the substrate via the projection optical system by synchronously moving the mask and the substrate by the aid of the mask stage and the stage apparatus.

According to an aspect S of the present invention, there is provided a method for producing a scanning type exposure apparatus for transferring a pattern on a mask onto a substrate by synchronously moving the mask and the substrate, the method comprising:

providing a substrate stage which places the substrate thereon;

providing, on the substrate stage, a first reflecting surface extending in a direction intersecting a first direction in which the substrate is synchronously moved and a second direction perpendicular thereto respectively, and a second reflecting surface extending in the second direction; and providing first and second interferometers which radiate length-measuring beams onto the first and second reflecting surfaces respectively.

According to an aspect T of the present invention, there is provided a scanning type exposure apparatus for successively transferring a pattern on a mask to a plurality of shot areas (for example, S1, S2) on a photosensitive substrate (W) by synchronously moving the mask (R) and the photosensitive substrate (W); the apparatus comprising a substrate stage (WST) which is movable in a two-dimensional plane while holding the photosensitive substrate (W); a mask stage (RST) which is movable while holding the mask; and a stage control system (33, 78, 80) which controls the both stages so that run-up operation for exposure for the next shot is performed for the substrate stage after completion of exposure simultaneously with stepping operation in a non-scanning direction for the exposure for the next shot in a concurrent manner, and the stepping operation in the non-scanning direction is completed before a synchronous settling period for the both stages before the exposure for the next shot.

According to this aspect, when the pattern on the mask is successively transferred to the plurality of shot areas on the photosensitive substrate, the both stages are controlled as follows. That is, the run-up operation (pre-scanning and over-scanning beforehand after the exposure period for performing scanning exposure for the shot) for the exposure for the next shot after the completion of the exposure is performed for the substrate stage simultaneously with the stepping operation in the non-scanning direction for the exposure for the next shot in the concurrent manner. Further, the stepping operation in the non-scanning direction is completed before the synchronous settling period for the both stages before the exposure for the next shot. Therefore, the run-up operation for the substrate stage in the scanning direction and the stepping operation for the next shot (adjoining shot in the non-scanning direction) in the non-scanning direction are performed simultaneously in the concurrent manner. The movement time is shortened as compared with the conventional control of the movement of the substrate stage between the shots comprising the operations (1) to (3) described above. Of course, even in the case of the conventional technique, the operations (1) and (2) can be performed simultaneously in a concurrent manner provided that the substrate stage has a double structure comprising a movement stage in the scanning direction and a movement stage in the non-scanning direction. However, in such a case, the scanning for the next shot is not started at the point of time at which the stepping is completed. Therefore, it is clear that the throughput is improved in the present invention as compared with the conventional technique, because the stepping operation is completed before the synchronous settling period for the both stages before the exposure for the next shot, in other words, the operation (3) is already started and the acceleration period is completed at the point of time at which the stepping is completed. Further, according to the present invention, the stepping is completed before the synchronous settling period for the mask stage and the substrate stage before the exposure for the next shot. Accordingly, the control can be concentrated on only the constant velocity synchronous control for the both stages during the synchronous settling period. Therefore, the settling time is not prolonged as well.

In the exposure apparatus according to the aspect T, it is desirable that the stage control system (33, 78, 80) controls the both stages so that a rate of acceleration of the substrate stage (WST) in the non-scanning direction, which corresponds to an over-scanning period composed of a constant velocity movement period and a deceleration period for the mask stage (RST) after the exposure for a previous shot, has an absolute value which is larger than that of a rate of deceleration in the non-scanning direction concerning a portion corresponding to a pre-scanning period for the mask stage (RST) before starting the exposure for the next shot. In this arrangement, for example, the shaking (vibration) of the main exposure apparatus body, which is generated upon the strong acceleration during the stepping, is attenuated during the deceleration process. Therefore, the vibration can be completely attenuated at the point of time at which the stepping is completed, i.e., before the synchronous settling period for the mask stage and the substrate stage. The control performance is improved corresponding thereto. Further, the settling time is shortened, and it is possible to improve the throughput.

According to an aspect U of the present invention, there is provided a scanning exposure method for successively transferring a pattern on a mask (R) to a plurality of comparted areas (S1, S2) on a substrate (W); the method comprising synchronously moving the mask and the substrate to perform scanning exposure for a certain comparted area (S1) of the plurality of comparted areas; and starting acceleration of the substrate in a first direction in which the substrate is synchronously moved before completing stepping operation for the substrate in a second direction after completing the scanning exposure for the certain comparted area (S1) in order to perform scanning exposure for another comparted area (S2) adjacent to the certain comparted area in the second direction perpendicular to the first direction.

According to this aspect, after the certain comparted area of the plurality of comparted areas is subjected to the scanning exposure by synchronously moving the mask and the substrate, the stepping operation is performed for the substrate in the second direction after completing the scanning exposure for the certain comparted area in order to perform the scanning exposure for the another comparted area adjacent to the certain comparted area in relation to the second direction (non-scanning direction) perpendicular to the first direction (scanning direction). The acceleration of the substrate in the first direction is started before completing the stepping operation. That is, the movement is started to the another comparted area adjacent to the certain comparted area in the non-scanning direction after completing the exposure for the certain comparted area, however, the acceleration of the substrate is started in the scanning direction during the above process. Therefore, the period for the movement to the adjacent another comparted area in the non-scanning direction can be at least partially overlapped with the period of the acceleration in the scanning direction for the exposure for the adjacent area. Thus, it is possible to improve the throughput as compared with the illustrative conventional technique in which the acceleration in the scanning direction is started for the exposure for the adjacent area after completing the stepping operation in the non-scanning direction for the exposure for the adjacent another comparted area.

In this process, it is desirable that the substrate (W) is moved by the acceleration obliquely with respect to the first and second directions before the scanning exposure for the another comparted area (S2), and a movement velocity in the first direction is set to be a velocity corresponding to a sensitivity characteristic of the substrate. In such a process, the movement velocity in the first direction is set to be the velocity corresponding to the sensitivity characteristic of the substrate before the scanning exposure for the another comparted area (S2). Therefore, it is enough to synchronously control the mask while maintaining the velocity during the exposure, and hence it is easy to perform the control. In the scanning exposure method described above, it is also preferable that, after completing the scanning exposure for the certain comparted area (S1), the substrate is moved in the second direction while decelerating the substrate in the first direction until the substrate is separated in the first direction by a run-up distance necessary to perform the scanning exposure for the another comparted area.

In the scanning type exposure process, it is desirable that the substrate (W) is moved so that at least one of a velocity component in the first direction and a velocity component in the second direction is not zero during a period between the scanning exposure for the certain comparted area (S1) and the scanning exposure for the another comparted area (S2), because of the following reason. That is, in such a process, the substrate is moved without any stop during the period between the scanning exposure for the certain comparted area (S1) and the scanning exposure for the another comparted area (S2). Therefore, the throughput is improved corresponding thereto.

In the scanning type exposure process described above, it is also preferable that the substrate (W) is moved so that a position in the second direction, at which a movement velocity in the first direction is zero, is nearer to the another comparted area than to the certain comparted area during a period between the scanning exposure for the certain comparted area (S1) and the scanning exposure for the another comparted area (S2). In such a process, even when the rate of acceleration of the substrate in the non-scanning direction is equal to the rate of deceleration during the period between the scanning exposure for the certain comparted area and the scanning exposure for the another comparted area, the velocity in the non-scanning direction is necessarily zero before the start of the scanning exposure for the another comparted area by a certain period of time. Accordingly, the movement in the non-scanning direction is completed at the point of the certain period of time before the start of the scanning exposure for the another comparted area. Therefore, it is unnecessary to increase the rate of deceleration after the acceleration of the substrate in the non-scanning direction during the period between the scanning exposure for the certain comparted area and the scanning exposure for the another comparted area. Any influence exerted thereby remains at the point of time of the start of the scanning exposure for the another comparted area. The synchronous settling period is not unnecessarily prolonged.

According to an aspect V of the present invention, there is provided a method for performing scanning exposure with a pattern on a mask for a first comparted area (S1) and a second comparted area (S2) on a substrate respectively arranged in a second direction substantially perpendicular to a first direction in which the substrate is synchronously moved, by synchronously moving the mask (R) and the substrate (W); the method comprising moving the substrate in the second direction while decelerating the substrate until a movement velocity of the substrate in the first direction is zero after completing the scanning exposure for the first comparted area, and moving the substrate in the second direction while accelerating the substrate in the first direction before performing the scanning exposure for the second comparted area. According to this aspect, the substrate is moved along a parabolic route after the completion of the scanning exposure for the first comparted area. Therefore, the substrate is moved along the route which is approximate to the shortest distance. It is possible to improve the throughput corresponding thereto.

According to an aspect W of the present invention, there is provided a scanning exposure method for transferring a pattern on a mask to a first comparted area (S1) and a second comparted area (S2) on a substrate respectively arranged in a second direction substantially perpendicular to a first direction in which the substrate (W) is synchronously moved, by synchronously moving the mask (R) and the substrate (W); the method comprising moving the substrate so that its movement locus is substantially parabolic after scanning exposure for the first comparted area (S1), and then performing scanning exposure for the second comparted area (S2) with the pattern on the mask. According to this aspect, the substrate is moved so that its movement locus is substantially parabolic before starting the scanning exposure for the second comparted area after the scanning exposure for the first comparted area. Accordingly, the substrate is moved substantially in the first direction at a final part of the movement. The velocity component of the substrate in the non-scanning direction does not affect the scanning exposure after the start of the scanning exposure.

In this process, it is desirable that acceleration is started for the mask (R) before a velocity component of the substrate (W) in the second direction is zero, because of the following reason. That is, in this process, the acceleration is started for the mask before the velocity component of the substrate in the second direction is zero. Accordingly, the period of time, which is required to obtain a constant velocity synchronized state for the mask and the substrate, is shortened, and the throughput can be improved corresponding thereto, as compared with a case in which the acceleration of the mask is started after the velocity component of the substrate in the second direction is zero.

According to an aspect X of the present invention, there is provided a scanning exposure method for transferring a pattern on a mask to a first comparted area (S1) and a second comparted area (S2) on a substrate respectively arranged in a second direction substantially perpendicular to a first direction in which the substrate is synchronously moved, by synchronously moving the mask (R) and the substrate (W); the method comprising moving the substrate in a direction intersecting the first and second directions during deceleration of the substrate after completing scanning exposure for the first comparted area (S1) and during acceleration of the substrate before performing scanning exposure for the second comparted area. According to this aspect, the substrate is moved in the direction intersecting the first and second directions during the deceleration of the substrate after completing the scanning exposure for the first comparted area and during the acceleration of the substrate before performing the scanning exposure for the second comparted area. As a result, the movement locus of the substrate is shortened as compared with the conventional ]-shaped route. The substrate is moved along the route which is near to the shortest distance. The throughput can be improved corresponding thereto.

In this process, the movement locus of the substrate may be a V-shaped configuration. However, it is desirable that the substrate is moved without any stop during a period between the scanning exposure for the first comparted area and the scanning exposure for the second comparted area so that the locus has a parabolic configuration (or a U-shaped configuration). In this case, the movement locus of the substrate is not shortest. However, the substrate is not stopped. Therefore, it is possible to-obtain the shortest total time required for the over-scanning, the stepping, and the pre-scanning (movement time for the substrate between shots).

According to an aspect Y of the present invention, there is provided a scanning exposure method for successively transferring a pattern on a mask to a first comparted area (S1) and a second comparted area (S2) on a substrate, arranged in a second direction perpendicular to a first direction in which the substrate (W) is synchronously moved, by synchronously moving the mask (R) and the substrate (W); the method comprising starting acceleration of the substrate in order to perform scanning exposure for the second comparted area before a position of the substrate in the second direction is coincident with a position of the second comparted area (S2) in the second direction after completing scanning exposure for the first comparted area (S1). According to this aspect, the movement of the substrate is started in the second direction toward the second comparted area after completing the scanning exposure for the first comparted area. During this process, the acceleration of the substrate is started in the first direction for the substrate in order to perform the scanning exposure for the second comparted area. Therefore, it is possible to improve the throughput as compared with a case in which the acceleration is started for the scanning exposure for the second comparted area after completing the movement of the substrate in the second direction for the scanning exposure for the second comparted area.

In this process, it is desirable that the substrate is moved obliquely with respect to the first direction before a velocity component of the substrate (W) in the first direction is zero after completing the scanning exposure for the first comparted area (S1), and the substrate is moved so that respective velocity components in the first and second directions are not zero immediately after starting the acceleration of the substrate.

According to an aspect Z of the present invention, there is provided a scanning exposure method for successively transferring a pattern on a mask to a first comparted area (S1) and a second comparted area (S2) on a substrate, arranged in a second direction perpendicular to a first direction in which the substrate is synchronously moved, by synchronously moving the mask (R) and the substrate (W); the method comprising starting acceleration of the substrate in order to perform scanning exposure for the second comparted area before a velocity component of the substrate (W) in the second direction is zero after completing scanning exposure for the first comparted area (S1). According to this aspect, the substrate is moved in the second direction toward the second comparted area after completing the scanning exposure for the first comparted area. The acceleration of the substrate is started in order to perform the scanning exposure for the second comparted area, before the velocity component of the substrate in the second direction is zero after completing the movement. Therefore, it is possible to improve the throughput as compared with a case in which the acceleration is started for the scanning exposure for the second comparted area after completing the movement of the substrate in the second direction in order to perform the scanning exposure for the second comparted area.

In this process, it is desirable that the substrate (W) is accelerated in relation to the first direction, and it is decelerated in relation to the second direction. In other words, it is desirable that the acceleration in the first direction is performed before the scanning exposure for the second comparted area during the deceleration of the substrate in the second direction.

In the method according to the aspect Z, it is desirable that the acceleration of the substrate in the second direction is started before a velocity component of the substrate in the first direction is zero after completing the scanning exposure for the first comparted area.

According to an aspect α of the present invention, there is provided a scanning exposure method for successively transferring a pattern on a mask to a first comparted area (S1) and a second comparted area (S2) on a substrate, arranged in a second direction perpendicular to a first direction in which the substrate is synchronously moved, by synchronously moving the mask (R) and the substrate (W); wherein a position of the substrate in the second direction, at which a velocity component of the substrate in the first direction is zero after completing scanning exposure for the first comparted area (S1), is deviated toward the first comparted area as compared with a position of the second comparted area in the second direction, and the substrate is moved obliquely with respect to the first and second directions in order to perform scanning exposure for the second comparted area. According to this aspect, the movement locus of the substrate, which is obtained after completing the scanning exposure for the first comparted area, is shorter than the conventional ]-shaped route. The substrate is moved along the route which is approximate to the shortest distance. The throughput can be improved corresponding thereto. In this process, the movement locus of the substrate may be a V-shaped configuration. However, it is desirable that the substrate is moved without any stop during a period between the scanning exposure for the first comparted area and the scanning exposure for the second comparted area so that the locus has a parabolic configuration (or a U-shaped configuration).

According to an aspect β of the present invention, there is provided a scanning exposure method for successively transferring a pattern on a mask to a first comparted area (S1) and a second comparted area (S2) on a substrate, arranged in a second direction perpendicular to a first direction in which the substrate is synchronously moved, by synchronously moving the mask (R) and the substrate (W); wherein a velocity component of the substrate in the first direction is zero after completing first scanning exposure in order to move the substrate during the first scanning exposure for the first comparted area (S1) in a direction opposite to a direction for moving the substrate during second scanning exposure for the second comparted area (S2), and the substrate is accelerated so that respective velocity components in the first and second directions are not zero prior to the second scanning exposure. According to this aspect, the substrate is moved obliquely with respect to the first and second directions along a curved (or straight) route prior to the second scanning exposure.

According to an aspect γ of the present invention, there is provided a scanning exposure method for successively transferring a pattern on a mask to a first comparted area (S1) and a second comparted area (S2) on a substrate, arranged in a second direction perpendicular to a first direction in which the substrate is synchronously moved, by synchronously moving the mask (R) and the substrate (W); the method comprising moving the substrate so that a position of the substrate in the second direction, at which a velocity component in the first direction is zero after completing first scanning exposure, is located between a position of the first comparted area in the second direction and a position of the second comparted area in the second direction, during a period between the first scanning exposure for the first comparted area (S1) and second scanning exposure for the second comparted area (S2). According to this aspect, when the first scanning exposure is completed, the movement is performed in the second direction while decelerating the velocity of the substrate in the first direction. During this process, the substrate is moved so that the position of the substrate in the second direction, at which the velocity component in the first direction is zero, is located between the position of the first comparted area in the second direction and the position of the second comparted area in the second direction. Therefore, when the first scanning exposure is completed, the substrate is moved obliquely with respect to the first and second directions along a curved (or straight) route.

According to an aspect δ of the present invention, there is provided a scanning exposure method for successively transferring a pattern on a mask to a first comparted area (S1) and a second comparted area (S2) on a substrate, arranged in a second direction perpendicular to a first direction in which the substrate is synchronously moved, by synchronously moving the mask (R) and the substrate (W); the method comprising moving the substrate while a velocity component in the second direction is not zero during deceleration of the substrate after first scanning exposure and during acceleration of the substrate before second scanning exposure so that a movement locus of the substrate is substantially parabolic during a period between the first scanning exposure for the first comparted area (S1) and the second scanning exposure for the second comparted area (S2). According to this aspect, the movement locus of the substrate, which is obtained during the period between the first scanning exposure for the first comparted area and the second scanning exposure for the second comparted area, is substantially parabolic. Further, the substrate is moved while the velocity component in the second direction is not zero. Therefore, the substrate is not stopped, and it is possible to obtain the approximately shortest total time required for the over-scanning, the stepping, and the pre-scanning (movement time for the substrate between shots).

In this process, it is also preferable that the velocity component of the substrate (W) in the second direction is substantially zero immediately after completing the first scanning exposure and immediately before starting the second scanning exposure.

According to an aspect ζ of the present invention, there is provided a scanning exposure method for successively transferring a pattern on a mask to a first comparted area (S1) and a second comparted area (S2) on a substrate, arranged in a second direction perpendicular to a first direction in which the substrate is synchronously moved, by synchronously moving the mask (R) and the substrate (W); wherein during a period between first scanning exposure for the first comparted area (S1) and second scanning exposure for the second comparted area (S2), acceleration of the substrate in the second direction is started before a velocity component of the substrate in the first direction is zero after completing the first scanning exposure, and acceleration of the substrate in the first direction is started before a velocity component of the substrate in the second direction is zero. According to this aspect, the movement locus of the substrate resides in a route having a U-shaped configuration of a configuration approximate thereto during the period between the first scanning exposure for the first comparted area and the second scanning exposure for the second comparted area. In this process, it is desirable that the acceleration of the substrate in the first direction is started during deceleration of the substrate concerning the second direction. Further, it is desirable that the acceleration of the substrate (W) in the second direction is started during the deceleration of the substrate after completing the first scanning exposure.

In the aspects V to ζ described above, it is desirable that the substrate is moved without any stop during the period between the scanning exposure for the first comparted area and the scanning exposure for the second comparted area.

According to an aspect η of the present invention, there is provided a scanning exposure method based on step-and-scan manner for successively transferring a pattern on a mask to a plurality of comparted areas (S1, S2, S3, . . . ) on a substrate, by synchronously moving the mask (R) and the substrate for each of the comparted areas on the substrate (W); the method comprising moving the substrate without any stop during a period between scanning exposure steps for two of the comparted areas on the substrate to which the pattern on the mask is transferred in accordance with reciprocating movement of the mask. According to this aspect, the substrate is not stopped between the scanning exposure steps for the two of the comparted areas (usually adjacent areas) on the substrate to which the pattern on the mask is transferred. Therefore, the throughput is further improved with respect to the concerning portion.

In this process, it is desirable that the substrate (W) is moved so that a velocity component in at least one of a first direction in which the substrate is synchronously moved and a second direction perpendicular thereto is not zero until completion of scanning exposure for the last comparted area on the substrate to which the pattern on the mask (R) is to be transferred. In this process, the substrate is not stopped consequently during the period in which the scanning exposure based on the step-and-scan manner is performed for all of the plurality of comparted areas. Therefore, the most improved throughput is obtained.

According to an aspect μ of the present invention, there is provided an exposure apparatus for transferring a pattern on a mask onto a substrate, the apparatus comprising a base board, at least two first movable members which are movable with respect to the base board and hold the substrates respectively; a second movable member for placing the respective first movable members thereon, the second movable member being arranged on the base board and being movable relative to the base board and the respective first movable members respectively; and a driving unit provided for the second movable member, for driving the respective first movable members in a two-dimensional plane, wherein:

the second movable member is moved in accordance with a reaction force generated when the respective first movable members are driven; and the substrates for transferring the pattern on the mask thereto are held by the respective first movable members. In this exposure apparatus, a mass of each of the first movable members is about ⅑ of a mass of the second movable member. The apparatus may further comprise a second driving unit for driving, at a low response frequency, the second movable member on the base board. When the apparatus further comprises a projection optical system for projecting the pattern on the mask onto the substrate, it is also preferable that the first movable member, which holds the substrate as an objective of the transfer of the pattern, is driven in a scanning direction with respect to the projection optical system in synchronization with the mask by the aid of the driving unit when the pattern on the mask is transferred to the substrate held by each of the first movable members.

According to an aspect ι of the present invention, there is provided a scanning exposure method for transferring a pattern on a mask to one or two or more comparted areas on a substrate by synchronously moving the mask and the substrate; wherein at least one of the mask and the substrate is accelerated in a direction of the synchronous movement on the basis of a rate of acceleration variation curve along which a rate of acceleration is gradually converged to zero, prior to the synchronous movement of the mask and the substrate when scanning exposure is performed for the respective comparted areas.

According to this aspect, when the scanning exposure is performed for the respective comparted areas, at least one of the mask and the substrate is accelerated in the direction of the synchronous movement on the basis of the rate of acceleration variation curve along which the rate of acceleration is gradually converged to zero, prior to the synchronous movement of the mask and the substrate. Accordingly, the rate of acceleration is not changed discontinuously, i.e., suddenly at the point of time of completion of the acceleration, which would be otherwise caused when the acceleration is performed to achieve a target scanning velocity at a constant rate of acceleration. Therefore, it is possible to suppress the high frequency vibration of at least one of the mask and the substrate resulting from the sudden change in acceleration. The position error with respect to the target position (which is of course changed depending on the time) can be promptly converged to be within an allowable range. As a result, it is possible to shorten the synchronous settling time for the mask and the substrate.

The shortest settling time can be obtained when the mask and the substrate are accelerated in the synchronous movement direction on the basis of the rate of acceleration variation curve as described above. Usually, in the scanning type exposure apparatus, the constraint condition is, for example, the maximum velocity of predetermined one of the mask (mask stage) and the substrate (substrate stage). Therefore, it is possible to obtain a sufficient effect when the foregoing acceleration method is applied to one of the mask and the substrate which constitutes the constraint condition.

In this process, it is also preferable that when the pattern on the mask is successively transferred to a first comparted area and a second comparted area on the substrate, arranged in a second direction perpendicular to a first direction in which the substrate is synchronously moved; the substrate is moved in a direction intersecting the first direction and the second direction during deceleration of the substrate in the first direction after completing scanning exposure for the first comparted area and during acceleration of the substrate in the first direction before performing scanning exposure for the second comparted area. In this process, the substrate is consequently moved along a route which is approximate to the shortest distance. Therefore, it is possible to further improve the throughput in combination of the reduction of the settling time as described above.

According to an aspect κ of the present invention, there is provided a scanning exposure method for successively transferring a pattern on a mask to a first comparted area and a second comparted area on a substrate, arranged in a second direction perpendicular to a first direction in which the substrate is synchronously moved, by synchronously moving the mask and the substrate; wherein when scanning exposure is performed for at least the first comparted area, at least one of the mask and the substrate is accelerated in the first direction on the basis of a rate of acceleration variation curve along which a rate of acceleration is gradually converged to zero prior to the synchronous movement of the mask and the substrate, and it is decelerated in the first direction at a constant rate of deceleration after completing the synchronous movement.

According to this aspect, when the scanning exposure is performed for the first comparted area, at least one of the mask and the substrate is accelerated in the first direction on the basis of the rate of acceleration variation curve along which the rate of acceleration is gradually converged to zero prior to the synchronous movement of the mask and the substrate, and it is decelerated in the first direction at the constant rate of deceleration after completing the synchronous movement. Accordingly, the rate of acceleration is not suddenly changed, which would be otherwise caused when the acceleration is performed to a target scanning velocity at a constant rate of acceleration. Therefore, the position error of at least one of the mask and the substrate can be promptly converged to be within an allowable range. As a result, it is possible to shorten the synchronous settling time for the mask and the substrate. In addition, the deceleration is performed at a constant rate of deceleration (usually a rate of deceleration corresponding to the maximum rate of acceleration) during the deceleration after completing the synchronous movement, and hence it is possible to shorten the period of time required to perform the deceleration as compared with a case in which the deceleration is performed on the basis of an acceleration curve which is symmetrical to that used during the acceleration. Therefore, at least when the scanning exposure for the first comparted area is performed, it is possible for at least one of the mask and the substrate to further shorten the total period of time from the start of acceleration and the end of deceleration.

Also in this case, when the acceleration control method described above is adopted for both of, or at least one which constitutes the constraint condition, of the mask (mask stage) and the substrate (substrate stage), it is possible to obtain a sufficient effect. In the method described above, it is also preferable that the substrate is moved in a direction intersecting the first direction and the second direction during the deceleration of the substrate in the first direction after completing the scanning exposure for the first comparted area and during acceleration of the substrate in the first direction before performing scanning exposure for the second comparted area. In this process, the substrate is consequently moved along a route which is approximate to the shortest distance. Therefore, it is possible to further improve the throughput in combination of the reduction of the settling time and the deceleration time as described above.

According to an aspect λ of the present invention, there is provided a scanning exposure method for transferring a pattern on a mask onto a substrate by synchronously moving the mask and the substrate with respect to an area onto which an energy beam is radiated, the method comprising:

starting the movement while accelerating the mask and the substrate;

allowing the mask and the substrate to arrive at a constant velocity while continuously decreasing a rate of acceleration of one of the mask and the substrate; and executing scanning exposure when the mask and the substrate are moved at the constant velocity. One of the mask and the substrate may be decelerated at a constant rate of deceleration after the mask and the substrate are moved at the constant velocity.

According to an aspect ν of the present invention, there is provided a method for producing a scanning type exposure apparatus which successively transfers a pattern on a mask to a plurality of shot areas on a photosensitive substrate by synchronously moving the mask and the photosensitive substrate, the method comprising:

providing a substrate stage which is movable in a two-dimensional plane while holding the photosensitive substrate;

providing a mask stage which is movable while holding the mask; and providing a stage control system which controls the both stages so that run-up operation for exposure for the next shot is performed for the substrate stage after completion of exposure simultaneously with stepping operation in a non-scanning direction for the exposure for the next shot in a concurrent manner, and the stepping operation in the non-scanning direction is completed before a synchronous settling period for the both stages before the exposure for the next shot.

According to an aspect π of the present invention, there is provided a microdevice such as a semiconductor element and a liquid crystal substrate produced by using the exposure method in accordance with any one of the aspects C, F, G, and H.

According to an aspect ρ of the present invention, there is provided a microdevice such as a semiconductor element and a liquid crystal substrate produced by using the exposure method in accordance with any one of the aspects N, U, V, W, X, Y, Z, α, β, γ, δ, ζ, η, ι, and κ.

BRIEF DESCRIPTION OF THE DRAWINGS

FIG. 5 illustrates a laser interferometer system shown in FIG. 2 in further detail, wherein FIG. 5(A) shows a plan view illustrating interferometer beams from three interferometers which constitute the laser interferometer system together with a substrate table TB, FIG. 5(B) shows further details of the interferometer beam from the second interferometer together with a part of an optical system which constitutes the interferometer, and FIG. 5(C) illustrates the positional relationship between a length-measuring beam RIY3 and a length-measuring beam RIY1 (or RIY2) from the second interferometer.

FIG. 7 illustrates the role and the control method of a movable type base board, wherein FIG. 7(A) shows a plan view illustrating components disposed in the vicinity of the base board, and FIG. 7(B) shows a schematic front view as viewed in the direction of the arrow A shown in FIG. 7 (A).

FIG. 19(A) shows a table illustrating the extension distance of the wafer side movement mirror required when the reticle scanning maximum velocity Vr is changed under three conditions of (rate of acceleration-of reticle Ar, settling time t2)=(3 G, 22 ms), (4 G, 36 ms), (4 G, 22 ms) provided that the projection magnification is ¼-fold, and FIG. 19(B) shows a table illustrating the period of time required to expose one sheet of wafer when the reticle scanning maximum velocity Vr is changed under the same conditions as those described in FIG. 19(A).

FIG. 29 shows plan views illustrating the reticle stage when 9-inch reticle is used, wherein FIG. 29(A) shows a plan view illustrating the conventional illustrative reticle stage, and FIG. 29(B) illustrates the object to be achieved by the invention.

DESCRIPTION OF THE PREFERRED EMBODIMENTS OF THE INVENTION

Figure 1:
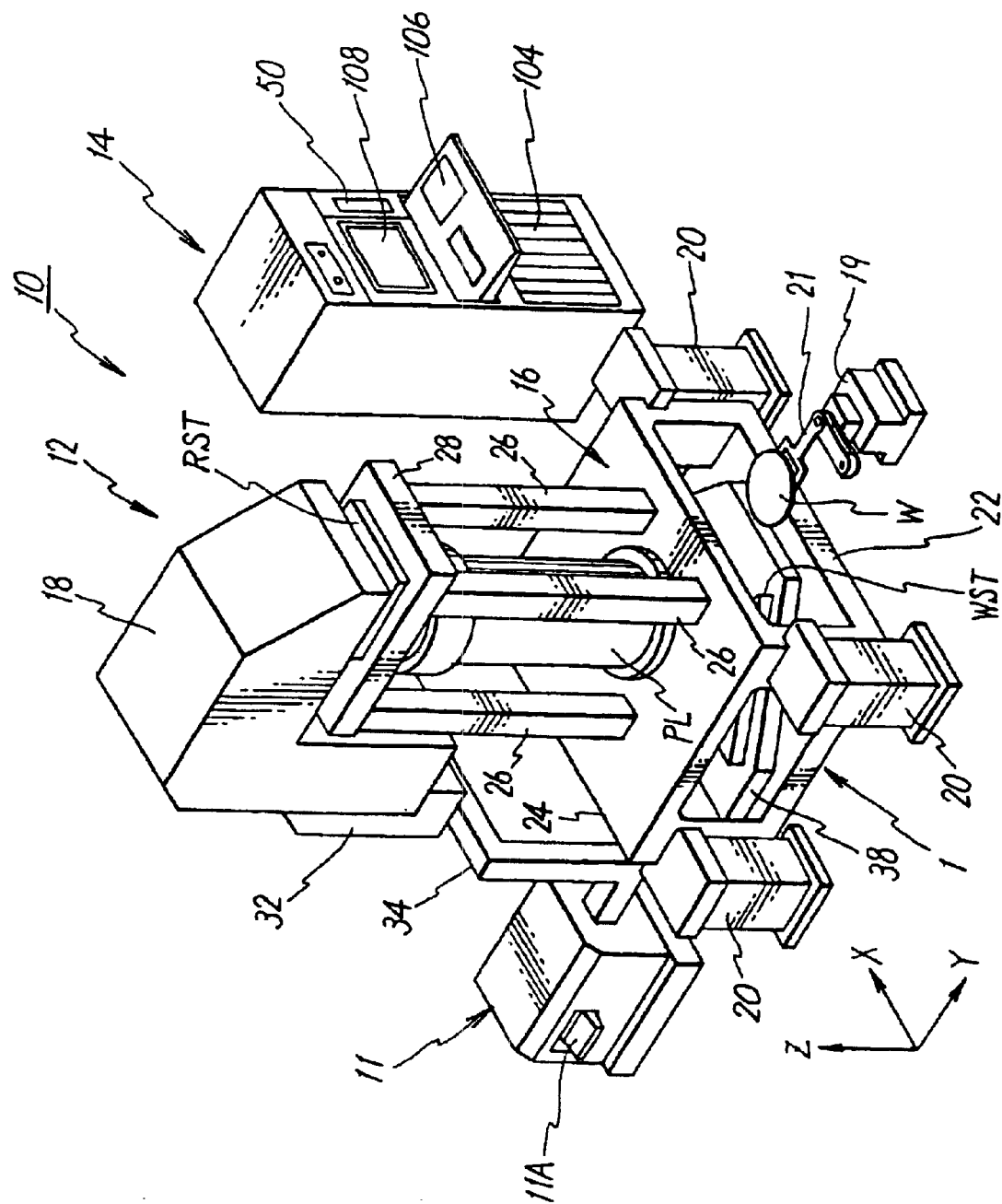
FIG. 1 shows a perspective view illustrating a scanning type exposure apparatus according to an embodiment of the present invention.

The invention concepts included in this international application are common in that the object of the present invention described above is intended to be achieved. As described above, the classification may be generally made into the following five concepts. However, the classification is based on the object to understand the summary of the group of inventions disclosed in this specification and claims. The scope of claims and the embodiments of the invention should not be interpreted in a limited manner depending on the classification.

The first concept is a concept which relates to a scanning exposure method and a scanning exposure apparatus in which a substrate is moved in synchronization with a mask having a large pattern or a plurality of comparted patterns so that the large pattern is transferred to the substrate in a stitching manner, or the plurality of patterns are transferred to an identical area of the substrate in a superimposing manner. The first concept is principally characterized, for example, by the method for moving the mask, the structure and the arrangement of the reflecting mirror to be used for performing the position control, and the double exposure method. The feature of the first concept is exemplified, for example, by the aspects A to H and $\pi$ of the present invention described above.

The second concept is a concept which relates to a stage apparatus having a reflecting mirror extending obliquely with respect to a movement direction of the stage, and an interferometer for transmitting a length-measuring beam thereto. The second concept is characterized, for example, by the attachment position of the reflecting mirror, the shape and the structure of the stage apparatus, the method for radiating the length-measuring beam, the scanning exposure apparatus provided with the stage apparatus, the scanning exposure method for controlling the position of the stage by radiating the length-measuring beam as described above, and the method for producing the stage and the scanning exposure apparatus. The feature of the second concept is exemplified, for example, by the aspects I, J, M, N, O, P, S, $\rho$, and $\sigma$ of the present invention.

The third concept is a concept which relates to an unbalanced load-preventive stage apparatus which supports a first movable member and a second movable member in a floating manner over a base board respectively, and a scanning exposure apparatus including the stage apparatus. The third concept is characterized, for example, by the movement of the second movable member by utilizing the reaction force generated by the movement of the first movable member, the weight ratio between the first and second movable members, the vibration-preventive apparatus, the structure of the first movable member and the second movable member, the exposure apparatus which uses the stage apparatus as the substrate stage, and the method for producing the stage apparatus and the exposure apparatus. The feature of the third concept is exemplified, for example, by the aspects K, L, Q, R, and $\mu$ of the present invention.

The fourth concept is a concept which relates to the timing control for the stepping movement (stepping) of a substrate in a direction perpendicular to a scanning direction and the scanning movement of the substrate in the scanning direction when the next comparted area is subjected to scanning exposure after a certain area comparted on the substrate is subjected to scanning exposure. Especially, the fourth concept is characterized by the relationship between the timing of movement and the timing of start or end of the scanning exposure, and the relationship among the movement locus of the substrate, the stepping movement, and the scanning movement. The feature of the fourth concept is exemplified, for example, by the aspects T to Z, α, β, γ, δ, η, and ρ of the present invention.

The fifth concept relates to a concept concerning the control of the rate of acceleration during movement of a mask or a substrate to shorten the settling time for synchronizing the mask and the substrate during scanning exposure. The fifth concept is characterized by the acceleration method to obtain a constant velocity while continuously decreasing the rate of acceleration of the substrate, and the method for performing deceleration at a constant rate of deceleration. The feature of the fifth concept is exemplified, for example, by the aspects ι, κ, λ, and ρ of the present invention.

The first embodiment of the present invention will be explained below on the basis of FIGS. 1 to 20. In order to easily understand the contents of this specification, appropriate titles are given at portions at which the first to fifth concepts described above are principally represented. However, the description of the invention concept is not restricted at all depending on the portion affixed with the title.

First Embodiment

Figure 2:
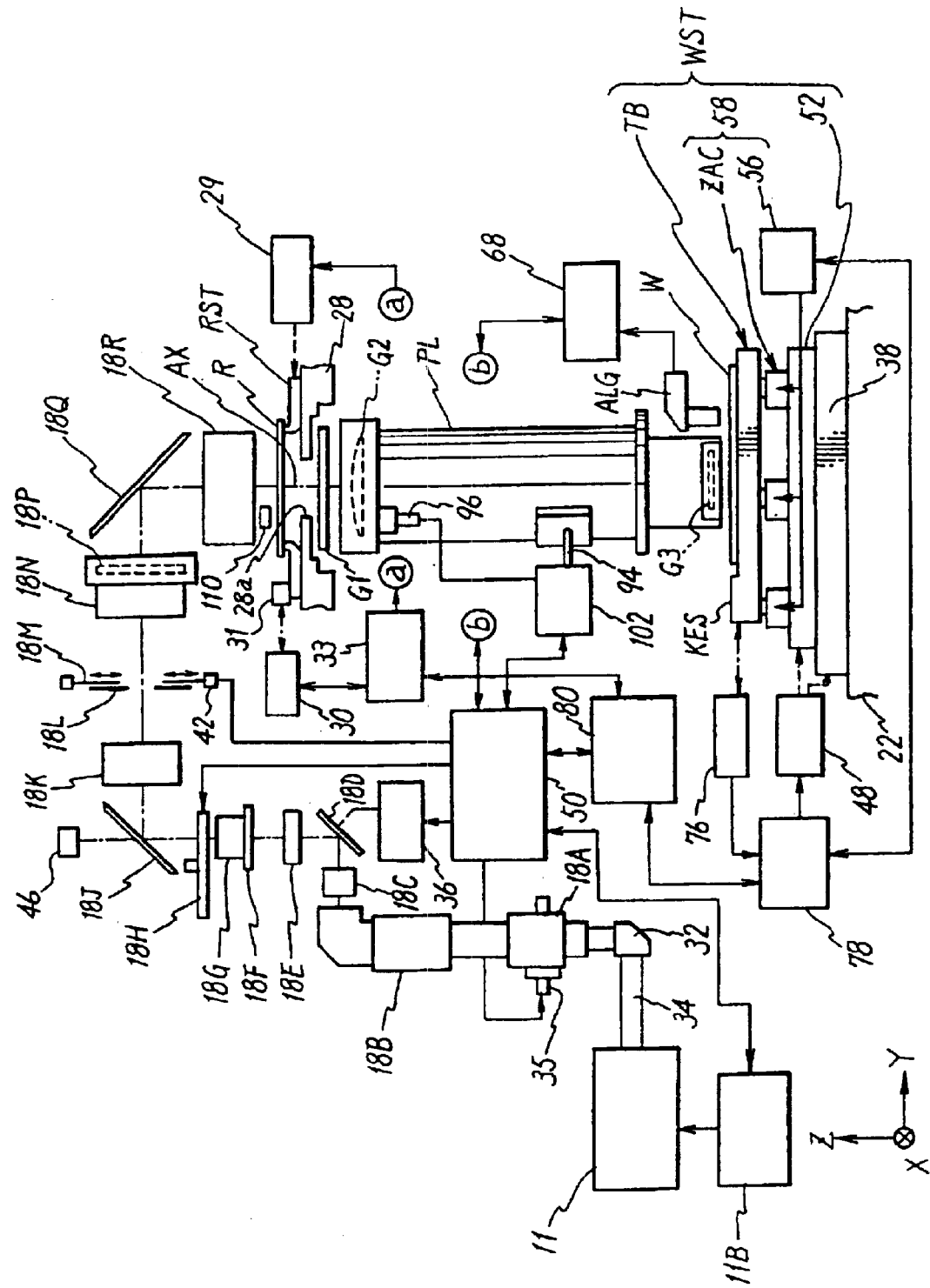
FIG. 2 schematically shows an internal arrangement of the scanning type exposure apparatus shown in FIG. 1.

In the first embodiment, the first to fourth concepts are specified. FIG. 1 shows a perspective view illustrating a scanning type exposure apparatus 10 according to an embodiment of the present invention. FIG. 2 schematically shows an internal arrangement of the scanning type exposure apparatus 10. The scanning type exposure apparatus 10 is a projection exposure apparatus for performing the exposure operation in accordance with the step-and-scan manner which is being dominantly used as a lithography apparatus for producing semiconductor devices. The scanning type exposure apparatus 10 transfers an entire circuit pattern on a reticle R to a plurality of shot areas on a wafer W respectively in accordance with the step-and-scan manner by relatively scanning the reticle and the wafer W in the one-dimensional direction (Y direction in this case) with respect to the field of a projection optical system PL while projecting a part of the circuit pattern depicted on the reticle R as the mask (see FIG. 2), onto the wafer W as the substrate via the projection optical system PL.

As shown in FIG. 1, the scanning type exposure apparatus 10 comprises an excimer laser light source 11, a main exposure apparatus body 12, and a control rack 14 as a main control system for controlling these components in an integrated manner. Usually, the excimer laser light source 11 is installed in a separate room (service room having a low degree of cleanness) isolated from a super clean room in which the main exposure apparatus body 12 is installed usually, the main exposure apparatus body 12 is installed in the super clean room with an internal space which is highly protected from dust. The main exposure apparatus body 12 is accommodated in an environmental chamber which is subjected to highly accurate temperature control. However, FIG. 1 schematically shows only the main body structure accommodated in the chamber.

Next, explanation will be made for the arrangement of the excimer laser light source 11, the main exposure apparatus body 12, and the control rack 14 with reference to FIGS. 1 and 2.

The excimer laser light source 11 is provided with an operation panel 11A. The excimer laser light source 11 contains a control computer 11B (not shown in FIG. 1, see FIG. 2) which is interfaced with the operation panel 11A. During the ordinary exposure operation, the control computer 11B controls the pulse light emission of the excimer laser light source 11 in response to the command of a main control unit 50 composed of a microcomputer for controlling the exposure apparatus.

The excimer laser light source 11 is used as an exposure light source, and it emits, for example, pulses of a KrF excimer laser beam having a wavelength of 248 nm, or an ArF excimer laser beam having a wavelength of 193 nm. The reason why the pulse laser beam in the ultraviolet region emitted from the excimer laser light source 11 is used as an illumination light beam for exposure is as follows. That is, it is intended to obtain a pattern resolution of a minimum line width of about 0.25 to 0.10μ required to mass-produce a microcircuit device having degrees of integration and fineness corresponding to a semiconductor memory element (D-RAM) of not less than the 256 Mbit to 4 Gbit class.

The wavelength width of the pulse laser beam (excimer laser beam) has a narrow band to obtain an allowable range of chromatic aberration resulting from various refractive optical elements for constructing the illumination system and the projection optical system PL of the exposure apparatus. The absolute value of the central wavelength to give the narrow band and the value of the narrow band width (0.2 pm to 300 pm) are displayed on the operation panel 11A, and they can be finely adjusted from the operation panel 11A, if necessary. The operation panel 11A can be used to set the pulse light emission mode (represented by the three modes of self-exciting oscillation, external trigger oscillation, and oscillation for maintenance). An example of the exposure apparatus, which uses an excimer laser as a light source, has been explained in the first embodiment. Reference may be made to the explanation.

The main exposure apparatus body 12 comprises, for example, a pedestal section 16 as a first pedestal, a reticle stage RST, an illumination optical system 18, a projection optical system PL, an image formation characteristic-adjusting unit (hereinafter referred to as "LC/MAC system"), a stage apparatus 1, a wafer transport robot 19, and an alignment system.

The arrangement will be further described below. As shown in FIG. 1, the pedestal section (first pedestal). 16 is supported by the aid of four vibration-preventive apparatuses 20 on the floor surface. Each of the vibration-preventive apparatuses 20 includes various sensors and an actuator which supports the self-weight of the main exposure apparatus body 12 by the aid of an unillustrated air cylinder (vibration-preventive pad), and actively correcting the inclination of the entire main exposure apparatus body 12, the displacement in the Z direction, and the displacement in the X, Y directions in FIG. 1 of the entire main exposure apparatus body in accordance with the feedback control or the feedforward control effected by an unillustrated control system. Such an active vibration-preventive apparatus is disclosed, for example, in Japanese Patent Application Laid-Open No. 9-74061 and corresponding U.S. patent application Ser. No. 707216 (filed on Sep. 3, 1996). The disclosure of the above-mentioned patent documents is incorporated herein by reference so long as the domestic laws of the states designated in this application permit the incorporation.

The pedestal section 16 comprises a base board 22 which is parallel to the floor surface, and a support plate section 24 which is provided over the base board 22 opposing thereto. The pedestal section 16 has a box-shaped configuration with an internal hollow portion. The support plate section 24 is composed of a rectangular plate-shaped member with a circular opening which is formed at a central portion. The projection optical system PL is inserted into the central opening in a state of being perpendicular to the support plate section 24. The projection optical system PL is held by the support plate section 24 at a flange section which is provided at a part of the outer circumference of the projection optical system PL.

Figure 3:
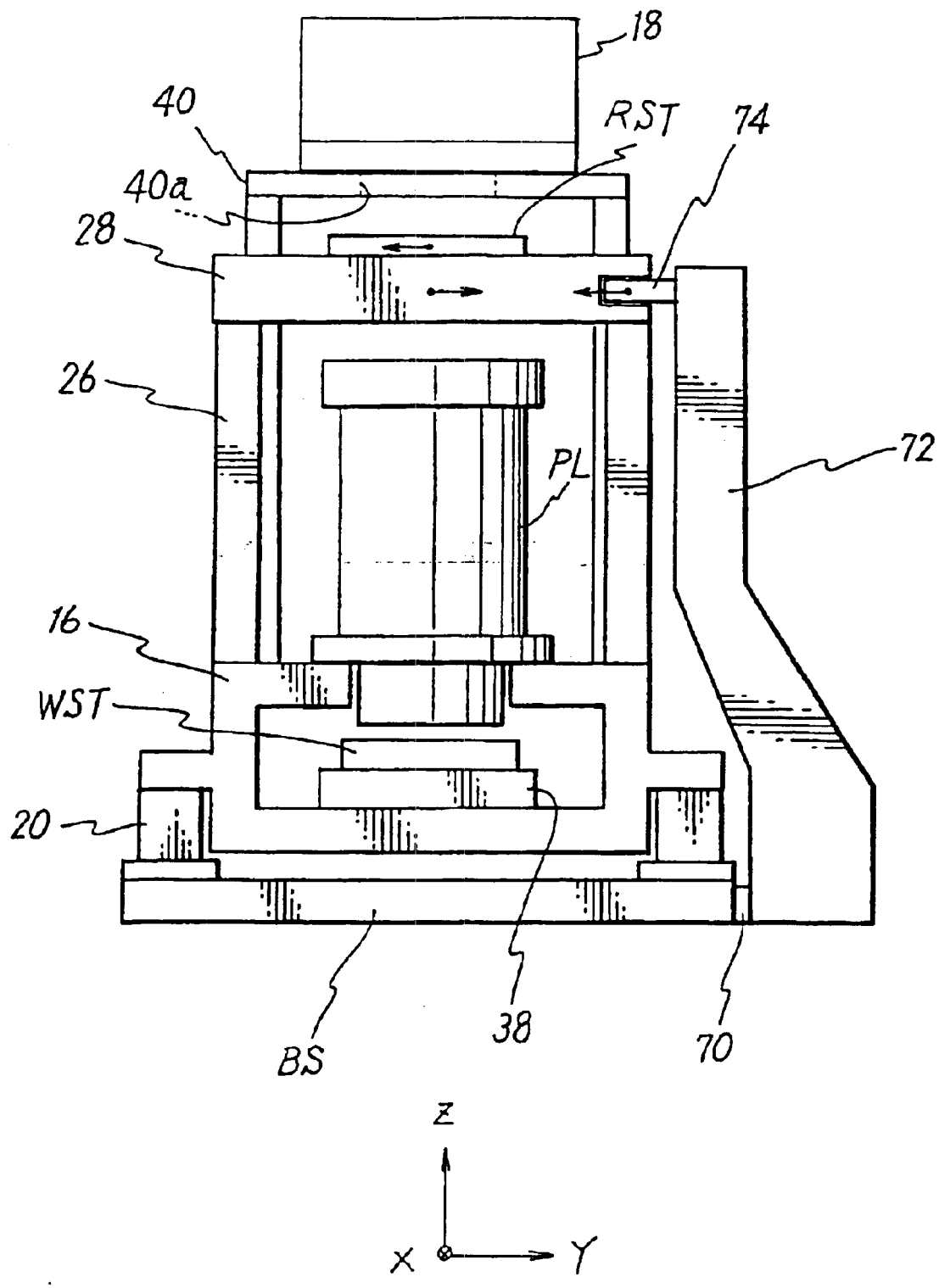
FIG. 3 illustrates a reaction actuator and a reaction frame.

Four legs 26 are provided in an upstanding manner on the upper surface of the support plate section 24 so that the projection optical system PL is surrounded thereby. A reticle base board 28, which is supported by the four legs 26 and which mutually connects the upper ends of the legs 26, is provided on the four legs 26. A second column (second pedestal) is constructed by the four legs 26 and the reticle base board 28. Although not shown in FIG. 1, a first frame 40, which is different from the second column as shown in FIG. 3, is actually provided in an upstanding manner on the upper surface of the support plate section 24. A part of the illumination optical system 18 (portion in the vicinity of the outgoing end) is supported by the first frame 40. An opening 40a is provided at a portion of the first frame 40 opposing to the outgoing end of the illumination optical system 18.

An opening 28a (see FIG. 2) is formed at a central portion of the reticle base board 28. The outgoing end of the illumination optical system 18 is arranged oppositely to the opening 28a. The reticle stage RST, which is movable in the XY two-dimensional plane while sucking and holding a 9-inch size reticle R as a large mask by means of vacuum suction, electrostatic suction or the like, is arranged on the reticle base board 28. FIG. 2 shows the X direction (second axis direction or second direction), the Y direction (first axis direction or first direction), and the Z direction. The reticle R is sucked by an unillustrated electrostatic chuck or the like on the reticle stage RST at a strength of such a degree that no lateral shift or the like is caused on the reticle R even when a rate of acceleration at 4 G level is exerted thereon.

In the embodiment of the present invention, the reticle stage RST is driven by a magnetically floating type two-dimensional plane motor. However, in FIG. 2, the magnetically floating type two-dimensional plane motor is illustrates as a motor driving system 29 for the convenience of illustration and explanation. An arbitrary driving system such as a voice coil motor and a piezoelectric motor may be used for the driving system for the reticle stage. In this embodiment, the reticle stage RST is constructed to be capable of fine driving by the driving system 29 in the rotational direction (0 direction) about the optical axis AX of the projection optical system PL as well. The position-measuring system for the reticle stage RST is one of the characteristic constitutive components of the embodiment of the present invention, which will be described in detail later on.

As shown in FIG. 1, the illumination optical system 18 accommodates a beam-receiving system 32 at its back portion. The illumination optical system 18 is connected to the excimer laser light source 11 via the beam-receiving system 32 and BMU (beam matching unit) composed of a shielding tube 34 connected thereto. A plurality of movable reflecting mirrors (not shown) for optimally adjusting the incoming position and the incoming angle of the excimer laser beam into the illumination optical system 18 is provided in the beam-receiving system 32 which constitutes BMU so that the excimer laser beam, which is introduced via the tube 34 from the exposure light source 11, always comes thereinto in a predetermined positional relationship with respect to the optical axis of the illumination optical system 18.

As shown in FIG. 2, the illumination optical system 18 comprises, for example, a variable light-reducing unit 18A, a beam-shaping optical system 18(B), a first fly's eye lens system 18C, a vibration mirror 18D, a light-collecting lens system 18E, an illumination NA correction plate 18F, a second fly's eye lens system 18G, an illumination system aperture diaphragm plate 18H, a beam splitter 18J, a first relay lens 18K, a fixed reticle blind 18L, a movable reticle blind 18M, a second relay lens 18N, an illumination telecentric correction plate (tiltable quartz parallel planar plate) 18P, a mirror 18Q, and a main condenser lens system 18R. The respective constitutive components of the illumination optical system 18 will now be explained.

The variable light-reducing unit 18A is provided to adjust the average energy of each pulse of the excimer laser beam. Those usable as the variable light-reducing unit 18A include, for example, a means for changing the light-reducing ratio in a stepwise manner, for example, with a plurality of optical filters having different light-reducing ratios which are arranged in a switching manner, and a means for continuously varying the light-reducing ratio by adjusting the overlapping situation of two optical filters with transmission factors which are continuously changed. The optical filter of the variable light-reducing unit 18A is driven by a driving mechanism 35 which is controlled by the main control unit 50.

The beam-shaping optical system 18(B) is operated such that the cross-sectional configuration of the excimer laser beam, which is adjusted to have a predetermined peak intensity by the variable light-reducing unit 18A, is shaped to be similar to the entire shape of the incoming end of the first fly's eye lens system 18C for constructing the incoming end of the double fly's eye lens system described later on provided at the back of the optical path of the excimer laser beam to allow the light beam to efficiently come into the first fly's eye lens system 18c. The beam-shaping optical system 18(B) is composed of, for example, a cylinder lens and a beam expander (any of which is not shown in the drawing).

The double fly's eye lens system is provided to obtain a uniform intensity distribution of the illumination light beam. The double fly's eye lens system comprises the first fly's eye lens system 18C, the light-collecting lens 18E, and the second fly's eye lens system 18G which are successively arranged on the optical path of the excimer laser beam at the back of the beam-shaping optical system 18B. In this arrangement, the vibration mirror 18D for smoothing the interference fringe and the weak speckle generated on the objective irradiated surface (reticle surface or wafer surface) is arranged between the first fly's eye lens system 18C and the light-collecting lens 18E. The vibration (deflection angle) of the vibration mirror 18D is controlled by the main control unit 50 by the aid of the driving system 36.

The illumination NA correction plate 18F for adjusting the orientation (illumination NA difference) of the numerical aperture of the illumination light beam on the objective irradiated surface is arranged on the side of the incoming end of the second fly's eye lens system 18G.

The arrangement, in which the double fly's eye lens system and the vibration mirror 18D are combined as in the embodiment of the present invention, is disclosed in detail, for example, in Japanese Patent Application Laid-Open No. 1-235289 and U.S. Pat. No. 5,307,207 corresponding thereto and in Japanese Patent Application Laid-Open No. 7-142354 and U.S. Pat. No. 5,534,970 corresponding thereto. The disclosure of the above-mentioned patent documents is incorporated herein by reference so long as the domestic laws of the states designated in this application permit the incorporation.

The illumination system aperture diaphragm plate 18H composed of a disk-shaped member is arranged in the vicinity of the outgoing surface of the second fly's eye lens system 18G. The illumination system aperture diaphragm plate 18H is arranged at approximately equal angle intervals, for example, with an aperture diaphragm composed of an ordinary circular aperture, an aperture diaphragm (small σ diaphragm) composed of a small circular aperture to decrease the σ value as the coherence factor, a zonal aperture diaphragm (zonal diaphragm) for zonal illumination, and a modified aperture diaphragm composed of four apertures arranged eccentrically for the modified light source method. The illumination system aperture diaphragm plate 18H is rotated, for example, by an unillustrated motor controlled by the main control unit 50. Accordingly, any one of the aperture diaphragms is selectively set on the optical path of the pulse illumination light beam. The shape of the light source surface obtained by the Koehler illumination is restricted to be, for example, zonal, small circular, large circular, or four-field configuration.

The beam splitter 18J, which has a large reflectance and a small transmittance, is arranged on the optical path for the pulse illumination light beam at the back of the illumination system aperture diaphragm plate 18H. The relay optical system, which is composed of the first relay lens 18K and the second relay lens 18N, is arranged on the optical path at the back thereof with the fixed reticle blind 18L and the movable reticle blind 18M intervening therebetween.

The fixed reticle blind 18L is arranged on the surface which is slightly defocused from the conjugate surface with respect to the pattern surface of the reticle R, and it is formed with an opening having a predetermined shape which determines the illumination area on the reticle R. In the embodiment of the present invention, it is assumed that the opening is formed to have a slit-shaped configuration or a rectangular configuration extending linearly in the X direction perpendicular to the movement direction (Y direction) of the reticle R during the scanning exposure.

The movable reticle blind 18M, which has an opening with its position and width variable in the scanning direction, is arranged in the vicinity of the fixed reticle blind 18L. The illumination area is further restricted by the aid of the movable reticle blind 18M upon the start and the end of the scanning exposure. Thus, unnecessary portions are prevented from the exposure. The movable reticle blind 18M is controlled by the main control unit 50 by the aid of the driving system 42.

The illumination telecentric correction plate 18P is arranged at the outlet portion of the second relay lens 18N of the relay optical system. The mirror 18Q for reflecting, to the reticle R, the pulse illumination light beam passed through the second relay lens 18N and the illumination telecentric correction plate 18P is arranged on the optical path of the pulse illumination light beam at the back thereof. The main condenser lens system 18R is arranged on the optical path of the pulse illumination light beam at the back of the mirror 18Q.

Explanation will now be made for the function of the illumination optical system 18 constructed as described above. When the excimer laser beam from the excimer laser light source 11 comes into the illumination optical system 18 via the beam-receiving system 32, the excimer laser beam comes into the beam-shaping optical system 18B after being adjusted to have the predetermined peak intensity by the aid of the variable light-reducing unit 18A. The cross-sectional configuration of the excimer laser beam is shaped by the beam-shaping optical system 18B so that the laser beam efficiently comes into the first fly's eye lens system 18C disposed at the back thereof. Subsequently, when the excimer laser beam comes into the first fly's eye lens system 18C, a large number of secondary light sources are formed on the side of the outgoing end of the first fly's eye lens system 18C. The ultraviolet pulse beams, which are emitted from the large number of point light sources, come into the second fly's eye lens system 18G via the vibration mirror 18D, the light-collecting lens system 18E, and the illumination NA correction plate 18F. Accordingly, the large number of secondary light sources, which are composed of individual light source images obtained by uniformly distributing the large number of minute light source images within an area having a predetermined shape, are formed at the outgoing end of the second fly's eye lens system 18G. The pulse ultraviolet light beams, which are radiated from the large number of secondary light sources, pass through any one of the aperture diaphragms on the illumination system aperture diaphragm plate 18H, and they arrive at the beam splitter 18J having the large reflectance and the small transmittance.

The pulse ultraviolet light beam as the exposure light beam, which is reflected by the beam splitter 18J, illuminates the opening of the fixed reticle blind 18L with the uniform intensity distribution by the aid of the first relay lens 18K. However, the intensity distribution may be superimposed at a contrast of about several % with the interference fringe and the weak speckle depending on the interference performance of the ultraviolet pulse beam from the excimer laser light source 11. For this reason, any unevenness in exposure amount may arise due to the interference fringe and the weak speckle. However, the unevenness in exposure amount is smoothed by swinging the vibration mirror 18D in synchronization with the oscillation of the ultraviolet pulse beam and the movement of the reticle R and the wafer W during the scanning exposure, as described in Japanese Patent Application Laid-Open No. 7-142354 previously referred to.

The ultraviolet pulse beam, which has passed through the opening of the fixed reticle blind 18L, passes through the movable reticle blind 18M, and then it passes through the second relay lens 18N and the illumination telecentric correction plate 18P. The optical path is bent into the vertical downward direction by the mirror 18Q. After that, the ultraviolet pulse beam passes through the main condenser lens system 18R, and it illuminates, with a uniform intensity distribution, the predetermined illumination area (slit-shaped or rectangular illumination area extending linearly in the X direction) on the reticle R which is held on the reticle stage RST. In this arrangement, the rectangular slit-shaped illumination light beam, which is radiated onto the reticle R, is set to extend in a slender configuration in the X direction (non-scanning direction) at the central portion of the circular projection field of the projection optical system PL as shown in FIG. 1. The width of the illumination light beam in the Y direction (scanning direction) is set to be approximately constant.

On the other hand, the pulse illumination light beam, which is transmitted through the beam splitter 18J, comes into an integrator sensor 46 composed of a photoelectric conversion element, via an unillustrated collective lens, and it is subjected to the photoelectric conversion therein. A photoelectric conversion signal obtained by the integrator sensor 46 is supplied to the main control unit 50 via a peak hold circuit and an A/D converter as described later on. Those usable as the integrator sensor 46 include, for example, a PIN-type photodiode which has sensitivity in the far ultraviolet region and which has a high response frequency to detect the pulse light emission of the excimer laser light source 11. The correlation coefficient between the output of the integrator sensor 46 and the illuminance (exposure amount) of the pulse ultraviolet light beam on the surface of the wafer W is previously determined, and it is stored in a memory in the main control unit 50.

A refractive optical system having a reduction magnification of ¼ (or ⅕) is used as the projection optical system PL, which has a circular projection field with both of the object plane side (reticle R) and the image plane side (wafer W) being telecentric and which is composed of-only a refractive optical element (lens element) obtained by using quartz or fluorite as an optical saltpeter material. The image-forming light flux, which comes from the portion illuminated with the pulse ultraviolet light beam of the circuit pattern area on the reticle R, passes through the projection optical system PL, and it is projected with reduction of ¼ or ⅕ onto the resist layer on the wafer W electrostatically sucked (or vacuum sucked) to the holder on the wafer stage WST as described later on.

It is a matter of course that the projection optical system PL may be based on the so-called catadioptric system obtained by combining a refractive optical element and a reflective optical element (for example, a concave mirror and a beam splitter) as disclosed in Japanese Patent Application Laid-Open No. 3-282527 and U.S. Pat. No. 5,220,454 corresponding thereto. The disclosure of the above-mentioned patent documents is incorporated herein by reference so long as the domestic laws of the states designated in this application permit the incorporation.

Description of the First Concept

Figure 4:
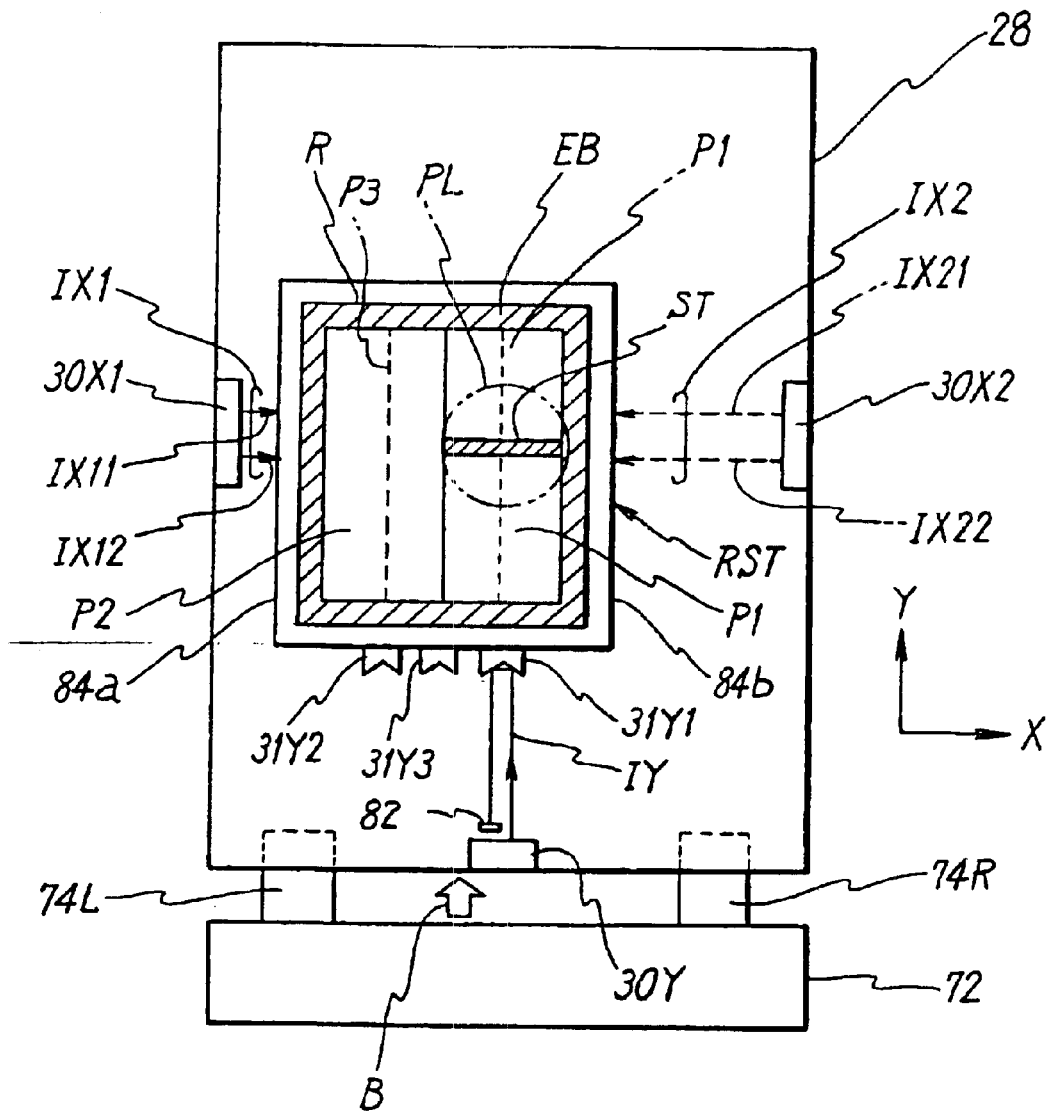
FIG. 4(A) shows a plan view illustrating components disposed in the vicinity of a reticle base board.
FIG. 4(B) shows a side view illustrating components disposed in the vicinity of the reticle base board as viewed in the direction of the arrow B shown in FIG. 4(A).
Figure 4:
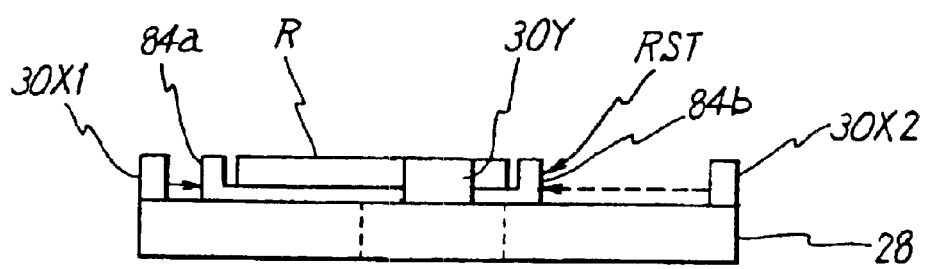
Figure 5:
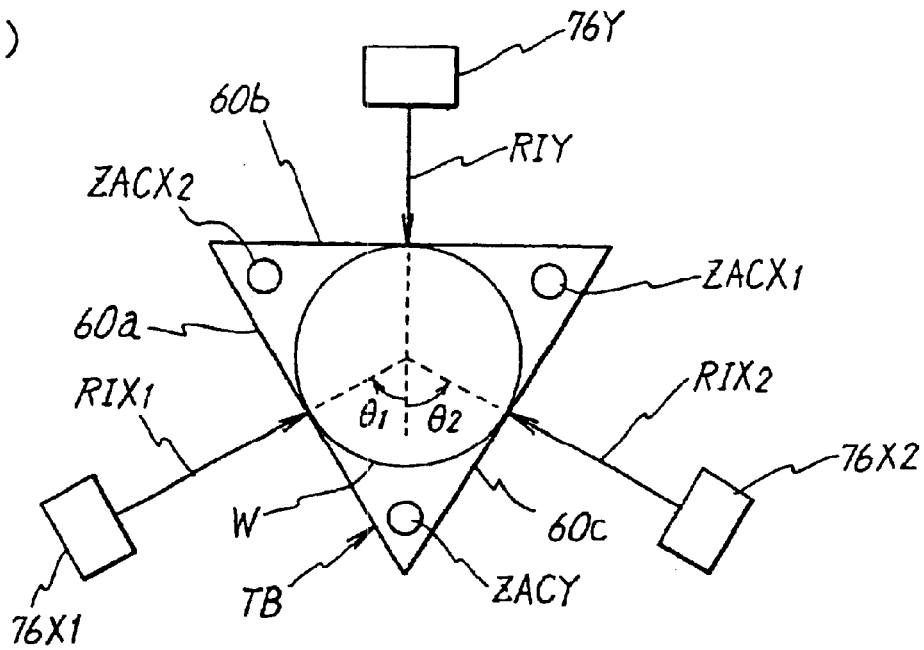
Figure 5:
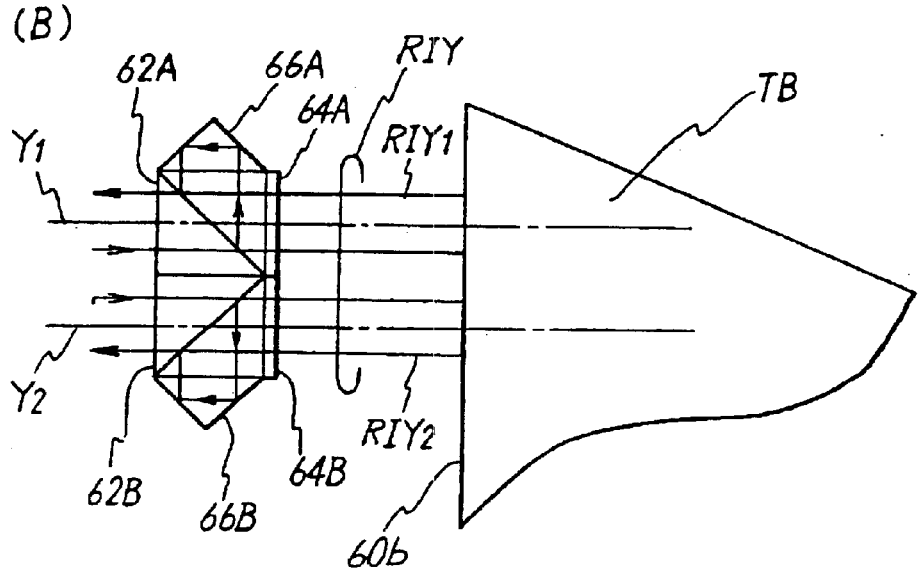
Figure 5:
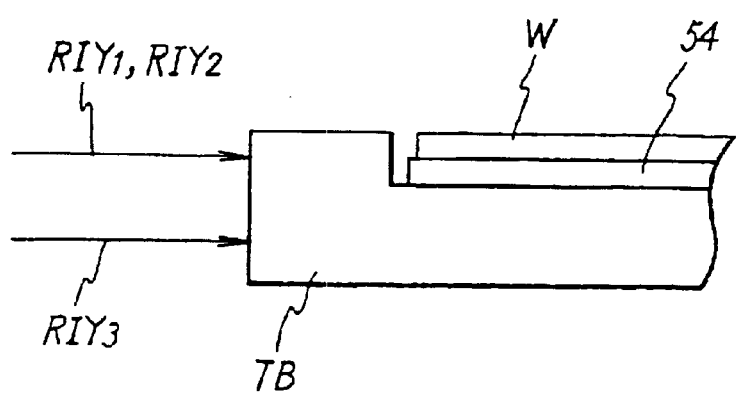

Next, the position-measuring system for the reticle stage RST will be described in detail with reference to FIG. 4. FIG. 4(A) shows a plan view illustrating components disposed in the vicinity of the reticle base board 28, and FIG. 4(B) shows a side view illustrating components disposed in the vicinity of the reticle base board 28 as viewed in the direction of the arrow B.

As shown in FIG. 4(A), the field ST (corresponding to the maximum slit-shaped illumination area defined by the reticle blind) of the projection optical system PL is only 100 mm×32 mm (four times the field projected onto the wafer W). One time of scanning exposure merely makes it possible to perform the exposure for only any one of areas of a first area P1 and second area P2 (both of them are 100 mm×200 mm) adjacent to one another in the non-scanning direction (X direction) on the 9-inch reticle R or a central area P3 (100 mm×200 mm) indicated by dotted lines.

In order to perform the exposure (transfer of the pattern onto the wafer W) for all of the areas. P1, P2, P3, it is necessary to shift the reticle stage RST in the non-scanning direction by 50 mm (in the case of the central area P3 indicated by the dotted lines) or by 100 mm (in the case of the area P2) on the basis of the exposure position of the area P1 shown in FIG. 4(A).

Accordingly, a first corner cube 31Y1 as a first mirror, a second corner cube 31Y2 as a second mirror, and a third corner cube 31Y3 are provided corresponding to the respective areas P2, P3, P1, on the side surface on the first end side (lower end side in FIG. 4(A)) of the reticle stage RST in the Y direction. In this arrangement, the three corner cubes 31Y1, 31Y2, 31Y3 are arranged in the X direction by intervals of 50 mm. However, there is no limitation thereto. Any interval is available provided that the interval is predetermined (usually, the interval is determined in conformity with the pattern arrangement of the reticle on the reticle stage RST).

As shown in FIG. 4(A), the reticle base board 28 is fixed with a reticle Y interferometer 30Y disposed thereon as the first interferometer which measures the position of the reticle stage RST in the scanning direction by radiating the length-measuring beam IY in the Y direction onto only any one of the three corner cubes 31Y1, 31Y2, 31Y3 and receiving the reflected light beam therefrom. In this arrangement, the corner cubes 31Y1, 31Y2, 31Y3 are used as the movement mirror which measures the position in the scanning direction (Y direction). For example, in a state in which the reticle stage RST is located at the position in the non-scanning direction (X direction) shown in FIG. 4(A), the length-measuring beam IY, which is radiated from the interferometer 30Y to the reticle stage RST, is successively reflected by the corner cube 31Y1, the reflecting mirror 82, and the corner cube 31Y1. The returning light beam from the corner cube 31Y1 returns in the opposite direction along approximately the same optical path as the incoming optical path (so-called double-path arrangement). Accordingly, even if the reticle stage RST is rotated by an angle θ, the reflected light beam can reliably return to the interferometer 30. It is possible to correctly measure the position of the reticle stage RST in the scanning direction. In this arrangement, the length-measuring axis of the reticle Y interferometer 30Y (central position of the incident light beam and the returning light beam with respect to the corner cube 31Y1) is located to make intersection with the center of the optical axis of the projection optical system PL. The position of the length-measuring beam IY in the Z direction from the reticle Y interferometer 30Y is coincident with the lower surface (pattern formation plane) of the reticle R. Accordingly, the position of the reticle R in the scanning direction is correctly measured without any Abbe error.

The two side surfaces of the reticle stage RST in the scanning direction (Y direction) are mirror-finished to form a first reflecting surface 84a and a second reflecting surface 82b extending in the Y direction. A reticle X interferometer 30X1 as the second interferometer and a reticle X interferometer 30X2 as the third interferometer are provided respectively at both ends on the reticle base board 28 in the non-scanning direction (X direction), opposing to the reflecting surfaces. Two-axes interferometers which radiate two length-measuring beams (length-measuring beams IX11, IX12 and length-measuring beams IX21, IX22) onto the first and second reflecting surfaces 84a, 84b are used for both of the reticle X interferometers 30X1, 30X2. The length-measuring axes (central positions of the respective length-measuring beams) of the reticle X interferometers 30X1, 30X2 intersect the center of the optical axis of the projection optical system PL. The position of the length-measuring beam IY in the Z direction from the reticle X interferometer 30X1, 30X2 is coincident with the lower surface (pattern formation plane) of the reticle R (see FIG. 4(B)). Accordingly, the position of the reticle stage RST in the non-scanning direction is also correctly measured without any Abbe error.

Next, explanation will be made for the operation of the position-measuring system for the reticle stage RST constructed as described above.

(a) At first, explanation will be made for the case of the scanning exposure in which the pattern in the first area P1 on the reticle R is transferred onto the wafer W. In this case, as shown in FIG. 4(A), the length-measuring beams IX11, IX12 are radiated from the first reticle X interferometer 30X1 to the first reflecting surface 84a of the reticle stage RST, and the reflected light beams therefrom are received respectively. Accordingly, the position of the first reflecting surface 84a in the X direction is measured (subjected to length measurement) at the radiating position of the respective length-measuring beams IX11, IX12. An average value of obtained measured values X1, X2 is used to determined the position of the reticle stage RST in the non-scanning direction. The average value is calculated and determined by the reticle stage controller 33 (see FIG. 2) to which the output from the reticle X interferometer 30X1 is inputted. In this process, the reticle stage controller 33 can also determine the θ rotation of the reticle stage RST on the basis of the difference between X1 and X2. On the other hand, the position of the reticle stage RST in the scanning direction is measured by radiating the length-measuring beam IY to the first corner cube 31Y1 by the reticle Y interferometer 30Y and receiving the reflected light beam therefrom.

(b) When the scanning exposure is performed to transfer the pattern in the second area P2 on the reticle R onto the wafer W, the scanning exposure is carried out in a state in which the reticle stage RST is driven by the driving system 29 from the state shown in FIG. 4(A) in the +X direction by 100 mm. In this case, the length-measuring beams IX21, IX22 are radiated from the second reticle X interferometer 30X2 onto the second reflecting surface 84b of the reticle stage RST, and the respective reflected light beams therefrom are received. Thus, the position of the second reflecting surface 84b in the X direction is measured (subjected to length measurement) at the radiating position of the respective length-measuring beams IX21, IX22. An average value of obtained measured values X3, X4 is used to determined the position of the reticle stage RST in the non-scanning direction by means of the reticle stage controller 33 in the same manner as described above. Similarly, the reticle stage controller 33 can also determine the θ rotation of the reticle stage RST on the basis of the difference between X3 and X4. On the other hand, the position of the reticle stage RST in the scanning direction is measured by radiating the length-measuring beam IY onto the second corner cube 31Y2 by the reticle Y interferometer 30Y and receiving the reflected light beam therefrom.

(c) In the case of the scanning exposure in which the pattern in the third area P3 on the reticle R is transferred onto the wafer W, the scanning exposure is performed in a state in which the reticle stage RST is driven by the driving system 29 in the +X direction from the state shown in FIG. 4(A) by 50 mm. In this case, the position of the reticle stage RST in the non-scanning direction is measured by using the reticle X interferometers 30X1, 30X2. That is, the measurement processes for the reticle stage RST with the reticle X interferometers 30X1, 30X2 as described in the items (a) and (b) are simultaneously performed. The reticle stage controller 33 determines the position of the reticle stage RST in the non-scanning direction in accordance with the following expression by using the measured values X1, X2, X3, X4 obtained by the reticle X interferometers 30X1, 30X2.

$$X=[\{(X1+X2)/2\}-\{(X3+X4)/2\}]/2$$

In this case, when the rotation of the reticle stage RST is determined, the rotation is determined by the reticle stage controller 33 in accordance with the calculation based on the following expression provided that the spacing distance between the length-measuring beams X11, X12 and the spacing distance between the length-measuring beams X21, X22 are L.

$$θ=\{(X1-X2)/L+(X4-X3)/L\}/2$$

On the other hand, the position of the reticle stage RST in the scanning direction is measured by radiating the length-measuring beam IY onto the third corner cube 31Y3 by the reticle Y interferometer 30Y and receiving the reflected light beam therefrom.

As clarified from the foregoing explanation, in the embodiment of the present invention, the position of the reticle stage RST in the scanning direction is measured during the scanning exposure for transferring the pattern on the reticle R to the wafer W, by using any one of the first, second, and third corner cubes 31Y1, 31Y2, 32Y3. Therefore, the position of the reticle stage RST in the scanning direction can be correctly measured even when there is any θ rotation of the reticle stage RST (or rotation error) or the like. The position of the reticle stage RST is determined by using the measured value obtained by the reticle X interferometer with which the distance to the opposing reflecting surface of the length-measuring beam is shorter. There is no possibility to cause any state of incapable measurement even when each of the first and second reflecting surfaces 84a, 84b is a plane mirror provided that the θ rotation of the reticle stage RST is minute.

As described above, in the embodiment of the present invention, the position-measuring system for the reticle stage RST is constructed by the three corner cubes 30Y1, 30Y2, 30Y3, the movement mirror composed of the first and second reflecting surfaces 84a, 84b, the reticle Y interferometer 30Y, and the two reticle X interferometers 30X1, 30X2. However, in FIG. 2, these components are illustrated and represented by the reticle laser interferometer 30 and the movement mirror 31.

In the embodiment of the present invention, the reticle stage RST is subjected to the position measurement for the X, Y, and θ directions respectively by means of the reticle stage controller 33 on the basis of the measured values obtained by the reticle laser interferometer 30 as described above. The reticle stage controller 33 basically controls the driving system (magnetically floating type two-dimensional plane motor) 29 for moving the reticle stage RST so that the position information (or velocity information) outputted from the interferometer 30 is coincident with the command value (target position, target velocity).

Further, the reticle stage controller 33, which functions as a reset unit, resets the reticle Y interferometer 30Y in response to the position of the reticle stage RST in the non-scanning direction while monitoring the measured values of the reticle X interferometers 30X1, 30X2. The reset of the interferometer means the fact that the measured value of the interferometer is returned to a predetermined value, and it does not necessarily mean the fact that the measured value is returned to the zero point.

When the pattern area objective of the scanning exposure is switched, it is necessary to move the reticle stage RST in the non-scanning direction (X direction). During this process, the length-measuring beam IY from the reticle Y interferometer 30Y does not hit any corner cube. Therefore, a state is given, in which it is impossible to measure the position with the reticle Y interferometer 30Y. For this reason, in the embodiment of the present invention, a sensor (not shown) is separately provided for roughly monitoring the position of the reticle during the period in which the measurement cannot be performed with the interferometer. For example, the sensor may be a sensor based on the heterodyne system which measures the position of the reticle stage RST as follows. That is, a lattice mark of a predetermined pitch is formed at a lower half portion of the reflecting surface 84a (or 84b) of the reticle stage RST. A pair of light fluxes, which have slightly different frequencies, are projected from an unillustrated light source system onto the lattice mark at an extremely small angle of incidence in a symmetrical direction. Interference fringes, which move at a predetermined velocity in the Y axis direction, are generated on the surface on which the lattice mark is formed. A combined light flux of diffracted light beams generated from the lattice mark in the X axis direction is received to measure the position of the reticle stage RST on the basis of the phase change of the photoelectric conversion signal of the combined light flux. Such a sensor is disclosed, for example, in Japanese Patent Application Laid-Open No. 5-40184. The disclosure is incorporated herein by reference.

In this case, it is also preferable for the reticle stage controller 33 that the reticle Y interferometer 30Y is reset immediately after the length-measuring beam IY from the reticle Y interferometer 30Y hits the corner cube 31Y corresponding to the area (predetermined area of P1, P2, P3) on the reticle R to be subsequently subjected to the scanning exposure. However, in the embodiment of the present invention, considering the possibility that the reticle stage RST may be subjected to any delicate positional discrepancy in the scanning direction (Y direction), or the reticle stage RST may be subjected to the θ rotation during the movement of the reticle stage RST in the non-scanning direction, the reticle alignment and the base line measurement are performed before resetting the interferometer as described later on.

In the non-scanning direction, the length-measuring beams from the reticle X interferometers 30X1, 30X2 always hit the first reflecting surface and the second reflecting surface. Therefore, the reticle stage controller 33 may optionally select the measured value of any one of the interferometers or the measured values of the both. That is, the reticle stage controller 33 selects and uses the measured values of the reticle interferometers 30X1, 30X2 on the basis of the position information on the area P1, P2, or P3 on the mask existing in the projection field of the projection optical system PL.

Although not shown in FIGS. 1 and 2, the scanning type exposure apparatus 10 according to the embodiment of the present invention is actually provided with an reaction actuator 74 in order to avoid transmission, via the support pillar 26 to the pedestal section 16, of the reaction force −Ar×Rm which acts on the reticle base board 28 from the reticle stage RST having a mass Rm depending on the rate of acceleration or deceleration Ar generated during the pre-scanning or the over-scanning before and after the constant velocity movement of the reticle stage RST having a mass Rm during the scanning exposure.

As shown in FIG. 3, the reaction actuator 74 is supported by a reaction frame 72 which is roughly positioned by an elastic member 70 with respect to the base plate BS for supporting the pedestal section 16. The reaction actuator 74 is arranged at approximately the same height as that of the center of gravity which is determined by the weights of the reticle stage RST, the reticle base board 28, and other components.

Actually, as shown in FIG. 4(A), the reaction actuator 74 includes a pair of reaction actuators 74L, 74R disposed on the both sides in the non-scanning direction. However, these components are represented and illustrated by the reaction actuator 74 in FIG. 3. The reaction actuator 74 is controlled by an unillustrated control unit so that the force opposite to the reaction force is applied to the reticle base board 28 to cancel the lateral shift of the center of gravity and the rotation during the acceleration and deceleration of the reticle stage RST. Accordingly, the pedestal section 16 is prevented from transmission of the vibration during the acceleration and deceleration via the support pillar 26. It is considered that the necessity and the effect of such a reaction actuator are enhanced, for example, when the magnetically floating type two-dimensional linear actuator is used as in the embodiment of the present invention, as compared with a case in which a feed screw system reticle stage is used. In this case, for example, the reaction actuator 74 comprises a voice coil motor. However, when the driving system for the reticle stage RST is constructed by the magnetically floating type two-dimensional plane motor as in the embodiment of the present invention, the reaction actuator may be constructed by a linear actuator which commonly uses, as a stator, a part of a coil for constructing the plane motor to commonly use a part of constitutive components of the driving system (actuator) for moving the reticle stage and the actuator which applies the force to the second pedestal.

The LC/MAC system finely adjusts the various optical characteristics (image formation performance) of the projection optical system PL. In the embodiment of the present invention, as shown in FIG. 2, the LC/MAC system comprises MAC including a telecentric lens system G2 which is disposed at a position near to the object plane in the projection optical system PL and which is capable of minute movement in the optical axis direction and minute inclination with respect to surface orthogonal to the optical axis and a driving mechanism 96 for finely moving the lens system G2 in the optical axis direction (including the inclination), and a lens controller 102 for finely adjusting the image formation magnification of the projected image by increasing and decreasing, with a pipe 94, within a range of, for example, about ±20 mmHg, the gas pressure in a specified air space chamber (enclosed chamber) tightly enclosed against the external air in the projection optical system PL. MAC makes it possible to adjust the magnification or the distortion of the projected image (for example, isotropic distorted aberration, and non-isotropic distorted aberration such as barrel, pincushion, and trapezoid).

In this arrangement, the lens controller 102 also serves as a control system for the driving mechanism 96 for the lens system G2. The switching control or the combined control is performed for the change of the magnification of the projected image by driving the lens system G2 and the change of the magnification of the projected image by controlling the pressure in the enclosed chamber in the projection optical system PL. The lens controller 102 is also managed by the main control unit 50.

However, when the illumination light beam lies in an ArF excimer laser light source having a wavelength of 193 nm, the mechanism for increasing and decreasing the pressure in the air space chamber may be omitted, because the interior of the illumination optical path and the interior of the lens barrel of the projection optical system PL are substituted with nitrogen gas or helium gas, and hence it is difficult to change the refractive index in the specified air space chamber in the projection optical system PL.

An astigmatism/frame aberration-correcting plate G3, which is used to reduce the astigmatism/frame aberration that is apt to occur at a portion of the projected image especially having a large image height (portion near to the periphery of the projection field), is contained at a position near to the image plane of the projection optical system PL.

In the embodiment of the present invention, an image strain-correcting plate G1, which is used to effectively reduce the random distortion component contained in the projected image formed in the effective image projection area in the circular field (determined by the opening of the fixed reticle blind 18L), is arranged between the reticle R and the lens system G2 of the projection optical system PL. The correcting plate G1 is obtained by locally polishing the surface of a parallel quartz plate having a thickness of about several millimeters, and it is used to minutely deflect the image formation light flux passing through the polished portion. An example of the method for producing such a correcting plate G1 is disclosed in detail in Japanese Patent Application Laid-Open No. 8-203805 and U.S. patent application Ser. No. 581016 (filed on Jan. 3, 1996). The technique disclosed in the patent documents is basically applied in the embodiment of the present invention as well. The disclosure of the above-mentioned patent documents is incorporated herein by reference so long as the domestic laws of the states designated in this application permit the incorporation.

Description of the Second Concept (I)

Next, explanation will be made for the stage apparatus 1 according to the present invention. As shown in FIGS. 1 and 2, the stage apparatus 1 comprises the base board 22 for constructing the pedestal section (first pedestal or first column) 16, the movable type base board 38 to serve as the second movable member supported relatively movably in the XY plane on the base board 22, and the wafer stage WST (first movable member) to serve as the substrate stage supported relatively movably with respect to the movable type base board 38 in the XY plane on the movable type base board 38.

The wafer stage WST is supported in a floating manner by a first planar magnetically floating type linear actuator 42 (see FIG. 7(B)) to serve as a driving unit provided on the movable type base board 38 under the projection optical system PL. The wafer stage WST is freely driven in the XY two-dimensional plane perpendicular to the optical axis AX of the projection optical system PL. The movable type base board 38 is supported in an floating manner by a second planar magnetically floating type linear actuator 44 (see FIG. 5(B)) provided on the base board 22, in the same manner as the wafer stage WST. The movable type base board 38 is freely driven in the XY two-dimensional plane. In FIG. 2, for convenience of illustration, the planar magnetically floating type linear actuators 42, 44 are collectively illustrated as the driving system 48. The driving system 48, i.e. each of the planar magnetically floating type linear actuators 42, 44 is controlled by the wafer stage controller 78. For example, the method for controlling the movable type base board 38 and the role of the movable type base board 38 will be described in detail later on.

The wafer stage WST comprises a movable stage 52 to serve as a second plate freely movable in the XY two-dimensional plane on the movable type base board 38, a leveling drive mechanism 58 carried on the movable stage 52, and a substrate table TB to serve as a first plate for holding the wafer W supported by the leveling drive mechanism 58.

In this embodiment, the movable stage 52 is formed to have a regular triangular configuration with one end surface arranged on the movable type base board 38 in the direction perpendicular to the Y axis direction (first axis direction) as the scanning direction for the reticle stage RST.

The substrate table TB is formed to have exactly the same regular triangular configuration as the configuration of the movable stage 52, and it is supported by three actuators ZAC which constitute the leveling drive mechanism 58, in a state in which the substrate stage TB is overlapped with the movable table 52 as viewed in a plan view. The substrate table TB is provided thereon with a substantially circular wafer holder 54 (see FIG. 5(C)). The wafer W is magnetostatically sucked by the wafer holder 54, and it is held while being corrected for its flatness. The wafer holder 54 is subjected to temperature control to suppress any expansion and deformation which would be otherwise caused by accumulation of heat during the exposure of the wafer W.

The leveling drive mechanism 58 comprises the three actuators (piezoelectric, voice coil motors or the like) ZACX1, ZACX2, ZACY (see FIG. 5(A)) which support the substrate table TB at positions in the vicinity of three apexes of the regular triangle respectively and which may be driven independently in the Z direction perpendicular to the XY plane at the respective support points, and an actuator control unit 56 for finely moving the substrate stage TB in the direction (Z direction) of the optical axis AX and inclining it with respect to the XY plane by independently controlling the three actuators ZACX1, ZACX2, ZACY. The driving command for the actuator control unit 56 is outputted from the wafer stage controller 78.

Although not shown in FIG. 2, a focus/leveling sensor for detecting the inclination (leveling error) and the deviation (focus error) in the Z direction between the image formation plane of the projection optical system PL and the surface of the wafer W is provided in the vicinity of the projection optical system PL. The wafer stage controller 78 outputs the driving command to the actuator control unit 56 in response to the focus error signal and the leveling error signal from the sensor. An example of such a focus/leveling detection system is disclosed in Japanese Patent Application Laid-Open No. 7-201699 and U.S. Pat. No. 5,473,424 corresponding thereto. The disclosure of the above-mentioned patent documents is incorporated herein by reference so long as the domestic laws of the countries designated in this application permit the incorporation.

The directional positions of the respective interferometer beams shown in FIG. 5(C) concerning the wafer stage WST, i.e., the substrate table TB are successively measured by the laser interferometer system 76 shown in FIG. 2. The position information is fed to the wafer stage controller 78. The wafer stage controller 78 determines the XY coordinate position in accordance with the predetermined calculation to output the command signal for driving the wafer stage WST to the driving system 48 on the basis of the determined coordinate position and the target position information to be positioned.

The specified arrangement of the laser interferometer system 76 will now be described in detail with reference to FIGS. 5(A) to 5(C).

FIG. 5(A) shows a plan view illustrating, together with the substrate table TB, the first, second, and third interferometers 76X1, 76Y, 76X2 for constructing the laser interferometer system 76, and the interferometer beams RIX1, RIY, RIX2 from the three interferometers.

As also understood from FIG. 5(A), the substrate table TB is formed to have the regular triangular configuration as viewed in the plan view in this embodiment, with its three side surfaces which are mirror-finished to form first, second, and third reflecting surfaces 60a, 60b, 60c. The second interferometer 76Y measures the position in the Y axis direction (or velocity) of the substrate table TB by perpendicularly radiating, onto the second reflecting surface 60b, the interferometer beam RIY in the Y axis direction (first axis direction) which is the scanning direction, and receiving the reflected light beam therefrom. The first interferometer 76X1 measures the position in the third axis direction (or velocity) which is the direction of the interferometer beam RIX1 by perpendicularly radiating, onto the first reflecting surface 60a, the interferometer beam RIX1 in the direction inclined by a predetermined angle θ1 (θ1 is −60° in this case) with respect to the Y axis direction, and receiving the reflected light beam therefrom. Similarly, the third interferometer 76X2 measures the position in the fourth axis direction (or velocity) which is the direction of the interferometer beam RIX2 by perpendicularly radiating, onto the third reflecting surface 60c, the interferometer beam RIX2 in the direction inclined by a predetermined angle θ2 (θ2 is +60° in this case) with respect to the Y axis direction, and receiving the reflected light beam therefrom.

The interferometer having a plurality of axes is used for each of the interferometers for constructing the laser interferometer system 76 in the embodiment of the present invention considering the fact that the exposure accuracy is badly affected by the minute rotation error (including the yawing component), which may be caused in the XY plane by the XY movement of the wafer stage WST and the fine movement of the substrate table TB.

FIG. 5(B) shows, in further detail, the interferometer beam RIY from the second interferometer 76Y together with a part of the optical system for constructing the interferometer. As shown in FIG. 5(B), first and second length-measuring beams RIY1, RIY2, which are two axes length-measuring beams as viewed in the plan view and which are radiated from the interferometer 76Y, are radiated onto the second reflecting surface 60b of the substrate table TB. The length-measuring beams RIY1, RYI2 are radiated perpendicularly onto the second reflecting surface 60b while being separated from each other by a predetermined spacing distance in the X direction on the identical horizontal plane. The length-measuring beams RIY1, RYI2 are radiated from an unillustrated light source, and then they are transmitted through polarized beam splitters 62A, 62B respectively as linearly polarized incident light fluxes. The length-measuring beams RIY1, RYI2 form circularly polarized light beams through λ/4 plates 64A, 64B, and they radiates the second reflecting surface 60b. The returning light beams are transmitted through the λ/4 plates 64A, 64B again to form linearly polarized outgoing light fluxes perpendicular to the direction of the polarization of the incoming light fluxes, they are reflected by the polarized beam splitters 62A, 62B respectively, and they come into the corner cube sections 66A, 66B. In this arrangement, the light fluxes, which are reflected by the three surfaces of the corner cubes, are transmitted through the polarized beam splitters 62A, 62B and the λ/4 plates 64A, 64B again to form circularly polarized light beams to arrive at the second reflecting surface 60b. The reflected light beams form linear polarized light beams which are in the same polarization direction as the original one when the beams pass through the λ/4 plates 64A, 64B, and they pass through the polarized beam splitters 62A, 62b. After that, the beams return to the side of the main interferometer body in parallel to the incoming light fluxes. In other words, the measurement by the respective length-measuring beams RIY1, RIY2 is performed in accordance with the so-called double-path arrangement.

The returning light flux is overlapped with the returning light flux of the reference beam from an unillustrated fixed mirror at the inside of the main interferometer body. When the interference fringes of the overlapped light fluxes are counted, it is possible to independently measure the positions of the second reflecting surface 60b of the substrate table TB on the axes Y1, Y2 indicated by dashed lines in FIG. 5(B) respectively at an accuracy which is twice the ordinary one. The rotation of the substrate table TB can be determined on the basis of the difference between measured values obtained by the length-measuring beams RIY1, RIY2.

However, only the ability to measure the rotation is insufficient especially, as in this embodiment, in the case of the arrangement in which the side surface of the substrate table is mirror-finished to provide the movement mirror, because of the following reason. That is, in such a case, the length-measuring beam from the interferometer cannot be set at the same height as that of the surface of the wafer W. Considering such a point, as shown in FIG. 5(C), the third length-measuring beam RIY3 is radiated from the second interferometer 76Y onto the position separated by a predetermined distance in the surface direction (downward direction) perpendicular to the XY plane from the position of radiation of the length-measuring beam RIY1 (or RIY2). Therefore, it is possible to determine the inclination of the substrate table TB with respect to the XY plane on the basis of the difference between the length-measuring beam RIY1 (or RIY2) and the length-measuring beam RIY3.

In this context, it is also preferable that the third length-measuring beam and the fourth length-measuring beam are radiated respectively onto the positions separated by the predetermined distance in the surface direction (downward direction) perpendicular to the XY plane respectively from the position of radiation of the length-measuring beam RIY1 or RIY2. In other words, it is desirable to use such an arrangement that at least three length-measuring beams, which are not disposed on an identical straight line on the second reflecting surface 60b, are radiated onto the second reflecting surface from the interferometer 76Y to make it possible to determine the inclination with respect to the XY plane and the rotation in the XY plane of the substrate table TB. Of course, it is desirable that the measurement is performed by using the third and fourth length-measuring beams in accordance with the double-path arrangement in order to improve the measurement accuracy.

The other interferometers 76X1, 76X2 are constructed in the same manner as the interferometer 76Y. That is, the positions of the first reflecting surface and the third reflecting surface at the radiation points of the respective length-measuring beams in the directions of the respective length-measuring beams are independently measured by radiating the three length-measuring beams onto the first reflecting surface 60a and the third reflecting surface 60c, and receiving the reflected light beams therefrom. In FIG. 5(A), the respective three length-measuring beams (or four length-measuring beams) from the interferometers 76X1, 76X2, 76Y are represented and indicated by the interferometer beams RIX1, RIX2, RIY.

In this arrangement, as shown in FIG. 5(A), the interferometers 76X1, 76Y, 76X2 perpendicularly radiate the interferometer light fluxes composed of at least three length-measuring beams respectively onto the reflecting surfaces 60a, 60b, 60c on the respective side surfaces of the regular triangular substrate table TB. The actuators ZACX1, ZACY, ZACX2 for making the tilting and the driving in the Z direction are arranged at the positions in the vicinity of the respective apexes of the substrate table TB opposing to the respective interferometer light fluxes. Accordingly, the actuators ZACX1, ZACY, ZACX2 can be independently controlled in accordance with the tilt angle of the corresponding reflecting surface measured by each of the interferometers. Therefore, it is possible to efficiently adjust the inclination of the substrate table TB. Additionally, the actuators ZACX1, ZACY, ZACX2, which are disposed at the positions furthest from the center of gravity of the substrate table TB, are driven and controlled. Thus, the arrangement makes it possible to obtain the high tilt driving control response.

With reference to FIG. 2 again, a spatial image detector KES, which is used to photoelectrically detect the image of the alignment mark and the image of the test pattern on the reticle R projected by the aid of the projection optical system PL, is fixed to a part of the substrate table TB. The spatial image detector KES is attached so that its surface is at approximately the same position as the height position of the surface of the wafer W. However, actually, the spatial image detector KES is set so that the image formation plane of the projection optical system PL is coincident with the surface of the spatial image detector KES when the substrate table TB is set at the center of the entire movement stroke (for example, 1 mm) in the Z direction.

Figure 6:
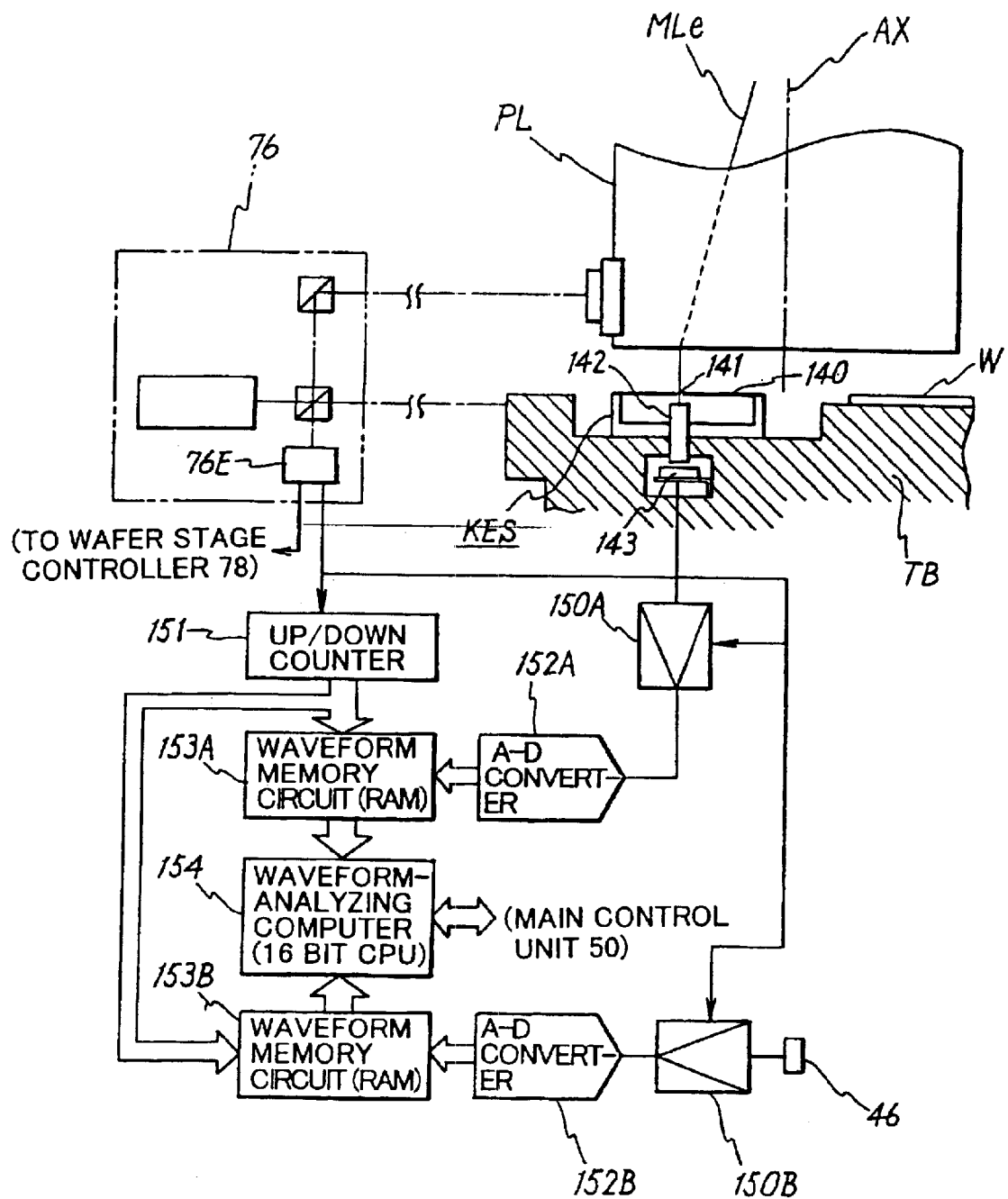
FIG. 6 schematically shows an arrangement of a spatial image detector attached onto the substrate table and an arrangement of a signal processing system related thereto.
Figure 7:
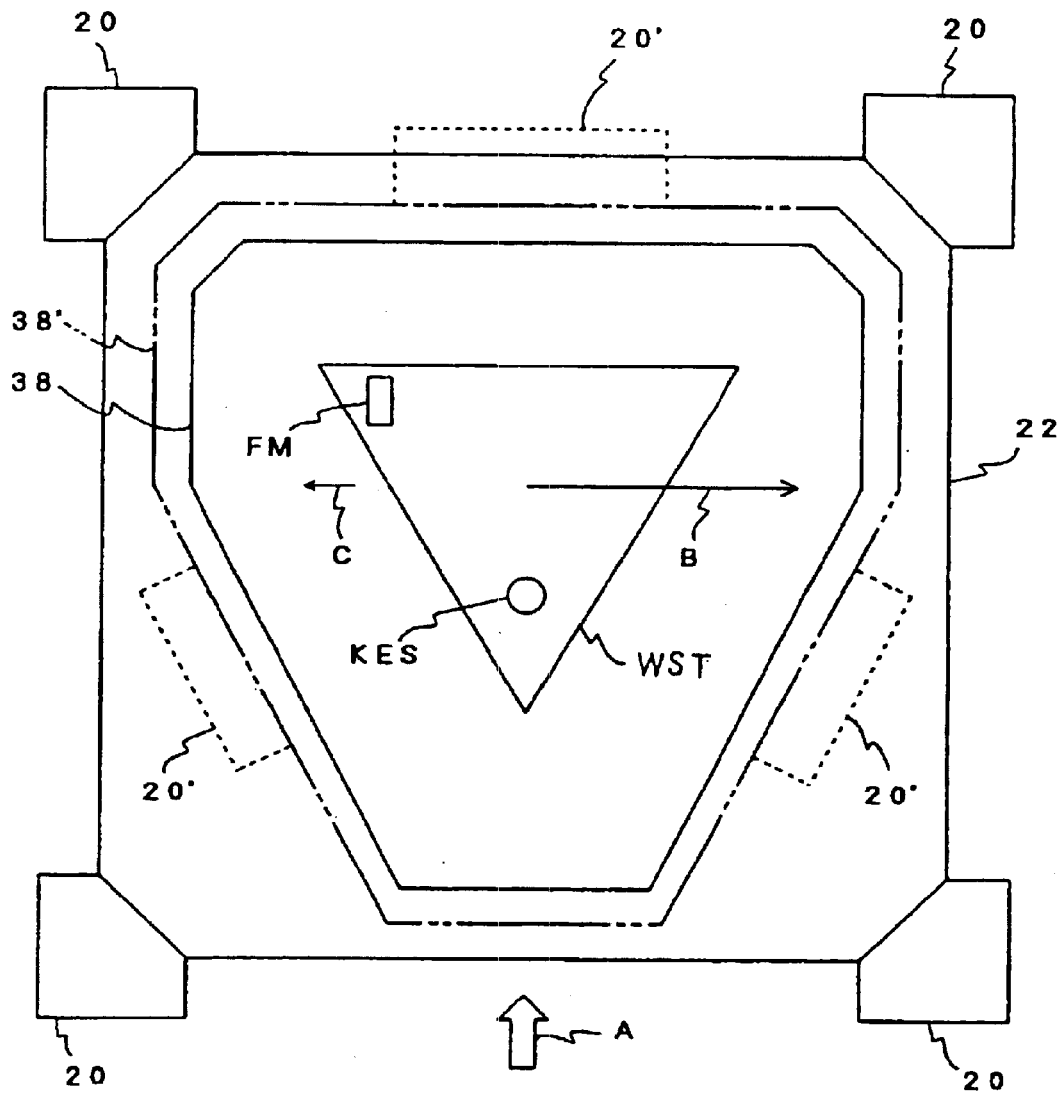
Figure 7:
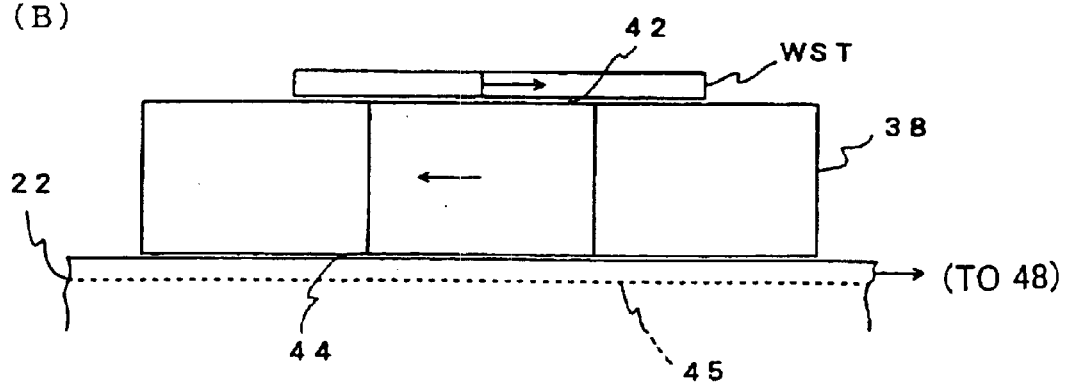

The spatial image detector KES is used to measure, for example, the exposure amount, the illuminance unevenness, and the image formation characteristic. Explanation will now be made for the arrangement of the spatial image detector KES and the image formation characteristic measurement based on the use of the same. FIG. 6 schematically shows the arrangement of the spatial image detector KES attached onto the substrate table TB shown in FIG. 2 and the arrangement of a signal processing system related thereto.

With reference to FIG. 6, the spatial image detector KES comprises, for example, a shield plate 140 which is provided to give the substantially same height as that of the surface of the wafer W on the substrate table TB (for example, within a range of about ±1 mm), a rectangular opening (knife edge opening) 141 which is formed at a predetermined position of the shield plate 140 and which is of about several tens μm to several hundreds μm, an optical pipe 142 made of quartz for allowing the image-forming light flux from the projection optical system PL transmitted through the opening 141 to come thereinto at a large NA (numerical aperture), and a semiconductor light-receiving element (for example, silicon photodiode or PIN photodiode) 143 for photoelectrically detecting the light amount of the image-forming light flux transmitted by the optical pipe 142 substantially without any loss.

When the exposing illumination light beam is obtained from the exposure light source 11 as in the embodiment of the present invention, the photoelectric signal, which is fed from the light-receiving element 143 of the spatial image detector KES, has a pulse waveform in response to the pulse light emission of the exposure light source 11. That is, it is assumed that MLe represents the image optical path from a certain object point on the unillustrated test reticle installed on the object plane of the projection optical system PL. When the exposure light source 11 shown in FIG. 2 is allowed to make light emission in a state in which the substrate table TB (i.e., the wafer stage WST) is positioned in the X, Y directions so that the image optical path MLe conforms to the rectangular opening 141 of the spatial image detector KES, then the photoelectric signal from the light-receiving element 143 also has the pulse waveform having a time width of about 10 to 20 ns.

Considering the foregoing fact, in this embodiment, the signal processing system for the spatial image detector KES is provided therein with a sample hold circuit (hereinafter referred to as "S/H circuit") 150A for inputting and amplifying the photoelectric signal from the light-receiving element 143 and alternately performing the sampling operation and the holding operation in response to the counting pulse signal for every 10 nm generated by a receiver 76E of the laser interferometer system 76. Additionally, the signal processing system is provided therein with an A-D converter 152A for converting the output of the S/H circuit 150A into a digital value, a waveform memory circuit (RAM) 153A for storing the digital value, and a waveform-analyzing computer 154. In this arrangement, the system further comprises an up/down counter 151 for counting the counting pulse signal for every 10 nm fed from the laser interferometer system 76, as the address counter for RAM 153A.

In the embodiment of the present invention, the control computer 11B (see FIG. 2) for the excimer laser light source 11 triggers the pulse light emission in accordance with the coordinate position information calculated by the wafer stage controller 78 on the basis of the measured value from the laser interferometer system 76 and fed to the synchronous control system and the main control unit 50 as described later on. That is, in the embodiment of the present invention, the pulse light emission of the excimer laser light source 11 is performed in conformity with the coordinate position of the substrate table TB. The S/H circuit 150A holds the peak value of the pulse signal waveform from the light-receiving element 143 in synchronization with the pulse light emission. The peak value, which is held by the S/H circuit 150A, is converted into the digital value by the A-D converter 152A. The digital value is stored in the waveform memory circuit (RAM) 153A. The address upon the storage operation of RAM 153A is generated by the up/down counter 151. The position of the substrate table TB is allowed to definitely correspond to the address upon the storage operation of RAM 153A.

The peak intensity of the pulse light beam from the excimer laser light source 11 is subjected to variation of about several % for each pulse. Accordingly, in order to avoid any deterioration of the image measurement accuracy due to the variation, as shown in FIG. 6, the signal processing circuit of the embodiment of the present invention is provided therein with an S/H circuit 150B (having the same function as that of the S/H circuit 150 described above) into which the photoelectric signal (pulse waveform) from the photoelectric detector (integrator sensor) 46 provided in the illumination optical system described above to detect the intensity is inputted, an A-D converter 152B for converting the output of the S/H circuit 150B into a digital value, and a waveform memory circuit (RAM) 153B (to generate the address upon the storage operation commonly with RAM 153A) for storing the digital value.

Accordingly, the peak intensity of each of the pulse light beams from the excimer laser light source 11 is stored in RAM 153B in a state in which the position of the substrate table TB is allowed to definitely correspond to the address upon the storage operation of RAM 153B.

The digital waveforms, which are stored in respective RAM's 153A, 153B as described above, are read by the waveform-analyzing computer (CPU) 154. The measured waveform, which corresponds to the image intensity stored in RAM 153A, is subjected to normalization (subtraction) with the intensity fluctuation waveform of the illumination pulse light beam stored in RAM 153B. The normalized measured waveform is temporarily stored in the memory in the waveform-analyzing computer 154. The central position of the image intensity to be measured is determined with various waveform processing programs.

In the embodiment of the present invention, the test pattern image on the test reticle is detected by using the edge of the opening 141 of the spatial image detector KES. Therefore, the central position of the image analyzed by the waveform-analyzing computer 154 is determined as the coordinate position of the substrate table TB (wafer stage 14) measured by the laser interferometer system 76 when the center of the test pattern image coincides with the edge of the opening 141 in the XY plane.

The information on the central position of the test pattern image thus analyzed is fed to the main control unit 50. The main control unit 50 instructs the control computer 11B for the excimer laser light source 11, the wafer stage controller 78, and the waveform-analyzing computer 154 to perform the operation for successively measuring the positions of the respective projected images of the test pattern formed at a plurality of points (for example, ideal lattice points) on the test reticle.

The image formation performance of the projection optical system PL and the illumination characteristic of the illumination optical system are measured by using the spatial image detector KES as described above. The various optical elements and the mechanisms shown in FIG. 2 can be adjusted on the basis of the obtained result of the measurement.

A fiducial mark plate FM, which has its surface disposed at approximately the same height position as that of the surface of the wafer W, is provided on the substrate table TB of the embodiment of the present invention (see FIG. 7(A)). Fiducial marks (as described later on), which are detectable by various alignment systems described later on, are formed on the surface of the fiducial mark plate FM. The fiducial marks are used, for example, to check the point of detection center of each of the alignment systems (calibration), measure the base line length between the detection centers, check the position of the reticle R with respect to the wafer coordinate system, and check the position in the Z direction of the best image formation plane which is conjugate with the pattern plane of the reticle R. When the fiducial mark is formed on the surface of. KES described above, it is possible to perform the calibration in the X, Y, Z, and tilt directions with the identical fiducial plate. Therefore, it is possible to mitigate the accumulated error corresponding to each of the fiducial plates. Description will be made later on for the base line measurement and the reticle alignment based on the use of the fiducial mark plate FM.

The wafer transport robot 19 shown in FIG. 1 constitutes a part of the wafer transport system to transport the wafer W from the unillustrated wafer-placing section to the wafer stage WST. The wafer transport robot 19 is provided with a robot arm (wafer load/unload arm) 21 for delivering the wafer W with respect to the holder of the wafer stage WST moved to the predetermined loading position (delivery position).

The scanning type exposure apparatus 10 according to the embodiment of the present invention is provided with the off-axis alignment sensor (alignment optical system) as the alignment system for optically detecting the fiducial mark on the fiducial mark plate FM and the alignment mark formed for each of shot areas on the wafer W without using the projection optical system PL. As shown in FIG. 2, the alignment optical system ALG is arranged on the side of the projection optical system PL. The alignment optical system ALG radiates, through the objective lens, a non-sensitive illumination light beam (uniform illumination or spot illumination) onto the resist layer on the wafer W, and it photoelectrically detects the reflected light beam from the alignment mark or the fiducial mark by the aid of the objective lens. The photoelectrically detected mark detection signal is inputted into the signal processing circuit 68. The measured value of the laser interferometer system 76 is inputted into the signal processing circuit 68 by the aid of the wafer stage controller 78, the synchronous control system 88, and the main control unit 50. The signal processing circuit 68 performs the waveform processing in accordance with a predetermined algorithm for the photoelectrically detected mark detection signal to determine, on the basis of the result of the processing and the measured value of the laser interferometer system 76, the positional discrepancy amounts of the wafer mark and the fiducial mark with respect to the coordinate position of the wafer stage WST (shot alignment position) or the detection center so that the center of the mark coincides with the detection center of the alignment optical system ALG (for example, index mark, reference picture element on the image pickup plane, light-receiving slit, or spot light beam). The information on the determined alignment position or the positional discrepancy amount is fed to the main control unit 50 so that it is used, for example, to position the wafer stage WST during the alignment and set the start position of the scanning exposure for the respective shot areas on the wafer W.

As shown in FIG. 2, the scanning type exposure apparatus 10 of the embodiment of the present invention further comprises a reticle microscope for performing the reticle alignment, the reticle microscope being disposed over the reticle stage RST. Actually, two reticle microscopes 110 are arranged at a predetermined spacing distance in the non-scanning direction. However, in FIG. 2, the reticle microscope 110, which is disposed on the back side with respect to the plane of the paper, is hidden by the reticle microscope 110 which is disposed on the front side. Therefore, only one reticle microscope 110 is shown in FIG. 2.

The scanning type exposure apparatus 10 according to the embodiment of the present invention is further comprises the synchronous control system 80 for synchronously moving the reticle stage RST and the wafer stage WST, the synchronous control system 80 being provided in the control system. The synchronous control system 80 is operated as follows. That is, in order to mutually link the control of the driving system 29 performed by the reticle stage controller 33 and the control of the driving system 48 performed by the wafer stage controller 78 when the reticle stage RST and the wafer stage WST are synchronously moved especially during the scanning exposure, the states of the respective positions and the respective velocities of the reticle R and the wafer W measured by the reticle laser interferometer system 30 and the interferometer system 76 are monitored in real-time to make management so that the mutual relationship between them is predetermined. The synchronous control system 80 is controlled by various commands and parameters fed from the main control unit 50.

Next, explanation will be made for the arrangement of the control rack 14 shown in FIG. 1.

The control rack 14 is constructed as a distributed type system for individually controlling the respective units (for example, excimer laser light source 11, illumination optical system 18, reticle stage RST, wafer stage WST, and transport robot 19) of the main exposure apparatus body 12 respectively. The control rack 14 is composed of a single rack arrangement constructed by stacking, for example, a processor board rack section 104 for accommodating a plurality of processor boards for controlling the respective units, a rack section for accommodating the main control unit (microcomputer) 50 (see FIG. 2) for collectively controlling the respective processor boards, and a rack section for accommodating, for example, an operation panel 106 for man-machine interface with respect to an operator and a display 108. The overall operation of the main exposure apparatus body 12 is managed by means of the control rack 14.

The unit side computer such as a microprocessor is provided in each of the processor boards in the processor board rack section 104. The unit side computers are linked to the main control unit (microcomputer) 50 to thereby execute the series of exposure processes for a plurality of sheets of wafers.

The overall sequence for the series of exposure processes is collectively controlled in accordance with the predetermined process program stored in the unillustrated memory in the main control unit 50.

The process program is used to store, under the file name of the exposure process prepared by the operator, a package of parameter groups including the information concerning the wafer to be subjected to the exposure (for example, number of sheets to be processed, shot size, shot array data, alignment mark arrangement data, alignment condition), the information concerning the reticle to be used (for example, pattern type data, arrangement data of respective marks, and size of circuit pattern area), and the information concerning the exposure condition (for example, exposure amount, focus offset amount, offset amount of scanning velocity, offset amount of projection magnification, correction amount for various aberrations and image distortions, setting of σ value of illumination system and NA of illumination light beam, and setting of NA value of projection optical system).

The main control unit 50 analyzes the process program instructed to be executed, and it successively instructs, as commands, the operations of the respective constitutive elements necessary for the exposure process for the wafer, to the corresponding unit side computer. During this process, when one command is normally ended, each of the unit side computers feeds the status to indicate this fact to the main control unit 50. The main control unit 50, which has received the status, feeds the next command to the unit side computer.

During the series of operations, for example, when the wafer exchange command is fed from the main control unit 50, the wafer stage controller 78, which is the control unit for the wafer stage WST, is cooperated with the control unit for the wafer transport robot 19 to set the wafer stage WST and the arm 21 (wafer W) to be in the positional relationship as shown in FIG. 1.

A plurality of utility softwares are stored in the memory in the main control unit 50. The softwares are represented by two types, i.e., (1) the measurement program for automatically measuring the optical characteristics of the projection optical system and the illumination optical system, and evaluating the quality of the projected image (for example, distortion characteristic, astigmatism/frame characteristic, telecentric characteristic, and illumination numerical aperture characteristic), and (2) the correction program for carrying out the various correcting processes corresponding to the quality of the evaluated projected image.

Description of the Third Concept

Next, the role and the control method of the movable type base board 38 will be explained with reference to FIGS. 7(A) and 7(B). FIG. 7(A) shows a schematic plan view illustrating components disposed in the vicinity of the base board 22, and FIG. 7(B) shows a schematic front view as viewed in the direction of the arrow A shown in FIG. 7(A).

In FIG. 7(A), the arrow C indicates the movement distance of the movable type base board 38 caused by the reaction force exerted on the movable type base board 38 in accordance with the acceleration and deceleration when the wafer stage WST is moved by the distance of the arrow B.

A plurality of coils (not shown), which constitute the planar magnetically floating type linear actuator 42, are spread over the XY two-dimensional direction on the upper surface of the movable type base board 38 together with the unillustrated permanent magnet disposed at the lower surface of the wafer stage WST. The wafer stage WST is supported in an floating manner over the movable type base board 38 by the aid of the planar magnetically floating type linear actuator 42. The wafer stage WST is driven in an arbitrary two-dimensional direction by controlling the current allowed to flow through the coils.

Similarly, a plurality of coils (not shown), which constitute the planar magnetically floating type linear actuator 44, are spread over the XY two-dimensional direction on the upper surface of the base board 22 together with the unillustrated permanent magnet disposed at the lower surface of the movable type base board 38. The movable type base board 38 is supported in an floating manner over the base board 22 by the aid of the planar magnetically floating type linear actuator 44. The movable type base board 38 is driven in an arbitrary two-dimensional direction by controlling the current allowed to flow through the coils.

In this arrangement, no contact is made between the wafer stage WST and the movable type base board 38 and between the movable type base board 38 and the base board 22 respectively. Therefore, the friction between these components is extremely small. As a result, the law of conservation of momentum holds for the entire system including the wafer stage WST and the movable type base board 38.

Therefore, assuming that the mass of the wafer stage WST is m, and the mass of the movable type base board 38 is M, if the wafer stage WST is moved at a velocity v with respect to the movable type base board 38, then the movable type base board 38 is moved at a velocity of $V=mv/(M+m)$ in the opposite direction with respect to the base board 22 according to the law of conservation of momentum. However, the rate of acceleration is obtained by differentiating the velocity with respect to the time. Therefore, if the wafer stage WST is moved at a rate of acceleration a (if the force $F=ma$ is exerted), the movable type base board 38 receives a rate of acceleration $A=ma/(M+m)$ in the opposite direction by the reaction force of the force F.

In this case, the wafer stage WST is placed on the movable type base board 38. Accordingly, the wafer stage WST is moved with respect to the base board 22 at a velocity of $v\times\{1-m/(M+m)\}$ and hence at a rate of acceleration of $a\times\{1-m/(M+m)\}$. Therefore, if the mass m (weight: m g) of the wafer stage WST is approximate to the mass M (weight: M g) of the movable type base board 38, it is impossible to obtain a desired rate of acceleration and a desired maximum velocity of the wafer stage WST. Since the movement distance is proportional to the velocity, the movement amount of the movable type base board 38 is increased, and the foot print is deteriorated.

For example, it is assumed that there is given $m:M=1:4$. If it is intended to move the wafer stage WST in an amount of 300 mm in order to perform the exposure for the entire surface of 12-inch wafer, it is necessary to ensure a stroke of the movable type base board 38 of an amount of 60 mm which is ⅕ of 300 mm according to the foregoing expression $V=mv/(M+m)$.

Accordingly, in the embodiment of the present invention, in order to suppress the deterioration of the rate of acceleration of the wafer stage, the maximum velocity, and the foot print to be not more than 1 figure, the setting is made such that the ratio of the mass m of the wafer stage WST to the mass M of the movable type base board 38 is not more than m:M=1:9, i.e., the weight of the wafer stage WST is not more than ⅑ of the weight of the movable type base board 38.

In order to decrease the necessary stroke of the movable type base board 38, the wafer stage controller 78 varies, between the period of exposure and alignment and the period of other operations, the control response frequency for the planar magnetically floating type linear actuator 44 for driving the movable type base board 38.

The control response frequency will be described in further detail below. During the exposure, the wafer stage WST and the reticle stage RST are moved in synchronization with each other. If the control response frequency of the planar magnetically floating type linear actuator 44 for driving the movable type base board 38 is adjusted and used at several Hz, it is almost impossible to follow the reaction force to the movable type base board 38 of the planar magnetically floating type linear actuator 42 for driving the wafer stage WST controlled at several tens Hz. According to the law of conservation of momentum, the movable type base board 38 is freely moved to absorb the reaction force, and the influence of the reaction force is not exerted to the outside.

The wafer stage controller 78 is operated as follows. When the main exposure apparatus body 12 is inclined as a whole due to any change of the position of the reticle stage RST and the position of the wafer stage WST, it is possible to avoid the low frequency positional discrepancy in which the movable type base board 38 is moved in the direction of inclination, by controlling the control response of the planar magnetically floating type linear actuator 44 at several Hz.

Even when the setting is made to give m:M=1:9, if the wafer stage 300 is fully moved by 300 mm, then the movable type base board 38 is also moved by about 30 mm in the opposite direction. However, the stepping length in the non-scanning direction between the shot exposure processes is about 30 mm at most. Therefore, the movement of the movable type base board 38 at this time is about 3 mm. Accordingly, in the embodiment of the present invention, the wafer stage controller 78 increases the response frequency in the same direction as the stepping of the planar magnetically floating type linear actuator 44 for driving the movable type base board 38 to be several tens Hz during the deceleration of the wafer stage (during the stepping acceleration in the non-scanning direction) which does not affect the synchronous control performance after the scanning exposure to make control so that the movable type base board 38 is returned to the original position before the stepping in accordance with the feedback control based on the use of the linear encoder 45 (see FIG. 7(B)) as the position-measuring unit for detecting the position of the relative movement in the XY direction of the movable type base board 38 with respect to the base board 22. Accordingly, it is possible to decrease the movement amount of the movable type base board 38 (see phantom lines 38' in FIG. 7(A)). Further, it can be assumed that the movable type base board 38 and the base board 22 are in a fixed state during the foregoing process. Therefore, it is possible to improve, by 10%, the rate of acceleration and the maximum velocity of the wafer as well.

Such a control method is also applicable equivalently to the movement of the wafer stage WST during the other alignment and the movement to the loading position when the wafer is exchanged.

An air pad for avoiding the high frequency vibration such as the floor vibration and a linear actuator for removing the low frequency vibration accompanied thereto are carried on the vibration-preventive apparatus 20 for supporting the pedestal section 16. However, the apparatus is slightly inclined in some cases due to the positions of the reticle stage RST and the wafer stage WST. In such a case, it is necessary to correct the inclination by continuously applying a predetermined voltage to the linear actuator which constitutes the vibration-preventive apparatus 20. However, the service life of any part such as the actuator may be shortened, because the load is always applied to the actuator. In such a case, in the embodiment of the present invention, the wafer stage controller 78 moves the movable type base board 38 by the predetermined amount as described above to correct the center of gravity of the entire apparatus. Thus, it is possible to correct the inclination of the apparatus so that the load is not applied to the linear actuator. Accordingly, it is possible to prolong the service life of the part such as the actuator.

Owing to the various improvements as described above, in the embodiment of the present invention, the shape and the movable range of the movable type base board 38 are triangular with no apex (octagonal) indicated by solid lines and phantom lines shown in FIG. 7(A) respectively corresponding to the shape and the movable range of the wafer stage WST. In this arrangement, the scanning direction for the wafer stage WST is the vertical direction on the plane of paper in FIG. 7(A). In this embodiment, the base board 22 is formed to be substantially square. The four vibration-preventive apparatuses 20 for supporting the base board 22 are arranged in a quadrilateral configuration in order to enhance the rigidity. However, in order to effectively use the space, the shape of the base board 22 may be a shape similar to the shape indicated by the phantom lines 38' in FIG. 7(A), and the vibration-preventive apparatuses 20 may be arranged at three points indicated by the dotted lines in FIG. 7(A). Accordingly, it is clearly possible to improve the foot print. However, in this case, it is necessary to increase the rigidity of the vibration-preventive apparatus.

Figure 8:
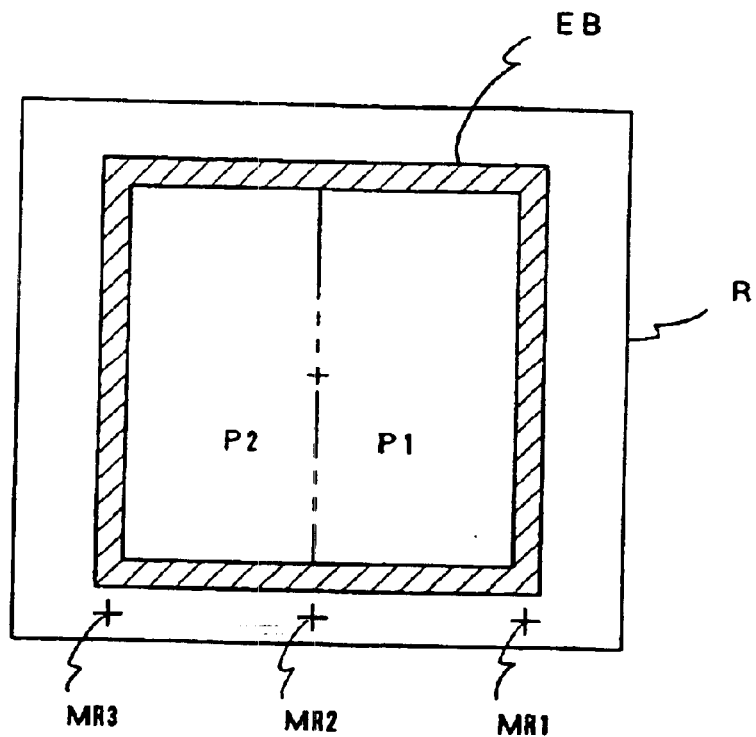
FIG. 8(A) shows a plan view illustrating an example of 9-inch reticle.
FIG. 8(B) shows a plan view illustrating another example of 9-inch reticle.
Figure 8:
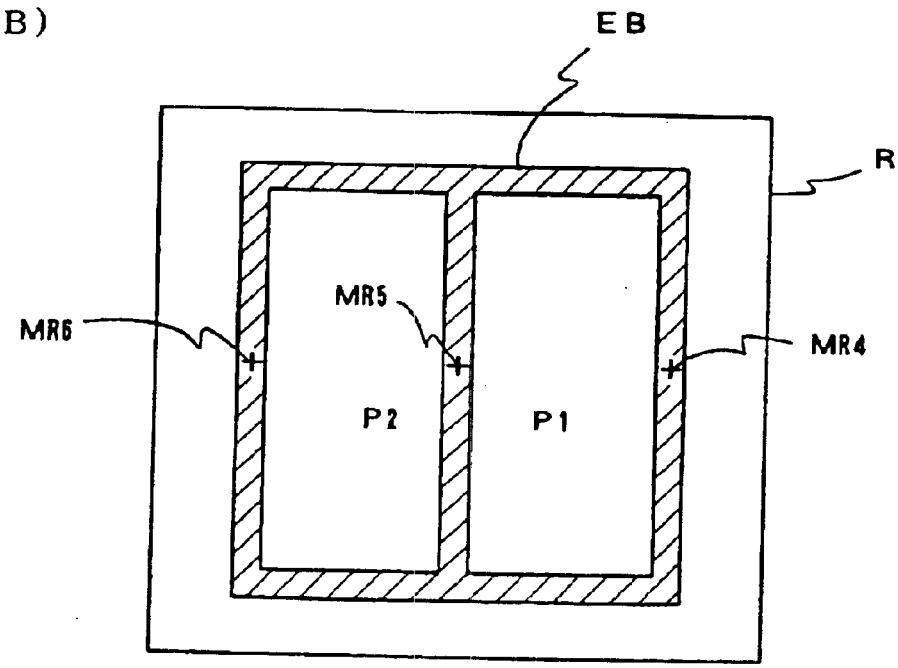

Next, explanation will be made with reference to FIGS. 8 and 9 for the reticle alignment and the base line measurement to be performed prior to the scanning exposure.

FIG. 8(A) shows a plan view illustrating a 9-inch size reticle R held on the reticle stage RST. As shown in FIG. 8(A), three reticle alignment marks MR1, MR2, MR3 are formed on the reticle R in the X direction on the first end side in the Y direction of the shield band EB for comparting the pattern area P.

Figure 9:
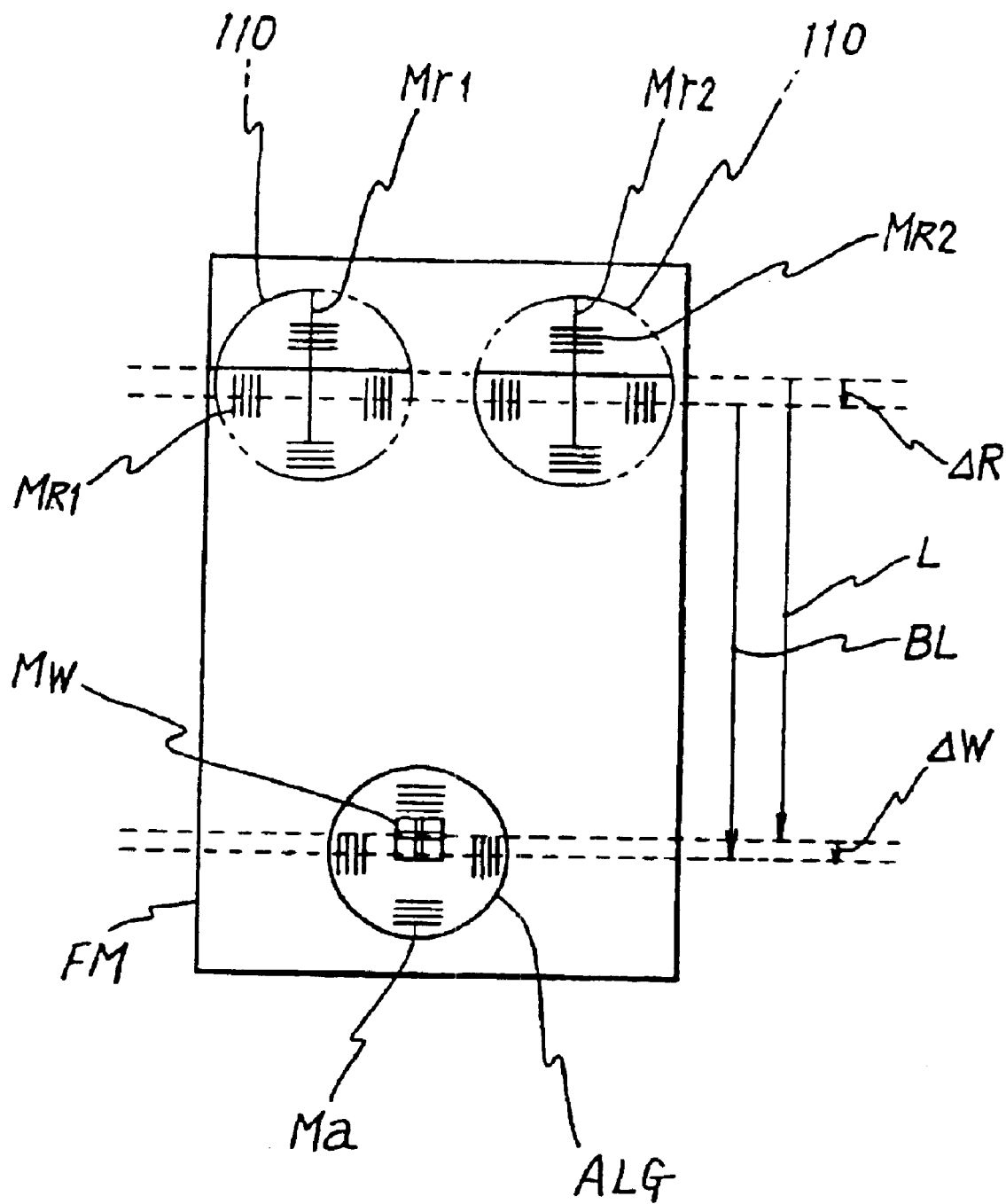
FIG. 9 illustrates the reticle alignment and the base line measurement.

On the other hand, as shown in FIG. 9, first fiducial marks Mr1, Mr2 and a second fiducial mark Mw are formed in a predetermined positional relationship on the fiducial mark plate FM. Accordingly, for example, before the scanning exposure for the area P1 on the reticle R, the reticle alignment and the base line measurement are performed as follows.

That is, the main control unit 50 moves the reticle stage to a position at which the reticle alignment marks MR1, MR2 can be simultaneously measured with the two reticle microscopes 110, by the aid of the reticle stage controller 33. The main control unit 50 drives the wafer stage WST by the aid of the wafer stage controller 78 to a position at which the first fiducial marks Mr1, Mr2 on the fiducial mark plate FM can be measured with the two reticle microscopes 110 simultaneously with the reticle alignment marks MR1, MR2. FIG. 9 shows a relative positional relationship at this time among the two reticle microscopes 110, the fiducial mark plate FM, and the alignment sensor ALG. In this arrangement, as also clarified from FIG. 9, the second fiducial mark Mw is measured by the alignment sensor ALG. That is, the first fiducial marks Mr1, Mr2 and the second fiducial mark Mw are formed on the fiducial mark plate FM in the positional relationship as described above. The positional relationship between the two reticle microscopes 110 and the alignment sensor ALG are determined.

In the state shown in FIG. 9, the main control unit 50 uses the alignment sensor ALG to measure the central position ΔW of the index Ma of the alignment sensor ALG with respect to the second fiducial mark Mw. Approximately simultaneously therewith, the two reticle microscopes 110 are used to measure the positions ΔR of the reticle alignment marks MR1, MR2 with respect to the first fiducial marks Mr1, Mr2.

In this case, the distance L from the first fiducial marks Mr1, Mr2 to the second fiducial mark Mw is known. Therefore, it is possible to determine the distance from the projection position of the first area P1 on the reticle R represented by the reticle alignment marks MR1, MR2 to the detection center of the alignment sensor ALG (i.e., the center of the index Ma), i.e., the base line amount BL. As clarified from FIG. 9, the base line amount BL to be determined is given by the following expression considering the sign of each of the amounts (direction of the arrow).

$$BL = L + \Delta W - \Delta R$$

Accordingly, after measuring ΔW and ΔR as described above, the main control unit 50 performs the operation in accordance with the foregoing expression to calculate the distance (relative positional relationship) from the projection position of the first area P1 on the reticle R to the detection center of the alignment sensor ALG (i.e., the center of the index Ma).

In exactly the same manner as described above, the reticle alignment and the base line measurement are performed before the scanning exposure for the area P2 on the reticle R. However, in this case, the reticle alignment marks Mr2, Mr3 are used for the reticle alignment.

For example, as shown in FIG. 8(B), when the shield band EB exists at the boundary between the first area P1 and the second area P2 on the reticle R, reticle alignment marks MR4, MR5, MR6 may be provided on the shield band EB at central portions in the longitudinal direction of the respective areas P1, P2. Similarly, if there is no trouble even when the reticle alignment mark is provided in the pattern area, the reticle alignment mark may be provided in the concerning area.

As clarified from the foregoing expression, in the embodiment of the present invention, the driving system, which can drive the movable type base-board 38 as the second movable member at the predetermined response frequency, is constructed by the planar magnetically floating type linear actuator 44. The control unit, which controls the position of the movable type base board 38 at the response frequency of not more than several Hz by the aid of the driving system, is constructed by the wafer stage controller 78. In the embodiment of the present invention, the planar magnetically floating type linear actuator 44 and the wafer stage controller 78 construct the second driving unit for driving the movable type base board 38 at the low response frequency on the base board 22 and positioning the movable type base board 38 at the predetermined point on the base board 22 on the basis of the output of the position-measuring unit (linear encoder 45) during the operation other than the exposure operation for the wafer W and the alignment operation.

Description of the Fourth Concept

Figure 10:
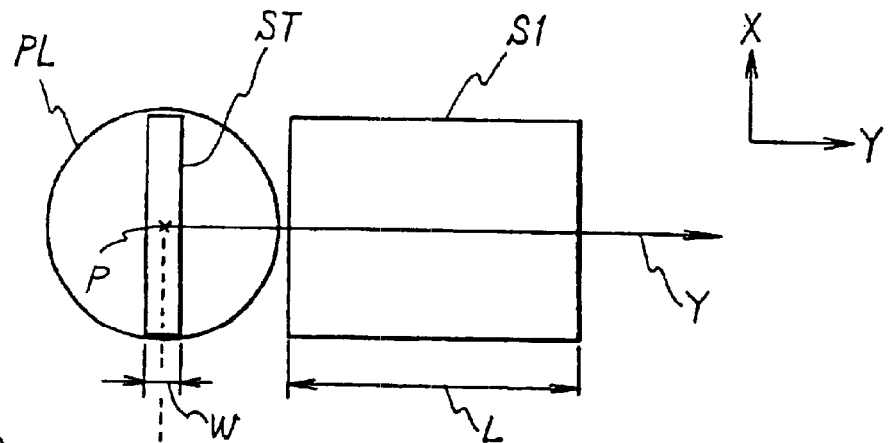
FIG. 10(A) shows a plan view illustrating the relationship between a shot area S1 and a slit-shaped illumination area on a wafer inscribing an effective field of a projection optical system.
FIG. 10(B) shows a diagram illustrating the relationship between the stage movement time and the stage velocity.
FIG. 10(C) illustrates the relationship between the wafer peripheral shot S and the movement mirror extension amount when the exposure is performed for the shot area S disposed at the periphery of the wafer.
Figure 10:
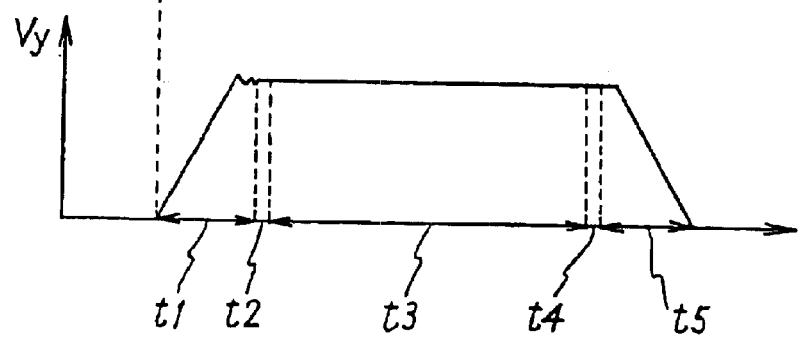
Figure 10:
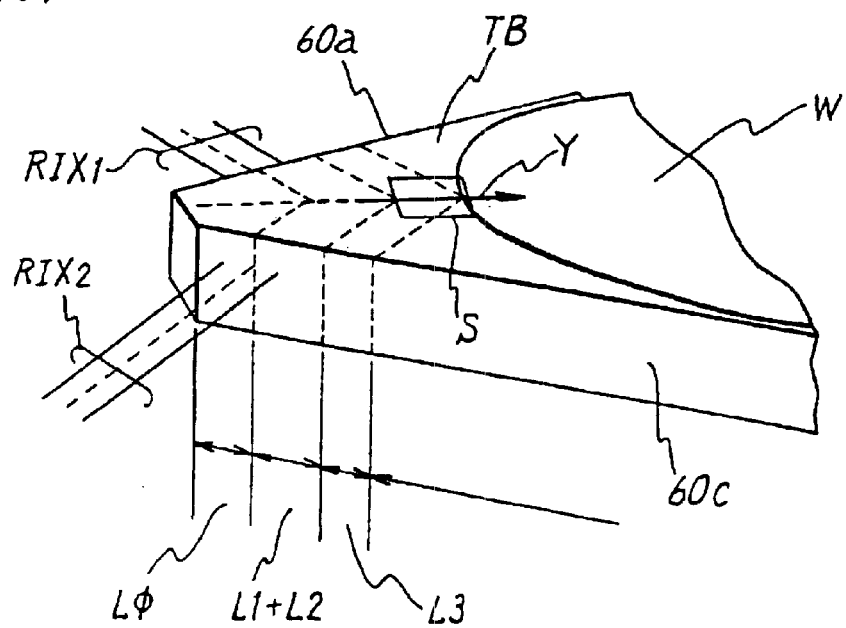

Next, brief explanation will be made with reference to FIG. 10 for the basic scanning procedure for the wafer stage during the one time of exposure for one shot area, performed by the stage control system (wafer stage controller 78, reticle stage controller 33, synchronous control system 80) for relatively moving the reticle stage RST and the wafer stage WST in the scanning direction (Y direction).

FIG. 10(A) shows a plan view illustrating a relationship between a slit-shaped illumination area ST (area conjugate to the illumination area on the reticle R, hereinafter referred to as "illumination slit") on the wafer inscribing the effective field PL' of the projection optical system PL and the shot area S1 as one comparted area. FIG. 10(B) shows a relationship between the stage movement time t and the stage velocity Vy. Actually, the exposure is performed by allowing the shot area S1 to move in a direction opposite to the arrow Y with respect to the illumination slit ST. However, in this description, the drawing is depicted such that the illumination slit ST on the wafer is moved with respect to the shot area S1 in order to give the corresponding relation with respect to the relationship table between the stage movement time and the stage velocity shown in FIG. 10(B).

At first, the basic (general) scanning procedure is performed such that the center P of the illumination slit ST is positioned at a position separated by a predetermined amount from the shot end of the shot area S1 to start the acceleration of the wafer stage WST. At a point of time at which the wafer stage WST approaches a predetermined velocity, the synchronous control is started for the reticle R and the wafer W. The time t1, which ranges from the point of time of the start of the acceleration to the point of time of the start of the synchronous control, is called "acceleration time". The follow-up control is performed by the reticle stage RST after the synchronous control is started until the displacement error concerning the wafer and the reticle gives a predetermined relationship, and then the exposure is started. The time t2, which ranges from the start of the synchronous control to the start of the exposure, is called "settling time".

The time (t1+t2), which ranges from the start of the acceleration to the start of the exposure, is called "pre-scanning time". Assuming that the average rate of acceleration at the acceleration time t1 is a, and the settling time is t2, the movement distance during the pre-scanning is represented by $(\frac{1}{2}) \cdot a \cdot t1^2 + a \cdot t1 \cdot t2$.

The exposure time t3 for performing the exposure in accordance with the constant velocity movement is $t3 = (L+w)/(a \cdot t1)$ provided that the shot length is L, and the width of the illumination slit ST in the scanning direction is w. The movement distance is L+w.

At the point of time at which t3 comes to the end, the transfer of the reticle pattern to the shot area S1 is completed. However, in order to improve the throughput, in the case of the step-and-scan manner, usually the exposure is successively performed for the next shot by effecting the alternate scanning (reciprocating scanning) of the reticle R. Therefore, it is necessary to further move the reticle R from the point of time of the exposure end by the same distance as that of the movement distance in the pre-scanning so that the reticle R is returned to the scanning start position for the exposure for the next shot (therefore, the wafer W is also moved in the scanning direction corresponding thereto). The period of time required for this process is the constant velocity over-scanning time t4 and the decelerating over-scanning time t5. In general, (t4+t5) is the over-scanning time. Assuming that the rate of deceleration in the decelerating over-scanning time t5 is b, the movement distance in the over-scanning time is $-(½)·b·t5^2-b·t5·t4$. The parameters t4, t5 and the rate of deceleration b are set so that the distance is $(½)·a·t1^2-a·t1·t2$.

In the case of the general control system, there is given a=-b. Therefore, when the setting is made to give t1=t5, t2=t4, the easiest control method is obtained. As described above, in the scanning exposure, the pre-scanning distance and the over-scanning distance are required to perform the constant velocity synchronous scanning. Even when the exposure is performed for the peripheral shot of the wafer, the interferometer light flux should not be deviated from the reflecting surface (movement mirror) during the pre-scanning and the over-scanning. Therefore, it is necessary that the reflecting surface is made long corresponding thereto.

Next, explanation will be made with reference to FIG. 10(C) for the setting of the length of each of the reflecting surfaces of the substrate table TB in the embodiment of the present invention. FIG. 10(C) shows the relationship between the wafer peripheral shot S and the extended amount of the movement mirror (L0, L1+L2, L3) when the shot area S at the periphery of the wafer is subjected to the exposure by scanning the wafer stage WST (substrate table TB) in the direction of the arrow Y. In FIG. 10(C), the necessary minimum length of the reflecting surface is the length of the reflecting surface 60a, 60c when the extension line of the interferometer beam RIX1, RIX2 intersects the outer circumference of the wafer W. Further, it is assumed that L3 represents the lacking imaginary shot length when the outer circumference of the wafer W can be exposed with the shot S in a lacked state, L1+L2 represents the distance required for the pre-scanning and the over-scanning, and L0 represents the total sum of the predetermined margin, the radii of the respective beams, and the distances to the centers of the respective length-measuring beams concerning the central positions (dotted lines) of the two length-measuring beams when the interferometer beams are the two length-measuring beams in the XY plane. The amount of extension of the reflecting surface is L0+L1+L2+L3. The length of the reflecting surface is set so that the value is smaller than the apex of the triangle of the substrate table TB. Accordingly, it is possible to avoid such an inconvenience that the length-measuring beam is deviated from the reflecting surface during the scanning exposure. However, it is unnecessary that the shot at the outer circumference of the wafer is subjected to the exposure perfectly for the amount of the shot length L. Therefore, the extension amount of the movement mirror may be L0+L1+L2 by making control such that only the portion exposed on the wafer is subjected to the exposure.

Description of the Second Concept (II)

The basic scanning procedure for the wafer stage when one shot area is subjected to the exposure has been explained above. Next, detailed explanation will be made for the movement control method for the wafer stage WST (substrate table TB) when a plurality of adjacent shot areas are successively exposed with the reticle pattern. Explanation will now be made, for example, for a case in which adjacent shot areas S1, S2, S3 shown in FIG. 11(A) are successively subjected to the exposure.

FIG. 11(A) shows a locus along which the center P of the illumination slit ST on the wafer passes over the respective shots when the shots S1, S2, S3 are successively subjected to the exposure. As clarified from FIG. 11(A), the wafer stage controller 78 and the synchronous control system 80 perform, at the same timing, the pre-scanning and the over-scanning of the wafer stage WST in the scanning direction (Y direction) and the stepping of the wafer stage WST in the non-scanning direction (X direction). Accordingly, the movement distance of the wafer stage WST between the shots is shortened, and hence the movement time required for this process is shortened. Thus, it is possible to improve the throughput.

As described above, the pre-scanning time includes the settling time t2 for allowing the reticle R to completely follow the wafer W. Therefore, it is desirable that the control of the acceleration and deceleration concerning the non-scanning direction is completed before the point of time of the start of the settling time t2 as early as possible. In order to realize this object, in the embodiment of the present invention, the wafer stage controller 78 and the synchronous control system 80 are operated such that the stepping in the non-scanning direction is started for the wafer stage WST during the constant velocity over-scanning time t4 in the scanning direction of the wafer stage WST following the end of the exposure. The control is made such that the acceleration and deceleration control generated in the non-scanning direction is completed earlier by the constant velocity over-scanning time t4. FIG. 11(B) shows the relationship between the time and the velocity Vy of the wafer stage WST in the scanning direction in this process, and FIG. 11(C) shows the relationship between the time and the velocity Vx in the non-scanning direction corresponding thereto. According to the method for controlling the movement of the wafer stage, the control in the non-scanning direction is unnecessary during the settling time t2, and it is enough to perform the synchronous control in the scanning direction.

It is assumed that the stepping direction is along the X axis, and the scanning direction is along the Y axis. Discussion will be made specifically for the respective axes for the time allocation provided that the scanning velocity of the shot S1 during the exposure is -VY, and the maximum velocity during the stepping is VX.

At first, discussion will be made for the scanning direction. The deceleration of the wafer stage WST (acceleration in the +Y direction having the velocity in the -Y direction in FIG. 11(A)) is started after the over-scanning time t4 after completing the exposure for the shot S1. It is assumed that the rate of deceleration during this process is ay. With the reference point of the point O (0, 0) in FIG. 11(A), the wafer stage WST travels in the scanning direction by -VY·t4 in the time t4. Subsequently, with the reference point of time at the point of time of passage of the time t4, the wafer stage WST is subjected to the change of $-VY·t+(½)·ay·t^2$ to arrive at the turning point B (see FIG. 11(A)) at which the pre-scanning is started for the shot S2 as another comparted area at the point of time to satisfy $-VY·t+(½)·ay·t^2=-VY·t·(½)$, i.e., at the point of time to give t=ty5=VY/ay (see FIG. 11(B)). After that, with the reference point of the time of the acceleration start point, the wafer stage WST travels along a locus of $½·ay·t^2$ during the acceleration period to continue the acceleration until ty1=VY/ay is given. Subsequently, the exposure is started after passage of t2 as the synchronous control period for the reticle R and the wafer W. The exposure time t3 is represented by t3=(shot length Ly+illumination slit width w/VY).

Next, discussion will be made for the stepping direction. The wafer stage WST starts the acceleration immediately after the completion of the exposure for the shot S1. Assuming that the rate of acceleration is ax, the X coordinate of the wafer stage WST is $(½)\cdot ax\cdot t^2$ with the reference point of the point O in FIG. 11(A). The wafer stage WST arrives at the maximum velocity at t=tx5=VX/ax (see FIG. 11(C)). If there is given the stepping length $Lx \leq ax\cdot tx5^2$, the deceleration (acceleration in the −X direction having the velocity in the +X direction) is started at the point of time of tx5=(Lx/ax). After that, with the reference point of the time of the deceleration start point, the wafer stage WST is subjected to the change of $ax\cdot tx5\cdot t−(½)\cdot ax\cdot t^2$ during the deceleration period, and it is decelerated and stopped at the point of time to give $ax\cdot tx5\cdot t−(½)\cdot ax\cdot t^2=(½)\cdot ax\cdot tx5\cdot t$, i.e., at the point of time of the passage of the time tx1 from the deceleration start point.

That is, as shown in FIG. 11(B), as for the scanning direction, the exposure is started for the next shot by t4+ty5+ty1+t2 from the point of time of the completion of the exposure for the previous shot. However, as shown in FIG. 11(C), the acceleration and deceleration are completed in the stepping direction at the point of time of tx5+t4+tx1 from the point of time of the completion of the exposure for the previous shot. Accordingly, if there are given ty1=tx1, ty5=tx5, considering the fact that there is given t2=t4 as described above, it is understood that the stepping operation is completed earlier by t4 than the start of the synchronous control at the settling time t2 in the scanning direction. In this process, the locus of the wafer stage WST is parabolic. The actual parabola is represented by $y=x^2$ or $y=\sqrt{x}$. If t is erased, a function is obtained, which contains $x^2$ and $\sqrt{x}$. Therefore, conveniently, the parabolic configuration represents those including such functions.

This fact may be expressed in another way as follows. That is, the wafer stage controller 78 and the synchronous control system 80 control the movement of the wafer stage WST in the respective X and Y directions so that the stepping operation in the non-scanning direction is performed concurrently with the over-scanninq operation and the pre-scanning operation of the wafer stage WST in the scanning direction in order that the X coordinate Bx of the point B (Bx, By) shown in FIG. 11(A) as the point at which the velocity in the scanning direction is zero, i.e., the point at which the deceleration is completed and the acceleration for the exposure for the next shot is started is deviated toward S2 with respect to the boundary between the shots S1, S2.

In the foregoing explanation, the rate of acceleration during the stepping is ±ax. However, if the condition is set such that the rate of acceleration during the deceleration is −bx corresponding to ax during the acceleration to give |−bx|<ax, then the acceleration itself is suppressed to be small, although it takes a long stepping time. Therefore, an effect is obtained in that the apparatus vibration itself can be suppressed to be small as well.

In the foregoing explanation, the case has been described, in which there is given the stepping length $Lx \leq ax\cdot tx5^2$. However, if there is given $Lx>ax\cdot tx5^2$, the position of the wafer stage WST in the X direction may be controlled such that the deceleration operation is started after the scanning at the maximum velocity VX during the period of time tx6 to satisfy $tx6=(Lx−ax\cdot tx5^2)$. However, in any case, it is important that the rate of acceleration ax and the maximum velocity VX are set to give $t4+ty5+ty1 \geq tx5+tx6+tx1$. By doing so, the concurrent operation is performed with respect to the pre-scanning and the over-scanning for all of the stepping time. Thus, the throughput is improved.

That is, according to the scanning exposure method which adopts the method for controlling the movement of the wafer stage WST (substrate table TB) explained with reference to FIGS. 11A to 11(C), the reticle R and the wafer W are synchronously moved in the Y direction (first direction) as the scanning direction to perform the scanning exposure for the shot S1, and then the acceleration of the wafer W in the scanning direction is started before the wafer W arrives at the position of the shot S2 adjacent to the shot S1 concerning the X direction (non-scanning direction) (during the deceleration before the completion of the stepping in the non-scanning direction between the shots) to perform the scanning exposure for the shot S2 with the pattern on the reticle R. In other words, the movement to the shot S2 is started after the completion of the exposure for the shot S1 while the acceleration of the wafer in the scanning direction is started during this process. Therefore, the movement time of the shot 52 in the non-scanning direction can be completely overlapped with the acceleration time in the scanning direction for the exposure for the shot S2. It is clear that the throughput can be improved as compared with the illustrative conventional technique in which the acceleration in the scanning direction is started for the exposure for the shot S2 after the arrival of the wafer W at the position of the shot S2.

Figure 11:
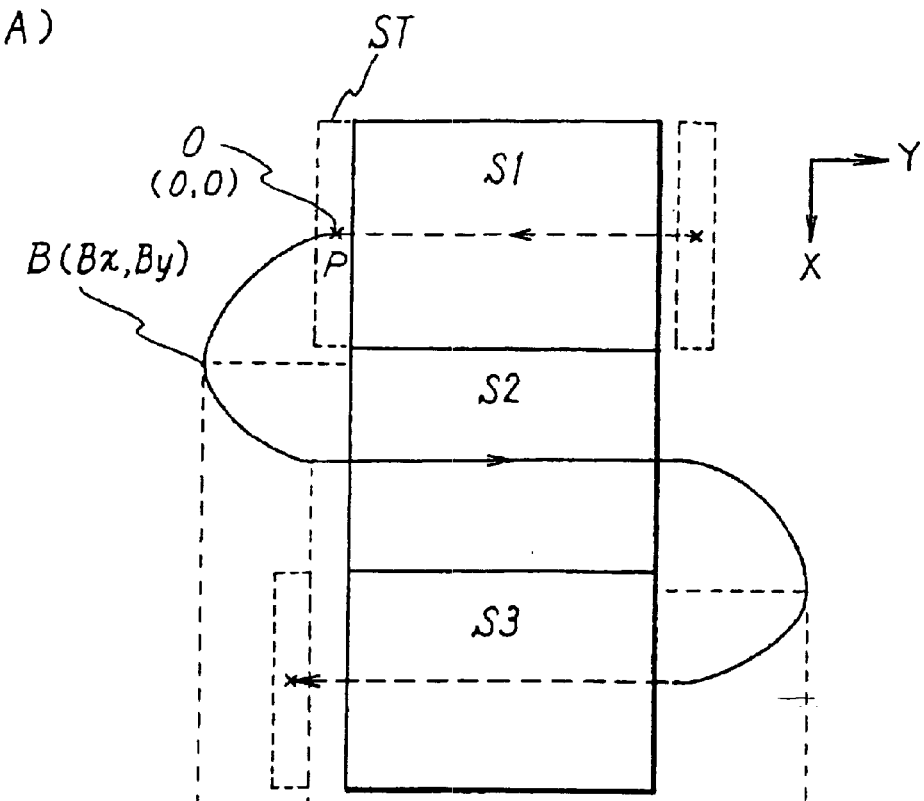
FIG. 11(A) shows a locus along which the center P of the illumination slit ST on the wafer passes over the respective shots when the shots S1, S2, S3 are successively exposed.
FIG. 11(B) shows a diagram illustrating the relationship between the time and the velocity of the wafer stage in the scanning direction in the case of FIG. 11(A)
FIG. 11(C) shows a diagram illustrating the relationship between the time and the velocity in the non-scanning direction corresponding thereto.
Figure 11:
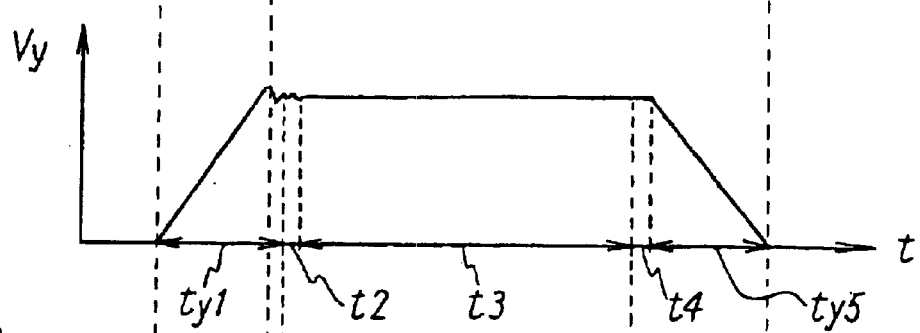
Figure 11:
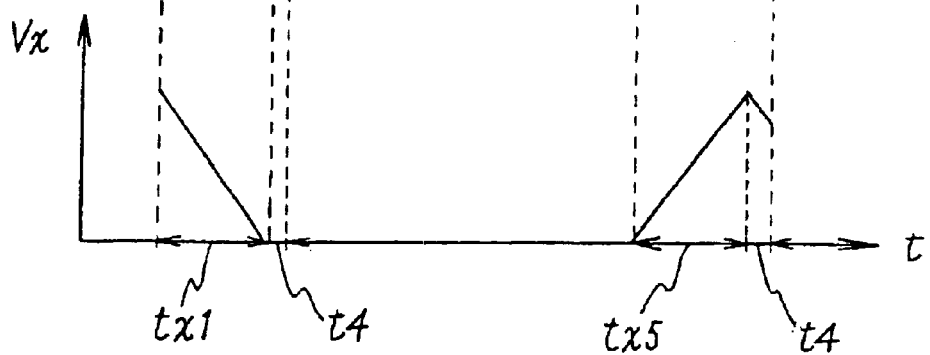

In the case of the arrangement shown in FIG. 11, the acceleration of the wafer W in the non-scanning direction is started during the constant velocity movement in the scanning direction after the completion of the scanning exposure of the shot S1, because of the following reason. That is, it is intended that the stepping operation is completed earlier by t4 than the start of the synchronous control at the settling time t2 in the scanning direction. There is no limitation thereto. It is also preferable that the acceleration of the wafer W in the non-scanning direction is started during the deceleration of the wafer W.

In this arrangement, the wafer W is accelerated in the direction intersecting the scanning direction before the scanning exposure for the shot S2. The movement velocity in the scanning direction is set to be the velocity corresponding to the sensitivity characteristic of the wafer W. Therefore, the synchronous control may be made for the reticle while maintaining the velocity during the exposure. Accordingly, it is easy to perform the control.

As clarified from FIGS. 11(B) and 11(C), the wafer W is moved between the scanning exposure for the shot S1 and the scanning exposure for the shot S2 so that at least one of the movement velocity in the scanning direction and the movement velocity in the non-scanning direction is not zero. Therefore, the movement is performed without any stop between the scanning exposure for the shot S1 and the scanning exposure for the shot S2. Thus, the throughput is improved corresponding thereto.

As clarified from FIG. 11(A), the wafer W is moved between the scanning exposure for the shot S1 and the scanning exposure for the shot S2 so that the position of the point B in the X direction, at which the movement velocity in the scanning direction is zero, is nearer to the shot S2 as compared with the shot S1. Accordingly, even when the rate of acceleration in the non-scanning direction of the wafer W is equal to the rate of deceleration between the shot S1 and the shot S2, the velocity in the non-scanning direction is necessarily zero, a certain period of time (t2 in the foregoing example) before the start of the exposure for the shot S2. Therefore, it is unnecessary to increase the rate of deceleration after the acceleration of the wafer W in the non-scanning direction between the scanning exposure for the shot S1 and the scanning exposure for the shot S2. No influence thereof remains at the point of time of the start of the exposure, and the synchronous settling time is not unnecessarily prolonged.

However, it is unnecessary that the wafer W is moved along the movement locus as shown in FIG. 11(A) between the scanning exposure for the shot S1 and the scanning exposure for the shot S2. For example, the following procedure is available. That is, the position of the wafer in the non-scanning direction (position of the point B in the X direction), at which the velocity component of the wafer W in the scanning direction is zero after completing the scanning exposure for the shot S1, is deviated toward the shot S1, and the wafer is moved obliquely with respect to the scanning direction and the non-scanning direction in order to perform the scanning exposure for the shot S2. Alternatively, the wafer W may be moved between the scanning exposure for the shot S1 and the scanning exposure for the shot S2 such that the position of the wafer W in the non-scanning direction (position of the point B in the X direction), at which the velocity component in the scanning direction is zero after completing the scanning exposure for the shot S1, is located between the position of the shot S1 in the non-scanning direction and the position of the shot 52 in the non-scanning direction. In these cases, when the scanning exposure for the shot S1 is completed, the wafer W is moved in the non-scanning direction while decelerating the velocity in the scanning direction. The substrate is moved obliquely with respect to the scanning direction and the non-scanning direction along a curved (or straight) route. Therefore, the movement locus of the wafer W after completing the scanning exposure for the shot S1 is shorter than the conventional ]-shaped route. The substrate is moved along the route which is approximate to the shortest distance. It is possible to improve the throughput corresponding thereto. In this case, the movement locus of the wafer W may be V-shaped. However, it is desirable that the wafer W is moved without any stop between the scanning exposure for the shot S1 and the scanning exposure for the shot S2 so that the locus is parabolic (or U-shaped).

As clarified from FIG. 11(A) (FIG. 11(C)), the wafer W is accelerated in the direction intersecting the scanning direction and the non-scanning direction after the scanning exposure for the shot S1, and then the exposure is started after the constant velocity movement in the scanning direction for the predetermined period of time (t2+α). Therefore, the velocity component of the substrate in the scanning direction does not affect the scanning exposure.

In this process, the acceleration of the reticle R is started during the movement of the wafer W in the direction intersecting the scanning direction and the non-scanning direction, and hence before the velocity component of the wafer W in the non-scanning direction is zero. Therefore, the time, which is required to give the constant velocity synchronous state of the reticle R and the wafer W, is shortened as compared with the case in which the acceleration of the reticle R is started after the transition to the constant velocity movement of the wafer. Accordingly, it is possible to improve the throughput corresponding thereto. The rate of acceleration and the rate of deceleration (negative rate of acceleration) described above refer to the average acceleration and deceleration during the operation. It is needless to say that an effect equivalent to that of the embodiment of the present invention is obtained even in the case of the acceleration and deceleration map control in order to smoothly perform the acceleration and deceleration.

Next, explanation will be made for the relationship with respect to the scanning velocity, of the extension distance of the measuring reflecting surface (movement mirror) in the non-scanning direction of the wafer stage and the time required to perform the exposure for one wafer, required concerning the pre-scanning and the over-scanning described above.

FIGS. 19(A) and 19(B) show the data actually measured with the projection exposure apparatus of the step-and-scan manner based on the use of the conventional rectangular stage in the case of t4+ty5+ty1≧tx5+(tx6)+tx1 described above with the slit width: 8 mm, the shot length: 33 mm, the shot length: 25 mm, the shot number: 65 (wafer shot number obtained for 33×25 shot size on 12-inch wafer), the minimum pulse number of the laser pulse necessary to perform the exposure for one shot: 32, the modulation frequency of the exposing pulse laser: 1 k to 2 kHz variable control, the interferometer beam diameter: 5 mm, the double-path interferometer spacing distance: 19 mm, and the interferometer spacing distance for measuring the yawing: 35 mm. Especially, FIG. 19(A) shows the extension distance of the wafer side movement mirror necessary when the reticle scanning maximum velocity Vr is changed under three conditions of (reticle rate of acceleration Ar, settling time t2)=(3 G, 22 ms), (4 G, 36 ms), (4 G, 22 ms) provided that the projection magnification is ¼-fold. FIG. 19(B) shows the time required to perform the exposure for one sheet of wafer when the reticle scanning maximum velocity Vr is changed under the same conditions as those used for FIG. 49(A).

FIG. 20(A) shows a graph corresponding to FIG. 19(A) in which the horizontal axis is the reticle scanning maximum velocity, and the vertical axis is the extension distance of the movement mirror. FIG. 20(B) shows a graph corresponding to FIG. 19(B) in which the horizontal axis is the reticle scanning maximum velocity, and the vertical axis is the time required to perform the exposure for one sheet of wafer (the rate of acceleration and the velocity of the wafer are obtained by multiplying the reticle condition by the projection magnification).

Figure 20:
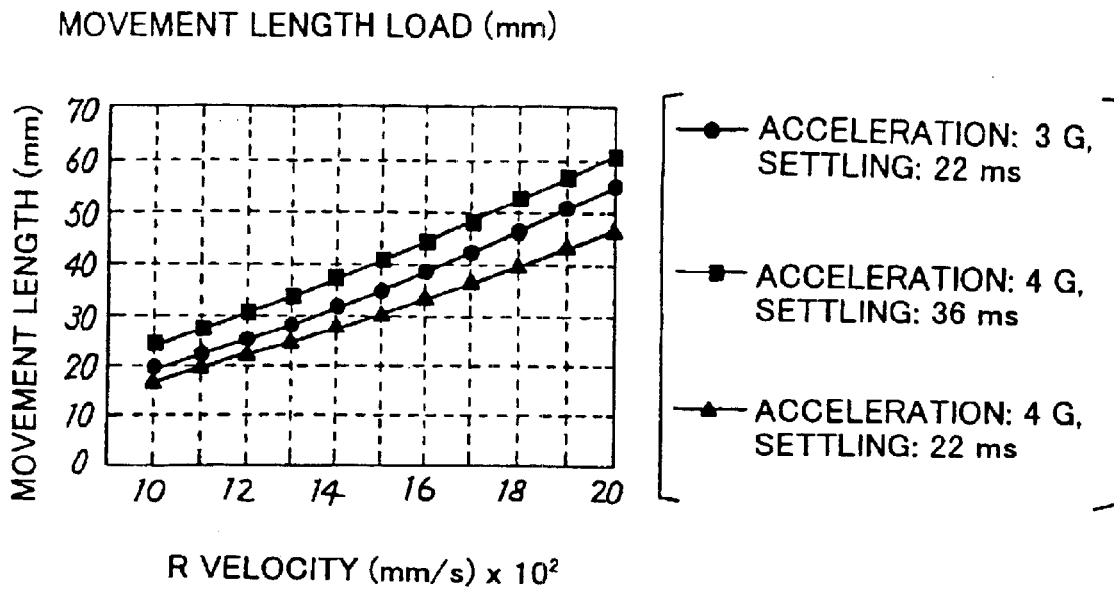
FIG. 20(A) shows a graph corresponding to FIG. 19(A) in which the horizontal axis is the reticle scanning maximum velocity and the vertical axis is the extension distance of the movement mirror.
FIG. 20(B) shows a graph corresponding to FIG. 19(B) in which the horizontal axis is the reticle scanning maximum velocity and the vertical axis is the period of time required to expose one sheet of wafer.
Figure 20:
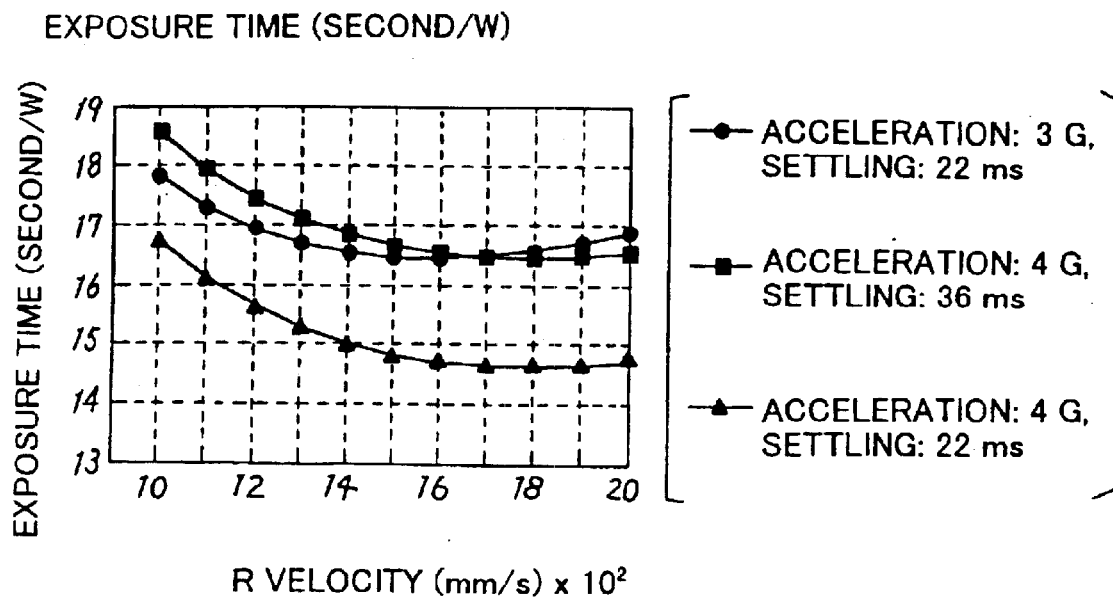

As understood from FIG. 19 and FIG. 20, for example, when Vr is changed under the condition of (4 G, 36 ms), if Vr is increased to a range of 1600 to 2000 mm/s, then the exposure time is 16.5 seconds/wafer, and the throughput is improved. However, in the case of Vr of not less than 1600 mm/s, the exposure time is not further shortened. On the other hand, if the velocity Vr is increased from 1600 to 2000 mm/s, the movement mirror extension distance is increased. The movement mirror extension distance is 61 mm at 2000 mm/s. That is, there is merely a slight difference of 0.2 second concerning the time required for the exposure between those obtained when Vr is 1500 mm/s and 2000 mm/s. As for other conditions such as the wafer exchange time, even when the alignment time is 15 seconds, the number of sheets of wafers processed per unit time is 3600/(16.7+15)=114.28 sheets/h, 3600/(16.5+15)=113.56 sheets/h. There is only a difference of one sheet. On the contrary, the difference in the extension amount of the movement mirror under the same condition is 61.0−41.1= 19.9 mm (one direction). Assuming a rectangular stage with one side of 300 mm, the amount of increase in the stage areal size, i.e., the amount of increase in the weight is about 13% of 19.9×2/300, giving a great influence on the control performance. Therefore, in view of the wafer stage control performance, it is more efficient that the rate of acceleration Ar/4 during the scanning (ay as the wafer side rate of acceleration) and the scanning velocity Vr/4 (VY as the wafer side velocity) are set by degrading the velocity condition up to a limit at which the deterioration of the throughput is suppressed to be within 1% with respect to the condition in which ty1+t2+t3+t4+ty5 is minimum (it is assumed that there are given ty1=ty5, t2=t4, and ay is fixed), i.e., the wafer velocity condition determined by the local minimum point of VY/ay+t2+(Ly+w)/VY.

For example, when comparison is made for the conditions of (4 G, 36 ms) and (4 G, 22 ms), it is confirmed that the throughput is extremely deteriorated by the deterioration of the settling time due to the decrease in the wafer stage control performance.

The foregoing description is directed to the conventional rectangular stage. Although there is any difference in degree of influence as compared with the conventional stage, the same fact is affirmed for the triangular wafer stage WST according to the embodiment of the present invention. It is desirable that the velocity condition is set from the same viewpoint as described above.

Figure 12:
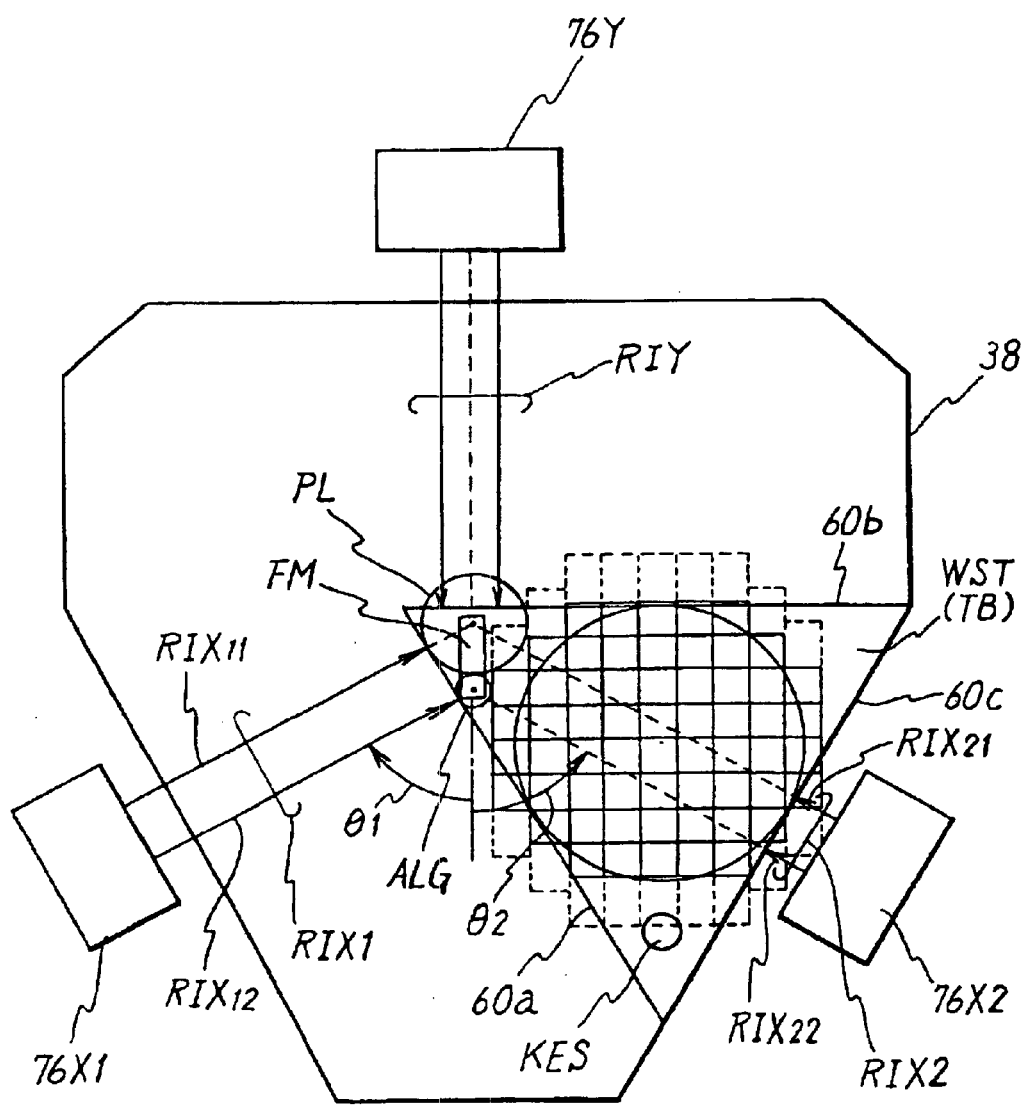
FIG. 12 shows a plan view illustrating components disposed in the vicinity of the movable type base board when the wafer stage is positioned at the loading position for exchanging the wafer W.

Next, with reference to FIG. 12, detailed description will be made, for example, for the arrangement, in the apparatus, of the length-measuring beams of the first, second, and third interferometers 76X1, 76Y, 76X2 for constructing the interferometer system shown in FIG. 2, and the method for calculating the X, Y position and the rotation of the substrate table TB, performed by the wafer stage controller 78. FIG. 12 shows a plan view illustrating components disposed in the vicinity of the movable type base board 38 when the wafer stage WST is positioned at the loading position for exchanging the wafer W.

As shown in FIG. 12, the interferometers 76X1, 76Y, 76X2, which are used to monitor the position of the wafer stage WST on the XY control system (stage control system), have the two length-measuring beams respectively as viewed in the plan view. The respective two length-measuring beams serve as two independent light fluxes for measuring the yawing, and they effect radiation onto the three reflecting surfaces 60a, 60b, 60c of the substrate table TB (the interferometer length-measuring beam for the measurement in the inclination direction is not shown in the drawing).

The optical axis of the projection optical system PL is located at the position at which the extension line of one of the length-measuring beams (length-measuring beams of the first length-measuring axis RIX11 and the third length-measuring axis RIX21) radiated from the first and third interferometers 76X1, 76X2 respectively intersects the extension line of the center line of the two length-measuring beams radiated from the second interferometer 76Y. The detection center of the alignment optical system ALG is located at the position at which the extension lines of the remaining length-measuring beams (length-measuring beams of the second length-measuring axis RIX12 and the length-measuring beam of the fourth length-measuring axis RIX22) radiated from the interferometers 76X1, 76X2 respectively make intersection, and at which the extension line of the center line of the two length-measuring beams radiated from the second interferometer 76Y makes intersection.

In this arrangement, the wafer stage controller 78 always calculates, as the Y position of the substrate table TB, the average value (y1+y2)/2 of the measured values y1, y2 of the positions in the Y axis direction obtained by using the two length-measuring beams radiated from the interferometer 76Y. That is, the substantial length-measuring beam of the interferometer 76Y is the Y axis which passes through the optical axis of the projection optical system PL and the detection center of the alignment optical system ALG. The two length-measuring beams, which are radiated from the interferometer 76Y, are not deviated from the second reflecting surface 60b of the substrate table TB in any case, i.e., even when the wafer stage WST is located at any position in the X direction. The rotation (yawing) of the substrate table TB can be also determined by using any two measured values of the interferometers 76X1, 76X2, 76Y. However, as described later on, there is a possibility that one of the length-measuring beams of the interferometers 76X1, 76X2 is deviated from the reflecting surface of the substrate table during the alignment. Therefore, the wafer stage controller 78 also calculate the rotation of the substrate table TB on the basis of the difference between the measured values y1, y2 of the positions in the Y axis direction obtained by using the two length-measuring beams radiated from the interferometer 76Y. When the rotation can be determined on the basis of the measured values with the interferometers 76X1, 76X2, 76Y respectively, the wafer stage controller 78 may determine the rotation on the basis of any arbitrary one of the rotation amounts determined respectively, or an arithmetic mean of arbitrary two or three.

In the embodiment of the present invention, the first interferometer 76X1 perpendicularly radiates, onto the first reflecting surface 60a, the interferometer beam RIX1 in the direction inclined by a predetermined angle $\theta 1$ ($\theta 1$ is $-60°$ in this case) with respect to the Y axis direction. The third interferometer 76X2 perpendicularly radiates, onto the third reflecting surface 60c, the interferometer beam RIX2 in the direction inclined by a predetermined angle $\theta 2$ ($\theta 2$ is $+60°$ in this case) with respect to the Y axis direction.

Therefore, assuming that X1 represents the measured value measured on the basis of the reflected light beam of the interferometer beam RIX1, and X2 represents the measured value measured on the basis of the interferometer beam RIX2, the X coordinate position of the wafer stage WST can be determined in accordance with the following expression (1).

$$X=\{(X1/\sin \theta 1)-(X2/\sin \theta 2)\}\times(\tfrac{1}{2}) \tag{1}$$

In this case, the interferometer beams RIX1 and RIX2 are in the symmetrical direction with respect to the Y axis, and hence there is given $\sin \theta 1 = \sin \theta 2 = \sin \theta$. Therefore, the X coordinate position of the wafer stage WST can be determined in accordance with the following expression.

$$X=(X1-X2)/(2 \sin \theta) \tag{1'}$$

However, it is important that the so-called Abbe error is not produced. Accordingly, the wafer stage controller 78 calculates the X position of the wafer stage WST in accordance with the foregoing expression (1)' by using the measured values of the first and third length-measuring beams radiated from the interferometers 76X1, 76X2 to the optical axis of the projection optical system PL during the exposure. The wafer stage controller 78 calculates the X position of the wafer stage WST in accordance with the foregoing expression (1)' by using the measured values of the second and fourth length-measuring beams radiated from the interferometers 76X1, 76X2 to the detection center of the alignment optical system ALG during the alignment.

However, it is necessary to make the setting so that the inclinations of the first and third reflecting surfaces 60a, 60c are predetermined angles ($\theta 1+90°$), ($\theta 2-90°$) respectively with respect to the scanning direction of the wafer stage WST. The position of the stage can be stably measured by adjusting the inclinations of the first and third reflecting surfaces 60a, 60c to satisfy the foregoing condition beforehand, thereafter measuring the residual inclination difference of θ1 and θ2 during the reticle alignment based on the use of the fiducial mark plate FM on the wafer stage WST, and correcting x determined in accordance with the foregoing expression (1) or (1)' on the basis of the difference obtained by the measurement.

The embodiment of the present invention is different from the conventional two directional interferometer in that the respective interferometer light fluxes are disposed at the positions of rotation separated from each other by 120°. Therefore, if the air conditioning is performed for the optical path of the interferometer in one direction, it is difficult to perform the air conditioning for the interferometer light flux disposed at least at one place, because it is hidden by the wafer stage WST. For this reason, blowing ports are provided for at least two ones of the interferometer light fluxes disposed at three places, for independently performing the air conditioning. In this arrangement, the air-conditioned air without any unevenness can be fed to the interferometer light fluxes disposed at the three places. The air-blowing method includes an air-conditioning method parallel to the light flux in which the air is fed from the interferometer side to the stage, and an air-conditioning method perpendicular to the light flux in which the air is fed downwardly from the position over the light flux. However, the air-conditioning method may be independently selected for the respective axes so that the heat source is disposed downwind depending on the position of the heat source.

First Exposure Method

Next, the operation from the wafer exchange to the completion of the exposure in the scanning type exposure apparatus 10 according to this embodiment will be explained with reference to FIGS. 12 to 15 principally for the operation concerning the wafer stage WST, as exemplified by a case of the double exposure in which the first pattern in the first area P1 on the reticle R shown in FIG. 4(A) and FIG. 8(A) is successively transferred to the shot areas S1, S2, . . . on the wafer W, and then the second pattern in the second area P2 is overlay-transferred to the shot areas S1, S2, . . . .

The apparatus is designed such that all of the length-measuring beams from all of the interferometers of the interferometer system 76 are radiated onto the respective reflecting surfaces of the substrate table TB at the wafer loading position shown in FIG. 12, because of the following reason. That is, it is intended that the reticle alignment and the base line measurement, which have been explained in relation to FIG. 9, are executed simultaneously with the wafer exchange. That is, the fiducial mark plate FM is arranged at one end of the apex of the triangle of the substrate table TB at the position of the wafer stage WST shown in FIG. 12. Therefore, the first fiducial marks Mr1, Mr2 on the fiducial mark plate FM are observed with the pair of reticle microscopes 110 based on the use of the exposure light beam transmitted through the projection optical system PL. Simultaneously, the second fiducial mark Mw can be observed with the alignment optical system (off-axis alignment sensor) ALG. The length-measuring beam is not deviated from each of the reflecting surfaces of the substrate table TB so that the position of the stage may be measured with the length-measuring beam during the observation. Accordingly, it is possible to simultaneously perform, during the wafer exchange, (1) the reticle alignment and the base line measurement described above, (2) the reset operation of the reticle Y interferometer 30Y for the exposure for the first area after completing the exposure for the second area P2, and (3) the reset operation of the interferometer for the alignment optical system ALG with the length-measuring beam deviated from the reflecting surface (movement mirror) during the exposure for the exposed wafer to be unloaded. The quick alignment mode, which is disclosed in Japanese Patent Application Laid-Open No. 7-176468, may be used for the reticle alignment and the base line measurement. The disclosure of the above-mentioned patent documents is incorporated herein by reference so long as the domestic laws of the countries designated in this application permit the incorporation. In FIG. 12, the shots, which are capable of being subjected to the exposure in one time of scanning on the wafer W, are depicted by solid line square frames. Broken lines of square frames indicate the position over which the wafer stage WST should be moved in the pre-scanning and the over-scanning.

Figure 13:
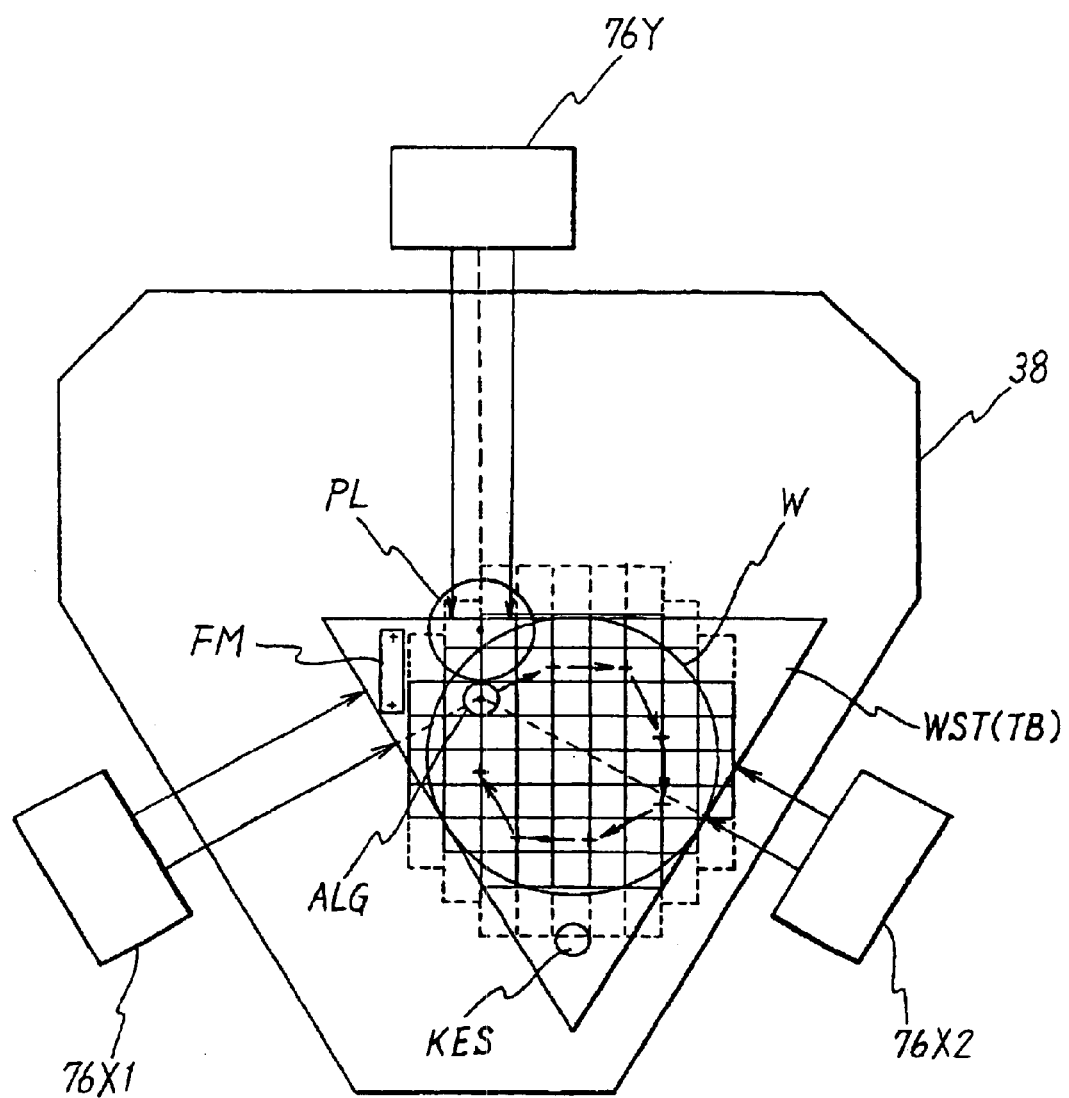
FIG. 13 shows a plan view illustrating components disposed in the vicinity of the movable type base board depicting a situation of movement of the wafer stage upon the alignment measurement.

The wafer stage WST is operated at the point of time of completion of the wafer exchange, the interferometer reset, the reticle alignment, and the base line measurement such that the alignment marks, which are formed on the respective shots on the wafer W, are detected with the alignment optical system ALG, for example, in accordance with the sequence to follow the arrows (→) depicted on the wafer W shown in FIG. 13. Further, the EGA (enhanced global alignment) measurement for measuring the positions of a plurality of representative marks is performed by using the measured value of the interferometer length-measuring beam for the alignment optical system at the detection position of each of the marks. The EGA measurement is disclosed, for example, in Japanese Patent Application Laid-Open No. 61-44429 and U.S. Pat. No. 4,780,617 corresponding thereto. The disclosure of the above-mentioned patent documents is incorporated herein by reference so long as the domestic laws of the countries designated in this application permit the incorporation. In this case, for example, the alignment mark measurement sequence is determined as follows.

That is, on the assumption that the double exposure is performed in accordance with the completely alternate scanning having the highest throughput considering the factors including, for example, the loading position, the even rows, and the odd rows of the total exposure shot rows, the wafer stage controller 78 determines the alignment mark measurement sequence with good efficiency (in a short period of time of the process) in which the alignment is started, after the measurement with the fiducial mark plate FM, from the shot disposed near to the concerning position, and the alignment is completed at the position near to the exposure start shot.

Figure 14:
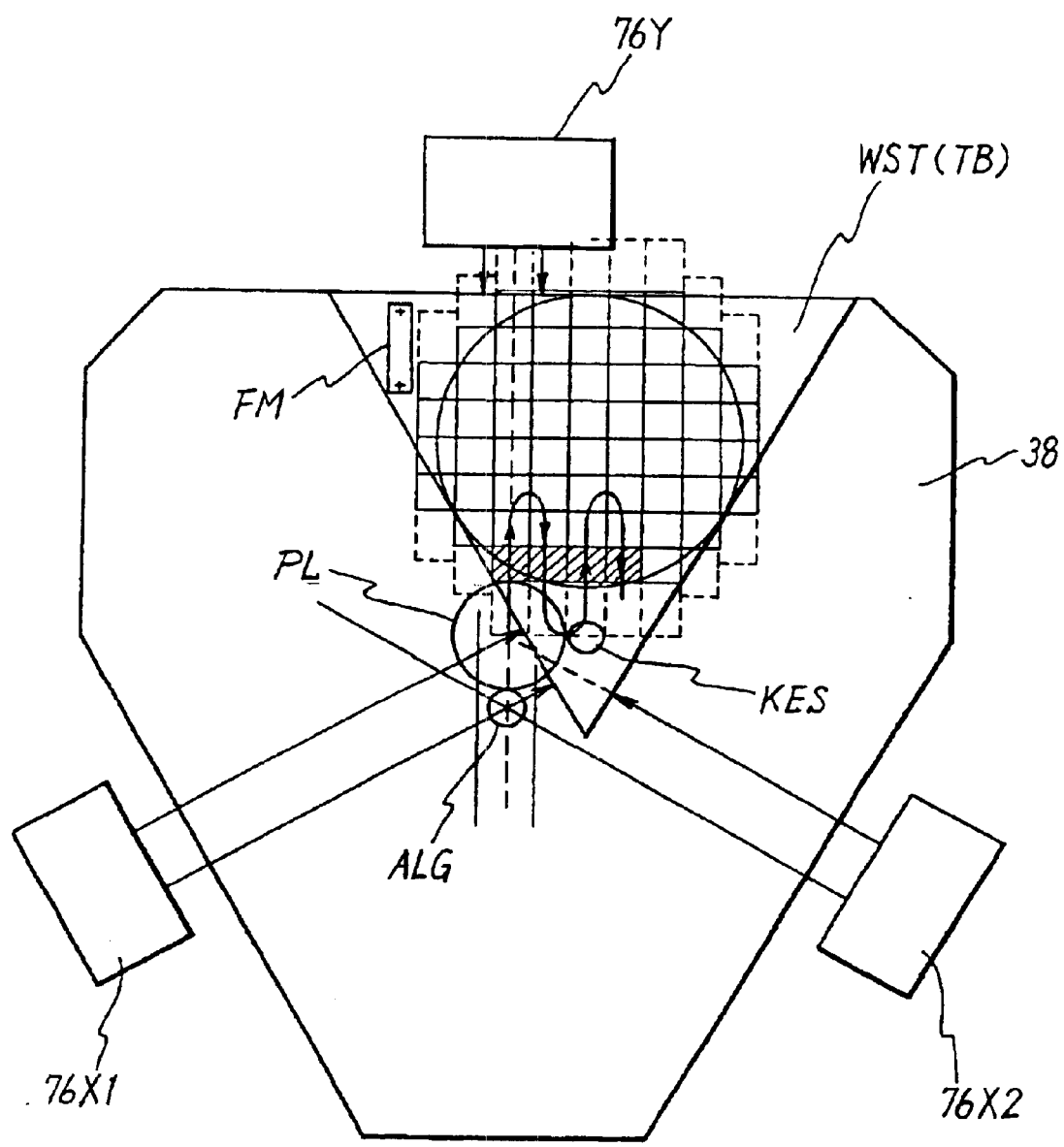
FIG. 14 shows a plan view illustrating components disposed in the vicinity of the movable type base board when the wafer stage is positioned at the exposure start position.
Figure 15:
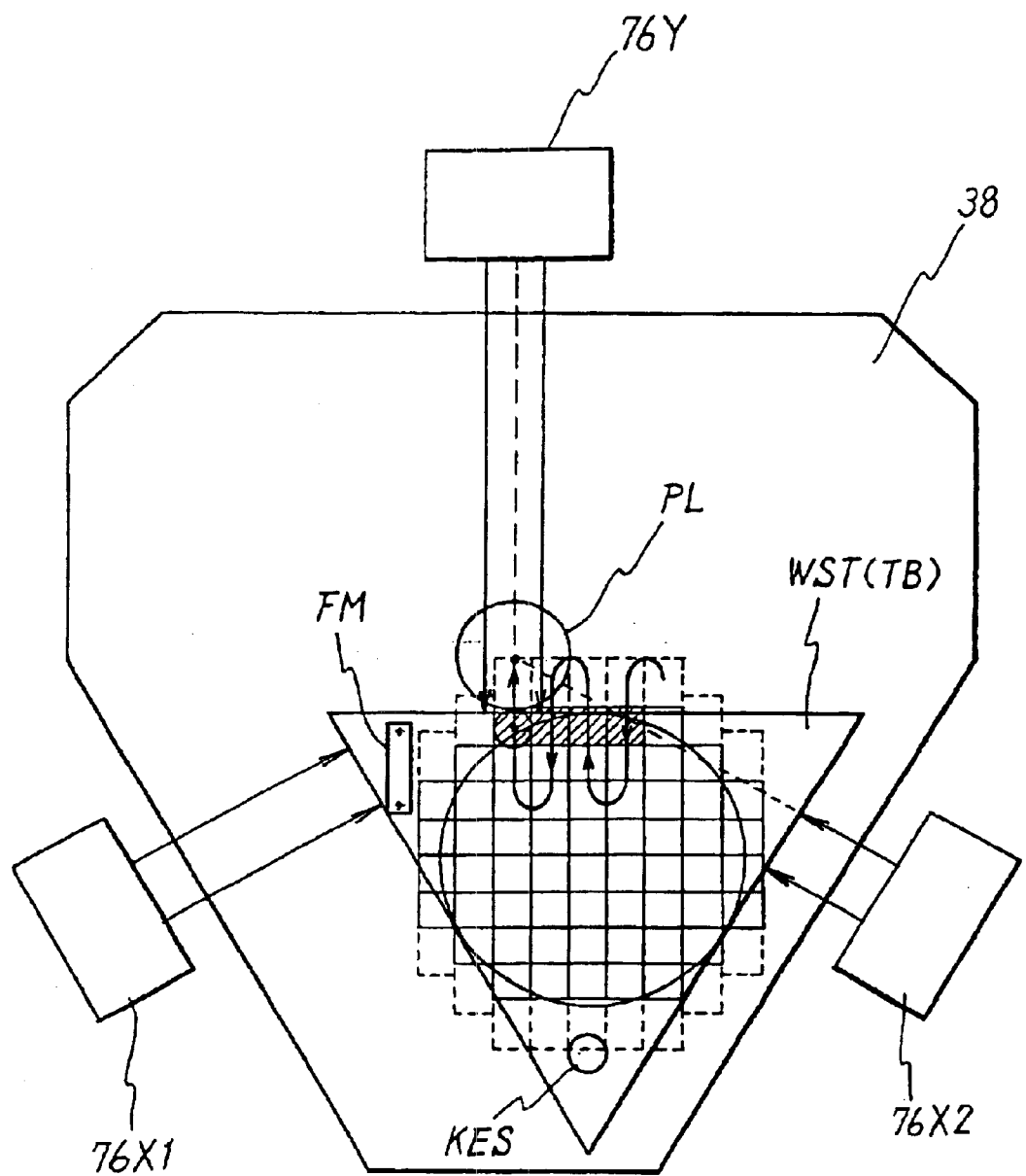
FIG. 15 shows a plan view illustrating components disposed in the vicinity of the movable type base board when the wafer stage is positioned at the exposure end position for the first area.
Figure 16:
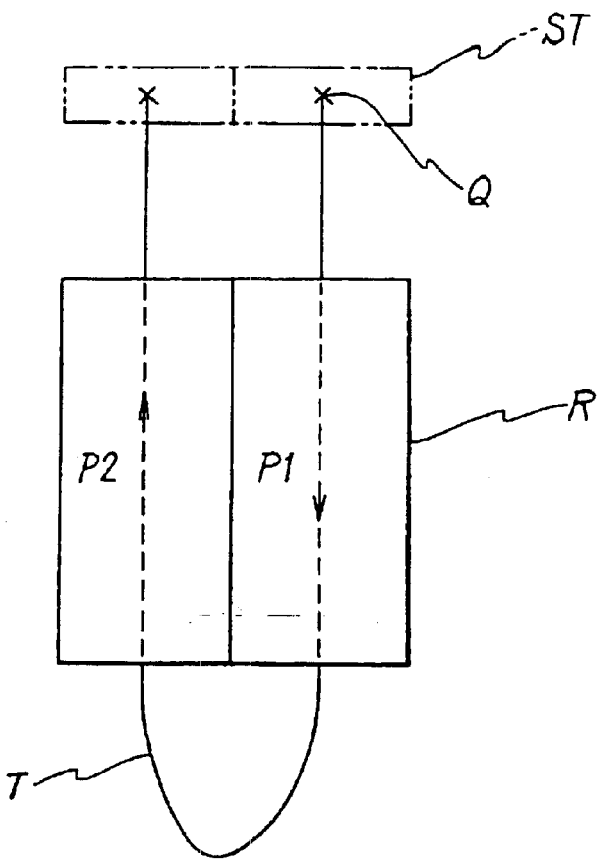
FIG. 16(A) shows a locus of movement of the reticle R (reticle stage RST) when modified double exposure is performed.
FIG. 16(B) shows an example of the pattern of the first area and the second area on the reticle optimum for the modified double exposure.
Figure 16:
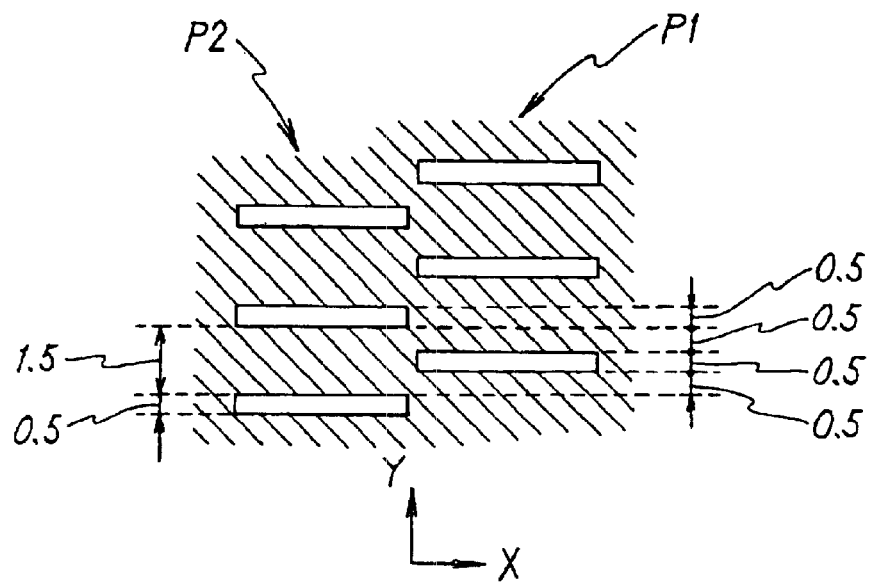

When the EGA measurement is completed in accordance with the measurement sequence described above, the wafer stage controller 78 switches the length-measuring axis of the interferometer to be used for measuring the position of the wafer stage WST into the optical axis (first and third length-measuring axes based on the length-measuring beam RIX11 and the length-measuring beam RIX21) of the interferometer for the exposure. After that, the exposure based on the step-and-scan manner is started to transfer the first area P1 on the reticle R to the plurality of shot areas on the wafer W. In this case, as also shown in FIG. 14, the total number of exposure rows is even. Therefore, the exposure is started from the left-downward position to perform the scanning exposure successively and alternately. When the first row is subjected to the exposure in an order of left→right, the stepping is alternately performed for the next row in an order of right→left. At the point of time at which the exposure for the left-upward position is finally completed as shown in FIG. 15, the scanning exposure (first scanning exposure) for transferring the first area P1 on the reticle R is completed.

Subsequently, the preparatory operation is performed to transfer the second area P2 on the reticle R. The preparatory operation includes, for example, the change of the illumination condition in addition to the same operations as the operations (1) to (3) described above, i.e., the reticle alignment and the base line measurement described above, the reset operation of the reticle Y interferometer 30Y for the exposure for the second area after completing the exposure for the first area P2, and optionally the reset operation of the interferometer for the alignment optical system ALG with the length-measuring beam deviated from the reflecting surface (movement mirror) during the exposure for the first area.

The change of the illumination condition is performed, for example, as follows. That is, when the pattern in the first area P1 is an L/S cluster pattern, and the pattern in the second area is, for example, contact hole or isolated pattern, then the optimum illumination condition differs between the respective patterns. Therefore, the aperture diaphragm plate 18H of the illumination system shown in FIG. 2 is rotated to make change, for example, from the zonal illumination condition to the small σ illumination condition in which N.A. of the illumination system is decreased. That is, the change of the illumination condition means the change of at least one of the intensity distribution of the slit-shaped illumination light beam (illumination beam) for radiating the reticle R, in other words, the shape and the size of the illumination source (secondary light source formed by the fly's eye lens) for radiating the illumination light beam. Accordingly, when the illumination condition suitable for the exposure is different between the pattern in the first area P1 and the pattern in the second area P2 on the reticle R, then the suitable illumination condition can be set in conformity with the respective patterns, and it is possible to further improve the exposure accuracy.

Subsequently, the scanning exposure based on the step-and-scan manner is performed to transfer the pattern in the second area P2 while moving the wafer stage WST along a route opposite to that used in the first scanning exposure described above, by using the result of the EGA measurement previously performed. Accordingly, the second pattern in the second area P2 is transferred in a superimposing manner (overlay exposure) to all of the shot areas on the wafer W to which the first pattern in the first area P1 has been already transferred. When the exposure for the final shot (i.e., shot S1) is completed, the wafer stage WST is moved to the wafer exchange position shown in FIG. 12. After that, the same operation is repeated for the next wafer. During the alternate scanning described above, the reticle stage RST merely repeats the reciprocating movement in the scanning direction. However, the efficient stepping control described above is performed for the wafer stage WST, as understood from FIGS. 14 and 15 as well.

The scanning exposure method based on the step-and-scan manner for successively transferring the pattern on the reticle R onto the plurality of shot areas S1, S2, S3, . . . on the wafer W by synchronously moving the reticle R and the wafer W described above is desirably performed such that the wafer W is moved without any stop between the scanning exposure operations for arbitrary two shot areas on the wafer W to which the pattern on the reticle R is transferred in accordance with the reciprocating movement of the reticle R, for example, for the shots S1, S2, because of the following reason. That is, in this case, the wafer W is not stopped between the scanning exposure operations for the adjacent areas on the wafer W to which the pattern on the reticle R is successively transferred, for example, for the shots S1, S2. Therefore, the throughput is further improved concerning such portions.

In this context, it is more desirable that the wafer W is moved so that at least one of the velocity components of the wafer W in the scanning direction and the non-scanning direction is not zero until the completion of the scanning exposure for the final shot area on the wafer W to which the pattern on the reticle R is to be transferred, because of the following reason. That is, in this case, the wafer is not consequently stopped during the period in which the scanning exposure based on the step-and-scan manner is performed for all of the plurality of shot areas. Therefore, the most improved throughput is obtained. In the embodiment of the present invention, the illumination condition is changed between the transfer of the first area on the reticle to the respective shots and the transfer of the second area to the respective shots. However, the illumination condition may not be changed depending on the patterns in the first area and the second area on the reticle. For example, only the numerical aperture of the projection optical system PL may be changed. Alternatively, both of the illumination condition and the numerical aperture of the projection optical system PL may be changed.

Second Exposure Method

The flow of the operation of the ordinary double exposure in the scanning type exposure apparatus 10 according to the embodiment of the present invention has been described above. However, there is no limitation thereto. For example, it is also possible to perform modified double exposure as follows. That is, the double exposure is executed such that the first pattern in the first area P1 on the reticle R and the second pattern in the second area P2 are successively overlay-transferred to the identical shot area S1, and then the next shot area S2 is overlay-exposed, in a sequence opposite to the above, with the second pattern in the second area P2 and the first pattern in the first area P1.

In this case, reversely to the above, the reticle stage RST makes reciprocating movement along a route similar to that of the wafer stage WST used when the adjacent shot areas S1, S2 are exposed in the case of the ordinary double exposure described above, during the period in which the wafer stage WST makes reciprocating movement in the scanning direction (Y direction) during the exposure for the identical shot area S. FIG. 16(A) shows a movement locus T of the reticle R (reticle stage RST) in this case. Actually, the exposure is performed by moving the reticle R opposingly to the locus T with respect to the illumination slit ST. However, for convenience of the explanation, the drawing is depicted such that the illumination slit ST (center Q) is moved on the reticle R with respect to the reticle R. The movement along the locus T is achieved by performing the velocity control of the reticle stage RST in the scanning direction and the non-scanning direction, in the same manner as the control of the wafer stage WST explained with reference to FIGS. 11(B) and 11(C).

When the area on the reticle R as the exposure objective is switched from the first area P1 to P2 (or reversely), the reticle Y interferometer 30Y is in the state of incapable of performing the measurement as described above. However, when the modified double exposure is performed, the change of the position of the reticle stage in the scanning direction is previously measured by experiment when the switching is made from the first area P1 to P2 (or reversely) respectively. The obtained result is stored as the correction data in the memory. When the exposure is actually performed, the measured value of the reticle Y interferometer 30Y before the switching of the area is stored. The Y coordinate of the reticle stage RST, which is obtained at the moment at which the reticle Y interferometer 30Y is reset after switching the area, is regarded as the value to be determined from the correction value and the measured value of the reticle Y interferometer 30Y before switching the area as described above to measure the position in the scanning direction.

The modified double exposure explained herein is performed, for example, most appropriately for the case in which a Y direction L/S pattern at a predetermined pitch (for example, 2 $\mu$m) is formed in the first area P1, and a Y direction L/S pattern at the same pitch, which is obtained by deviating the above by ½ pitch in the Y direction, is formed in the second area P2, as shown in FIG. 16(B), because of the following reason. That is, in the case of the modified double exposure, it is unnecessary to change the illumination condition between the transfer of the pattern in the first area and the transfer of the pattern in the second area, and there is no decrease in throughput which would be otherwise caused by such change. In the case of FIG. 16(B), the L/S pattern of 0.25 $\mu$m is finally formed on the wafer W provided that the reduction magnification of the projection optical system PL is ¼. In this method, the first pattern and the second pattern on the reticle R are successively transferred to the shot area S1 on the wafer W, and then the second pattern and the first pattern are transferred to the next shot area S2 in the sequence opposite to the above. However, it is also preferable that the movement of the reticle stage RST is controlled so that the movement locus is parabolic after irradiating the second area P2 on the reticle R with the illumination light beam in order that the reticle stage RST is driven without any stop between the scanning exposure operations for the two shot areas. Accordingly, the first pattern and the second pattern on the reticle R are transferred in the same sequence to the respective shot areas on the wafer W. The reticle stage RST is driven without any stop until the completion of the scanning exposure for the final shot area on the wafer W. Further alternatively, in the same manner as the first exposure method described above, it is also preferable that the wafer stage WST is driven without any stop between the two shots by controlling the movement so that the movement locus of the wafer stage WST is parabolic between the two adjacent shot areas.

Third Exposure Method

Additionally, when the scanning type exposure apparatus 10 according to the embodiment of the present invention is used, it is also possible to perform the patching exposure (stitching exposure) in which the patterns in the first area P1 and the second area P2 on the reticle R are transferred to the adjacent areas on the wafer W in the non-scanning direction respectively. This process is achieved by simultaneously and synchronously performing the movement control for the wafer stage WST used when the ordinary double exposure (first exposure method) described above is performed and the movement control for the reticle stage RST used when the modified double exposure method (second exposure method) is performed. In this case, a pattern having a large area, in which the patterns in the first area P1 and the second area P2 on the reticle R are stitched, is formed on the wafer W.

In the second and third exposure methods described above, it is also preferable that the reticle stage RST is moved obliquely with respect to the scanning direction during the deceleration of the reticle stage RST after irradiating the first area P1 on the reticle R with the illumination light beam, or before the velocity component of the reticle stage RST in the scanning direction (Y direction) is zero. By doing so, when the pattern in the second area is transferred onto the wafer W continuously to the transfer of the pattern in the first area, then the reticle stage RST is move not along the ]-shaped rout but along the route shorter than this route. Therefore, it is possible to improve the throughput owing to the reduction of the movement time.

It is also preferable that the reticle stage RST is accelerated in a direction intersecting the scanning direction and the non-scanning direction so that the second area P2 on the reticle R approaches the illumination light beam before irradiating the second area P2 on the reticle R with the illumination light beam. Alternatively, it is also preferable that the acceleration of the reticle stage RST in the scanning direction is started before the stepping operation of the reticle stage RST in the non-scanning direction (X direction) is completed, or before the velocity component of the reticle stage RST in the non-scanning direction is zero after irradiating the first area on the reticle R with the illumination light beam. It is preferable that the movement is controlled so that the movement locus of the reticle stage RST is parabolic (or U-shaped), in view of the throughput.

In the second and third exposure methods described above, it is desirable that the reticle stage RST is moved without any stop between the radiation of the illumination light beam onto the first area P1 on the reticle R and the radiation of the illumination light beam onto the second area P2 on the reticle R. In this arrangement, the reticle stage RST is not stopped, and hence the time required to move the reticle stage is substantially the shortest.

In the third exposure method described above, it is desirable that the wafer stage WST is driven without any stop between the first scanning exposure for transferring the first area P1 on the reticle R to the shot area S1 on the wafer W and the second scanning exposure for transferring the second area on the reticle R to the shot area S2 on the wafer W, because of the following reason. That is, in this process, the movement locus of the wafer stage WST is not necessarily the shortest, but the wafer stage WST is not stopped. Therefore, the time, which is required to move the wafer stage WST between the adjacent areas (stepping), is substantially the shortest. Especially, in the stitching, when the reticle stage RST is moved without any stop, and the wafer stage WST is driven without any stop, then the time, which is required from the end of the first scanning exposure to the start of the second scanning exposure, is the shortest. Further, it is desirable that the wafer stage WST is accelerated in a direction intersecting the scanning direction and the non-scanning direction before the second scanning exposure. In this case, the wafer stage WST is accelerated while traveling obliquely with respect to the scanning direction and the non-scanning direction.

As explained above, according to the scanning type exposure apparatus 10 concerning the embodiment of the present invention, the position of the reticle stage RST in the non-scanning direction is measured by at least one of the interferometers 30X1, 30X2. The length-measuring beam IY in the scanning direction is radiated from the interferometer 30Y depending on the measured position to one of the three corner cubes 31Y1, 31Y2, 31Y3. The reflected light beam therefrom is received, and thus the position of the reticle stage RST in the scanning direction is measured by the interferometer 30Y. The position of the reticle stage RST in the scanning direction can be managed by the interferometer 30Y. Accordingly, when the position of the reticle stage RST is located at the position at which any one of the corner cubes is selected, the pattern on the reticle R can be transferred onto the wafer W via the projection optical system PL by moving the wafer stage WST in the scanning direction in synchronization with the reticle stage RST while managing the position of the reticle stage RST in the scanning direction by using the interferometer 30Y. The patterns in the plurality of partial areas on the reticle R or in the plurality of areas on the reticle R can be transferred onto the wafer W via the projection optical system PL without exchanging the reticle R.

In this arrangement, the position of the reticle stage RST in the scanning direction is measured by the aid of the corner cube irradiated with the length-measuring beam IY from the interferometer 30Y. Accordingly, even when the rotation of the reticle stage RST is controlled in the same manner as in the conventional technique prior to the synchronous movement of the reticle stage RST and the wafer W state WST in the scanning direction (or during the synchronous movement), the position of the reticle stage RST in the scanning direction during the scanning exposure can be correctly managed, because the returning light flux from the corner cube is always overlapped with the reference light flux from the side of the fixed mirror. Therefore, the patterns in the plurality of partial areas on the reticle R or in the plurality of areas on the reticle R can be transferred onto the wafer W via the projection optical system PL without exchanging the reticle R. The position of the reticle stage RST in the first direction (scanning direction) can be correctly managed during the scanning exposure. Therefore, the throughput can be improved by realizing the large area exposure by means of the stitching based on the use of the large reticle. Further, the exposure can be performed highly accurately by controlling the rotation of the reticle stage RST. When the double exposure is performed, the exposure accuracy can be improved owing to the improvement in the throughput and the improvement in the depth of focus as well from the viewpoint that it is unnecessary to exchange the reticle.

In the embodiment of the present invention, the corner cubes 31Y1, 31Y2, 31Y3 are provided corresponding to the areas P1, P2, P3 on the reticle R respectively. Therefore, when the pattern in any area is transferred, the position of the reticle stage RST in the scanning direction can be managed reliably and correctly with the interferometer 30Y by using the corner cube corresponding to the concerning area. The corner cube 31Y3 is arranged at the position corresponding to the central portion of the reticle R in the non-scanning direction. Therefore, it is possible to respond to any of the ordinary exposure based on the use of the ordinary reticle (reticle), the multiple exposure such as double exposure based on the use of the reticle arranged with the plurality of pattern areas on the reticle R, and the stitching exposure.

In the embodiment described above, the function to reset the interferometer 30Y corresponding to the position information in the non-scanning direction of the reticle stage RST is possessed by the reticle stage controller 33. Therefore, at the moment at which the length-measuring axis of the interferometer 30Y hits any of the corner cubes during the movement of the reticle stage RST in the non-scanning direction, it is possible to reset the interferometer 30Y corresponding to the position information in the non-scanning direction of the reticle stage WST.

Further, the first reflecting surface 84a and the second reflecting surface 84b are provided on the both side surfaces of the reticle stage RST in the non-scanning direction. The interferometers 30X1, 30X2 are provided opposingly thereto. The reticle stage controller 33 calculates the position of the reticle stage RST in the non-scanning direction by using the measured value obtained by one with which the length-measuring beam to each of the reflecting surfaces is shorter, of the interferometers 30X1, 30X2. Accordingly, it is possible to decrease the influence of the rotation of the reticle stage RST on the measured value. It is possible to more correctly determine the position of the reticle stage RST in the non-scanning direction as well.

In the embodiment of the present invention, the fiducial mark plate FM is arranged on the wafer stage WST. The interferometer 30Y is reset corresponding to the position of the reticle stage RST in the non-scanning direction. Accordingly, the main control unit 50 measures the positional relationship between the reticle R and the substrate stage WST by measuring the fiducial mark on the fiducial mark plate FM by using the reticle microscope 110 and the alignment optical system ALG respectively. Therefore, there is no such an inconvenience that the overlay accuracy of the reticle and the wafer w is deteriorated, even when the reticle stage RST is moved in the non-scanning direction in order to perform the exposure for the different area on the reticle R during the ordinary exposure and the ordinary double exposure.

In the embodiment of the present invention, there is provided the frame 72 having the actuators 74R, 74L which apply the force corresponding to the reaction force generated by the movement of the reticle stage RST, to the reticle stage RST or the second pedestal (26, 28). Accordingly, the force, which corresponds to the reaction force generated by the movement of the reticle stage RST, is applied to the reticle stage RST or the second pedestal by the actuators 74R, 74L. Therefore, it is possible to avoid the transmission of the vibration of the reticle stage RST during the acceleration and deceleration via the second pedestal to the pedestal section 16.

In the case of the second and third exposure methods described above, the reticle stage RST is reciprocated at least once in the scanning direction by the aid of the driving control system (constituted by the synchronous control system 80 and the reticle stage controller 33 for constructing the stage control system) in order to transfer the pattern on the reticle R to the wafer W. Further, the reticle stage RST is moved in the non-scanning direction during the reciprocating movement. The two corner cubes 31Y1, 31Y2 are arranged by being separated from each other in the non-scanning direction by the distance corresponding to the movement amount. Accordingly, the position of the reticle stage RST is reliably managed by the interferometer 30Y at any position before and after the movement. The patterns in the different areas on the reticle R can be transferred to the identical area or the different areas on the wafer W during the one time of the reciprocating movement of the reticle stage RST. Also in this case, it is unnecessary to exchange the reticle.

According to the scanning type exposure apparatus 10 of the embodiment of the present invention, when the first exposure method, the third exposure method, or the ordinary scanning exposure is performed, the stepping of the wafer in the non-scanning direction (direction of non-scanning) is performed for the exposure for the next shot in synchronization with the pre-scanning based on the wafer run-up (acceleration time) before the exposure for the reticle R and the wafer W and the over-scanning based on the constant velocity movement time and the deceleration time after the exposure for the wafer. The stepping operation in the non-scanning direction is completed before the settling time until the transition from the wafer pre-scanning to the exposure operation. Accordingly, the pre-scanning and over-scanning time before and after the scanning exposure can be completely overlapped with the stepping time to perform the stepping to the adjacent shot. It is possible to improve the throughput as compared with the illustrative conventional technique in which the pre-scanning and over-scanning operations and the stepping operation for making stepping to the adjacent shot have been separately performed. Concerning the settling time, it is enough to perform only the synchronous control for the wafer and the reticle in the scanning direction. As a result, it is possible to shorten the settling time, and it is possible to improve the throughput corresponding thereto.

In the embodiment of the present invention, the control can be also made such that the absolute value of the rate of acceleration in the non-scanning direction of the portion corresponding to the over-scanning concerning the constant velocity movement time and the deceleration time after the exposure of the wafer is larger than that of the negative rate of acceleration in the non-scanning direction of the portion corresponding to the pre-scanning concerning the wafer run-up (acceleration time). Accordingly, for example, any fluctuation of the body due to the high acceleration can be completely attenuated before the settling time for the synchronous control. Therefore, the control performance is improved corresponding thereto, and it is possible to improve the throughput.

Figure 17:
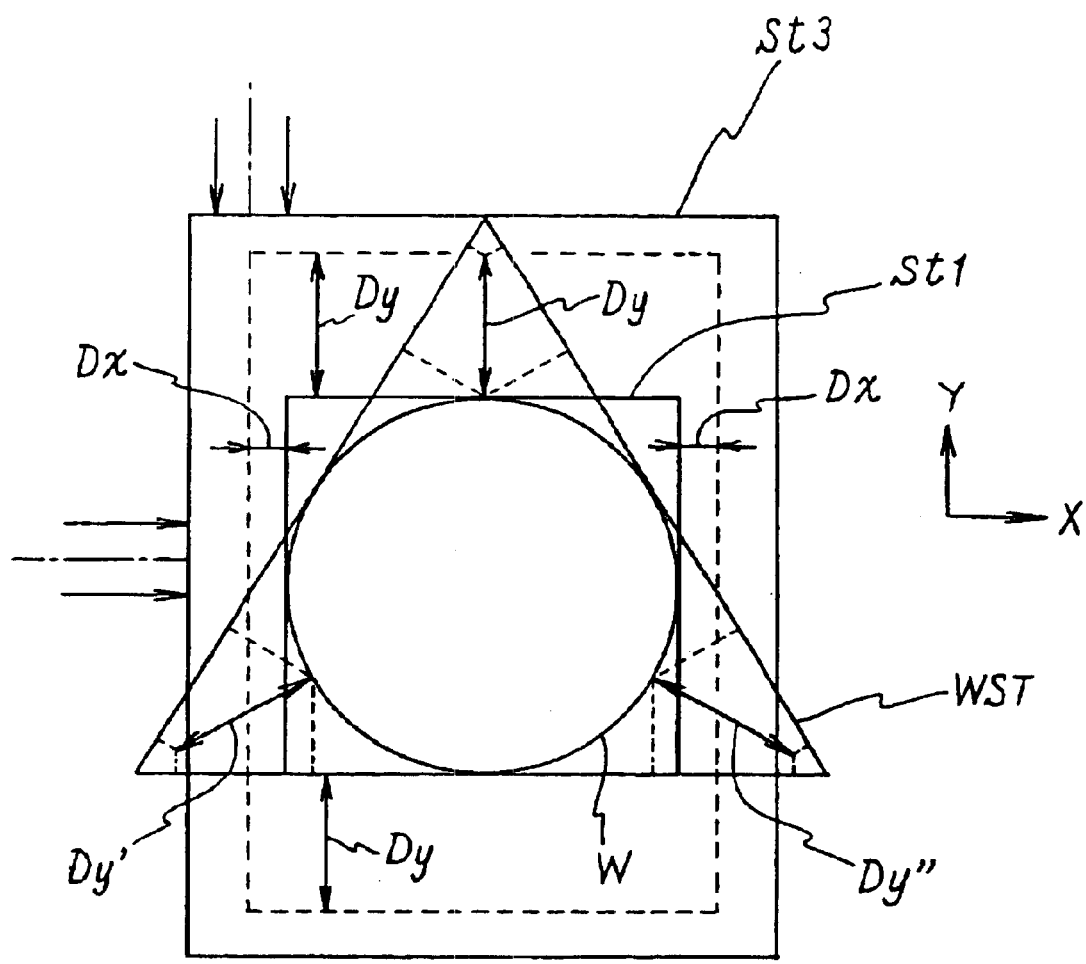
FIG. 17 shows an effect of the embodiment of the present invention, illustrating the fact that the wafer stage of the embodiment of the present invention can be made compact as compared with the conventional rectangular stage even in the presence of the deteriorated amount of the movement mirror distance resulting from the multiple axes of the interferometer, the pre-scanning, and the over-scanning.
Figure 18:
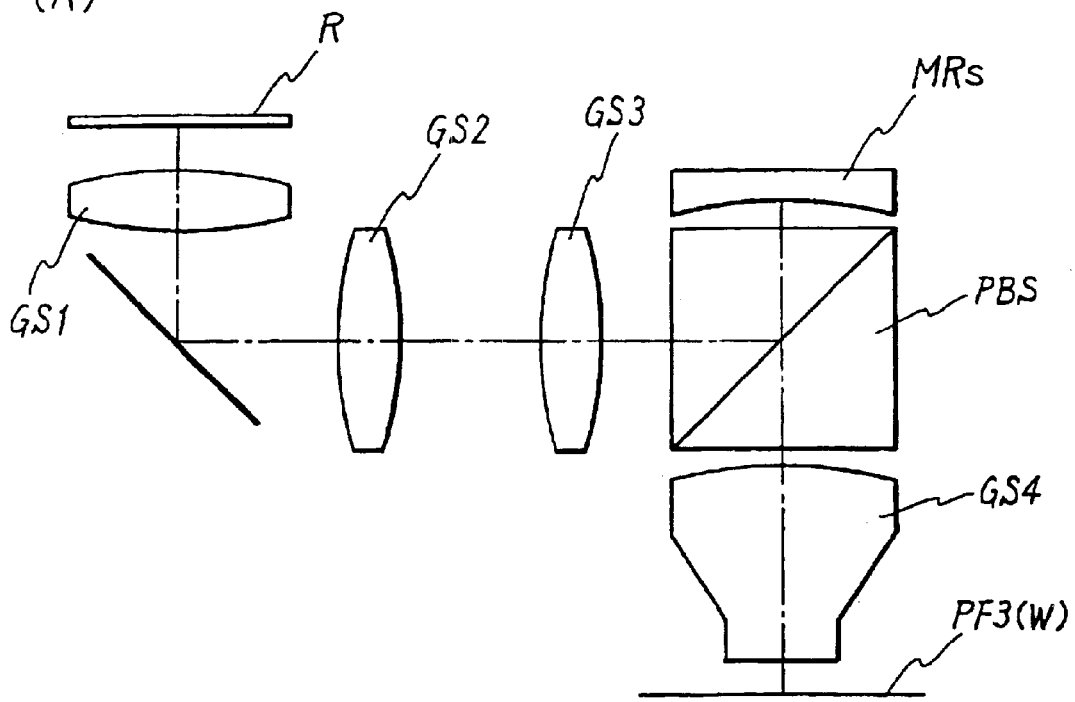
FIG. 18(A) shows an example in which the projection optical system is a cata-dioptric system.
FIG. 18(B) shows another example in which the projection optical system is a cata-dioptric system.
Figure 18:
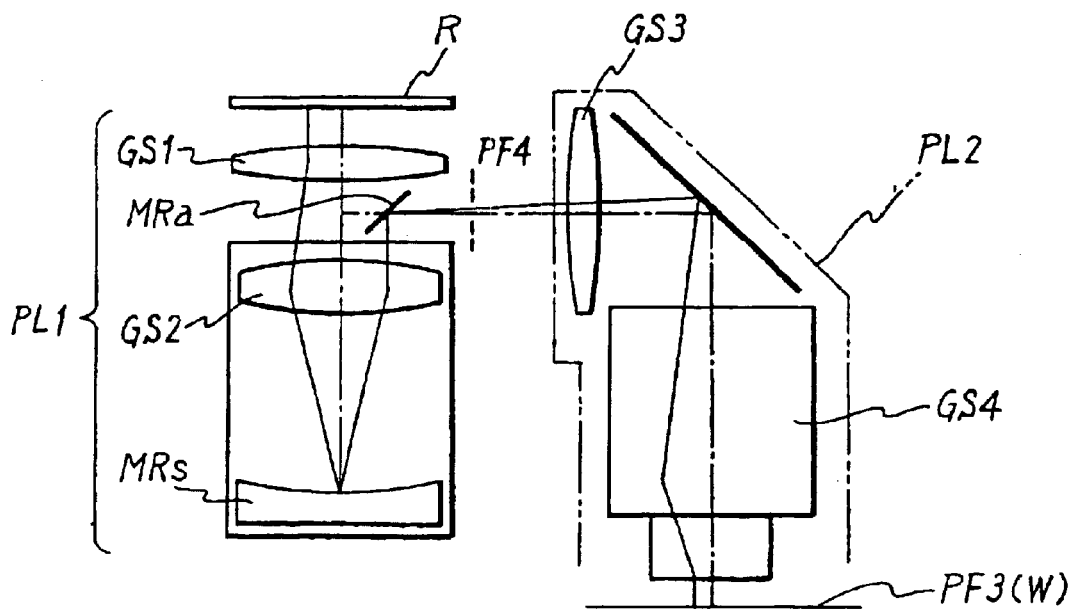

According to the scanning type exposure apparatus 10 and the stage apparatus 1 concerning the embodiment of the present invention, the position of the wafer W in the non-scanning direction is determined by the calculation during the exposure on the basis of the measured values of the first and third interferometers 76X1, 76X2 having the optical axes in the two different directions to form the angles of θ1, θ2 with respect to the Y axis as the scanning direction respectively. The length measurement is performed for the position of the wafer W in the scanning direction with the second interferometer 76Y having the length-measuring axis in the Y axis direction. Therefore, the shape of the substrate table TB (and hence the wafer stage WST) can be made triangular (regular triangular in the case of the embodiment described above). Accordingly, as shown in FIG. 17, it is possible to realize the light weight of the wafer stage WST as compared with the conventional rectangular state st3. The realization of the light weight of the stage is more effective when the acceleration and deceleration of the wafer stage are increased or when the maximum velocity is increased in future. The triangular stage makes it possible to decrease the foot print, and it is possible to improve the throughput. FIG. 17 shows the fact that the rectangular stage st3 is conspicuously larger than the rectangular stage st1 having the necessary and minimum size to hold the wafer due to the amounts of the additional distances Dx, Dy for the movement mirror provided to avoid the deviation of the interferometer optical axis indicated by the arrow (→) in the drawing due to the multiple axes of the interferometer, the pre-scanning, and the over-scanning, while the stage WST of the embodiment of the present invention has the stage shape which is extremely smaller than that of the rectangular stage st3 even when the same amounts of additional distances Dx, Dy are provided.

The yawing of the wafer stage WST is calculated on the basis of the measured value of the second interferometer 76Y for measuring the position of the wafer stage WST in the scanning direction. The yawing amount can be corrected as the rotation error of the wafer stage during the exposure on the side of the reticle stage for holding the reticle R. Accordingly, it is unnecessary to provide any rotation control mechanism for the wafer stage WST. It is possible to realize the light weight of the wafer stage corresponding thereto.

The point of intersection, which is obtained by extending the respective first optical axes of the first and third interferometers 76X1, 76X2 (length-measuring beam RIX11 (first length-measuring axis), length-measuring axis RIX21 (third length-measuring axis)), is coincident with the optical axis of the projection optical system PL. The point of intersection, which is obtained by extending the respective second optical axes thereof (length-measuring beam RIX12 (second length-measuring axis), length-measuring axis RIX22 (fourth length-measuring axis)), is coincident with the detection center of the alignment optical system ALG. Accordingly, it is possible to measure the position of the stage without any Abbe error even when the exposure and the alignment are performed, and thus the overlay accuracy is improved.

The first, second, and third interferometers 76X1, 76X2, 76Y measure the distances to the reflecting surfaces 60a, 60b, 60c which are formed on the different side surfaces of the wafer stage WST for holding the wafer W respectively. The rate of acceleration of the wafer stage WST, the maximum velocity, and the settling time are determined so that the respective interferometer optical axes are not deviated from the respective different reflecting surfaces 60a, 60b, 60c of the wafer stage WST owing to the over-scanning distance based on the constant velocity movement time and the deceleration time after the exposure for the wafer W and the pre-scanning distance based on the settling time until the constant velocity movement and the run-up of the wafer upon the relative scanning for the reticle R and the wafer W when the exposure is performed for the peripheral portion on the wafer stage. Therefore, it is unnecessary to extend an extra amount of the reflecting surface. Accordingly, the reflecting surface can be set within the range of the three side surfaces of the wafer stage (substrate table TB). Therefore, the wafer stage WST is well-balanced, and it is possible to enhance the rigidity of the stage. As a result, it is possible to improve the focus and tilt control response of the wafer stage.

The spatial image detector KES and the fiducial mark plate FM for performing the base line measurement, the image formation characteristic measurement, and the radiation amount measurement are arranged at the positions on the wafer stage at which the optical axes of the first, second, and third interferometers 76X1, 76X2, 76Y are not deviated from the respective different reflecting surfaces 60a, 60b, 60c of the wafer stage described above. Accordingly, it is unnecessary to extend the movement mirror (or the reflecting surface) for the measurement based on the use of the fiducial mark plate FM and the spatial image detector KES, which results in the realization of the light weight of the wafer stage WST as well.

The movable type base board 38, which is installed with the driving system for driving the wafer stage WST, is constructed to move in response to the reaction force brought about by the acceleration and deceleration during the movement of the wafer stage WST. Therefore, the unbalanced load, which is caused by the movement of the center of gravity of the wafer stage WST, can be canceled by the movement of the center of gravity of the movable type base board 38. Accordingly, it is possible to mitigate the load on the vibration-preventive apparatus 20, and the distortion of the body, which would be otherwise caused by the unbalanced load, can be suppressed to the minimum. Thus, it is possible to improve the positioning accuracy of the reticle R and the wafer W.

The driving of the movable type base board 38 can be controlled at the response frequency at several Hz. The driving is controlled to counteract the reaction force during the acceleration and deceleration upon the movement of the wafer stage WST. Further, the control can be made with the response frequency so that the movable type base board 38 is not moved in an arbitrary direction due to the attitude (unbalanced load) of the stage. Therefore, it is possible to avoid the unbalanced load which would be otherwise caused by the variation of the position of the reticle and the change of the environment.

The weight of the wafer stage WST is designed to be not more than 1/5 of the weight of the movable type base board 38. Therefore, the distance of the movement of the movable type base board 38 in accordance with the reaction force brought about by the acceleration and deceleration during the movement of the wafer stage WST is not more than 1/10 of the movement distance of the wafer stage WST. Thus, it is possible to set the small necessary movement range of the movable type base board 38.

The response frequency of the movable type base board 38 before the exposure and the alignment which require the position control accuracy is variable, and the other response frequencies are variable. The movable type base board 38 is monitored for the positions in the two directions by the linear encoder 45. The position of the movable type base board 38 is corrected to be the predetermined position during the driving operation other then the exposure and the alignment which require the position control accuracy. Therefore, the distance of the movement of the movable type base board 38 in the opposite direction due to the reaction during the acceleration and deceleration of the wafer can be decreased by one figure or more. That is, the control can be made highly accurately during the exposure and the alignment. Additionally, the position of the movable type base board 38 can be reset to an arbitrary position under the other conditions. Thus, it is possible to decrease the foot print.

In the embodiment described above, explanation has been made for the case in which the corner cube is used as the mirror for measuring the position of the reticle stage RST in the scanning direction. However, there is no limitation thereto in order to realize the scanning exposure method according to the present invention. It is also preferable to use a short reflecting surface (for example, a plane mirror). In this case, the production is easy as compared with the conventional plane mirror. Accordingly, it is possible to reduce the cost corresponding thereto.

In the embodiment described above, explanation has been made for the reticle for the double exposure including the two areas of the first area and the second area which exist on the reticle R. However, there is no limitation thereto. It is needless to say that the present invention is also applicable to a case in which three or more slender areas (or divided areas) exist on the reticle R by using a projection optical system PL having a smaller diameter.

In the embodiment described above, explanation has been made for the case in which the single reticle R is held on the reticle stage RST. However, for example, it is also preferable that reticles R1, R2 are arranged in the non-scanning direction, the first pattern in the first area P1 is formed on the reticle R1, and the second pattern in the second area is formed on the reticle R2. Even in the case of the plurality of reticles, when the patterns on the respective reticles are successively transferred onto the wafer W, the function of the foregoing embodiment is effected exactly as it is.

In the embodiment described above, the method for moving the wafer stage WST has been explained in detail with reference to FIGS. 11A to 11(C). However, it is a matter of course that the present invention is not limited thereto. Another example will be explained by using the same reference numerals as those used in the foregoing explanation. That is, it is also preferable that the wafer W is moved in a direction intersecting the scanning direction while decelerating the wafer W until the movement velocity of the wafer W in the scanning direction is zero after completing the scanning exposure for the shot S1, and the wafer W is moved in a direction intersecting the scanning direction while accelerating the wafer W before performing the scanning exposure for the shot S2. By doing so, the wafer W is moved along a V-shaped route after completing the scanning exposure for the shot S1. Therefore, the wafer W is moved along the route which is approximate to the shortest distance. It is possible to improve the throughput corresponding thereto. Alternatively, it is also preferable that the wafer W is moved in a direction intersecting the scanning direction and the non-scanning direction during the deceleration of the wafer W after completing the scanning exposure for the shot S1 and during the acceleration of the wafer W before performing the scanning exposure for the shot S2. In such a case, the wafer W is consequently moved along a V-shaped route. Therefore, the wafer W is moved along the route which is approximate to the shortest distance. It is possible to improve the throughput corresponding thereto.

It is needless to say that the wafer W is desirably moved without any stop between the scanning exposure for the shot S1 and the scanning exposure for the shot S2 in these cases as well.

In the embodiment described above, explanation has been made for the case in which the regular triangular stage is adopted as the wafer stage WST, and the interferometer system 76 is adopted in conformity therewith, which is composed of the three of the firsts second, and third interferometers 76X1, 76Y, 76X2 for measuring the position of the wafer stage WST in the three different directions respectively. However, this arrangement is made in view of the object of the present invention to more effectively achieve the improvement in the throughput. It is a matter of course that the present invention is not limited thereto. That is, the present invention is also applicable preferably to ordinary square and oblong wafer stages in the same manner as in the embodiment of the present invention. Although there is any difference in degree, if any, the effect of the improvement in the throughput is sufficiently obtained.

In the embodiment described above, explanation has been made for the case in which the wafer stage WST is provided, for example, with the movable stage 52, the leveling drive mechanism, and the substrate table TB. However, the present invention is not limited thereto. For example, it is allowable to use a simple plate-shaped member as the substrate stage, because of the following reason. That is, even in the case of such a plate-shaped member, when a so-called two-dimensional plane motor or the like (provided with Z driving coil) is used, it is possible to perform the inclination driving with respect to the XY plane and the driving in the Z direction.

In the embodiment described above, explanation has been made for the stage apparatus 1 and the scanning type exposure apparatus 10 containing the same in which the wafer stage WST as the first movable member is provided with all of the first, second, and third reflecting surfaces (60a, 60b, 60c), and the interferometer is also provided with the first, second, and third interferometers corresponding thereto. However, it is a matter of course that the present invention is not limited thereto. The first movable member may be provided with only the first reflecting surface, with only the third reflecting surface, or with any one of them and the second reflecting surface. The interferometer may be provided with only the first interferometer, with only third interferometer, or with any one of them and the second interferometer corresponding thereto.

For example, explanation will be made for an arrangement in which the first movable member is provided with only the first reflecting surface intersecting the scanning direction (first axis direction) and the non-scanning direction (second axis direction) with the reference numerals used in the foregoing embodiment. That is, the measured value X1 of the first interferometer is used for the non-scanning direction. According to X=X1/|sin θ1| and Y=X1/|cos θ1| for the scanning direction, it is possible to calculate the (X, Y) coordinate position of the first movable member. Therefore, the wafer stage controller 78 to serve as the calculating unit preferably performs the calculation as described above.

For example, when the first movable member is provided with the first reflecting surface intersecting the scanning direction (first axis direction) and the non-scanning direction (second axis direction) and the second reflecting surface in the non-scanning direction, the wafer stage controller 78 to serve as the calculating units preferably performs the calculation of X=X1/|sin θ1| for the non-scanning direction. As for the scanning direction, the measured value of the second interferometer is preferably used as it is.

In the embodiment described above, explanation has been made for the case in which the wafer stage WST as the first movable member is provided with, for example, the movable stage 52, the leveling drive mechanism, and the substrate table TB. However, the present invention is not limited thereto. For example, it is allowable to use a simple plate-shaped member as the first movable member, because of the following reason. That is, even in the case of such a plate-shaped member, when a so-called two-dimensional plane motor or the like (provided with Z driving coil) is used, it is possible to perform the inclination driving with respect to the XY plane and the driving in the Z direction. In this case, when the first movable member is triangular, if the inclination driving is performed with respect to the XY plane, it is desirable that the driving force in the Z direction is given with a coil corresponding to at least one point of predetermined three points disposed in the vicinity of respective apexes of the first movable member, of coils for constructing the two-dimensional plane motor as the driving unit to make the driving in the direction perpendicular to the XY plane in response to at least one of the outputs of the first, second, and third interferometers (76X1, 76Y, 76X2), because of the following reason. That is, by doing so, the inclination is adjusted by driving the portion disposed in the vicinity of the three apexes far from the position of the center of gravity. Therefore, it is possible to obtain the high control response (tilt drive control response) during this process.

In the embodiment described above, explanation has been made for the case in which all of the first, second, and third reflecting surfaces 60a, 60b, 60c are formed by means of the mirror finish on the side surfaces of the substrate table TB. However, the present invention is not limited thereto. It is a matter of course that any arbitrary one or two of them may be constructed by a reflecting surface of a movement mirror composed of a plane mirror.

In the embodiment described above, explanation has been made for the case in which all of the reticle Y interferometer 30Y as the first interferometer and the reticle X interferometers 30X1, 30X2 as the second and third interferometers are provided on the second pedestal. However, the present invention is not limited thereto. It is also preferable that at least one of the interferometers is provided on another frame such as the first frame 40 as shown in FIG. 3.

In the embodiment described above, explanation has been made for the case in which the reduction projection lens, which is constructed by only the refractive optical element (lens) based on the use of quartz or fluorite as the optical saltpeter material, is used for the projection optical system PL. However, the present invention is not limited thereto. A projection optical system of another type is also applicable in the same manner as described above. The projection optical system of the another type will be briefly described with reference to FIG. 18.

FIG. 18(A) shows a reduction projection optical system based on a combination of refractive optical elements (lens system) GS1 to GS4, a concave mirror MRs, and a beam splitter PBS. The system is characterized in that the focusing light flux from the reticle R is reflected by the concave mirror MRs by the aid of the large beam splitter PBS to return the light flux to the beam splitter PBS again, and the image is formed on a projection image plane PF3 (wafer W) by enhancing the reduction ratio with the refractive lens system GS4. Details are disclosed in Japanese Patent Application Laid-Open No. 3-282527 and U.S. Pat. No. 5,220,454. The disclosure of the above-mentioned patent documents is incorporated herein by reference so long as the domestic laws of the states designated in this application permit the incorporation.

FIG. 18(B) shows a reduction projection optical system based on a combination of refractive optical elements (lens system) GS1 to GS4, a small mirror MRa, and a concave mirror MRs. The system is characterized in that the image-forming light flux from the reticle R is focused on a projection image plane PF3 (wafer W) via the lens system GS1, GS2, the first image formation system PL1 of approximately 1× magnification composed of the concave mirror MRs, the small mirror MRa arranged eccentrically, and the second image formation system PL2 having an approximately desired reduction ratio composed of the lens system GS3, GS4. Details are disclosed in Japanese Patent Application Laid-Open No. 8-304705 and U.S. Pat. No. 5,691,802 corresponding thereto. The disclosure of the above-mentioned patent documents is incorporated herein by reference so long as the domestic laws of the countries designated in this application permit the incorporation.

In the embodiment described above, explanation has been made for the case in which the off-axis alignment sensor ALG is used as the alignment optical system. However, there is no limitation thereto. It is a matter of course that an on-axis alignment optical system such as those of the TTL (through the lens) type is preferably used. In such an arrangement, the optical axis of the projection optical system PL is located at the position of intersection of the extension line of center line of the two light fluxes (length-measuring beams) radiated from the interferometers 76X1, 76X2 in the same manner as in the interferometer 76Y. The wafer stage yawing is determined on the basis of the average value of resultant differences obtained by the measurement with the two-axis light fluxes for all of the three places. By doing so, the yawing measurement accuracy is improved to be $1/\sqrt{3}$.

In the embodiment described above, the double fly's eye lens system is used. only a single fly's eye lens (or a rod type integrator) may be used. Alternatively, a fly's eye lens and a rod type integrator may be used in combination. In the case of the illumination optical system arranged with the rod type integrator, the following operation is available in order to realize the change of the σ value and the modified illumination such as the zonal illumination. That is, for example, at least one optical element (lens element), which is arranged on the side deviated toward the light source as compared with the rod type integrator, may be moved or exchanged to change the intensity distribution of the illumination light beam on the incident plane of the rod type integrator.

For Example, an $F_2$ excimer laser having a wavelength of 157 nm may be used as the illumination light beam for the exposure, other than the KrF excimer laser and the ArF excimer laser. The scanning type exposure apparatus, which uses the $F_2$ excimer laser as the light source, adopts a cata-dioptric system as the projection optical system. All of the optical elements (lens elements) used for the illumination optical system and the projection optical system are made of fluorite. The air in the illumination optical system and the projection optical system is substituted with helium gas. In place of the excimer laser, it is also preferable to use a higher harmonic wave of a solid state laser such as YAG laser having an oscillation spectrum, for example, at a wavelength of any one of 248 nm, 193 nm, and 157 nm.

The embodiment described above has been explained for the case in which the excimer laser beam having the wavelength of not less than 100 nm is used as the illumination light beam for the exposure. However, it is a matter of course that the present invention is not limited thereto. For example, in recent years, in order to perform the exposure for a pattern of not more than 100 nm or 70 nm, the development of an EUV exposure apparatus is made, which is based on the use of a light source of SOR or a plasma laser with an EUV (Extra Ultra Violet) beam having an exposure wavelength of 13.5 to 6 nm, a reflection reduction optical system, and a reflection type reticle. In this apparatus, an arrangement is conceived, in which the circular-arc illumination is used to perform scanning exposure by synchronously scanning the reticle and the wafer. Therefore, such an apparatus is also included in an applicable range of the present invention. Assuming that the inside of the chamber for accommodating the EUV exposure apparatus is vacuum as well, the embodiment described above is improved, for example, such that the driving system for the stage is based on the magnetically floating type linear actuator, and the electrostatic suction system is used for the chuck system as well. However, in the case of the optical exposure apparatus with the exposure wavelength of not less than 100 nm, it is allowable to use a stage driving apparatus based on air flow, and it is allowable to use vacuum for suction.

In view of the object to principally improve the throughput during the double exposure, the present inventors have already proposed an exposure apparatus comprising two wafer stages (substrate stages), wherein other operations such as wafer exchange and alignment are concurrently performed on the second wafer stage during the exposure operation for the wafer on the first wafer stage (see Japanese Patent Application Laid-Open Nos. 10-163097 and 10-163098 and International Patent Publication WO 98/24115 corresponding thereto). When the exposure apparatus described in these patent documents is used for the ordinary exposure not for the double exposure, it is clear that the throughput is further improved as compared with the double exposure. When the scanning exposure method as explained in the first embodiment is adopted for the exposure apparatus described in the patent documents, it is possible to further improve the throughput even in any case of the ordinary exposure and the double exposure. Japanese Patent Application Laid-Open Nos. 10-163097 and 10-163098 and International Patent Publication WO 98/24115 corresponding thereto are incorporated herein by reference.

However, in such a case, for example, in addition to the improvement of the control that the operations, which exert no mutual influence, are performed synchronously concerning the operations to be performed on the side of the first wafer stage and the side of the second wafer stage, it is necessary to perform the control of the wafer stage as explained in the first embodiment. Therefore, the control program for the stage control system is extremely complicated. In order to improve such an inconvenience, the following second embodiment has been made.

Second Embodiment

Next, the second embodiment of the present invention will be explained with reference to FIGS. 21 to 25. The second embodiment especially discloses the second to fifth concepts of the present invention.

Figure 21:
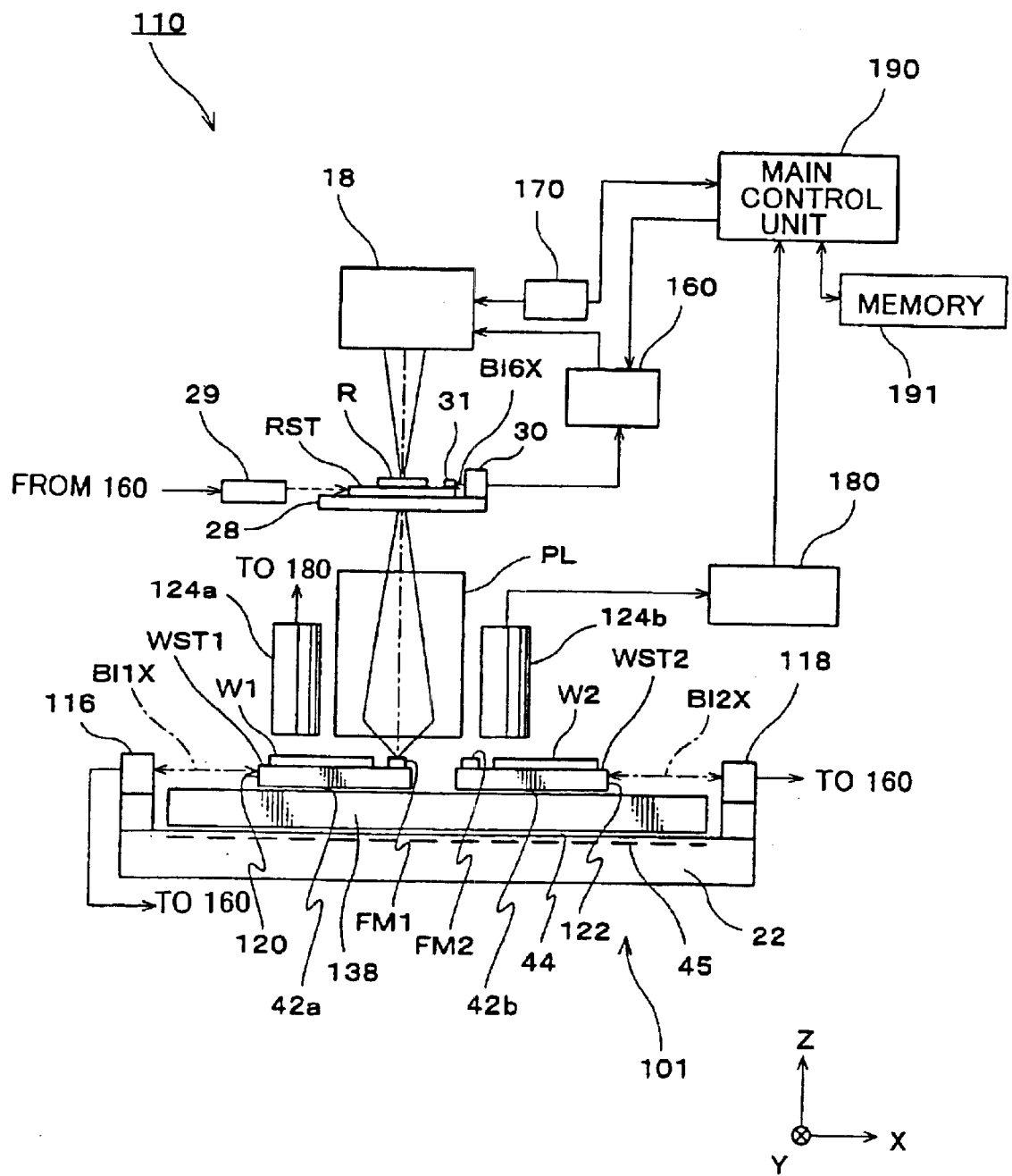
FIG. 21 shows a schematic arrangement of an exposure apparatus according to the second embodiment.

FIG. 21 shows a schematic arrangement of an exposure apparatus 110 according to the second embodiment. The same components as those of the first embodiment described above or components equivalent thereto are designated by the same reference numerals, explanation of which will be simplified or omitted. The exposure apparatus 100 is a projection exposure apparatus based on the so-called step-and-scan manner.

The exposure apparatus 110 comprises, for example, a stage apparatus 101 which is provided with two square wafer stages WST1, WST2 as the first movable members for making movement in the two-dimensional direction while independently holding wafers W1, W2 as the substrate respectively, a projection optical system PL which is arranged over the stage apparatus 101, a reticle-driving mechanism for driving a reticle R as the mask over the projection optical system PL principally in a predetermined scanning direction, i.e., in the Y axis direction (direction perpendicular to the plane of the paper of FIG. 21) in this embodiment, an illumination optical system 18 which is disposed over the reticle R for radiating the reticle R, and a control system for controlling the respective components described above.

The stage apparatus 101 includes a base board 22 for constructing the pedestal section (first column) 16, a rectangular movable type base board 138 as the second movable member which is supported by the base board 22 relatively movably in the XY plane, the two wafer stages WST1, WST2 which are supported on the movable type base board 138 relatively movably in the XY plane with respect to the movable type base board 138, and an interferometer system for measuring the positions of the wafer stages WST1, WST2. A movable type base board having a structure equivalent to that of the movable type base board 38 of the first embodiment described above is used as the movable type base board 138. The role or the like of the movable type base board 138 will be in detail later on.

The wafer stages WST1, WST2 are supported in an floating manner by planar magnetically floating type linear actuators 42a, 42b as the driving units provided on the movable type base board 138 under the projection optical system PL respectively, and they are driven mutually independently in the XY two-dimensional plane perpendicular to the optical axis AX of the projection optical system PL. In the same manner as the wafer stages WST1, WST2, the movable type base board 138 is supported in an floating manner by a planar magnetically floating type linear actuator 44 as the second driving unit provided on the base board 22, and it is freely driven in the XY two-dimensional plane. The planar magnetically floating type linear actuators 42a, 42b, 44 are controlled by a stage control unit 160 shown in FIG. 21.

The wafers W1, W2 are fixed, for example, by electrostatic suction or vacuum suction, on the wafer stages WST1, WST2 by the aid of unillustrated wafer holders. The wafer holder is finely driven by an unillustrated Z·θ driving mechanism in the Z axis direction perpendicular to the XY plane and in the θ direction (direction of rotation about the Z axis). Fiducial mark plates FM1, FM2, which are formed with various fiducial marks, are installed on the upper surfaces of the wafer stages WST1, WST2 so that they are approximately at the same height as that of the wafers W1, W2 respectively. The fiducial mark plates FM1, FM2 are used, for example, when the reference position of each of the wafer stages is detected.

Figure 22:
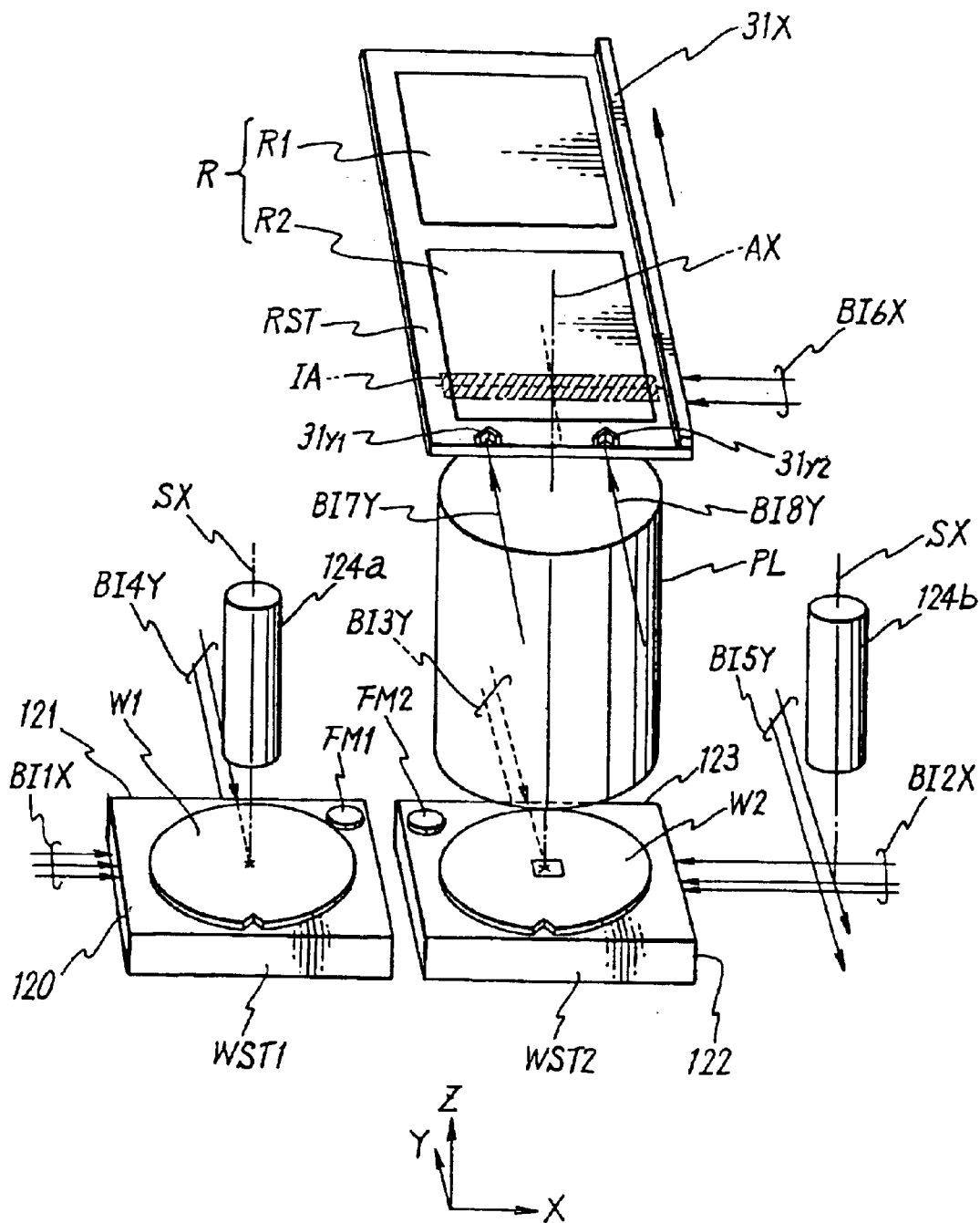
FIG. 22 shows a perspective view illustrating the positional relationship among two wafer stages, a reticle stage, a projection optical system, and an alignment system.

As shown in FIG. 22, a surface 120 (left side surface in FIG. 21) on the first side in the X axis direction and a surface 121 (surface disposed at the back of the paper in FIG. 21) on the second side in the Y axis direction of the wafer stage WST1 are mirror-finished reflecting surfaces. Similarly, a surface 122 (right side surface in FIG. 21) on the second side in the X axis direction and a surface 123 on the first side in the Y axis direction of the wafer stage WST2 are mirror-finished reflecting surfaces. Interferometer beams of respective length-measuring axes (for example, BI1X and BI2X) for constructing the interferometer system as described later on are radiated onto the reflecting surfaces. Reflected light beams therefrom are received by the respective interferometers to thereby measure the displacement from the reference position of each of the reflecting surfaces (in general, a fixed mirror is arranged on the side surface of the projection optical system and the side surface of the alignment optical system to use the concerning portion as the reference plane). Accordingly, it is possible to measure the two-dimensional positions of the wafer stages WST1, WST2 respectively. The arrangement of the length-measuring axis of the interferometer system will be described in detail later on.

As shown in FIG. 21, alignment systems 124, 124b based on the off-axis system having the same function are installed at positions separated by an identical distance from the center of the optical axis of the projection optical system PL (coincident with the projection center of the reticle pattern image) respectively on the both sides of the projection optical system PL in the X axis direction. The alignment systems 124a, 124b include three types of alignment sensors of the LSA (Laser Step Alignment) system, the FIA (Field Image Alignment) system, and the LIA (Laser Interferometric Alignment) system. It is possible to measure the positions in the X, Y two-dimensional direction of the fiducial mark on the fiducial mark plate and the alignment mark on the wafer.

The LSA system resides in the most versatile sensor for measuring the mark position by radiating the laser beam onto the mark to utilize the diffracted and scattered light, and it has been hitherto widely used for the process wafer. The FIA system resides in the sensor for measuring the position of the mark by illuminating the mark with a broad band light beam such as a halogen lamp and image-processing the mark image, and it is effectively used for the asymmetric mark on the aluminum layer and the wafer surface. The LIA system resides in the sensor for detecting the position information of the mark from the phase such that the laser beams having slightly varied frequencies are radiated onto the diffraction grating-shaped mark in two directions to interfere two generated diffracted light beams, and it is effectively used for the wafer having low difference in height and surface roughness.

In the second embodiment of the present invention, the three types of the alignment sensors are appropriately used separately depending on the object to perform, for example, the so-called search alignment in which the positions of one-dimensional marks at three points on the wafer are detected to roughly measure the position of the wafer and the fine alignment in which the accurate position of each of shot areas on the wafer is measured.

In this arrangement, the alignment system 124a is used, for example, to measure the positions of the alignment mark on the wafer WI held on the wafer stage WST1 and the fiducial mark formed on the fiducial mark plate FM1. The alignment system 124b is used, for example, to measure the positions of the alignment mark on the wafer W2 held on the wafer stage WST2 and the fiducial mark formed on the fiducial mark plate FM2.

The information from the respective alignment sensors for constructing the alignment systems 124a, 124b is subjected to A/D conversion by an alignment control unit 180. The digitized waveform signal is subjected to the operation processing to detect the mark position. An obtained result is fed to a main control unit 190. The main control unit 190 instructs, depending on the result, for example, the stage control unit 160 to perform the correction of the synchronized position during the exposure.

Although not shown in the drawing, an autofocus/autoleveling (AF/AL) measuring mechanism for investigating the focusing position is provided for each of the projection optical system PL and the alignment systems 124a, 124b respectively as disclosed in Japanese Patent Application Laid-Open No. 10-163098 described above.

Next, the reticle-driving mechanism will be explained on the basis of FIGS. 21 and 22.

The reticle-driving mechanism includes the reticle stage RST which is movable in the XY two-dimensional directions on the reticle base board 28 while holding the reticle R, the driving system 29 which is composed of, for example, an unillustrated linear motor for driving the reticle stage RST, and the reticle laser interferometer 30 for measuring the position of the reticle stage RST by the aid of the movement mirror 31 fixed to the reticle stage RST.

The arrangement will be described in further detail below. As shown in FIG. 22, the two reticles R1, R2 can be placed in series in the scanning direction (Y axis direction) on the reticle stage RST. The reticle stage RST is supported in an floating manner on the reticle base board 28 by the aid of, for example, an unillustrated air bearing. The reticle stage RST is subjected to the fine driving in the X axis direction, the fine rotation in the θ direction, and the scanning driving in the Y axis direction by the aid of the driving system 29. The driving system 29 is a mechanism including a linear motor as a driving source. However, the driving system 29 is depicted as a simple block in FIG. 21 for the convenience of illustration and explanation. Accordingly, the reticles R1, R2 on the reticle stage RST are selectively used, for example, when the double exposure is performed. The system is constructed such that any of the reticles can be subjected to the scanning in synchronization with the wafer.

A parallel planar movement mirror 31X, which is composed of the same material as that of the reticle stage RST (for example, ceramic), is provided to extend in the Y axis direction at the end on the second side in the X axis direction on the reticle stage RST. A reflecting surface is formed by mirror-finishing on the surface on the second side in the X axis direction of the movement mirror 31X. The interferometer beam from the interferometer (not shown), which is indicated by the length-measuring axis BI6X, is radiated toward the reflecting surface of the movement mirror 31X. The interferometer receives the reflected light beam therefrom to measure the relative displacement with respect to the reference surface. Thus, the position of the reticle stage RST is measured. Actually, the intetferometer, which has the length-measuring axis BI6X, has two interferometer optical axes capable of performing the measurement independently. It is possible to measure the position of the reticle stage in the X axis direction and measure the yawing amount. The measured value of the interferometer having the length-measuring axis BI6X is used to perform the synchronized control in the X axis direction and the rotation control for the reticle stage RST in the direction to cancel the relative rotation (rotation error) of the reticle and the wafer on the basis of the X position information and the yawing information on the wafer stages WST1, WST2 from the interferometers 116, 118 having the length-measuring axes BI1X, BI2X on the side of the wafer stage as described later on.

On the other hand, a pair of corner cube mirrors $31_{y1}$, $31_{y2}$ are installed on the second side (front side of the plane of paper in FIG. 21) in the Y axis direction as the scanning direction (direction of scanning) of the reticle stage RST. Interferometer beams, which are depicted as length-measuring axes BI7Y, BI8Y in FIG. 22, are radiated onto the corner cube mirrors $31_{y1}$, $31_{y2}$ from a pair of unillustrated double-path interferometers. The beams are returned by the corner cube mirrors $31_{y1}$, $31_{y2}$ to the reflecting surface on the reticle base board 28. The reflected light beams reflected thereby are returned along the identical optical paths respectively, and they are received by the respective double-path interferometers to measure the relative displacement from the reference position of the respective corner cube mirrors $31_{y1}$, $31_{y2}$ (reference position as the reflecting surface on the reticle base board 28 described above). The measured values of the double-path interferometers are supplied to the stage control unit 160 shown in FIG. 21 to measure the position of the reticle stage RST in the Y axis direction on the basis of an average value thereof. The information on the position in the Y axis direction is used to calculate the relative position of the reticle stage RST and the wafer stage WST1 or WST2 on the basis of the measured value of the interferometer having the length-measuring axis BI3Y on the wafer side and synchronously control the reticle and the wafer in the scanning direction (Y axis direction) during the scanning exposure on the basis thereof.

As described above, in the second embodiment of the present invention, the reticle laser interferometer 30 shown in FIG. 21 is constructed by the three interferometers in total of the interferometer indicated by the length-measuring beam BI6X and the pair of double-path interferometers indicated by the length-measuring axes BI7Y, BI8Y.

Next, the interferometer system for managing the positions of the wafer stages WST1, WST2 will be explained with reference to FIGS. 21 to 23.

As shown in these drawings, the interferometer beam, which is indicated by the length-measuring axis BI1X from the interferometer 116 shown in FIG. 21, is radiated onto the surface on the first side of the wafer stage WST1 in the X axis direction, along the X axis passing through the projection center of the projection optical system PL and the respective detection centers of the alignment systems 124a, 124b. Similarly, the interferometer beam, which is indicated by the length-measuring axis BI2X from the interferometer 118 shown in FIG. 21, is radiated onto the surface on the second side of the wafer stage WST1 in the X axis direction, along the X axis. The interferometers 116, 118 measure the relative displacement of each of the reflecting surfaces from the reference position by receiving the reflected light beams therefrom to measure the positions of the wafer stages WST1, WST2 in the X axis direction.

As shown in FIG. 22, each of the interferometers 116, 118 is a three-axis interferometer having three optical axes. The interferometers 116, 118 are capable of performing the tilt measurement and the θ measurement in addition to the measurement in the X axis direction for the wafer stages WST1, WST2. In this arrangement, the unillustrated θ stage for performing the θ rotation of the wafer stages WST1, WST2 and the unillustrated Z-leveling stage for performing the inclination driving and the fine driving in the Z axis direction are actually disposed under the reflecting surfaces (120 to 123). Therefore, all of the driving amounts during the tilt control of the wafer stage can be monitored by using the interferometers 116, 118.

The respective interferometer beams of the length-measuring axes BI1X, BI2X always hit the wafer stages WST1, WST2 in all of the regions of the movement ranges of the wafer stages WST1, WST2. Therefore, as for the X axis direction, the positions of the wafer stages WST1, WST2 are managed on the basis of the measured values obtained by using the length-measuring axes BI1X, BI2X, for example, in any case of the exposure based on the use of the projection optical system PL and the use of the alignment systems 124a, 124b.

Figure 23:
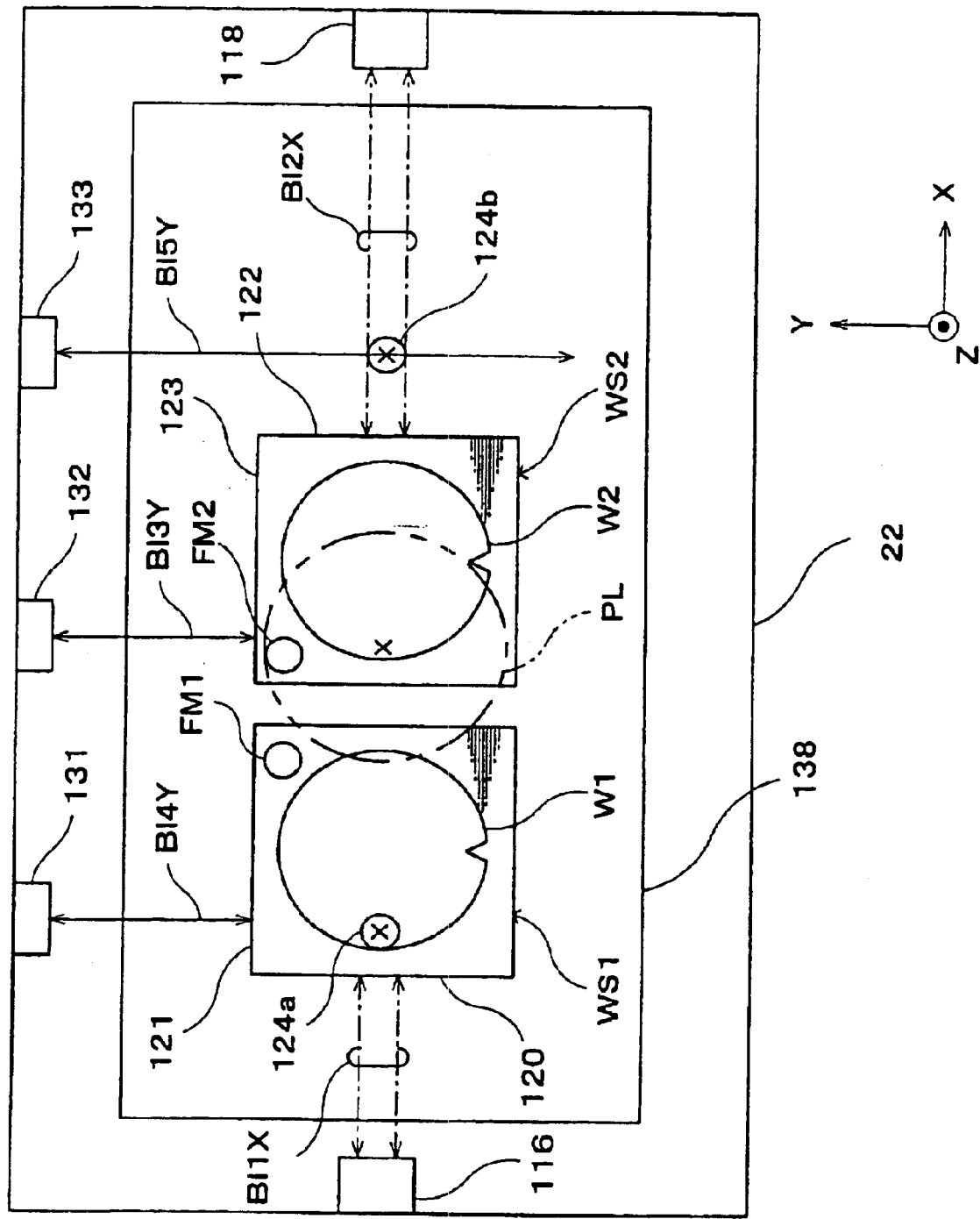
FIG. 23 shows a schematic plan view illustrating components disposed in the vicinity of a base board of the apparatus shown in FIG. 21.

As shown in FIGS. 22 and 23, there are provided an interferometer 132 which has a length-measuring axis BI3Y perpendicularly intersecting the X axis at the projection center of the projection optical system PL, and interferometers 131, 133 respectively having length-measuring axes BI4Y, BI5Y perpendicularly intersecting the X axis at the respective detection centers of the alignment systems 124a, 124b respectively.

In the case of the embodiment of the present invention, the measured value, which is obtained by the interferometer 132 of the length-measuring axis BI3Y passing through the projection center of the projection optical system PL, i.e., the optical axis AX, is used to measure the positions of the wafer stages WST1, WST2 in the Y direction during the exposure based on the use of the projection optical system PL. The measured value, which is obtained by the interferometer 131 of the length-measuring axis BI4Y passing through the detection center of the alignment system 124a, i.e., the optical axis SX, is used to measure the position of the wafer stage WST1 in the Y direction during the use of the alignment system 124a. The measured value, which is obtained by the interferometer 133 of the length-measuring axis BI5Y passing through the detection center of the alignment system 124b, i.e., the optical axis SX, is used to measure the position of the wafer stage WST2 in the Y direction during the use of the alignment system 124b.

Therefore, the length-measuring axis of the interferometer in the Y axis direction is deviated from the reflecting surface of the wafer stage WST1, WST2 depending on the respecting condition of use. However, at least one of the length-measuring axes, i.e., the length-measuring axes BI1X, BI2X is not deviated from the reflecting surface of each of the wafer stages WST1, WST2. Therefore, the interferometer on the Y side can be reset at an appropriate position at which the optical axis of the interferometer to be used enters the reflecting surface.

Each of the interferometers 132, 131, 133 of the length-measuring axes BI3Y, BI4Y, BI5Y for the Y measurement is the two-axis interferometer having two optical axes respectively, making it possible to perform the tilt measurement in addition to the measurement in the Y axis direction of the wafer stages WST1, WST2. In the embodiment of the present invention, the total five of interferometers 116, 118, 131, 132, 133 are used to construct the interferometer system for managing the two-dimensional coordinate positions of the wafer stages WST1, WST2.

The main control unit 190 shown in FIG. 21 is provided with a memory 191 for storing conditional expressions (for example, the interference condition) for managing the movement of the wafer stages WST1, WST2.

In the second embodiment of the present invention, as described later on, during the period in which the exposure sequence is executed for one of the wafer stages WST1, WST2, the wafer alignment sequence is executed for the other. During this process, in order to cause no interference between the both stages, the movement of the wafer stages WST1, WST2 is managed by the stage control unit 160 in response to the command of the main control unit 190 on the basis of the output values of the respective interferometers.

Next, brief explanation will be made, for example, the role and the control method of the movable type base board 138. The movable type base board 138 basically has its role equivalent to that of the movable type base board 38 of the first embodiment described above, and it is controlled by the stage control unit 160 in the same manner as described above.

That is, a plurality of coils (not shown) for constructing planar magnetically floating type linear actuators 42a, 42b are spread all over in the XY two-dimensional direction at the upper surface of the movable type base board 138 together with unillustrated permanent magnets provided at the lower surfaces of the wafer stages WST1, WST2. The wafer stages WST1, WST2 are arranged such that they are supported in an floating manner over the movable type base board 138 by the aid of the planar magnetically floating type linear actuators 42a, 42b, and they are independently driven in an arbitrary two-dimensional direction by controlling the current which is allowed to flow through the coil of the coils described above, disposed at the portion opposed to the respective wafer stages WST1, WST2.

The movable type base board 138 is arranged such that it is supported in an floating manner over the base board 22 by the aid of the planar magnetically floating type linear actuator 44, and it is driven in an arbitrary two-dimensional direction by controlling the current which is allowed to flow through the coil, in the same manner as the movable type base board 38 of the first embodiment.

In this arrangement, no contact is made between the wafer stages WST1, WST2 and the movable type base board 138 and between the movable type base board 138 and the base board 22 respectively. Therefore, the friction therebetween is extremely small. As a result, the law of conservation of momentum holds for the entire system including the wafer stages WST1, WST2 and the movable type base board 138, because of the following reason. That is, when one of the wafer stages WST1, WST2 is moved, the process is exactly the same as that explained in the first embodiment described above. When the wafer stages WST1, WST2 are simultaneously moved, the movable type base board 138 is moved by the reaction force which corresponds to the combined force of the driving forces of the stages.

The following setting is also made in the second embodiment in the same manner as in the first embodiment described above. That is, in order to suppress the deterioration of the foot print, the maximum velocity, and the acceleration of the wafer stage to be not more than one figure, the setting is made such that the ratio of the mass m of the wafer stages WST1, WST2 to the mass M of the movable type base board 138 is not more than m:M=1:9, i.e., the weight of the wafer stages WST1, WST2 is not more than ⅑ of the movable type base board 138.

In order to decrease the necessary stroke of the movable type base board 138, the stage control unit 160 varies the control response to the planar magnetically floating type linear actuator 44 for driving the movable type base board 138 between the processes of the exposure and the alignment and the other processes.

Therefore, when the exposure is performed, the wafer stage WST1 or WST2 and the reticle stage RST are moved in synchronization with each other. However, when the control response of the planar magnetically floating type linear actuator 44 for driving the movable type base board 138 is controlled at several Hz, it is almost impossible to follow the reaction force on the movable type base board 138 of the planar magnetically floating type linear actuators 42a, 42b for driving the wafer stages WST1, WST2 controlled at several tens Hz. According to the law of conservation of momentum, the movable type base board 138 freely makes motion, and it absorbs the reaction force. No influence of the reaction force is exerted to the outside.

Further, the stage control unit 160 is operated as follows. That is, when the main exposure apparatus body 12 is inclined as a whole due to any change of the position of the reticle stage RST and the positions of the wafer stages WST1, WST2, the low frequency positional discrepancy, in which the movable type base board 138 is moved in the inclination direction, is prevented by controlling the control response of the planar magnetically floating type linear actuator 44 at several Hz.

This embodiment also adopts the feedback control as follows, based on the use of a linear encoder 45 (see FIG. 21) as the position-measuring unit for detecting the position of the relative movement in the XY direction of the movable type base board 138 with respect to the base board 22, in the same manner as in the first embodiment. That is, the stage control unit 160 decreases the movement amount of the movable type base board 138 (maintains it approximately at a predetermined position), at a predetermined timing, for example, by means of the operation to increase the response frequency of the planar magnetically floating type linear actuator 44 for driving the movable type base board 138 to be several tens Hz.

The control system principally comprises the main control unit 190 for collectively controlling the entire apparatus, and it further comprises, for example, the exposure amount control unit 170 and the stage control unit 160 which are managed by the main control unit 190.

Explanation will now be made for the operation of the exposure apparatus 110 during the exposure, principally referring to the operations of the respective constitutive components of the control system described above.

The exposure amount control unit 170 opens an unillustrated shutter in the illumination optical system 18 by the aid of an unillustrated shutter-driving section before starting the synchronous scanning of the reticle R and the wafer (W1 or W2).

After that, the stage control unit 160 starts the synchronous scanning (scanning control) for the reticle R and the wafer (W1 or W2), i.e., for the reticle stage RST and the wafer stage (WST1 or WST2) in response to the instruction of the main control unit 190. The synchronous scanning is performed by controlling the reticle-driving section 29 and the wafer stage driving system (planar magnetically floating type linear actuator 42a or 42b) by using the stage control unit 160 while monitoring the measured values of the length-measuring axis BI3Y and the length-measuring axis BI1X or BI2X of the interferometer system and the length-measuring axes BI7Y, BI8Y and the length-measuring axis BI6X of the reticle laser interferometer 30.

The exposure amount control unit 170 starts the pulse light emission of the excimer laser at the point of time at which the both stages are subjected to the constant velocity control within a predetermined allowable error. Accordingly, the rectangular illumination area IA on the reticle R, which has the pattern vapor-deposited with chromium on the lower surface, is illuminated with the illumination light beam from the illumination optical system 18. The image of the pattern in the illumination area is reduced ¼-fold (or ⅕-fold) by the projection optical system PL, and it is projected to perform the exposure of the wafer (W1 or W2) having the photoresist applied to the surface. As also clarified from FIG. 22, the slit width in the scanning direction of the illumination area IA is narrow as compared with the pattern area on the reticle R. The image of the entire surface of the pattern is successively formed on the shot area on the wafer by synchronously scanning the reticle R and the wafer (W1 or W2) as described above.

The exposure amount control unit 170 drives the vibration mirror 18D simultaneously with the start of the pulse light emission to continuously perform the control until the pattern area on the reticle R completely passes over the illumination area IA (see FIG. 22), i.e., until the image of the entire surface of the pattern is formed on the shot area on the wafer. Thus, uneven interference fringes are reduced, which would be otherwise generated for the two fly's eye lenses.

The movable blind 18M is driven and controlled by the driving system 43 in synchronization with the scanning for the reticle R and the wafer W so that the illumination light beam is not leaked to the outside of the shield area on the reticle at the shot edge portion during the scanning exposure.

The system is arranged as follows as disclosed in Japanese Patent Application Laid-Open No. 10-163098 so that the cumulative exposure amount corresponding to the resist sensitivity is obtained during the scanning exposure (exposure by scanning) described above. That is, the main control unit 190 or the exposure amount control unit 170 calculates all of the variable amounts of the radiation energy and the oscillation frequency to control the light-reducing system provided at the inside of the light source section so that the radiation energy and the oscillation frequency are varied, and the shutter and the vibration mirror are controlled.

For example, when the movement start position (synchronized position) is corrected for the reticle stage and the wafer stage to perform the synchronous scanning during the scanning exposure, the main control unit 190 instructs the stage control unit 160 for controlling the movement of the respective stages to perform the correction of the stage position corresponding to the correction amount.

The exposure apparatus 110 according to the embodiment of the present invention further comprises a first transport system for exchanging the wafer with respect to the wafer stage WST1, and a second transport system for exchanging the wafer with respect to the wafer stage WST2.

Figure 24:
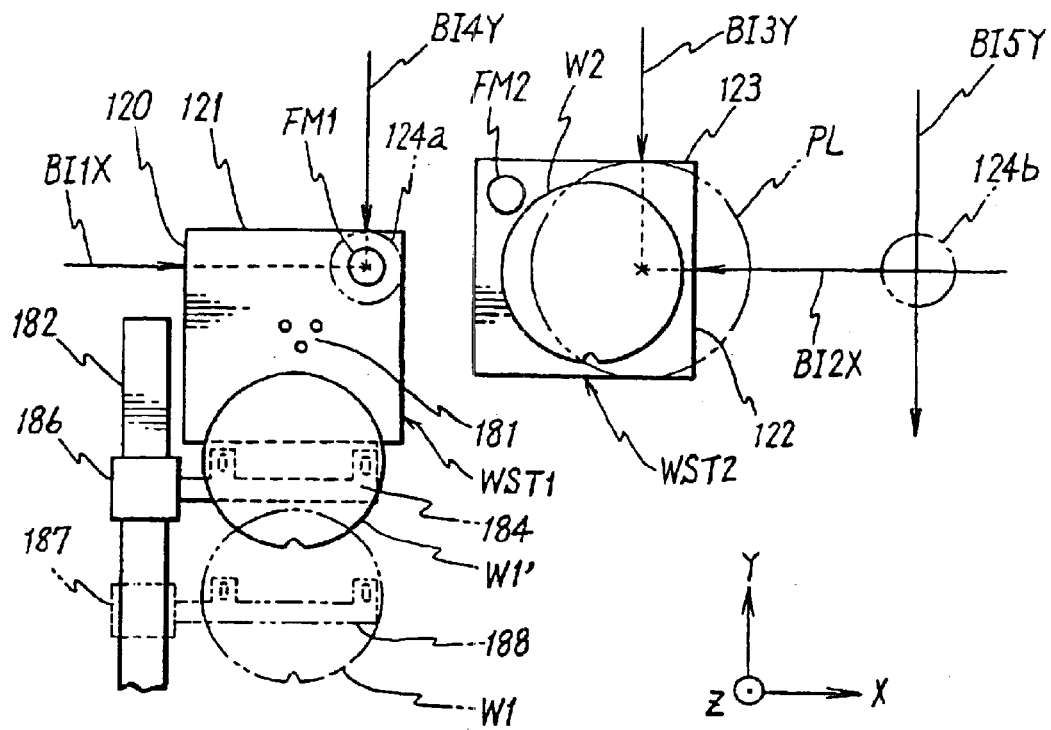
FIG. 24 shows a plan view illustrating a state in which the wafer exchange/alignment sequence and the exposure sequence are performed by using the two wafer stages.

As shown in FIG. 24, the first transport system performs the wafer exchange as described later on for the wafer stage WST1 at the left wafer loading position. The first transport system comprises a first wafer loader including, for example, a first loading guide 182 which extends in the Y axis direction, a first slider 186 and a second slider 187 which are movable along the loading guide 182, a first unload arm 184 which is attached to the first slider 186, and a first load arm 188 which is attached to the second slider 187, and a first center-up 181 including three vertical movement members which are provided on the wafer stage WST1.

The operation of the wafer exchange performed by the first transport system will now be briefly explained. Explanation will be made for a case as shown in FIG. 24 in which the wafer W1' placed on the wafer stage WST1 disposed at the left wafer loading position is exchanged with the wafer W1 transported by the first wafer loader.

At first, the main control unit 190 turns off the vacuum suction of the unillustrated wafer holder on the wafer stage WST1 by the aid of an unillustrated switch to release the wafer W1' from the vacuum suction.

Subsequently, the main control unit 190 upwardly drives the center-up 181 by a predetermined amount by the aid of an unillustrated center-up driving system. Accordingly, the wafer W1' is lifted up to a predetermined position. In this state, the main control unit 190 instructs the unillustrated wafer loader control unit to move the first unload arm 184. Accordingly, the first slider 186 is driven and controlled by the wafer loader control unit. The first unload arm 184 is moved to a position over the wafer stage WST1 along the loading guide 182, and it is disposed just under the wafer W1'.

In this state, the main control unit 190 downwardly drives the center-up 181 to a predetermined position. During the downward movement of the center-up 181, the wafer W1' is delivered to the first unload arm 184. Accordingly, the main control unit 190 instructs the wafer loader control unit to start the vacuum suction of the first unload arm 184. Accordingly, the wafer W1' is sucked and held by the first unload arm 184.

Subsequently, the main control unit 190 instructs the wafer loader control unit to retract the first unload arm 184 and start the movement of the first load arm 188. Accordingly, the first unload arm 184 starts the movement in the −Y direction in FIG. 24 integrally with the first slider 186, simultaneously with which the second slider 187 starts the movement in the +Y direction integrally with the first load arm 188 which holds the wafer W1. When the first load arm 188 arrives at a position over the wafer stage WST1, then the wafer loader control unit stops the second slider 187, and the vacuum suction of the first load arm is released.

In this state, the main control unit 190 upwardly drives the center-up 181 to lift-up the wafer W1 from the lower position by the aid of the center-up 181. Subsequently, the main control unit 190 instructs the wafer loader control unit to retract the load arm. Accordingly, the second slider 187 starts the movement in the −Y direction integrally with the first load arm 188 to retract the first load arm 188. Simultaneously with the start of the retraction of the first load arm 188, the main control unit 190 starts the downward driving of the center-up 181 to place the wafer W1 on the unillustrated wafer holder on the wafer stage WST1, and the vacuum suction is turned on for the concerning wafer holder. Accordingly, the series of sequence for the wafer exchange comes to an end.

Figure 25:
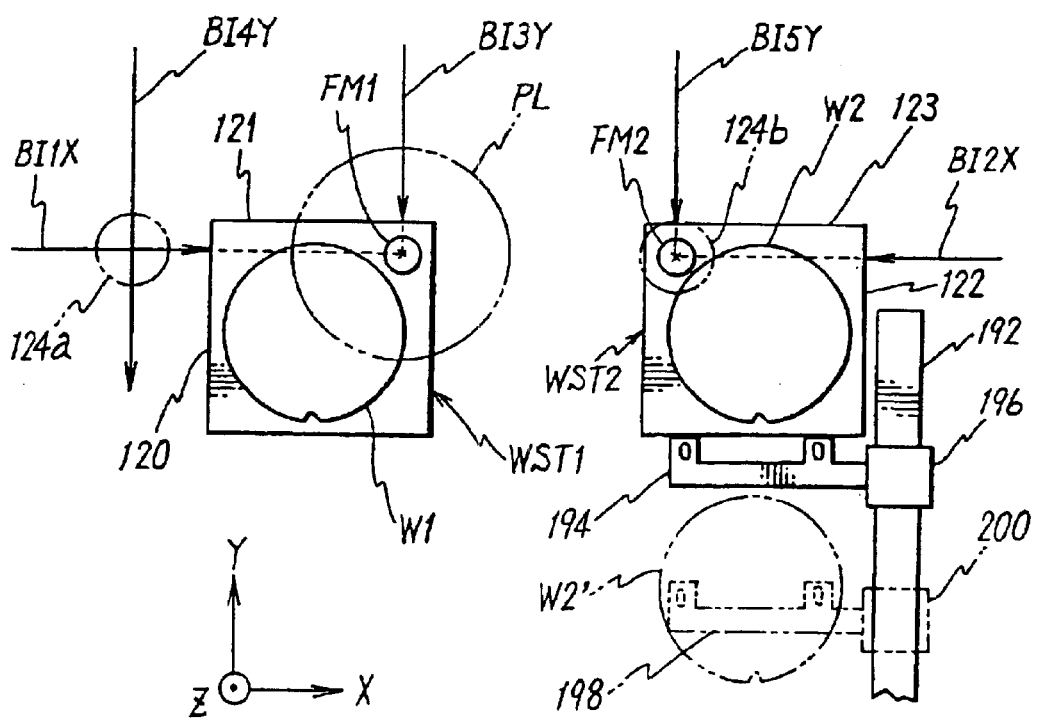
FIG. 25 shows a state in which the wafer exchange/alignment sequence and the exposure sequence shown in FIG. 24 are switched.

Similarly, as shown in FIG. 25, the second transport system performs the wafer exchange for the wafer stage WST2 at the right wafer loading position in the same manner as described above. The second transport system comprises a second wafer loader including, for example, a second loading guide 192 which extends in the Y axis direction, a third slider 196 and a fourth slider 200 which are movable along the second loading guide 192, a second unload arm 194 which is attached to the third slider 196, and a second load arm 198 which is attached to the fourth slider 200, and an unillustrated second center-up provided on the wafer stage WST2.

Next, the concurrent process performed by the two wafer stages WST1, WST2 will be explained with reference to FIGS. 24 and 25.

FIG. 24 shows a plan view illustrating the state in which the wafer exchange is performed between the wafer stage WST1 and the first transport system as described above at the left loading position during the period in which the exposure operation is performed for the wafer W2 on the wafer stage WST2 by the aid of the projection optical system PL. In this case, the alignment operation is performed as described later on continuously to the wafer exchange on the wafer stage WST1. In FIG. 24, the position of the wafer stage WST2 during the exposure operation is controlled on the basis of the measured values of the length-measuring axes BI2X, BI3Y of the interferometer system. The position of the wafer stage WST1 for performing the wafer exchange and the alignment operation is controlled on the basis of the measured values of the length-measuring axes BI1X, BI4Y of the interferometer system.

At the left loading position shown in FIG. 24, the fiducial mark on the fiducial mark plate FM1 of the wafer stage WST1 is arranged just under the alignment system 124a. Accordingly, the main control unit 190 resets the interferometer having the length-measuring axis BI4Y of the interferometer system before the fiducial mark on the fiducial mark plate FM1 is measured by the alignment system 124a.

The search alignment is performed continuously to the wafer exchange and the reset of the interferometer described above. The search alignment, which is performed after the wafer exchange, is the pre-alignment performed again on the wafer stage WST1, because the position error is large only with the pre-alignment which is performed during the transport of the wafer W1. Specifically, positions of three search alignment marks (not shown) formed on the wafer W1 placed on the wafer stage WST1 are measured by using, for example, the sensor of the LSA system of the alignment system 124a. The position of the wafer W1 is adjusted in the X, Y, and θ directions on the basis of the obtained result of the measurement. The operation of the respective components during the search alignment is controlled by the main control unit 190.

After completing the search alignment, the fine alignment is performed to determine the array of the respective shot areas on the wafer W1 by using EGA in this embodiment. Specifically, the alignment mark position of a predetermined sample shot on the wafer W1 is measured, for example, with the sensor of the FIA system of the alignment system 124a while successively moving the wafer stage WST1 on the basis of the designed shot array data (alignment mark position data) while managing the position of the wafer stage WST1 by using the interferometer system (length-measuring axes BI1X, BI4Y). The array data is calculated for all shots in accordance with the statistic operation based on the least square method on the basis of the obtained result of the measurement and the designed coordinate data of the shot array. The operation of the respective components during EGA is controlled by the main control unit 190. The calculating operation is performed by the main control unit 190. It is desirable that the calculation result is converted into those based on the coordinate system with reference to the fiducial mark position of the fiducial mark plate FM1.

In the case of the embodiment of the present invention, as described above, the position of the alignment mark is measured while executing the autofocus/autoleveling based on the measurement and control of the AF/AL mechanism in the same manner as in the process of the exposure, during the measurement performed by the alignment system 124a. It is possible to cause no offset (error) which would be otherwise caused by the attitude of the stage between the alignment process and the exposure process.

The double exposure is performed in accordance with the step-and-scan manner continuously while changing the exposure condition by using the two reticles R1, R2 on the side of the wafer stage WST2 during the period in which the wafer exchange and the alignment operation are performed on the side of the wafer stage WST1 as described above.

Specifically, the fine alignment is previously performed in the same manner as performed on the side of the wafer W1 described above. The movement operation (stepping) between the shots is successively performed to step to the adjacent shot on the wafer W2 on the basis of the resultant shot array data (based on the fiducial mark on the fiducial mark plate FM2) on the wafer W2. The scanning exposure described above is successively performed for the respective shot areas on the wafer W2. During the movement operation between the shots, the movement of the wafer stage WST2 is controlled in the same manner as that explained with reference to FIGS. 11A to 11(C) in the first embodiment described above.

The exposure for all of the shot areas on the wafer W2 as described above is also continuously performed after exchanging the reticle. Specifically, the following exposure sequence is available for the double exposure. That is, for example, the respective shot areas on the wafer W1 are successively subjected to the scanning exposure by using the reticle R2, and then the reticle stage RST is moved by a predetermined amount in the scanning direction to set the reticle R1 at the exposure position, followed by performing the scanning exposure in the sequence reverse to the above. During this process, the exposure condition (AF/AL, exposure amount) and the transmittance are different between the reticle R2 and the reticle R1. Therefore, it is necessary that the respective conditions are measured during the reticle alignment, and the condition is changed depending on the obtained result.

The operation of the respective components during the double exposure for the wafer W2 is also controlled by the main control unit 190.

The exposure sequence and the wafer exchange/alignment sequence, which are performed concurrently on the two wafer stages WST1, WST2 shown in FIG. 24 described above, are executed as follows. That is, the wafer stage, on which the operation is completed earlier, is in the waiting state. At the point of time at which the operations for the both are completed, the wafer stages WST1, WST2 are controlled and moved to the positions shown in FIG. 25. The wafer W2 on the wafer stage WST2, for which the exposure sequence is completed, is subjected to the wafer exchange at the right loading position. The wafer W1 on the wafer stage WST1, for which the alignment sequence is completed, is subjected to the exposure sequence under the projection optical system PL.

The right loading position shown in FIG. 25 is arranged such that the fiducial mark on the fiducial mark plate FM2 is located under the alignment system 124b in the same manner as the left loading position. The wafer exchange operation and the alignment sequence are executed. Of course, the reset operation for the interferometer of the length-measuring axis BI5Y of the interferometer system is executed prior to the detection of the mark on the fiducial mark plate FM2 by the alignment system 124b.

The reset operation for the interferometer, which is performed by the main control unit 190 during the process of the series of concurrent process operation described above, is exactly the same as the operation disclosed in Japanese Patent Application Laid-Open No. 10-163098 described above, which is known, and detained explanation of which will be omitted.

When the different operations are subjected to the simultaneous concurrent process by using the two wafer stages WST1, WST2 as in the embodiment of the present invention, there is a possibility that the operation performed on one stage may affect (give any disturbance to) the operation performed on the other stage. In such a case, in the exposure apparatus described in Japanese Patent Application Laid-Open No. 10-163098 described above, the control operation is complicated, because the timing is adjusted for the operations performed on the two stages WST1, WST2 as disclosed in FIGS. 11 to 13 and the corresponding description thereof disclosed in the foregoing patent document.

On the contrary, in the case of the embodiment of the present invention, as described above, the wafer stages WST1, WST2 are arranged on the base board 22 with the movable type base board 138 intervening therebetween. Accordingly, when any one of the wafer stages (WST1 or WST2) is driven by the planar magnetically floating type linear actuator 42a or 42b, then the movable type base board 138 is moved in accordance with the reaction force of the driving force, and the unbalanced load, which is caused by the movement of the center of gravity of the wafer stage (WST1 or WST2), can be canceled by means of the movement of the center of gravity of the movable type base board 138. As a result, the center of gravity of the entire stage apparatus 101 can be retained at the predetermined position. Additionally, when the wafer stages WST1, WST2 are simultaneously driven by the planar magnetically floating type linear actuators 42a, 42b, the movable type base board 138 is moved so that the unbalanced load, which is caused by the movement of the centers of gravity of the wafer stages WST1, WST2, is canceled by the movement of the center of gravity of the movable type base board 138 in accordance with the reaction force corresponding to the combined force of the driving forces. As a result, the center of gravity of the entire stage apparatus 101 can be retained at the predetermined position. Therefore, it is unnecessary to adjust the operations of the both wafer stages such that the operation of one of the wafer stages WST1, WST2 does not act as any disturbance on the other. Therefore, the control load is mitigated, and it is possible to maintain the high position control performance for the respective stages.

When the double exposure is performed by using the plurality of reticles R as described above, the effect is obtained for the high resolution and the improvement of DOF (depth of focus). However, in the double exposure method, it is necessary to repeat the exposure step at least twice. Therefore, in the case of the conventional exposure apparatus, an inconvenience arises in that the exposure time is prolonged, and the throughput is greatly deteriorated. On the contrary, in the second embodiment of the present invention, the throughput can be remarkably improved owing to the simultaneous concurrent process, for example, for the exposure operation on one of the wafer stages and the alignment/wafer exchange operation on the other wafer stage. Therefore, it is possible to obtain the effect of the high resolution and the improvement of DOF without deteriorating the throughput.

As also disclosed in Japanese Patent Application Laid-Open No. 10-163098 described above, in the case of the exposure apparatus provided with the double wafer stages, for example, when it is assumed that the respective process periods of time are T1 (wafer exchange time), T2 (search alignment time), T3 (fine alignment time), and T4 (one time of exposure time), if the double exposure is performed while executing the concurrent process for T1, T2, T3, and T4, then the exposure time constitutes the constraint condition to determine the overall throughput in the case of the 8-inch wafer, because the exposure time is greater. However, in the second embodiment of the present invention, it is possible to shorten the exposure time T4 owing to the reduction of the movement time between the shots of the wafer stages WST1, WST2. It is possible to realize the double exposure with the high throughput which is approximately equivalent to that obtained in the ordinary single exposure.

The second embodiment described above is illustrative of the case in which the stage apparatus according to the present invention is applied to the apparatus for performing the exposure for the wafer by using the double exposure method. However, the present invention is also applicable to the stitching which is a similar technique. In this case, during the period in which the exposure is performed twice with the two reticles on the side of one wafer stage, the wafer exchange and the wafer alignment are concurrently carried out on the side of the other wafer stage which is independently movable. Accordingly, it is possible to obtain the throughput which is higher than that obtained by the stitching performed with the ordinary exposure apparatus.

However, the applicable range of the stage apparatus according to the present invention is not limited thereto. The present invention is also preferably applicable to the case in which the exposure is performed in accordance with the single exposure.

The second embodiment described above is illustrative of the case in which the alignment operation and the wafer exchange operation and the exposure operation are subjected to the concurrent process. However, there is no limitation thereto. For example, the concurrent process may be performed together with the exposure operation in the same manner as described above for the sequence including, for example, the base line check (BCHK) and the calibration which is performed every time when the wafer exchange is performed.

Figure 26:
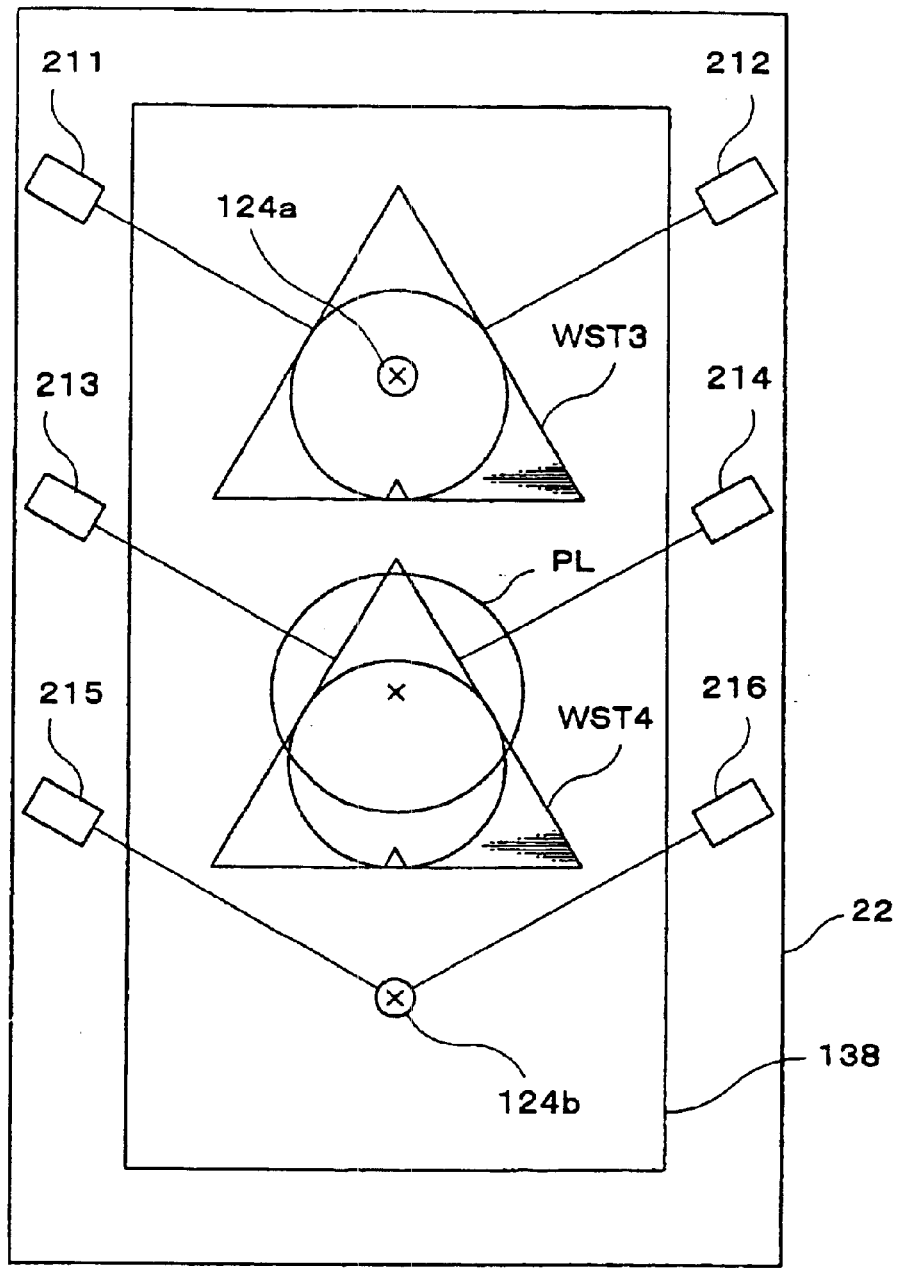
FIG. 26 shows a schematic plan view illustrating a modified embodiment of the second embodiment, depicting an example in which two triangular wafer stages are used as first movable members.

The second embodiment described above is illustrative of the exposure apparatus in which the square stages are used for the two wafer stages WST1, WST2. However, there is no limitation thereto. For example, as shown in FIG. 26, triangular wafer stages WST3, WST4, which are similar to the stage used in the first embodiment, may be arranged on the movable type base board 138 on the base board 22. As shown in FIG. 26, in the case of the apparatus shown in FIG. 26, it is preferable that the interferometer system for measuring the positions of the wafer stages WST3, WST4 comprises respective pairs of, i.e., total six of interferometers 211, 212, 213, 214, 215, 216 having length-measuring axes inclined by predetermined angles with respect to the XY axes intersecting at the centers of the projection optical system PL and the alignment optical systems 124a, 124b.

The second embodiment described above is illustrative of the case in which the wafer stages WST1, WST2 as the first movable members for constructing the stage apparatus 101 are driven by the planar magnetically floating type linear actuators. However, the stage apparatus according to the present invention is not limited thereto. The driving unit for driving each of the first movable members may be, for example, an ordinary linear motor.

The second embodiment described above is illustrative of the case in which the scanning exposure is performed in accordance with the step-and-scan system. However, the applicable range of the stage apparatus according to the present invention is not limited thereto. It is a matter of course that the present invention is also applicable equivalently, for example, to the projection exposure apparatus such as a stepper for performing the stationary exposure in accordance with the step-and-repeat system, the proximity exposure apparatus for transferring the pattern on the mask to the substrate by making tight contact between the mask and the substrate without using the projection optical system, the EB exposure apparatus, and the X-ray exposure apparatus.

In the description of the embodiment described above, the velocity control method has been explained, in which the movement locus during the movement between the shots of the wafer stage WST is set to be U-shaped as shown in FIG. 11(A), with reference to FIGS. 11(B) and 11(C). Explanation has been made concerning this process in which the wafer stage WST (and the reticle stage RST) is accelerated in the scanning direction up to the target scanning velocity (velocity of scanning) at the constant rate of acceleration, and the stage is decelerated at the constant rate of acceleration (constant rate of deceleration) after completing the scanning exposure at the target scanning velocity (see FIGS. 10(B) and 11(B)). However, the throughput can be further improved by changing the method for controlling the rate of acceleration of the reticle stage RST and the wafer stage WST concerning the scanning direction.

Figure 27:
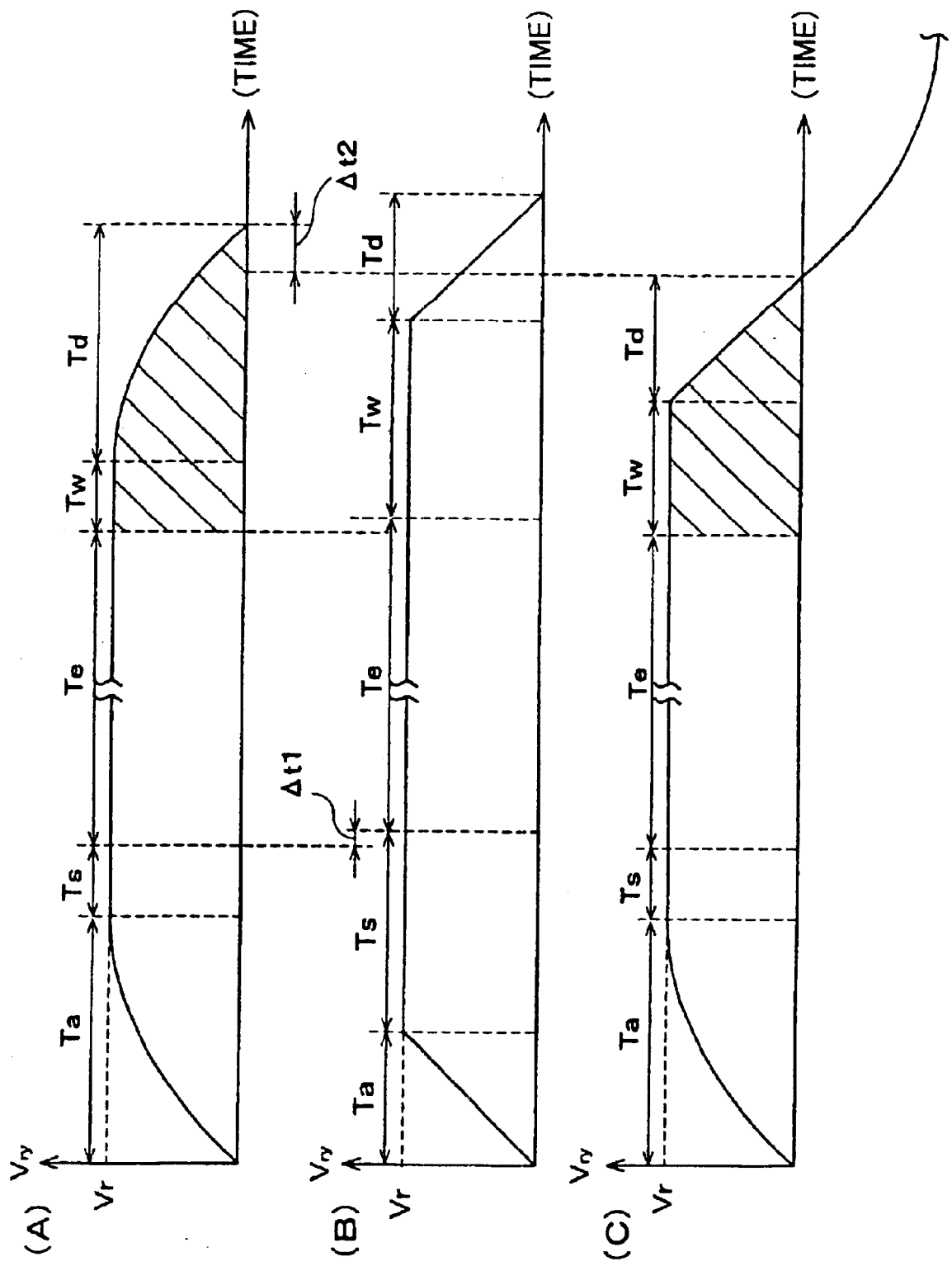
FIG. 27(A) shows a diagram illustrating the time-dependent change of the velocity command value in the scanning direction of the reticle stage when the first acceleration control method is adopted.
FIG. 27(B) shows a diagram illustrating the time-dependent change of the velocity command value in the scanning direction of the reticle stage corresponding to FIG. 11(B)
FIG. 27(C) shows a diagram illustrating the time-dependent change of the velocity command value in the scanning direction of the reticle stage when the second acceleration control method is adopted.
Figure 28:
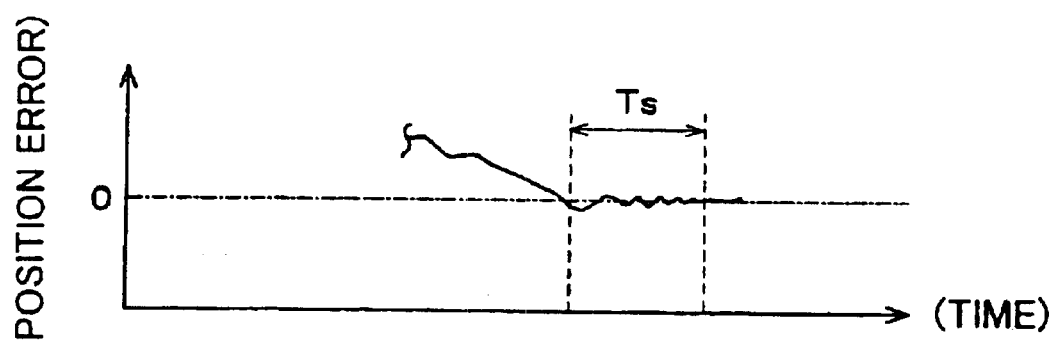
FIGS. 28(A) and 28(B) show diagrams illustrating the time-dependent change of the position error with respect to the target position of the reticle stage in the vicinity of the settling time Ts corresponding to FIGS. 27(A) and 27(B) respectively.
Figure 28:
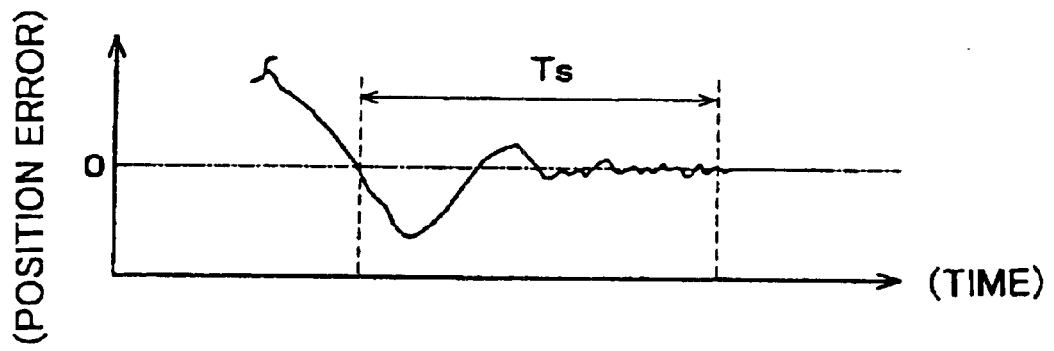
Figure 29:
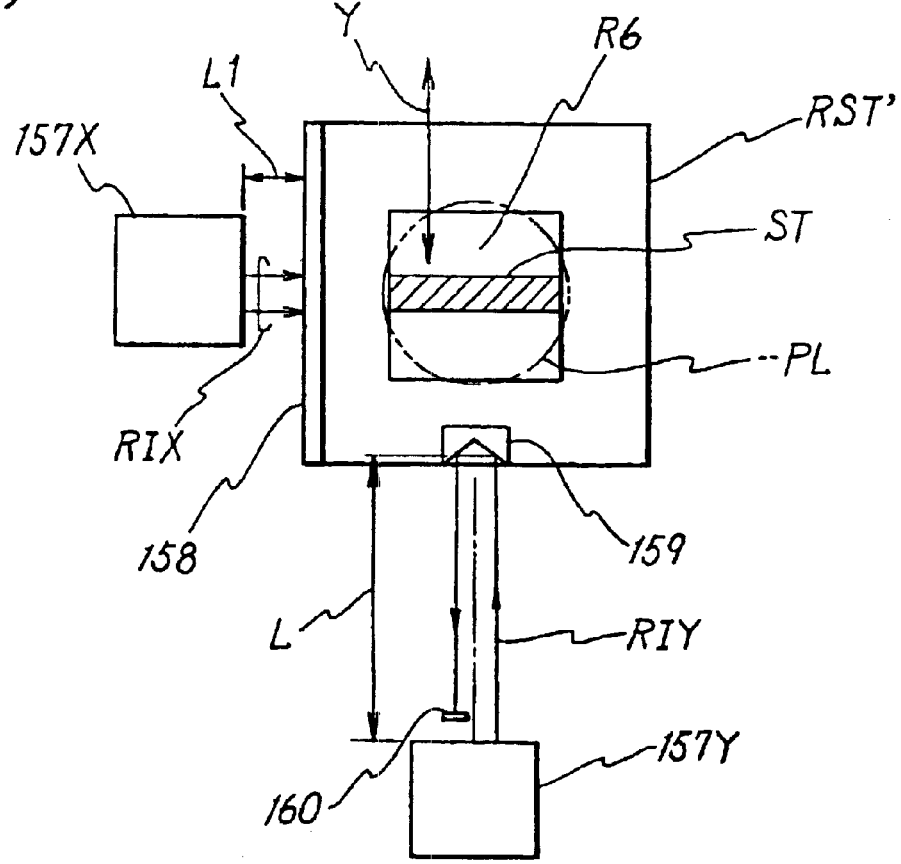
Figure 29:
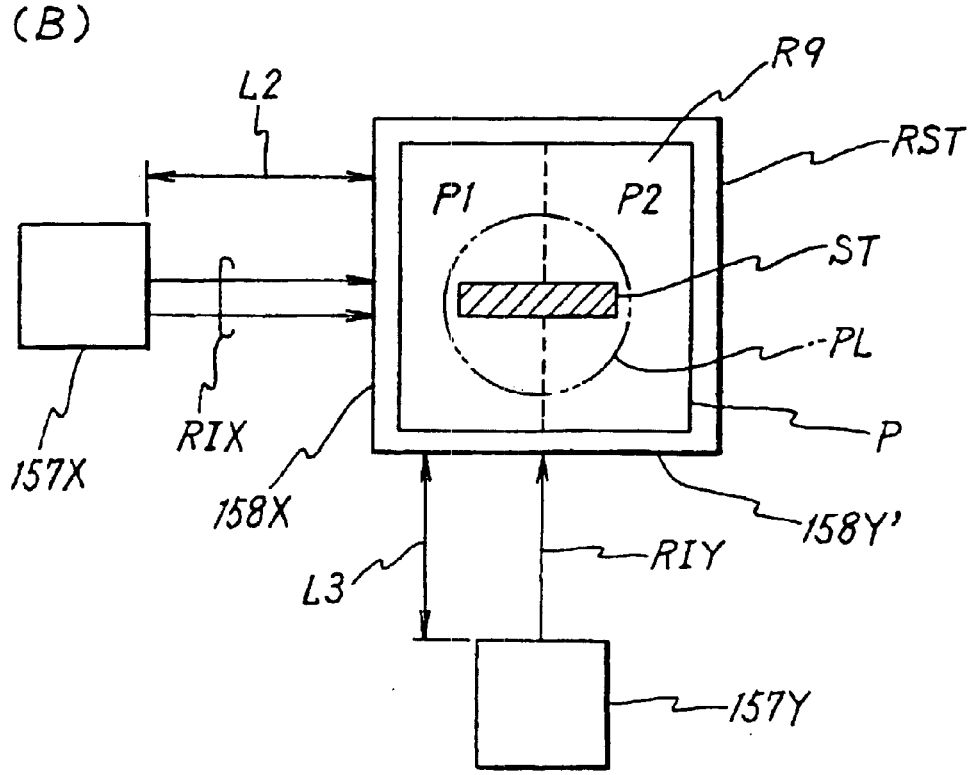

Explanation will be made below with reference to FIGS. 27 and 28 for the method for controlling the rate of acceleration of the stage based on the use of the stage control system when the adjacent shots S1, S2, S3 shown in (A) are successively exposed in accordance with the alternate scanning by using the scanning type exposure apparatus 10 according to the first embodiment described above.

Description of the Fifth Concept

In the case of the scanning type exposure apparatus 10, it is necessary to scan the reticle stage RST at the target scanning velocity which is 4-fold (or 5-fold) that of the wafer stage WST. Therefore, it is estimated that the constraint condition is the acceleration ability of the reticle stage. Accordingly, explanation will be made principally for the control of the rate of acceleration of the reticle stage RST.

FIG. 27(A) shows the time-dependent change of the velocity command value in the scanning direction (Y direction) of the reticle stage RST when the first method for controlling the rate of acceleration is adopted for the scanning exposure for the respective shots in the scanning exposure method according to the present invention. FIG. 27(B) shows Comparative Example of the time-dependent change of the velocity command value in the scanning direction (Y direction) of the reticle stage RST corresponding to FIG. 11(B) explained above. FIG. 27(C) shows the time-dependent change of the velocity command value in the scanning direction (Y direction) of the reticle stage RST when the second method for controlling the rate of acceleration is adopted for the scanning exposure for the respective shots. In these drawings, the horizontal axis indicates the time, and the vertical axis indicates the velocity command value Vry in the Y direction of the reticle stage.

In the following description, it is assumed that Ta represents the acceleration time from zero to the target scanning velocity Vr, Ts represents the synchronous settling time for the reticle and the wafer, Te represents the exposure time, Tw represents the adjustment time, i.e., the constant velocity over-scanning time, and Td represents the deceleration time from the target scanning velocity Vr to zero.

As shown in FIG. 27(A), the first method for controlling the rate of acceleration does not resides in the constant rate of acceleration control based on the maximum rate of acceleration obtained by the maximum thrust force capable of being generated by the linear motor for constructing the driving system 29 shown in FIG. 2. The reticle stage RST is accelerated in the synchronous movement direction (Y direction) from the velocity zero to the target scanning velocity Vr on the basis of a rate of acceleration change curve in which the rate of acceleration is gradually converged to zero. In this case, a quadric curve (parabola) or a higher-order curve is used as the rate of acceleration change curve.

According to the first method for controlling the rate of acceleration, the reticle R is accelerated in the Y direction on the basis of the rate of acceleration change curve in which the rate of acceleration is gradually converged to zero, before the synchronous movement of the reticle R and the wafer W when the scanning exposure is performed for the respective shots. Therefore, the rate of acceleration is not changed discontinuously, i.e., suddenly at the point of time of completion of the acceleration, unlike the case in which the acceleration is performed at a constant rate of acceleration to the target scanning velocity Vr as shown in FIG. 27(B).

FIGS. 28(A) and 28(B) show the time-dependent change of the position error with respect to the target position of the reticle stage RST in the vicinity of the settling time Ts corresponding to FIGS. 27(A) and 27(B) respectively. The target position is of course changed in a time-dependent manner. However, FIGS. 28(A) and 28(B) illustrate the position error on the basis of the target position (0 in the drawings) at the respective points of time. As clarified from the comparison between FIGS. 28(A) and 28(B), it is understood that according to the first method for controlling the rate of acceleration, the position error with respect to the target position can be quickly converged to be within an allowable range, as compared with the case shown in FIG. 27(B), because of the following reason. That is, it is possible to suppress the high frequency vibration of the reticle stage RST resulting from the sudden change of the rate of acceleration. In this case, it is possible to realize the prompt convergence to the target position of the reticle stage RST that is the stage in which the acceleration ability is the constraint condition, and hence to the target scanning velocity. It is clear that the synchronous settling time Ts for the reticle R (reticle stage RST) and the wafer W (wafer stage WST) can be consequently shortened (see FIGS. 27(A) and 27(B)).

When the first method for controlling the rate of acceleration is adopted, there is such a tendency that the acceleration time Ta itself is prolonged as compared with the case of the acceleration with the constant rate of acceleration.

However, the reduction of the synchronous settling time Ts sufficiently supplements the increase of the acceleration time. As clarified from the comparison between FIGS. 27(A) and 27(B), the pre-scanning time (Ta+Ts) is shorter by Δt1 when the first method for controlling the rate of acceleration is adopted. As described above, the synchronous settling time Ts and the constant velocity over-scanning time Tw are set to be the same time. Therefore, the constant velocity over-scanning time Tw is also short in the case of FIG. 27(A). In the case of FIG. 27(A) in which the velocity change on the acceleration side at the left is symmetrical to that on the deceleration side at the right in which the control is extremely easy, it is possible to shorten, by 2Δt1, the total period of time from the start of acceleration to the end of deceleration of the reticle stage RST. It is possible to improve the throughput corresponding thereto.

Concerning the first method for controlling the rate of acceleration described above, explanation has been made for the case in which the velocity change on the acceleration side at the left is set to be symmetrical to that on the deceleration side at the right, because the control is extremely easy. However, there is no trouble at all even when the rate of acceleration is suddenly changed during the deceleration, because there is no settling time for synchronously controlling the reticle and the wafer at the completion of the deceleration.

In view of this fact, in the second method for controlling the rate of acceleration, as shown in FIG. 27(C), the reticle stage RST is decelerated only during the deceleration at a constant rate of acceleration (negative rate of acceleration) corresponding to the maximum rate of acceleration. In this case, the constant velocity over-scanning time Tw is long as compared with the case of the first method for controlling the rate of acceleration shown in FIG. 27(A). However, the deceleration time Td is extremely short. Therefore, it is understood that the total over-scanning time (Tw+Td) is shorter by the time Δt2 than that of the first method for controlling the rate of acceleration (see FIGS. 27(A) and 27(C)). Therefore, when the scanning exposure is performed for the shots S1, S2, S3, it is possible to further shorten the total time required from the start of the acceleration to the end of the deceleration of the reticle R. If the areal size of the hatched portion shown in FIG. 27(A) is equal to that shown in FIG. 27(C), it is possible to correctly stop the reticle stage RST at the scanning start position for the next shot.

The first and second methods for controlling the rate of acceleration described above are also applicable to the wafer stage in the same manner as described above. The application of the first and second methods for controlling the rate of acceleration to both of the reticle stage and the wafer stage is most preferred from a viewpoint of the improvement of the throughput.

The first and second methods for controlling the rate of acceleration may be adopted for the acceleration control in the scanning direction (Y direction) used when the wafer stage WST is moved along the U-shaped (or V-shaped) movement locus as shown in FIG. 11(A) between the scanning exposure for the shot S1 and the scanning exposure for the shot S2 shown in FIG. 11(A). For example, when the first method for controlling the rate of acceleration is adopted, the wafer W is consequently moved along the route near to the shortest distance. Therefore, it is possible to further improve the throughput in combination with the reduction of the settling time described above. When the second method for controlling the rate of acceleration is adopted, it is possible to further improve the throughput, because the deceleration time can be shortened as well.

The first and second methods for controlling the rate of acceleration can be also performed by determining the control amount of the rate of acceleration by means of predetermined calculation on the basis of, for example, the measured value of the interferometer every time when the scanning exposure is performed for each of the shots. However, it is also preferable that a predetermine rate of acceleration control map is previously prepared, and the method is executed on the basis of the time by using the rate of acceleration control map.

The first and second methods for controlling the rate of acceleration are also applicable to the exposure apparatus 110 according to the second embodiment, in the same manner as described above. It is needless to say that the effect of improvement of the throughput is obtained as well.

The first and second embodiments have been explained for the case in which the present invention is applied to the exposure apparatus for producing semiconductors. However, there is no limitation thereto. The present invention is applicable, for example, to an exposure apparatus for liquid crystals for exposing an angular glass plate with a liquid crystal display element pattern, an exposure apparatus for transferring a thin film magnetic head to a ceramic wafer, and an exposure apparatus for producing an image pick-up element (for example, CCD). For example, when the far ultraviolet (DUV) light or the vacuum ultraviolet light (VUV) is used as the exposure laser beam in order to produce the reticle or the mask, the present invention is applicable to those composed of quartz glass, quartz glass doped with fluorine, and fluorite. For example, when the EUV (Extreme Ultra Violet) light in the soft X-ray region, the hard X-ray, or the electron beam is used as the exposure laser beam, the present invention is widely applicable to the exposure apparatus for transferring the circuit pattern to a silicon wafer or the like.

The illumination light beam for the exposure of the exposure apparatus of the respective embodiments is not limited to the KrF excimer laser beam (248 nm) and the ArF excimer laser beam (193 nm). It is a matter of course that the $F_2$ laser beam (157 nm) is usable. It is possible to use the g-ray (436 nm), the i-ray (365 nm), the X-ray, and the charged particle beam such as the electron beam. For example, when the electron beam is used, it is possible to use, as the electron gun, lanthanum hexaboride ($LaB_6$) and tantalum (Ta) of the thermoelectron radiation type.

The present invention is also applicable to the projection exposure apparatus (stepper) based on the step-and-repeat system for transferring the pattern on the reticle to the wafer via the projection optical system in a state in which the reticle and the wafer are stopped substantially stationarily, the mirror projection aligner, and the exposure apparatus based on the proximity system (for example, the scanning type X-ray exposure apparatus for relatively moving the mask and the wafer integrally with respect to a circular arc-shaped illumination area irradiated with the X-ray). The present invention is also applicable, for example, to various apparatuses other than the exposure apparatus to be used in the photolithography step, for example, the laser repair apparatus and the inspection apparatus.

The projection optical system is not limited to the reduction system, for which it is preferable to use the 1× magnification system. However, it is necessary to use a different saltpeter material for the projection optical system depending on the illumination light beam. When the far ultraviolet light such as the excimer laser is used, a material for transmitting the far ultraviolet light such as quartz and fluorite is used as the saltpeter material. When the $F_2$ laser or the X-ray is used, it is preferable to use the optical system of the cata-dioptric system or the reflection system (the reflective type reticle is used as well). When the electron beam is used, the electron optical system composed of the electron lens and the deflector may be used as the optical system. It is needless to say that the optical path for allowing the electron beam to pass therethrough is in the vacuum state.

The projection optical system and the illumination optical system composed of the plurality of lenses are incorporated into the main exposure apparatus body to perform the optical adjustment. The wafer stage and the reticle stage composed of a large number of mechanical parts are attached to the main exposure apparatus body, and wiring and piping are connected thereto, followed by performing the overall adjustment (for example, electric adjustment and confirmation of operation). Thus, it is possible to produce the exposure apparatuses according to the respective embodiments described above. It is desirable that the exposure apparatus is produced in a clean room in which, for example, the temperature and the cleanness are managed.

The semiconductor device is produced by carrying out, for example, the step of designing the function and the performance of the device, the step of manufacturing the reticle on the basis of the designing step, the step of manufacturing the wafer from the silicon material, the step of transferring the pattern on the reticle to the wafer by using the exposure apparatus according to the embodiment described above, the step of assembling the device (including the dicing step, the bonding step, and the packaging step), and the inspection step.

As explained above, according to the scanning type exposure apparatus and the scanning exposure method concerning the present invention, it is possible to improve the throughput owing to the various improvements in relation to the method for moving the substrate (substrate stage) from the end of the exposure for one comparted area on the substrate to the start of the exposure for another comparted area. Further, according to the stage apparatus concerning the present invention, it is possible to mitigate the control load, and it is possible to maintain the high position control performance of each of the first movable members for holding the substrate. Furthermore, it is possible to realize the small size and the light weight of the stage apparatus itself. Therefore, the present invention is preferably applied to the substrate stage of the scanning exposure apparatus. Especially, the present invention is extremely useful for the scanning exposure apparatus for exposing the large wafer of not less than 9 inches.

What is claimed is:

1. A scanning type exposure apparatus for transferring a pattern on a mask onto a substrate by synchronously moving the mask and the substrate, the apparatus comprising:
    a base board;
    a first movable member which holds the substrate, the first movable member being movable relative to the base board;
    a second movable member which arranges the first movable member thereon, the second movable member being arranged on the base board to move relative to the base board and the first movable member respectively;
    a driving system which drives the second movable member; and
    a control unit which varies control response of the driving system in a plurality of operation processes including a scanning exposure operation process for the substrate respectively, wherein;
    the control unit sets the control response of the driving system so that a relative position of the second movable member with respect to the base board is substantially maintained during the movement of the first movable member in a non-scanning direction after the scanning exposure; and
    the control unit sets a response frequency of the driving system to be higher than that during the scanning exposure, when the first movable member is moved in the non-scanning direction after the scanning exposure.

2. An exposure apparatus for transferring a pattern on a mask onto a substrate, the apparatus comprising:
    a first base board;
    a plurality of substrate stages, each of which is arranged on the first base board and holds the substrate respectively;
    a second base board which arranges the first base board thereon; and
    a support apparatus which supports the first base board movably relative to the second base board so as to suppress any fluctuation of a position of a center of gravity due to movement of at least one of the plurality of substrate stages;
    wherein a mass of each of the plurality of substrate stages is not more than about 1/5 of a mass of the first base board.

3. The exposure apparatus according to claim 2, wherein:
    a first substrate stage of the plurality of substrate stages is moved so that the substrate is exposed in accordance with step-and-repeat manner or step-and-scan manner; and
    the support apparatus includes a planar magnetically floating type linear actuator which supports the first base board movably relative to the second base board.

4. The exposure apparatus according to claim 3, wherein a second substrate stage, which is different from the first substrate stage, is driven so that an operation other than an exposure operation is executed on the second substrate stage during the exposure operation for the substrate on the first substrate stage.

5. The exposure apparatus according to claim 4, further comprising an alignment system which detects a mark on the substrate, wherein mark detection by the alignment system or load or unload of the substrate is executed on the second substrate stage.

6. The exposure apparatus according to claim 2, further comprising a mask stage which holds the mask in order to transfer the pattern onto the substrate by synchronously moving the mask and the substrate, wherein the mask stage is capable of holding a plurality of masks in a direction of the synchronous movement.

7. The exposure apparatus according to claim 2, further comprising a control unit which controls the substrate stages so that before one of scanning operation and stepping operation for one substrate stage of the plurality of stages is stopped, the other operation is started, when the pattern is transferred in accordance with step-and-scan manner to a plurality of areas on the substrate held by the one substrate stage of the plurality of substrate stages.

8. The exposure apparatus according to claim 7, wherein the control unit drives the substrate stages such that an absolute value of a rate of acceleration during deceleration of the one substrate stage is smaller than that during acceleration in the stepping operation.

9. The exposure apparatus according to claim 7, wherein the control unit drives the substrate stages such that the one substrate stage is accelerated in the scanning operation on the basis of a rate of acceleration variation curve along which the rate of acceleration is gradually converged to zero.

10. A stage apparatus comprising:
a first movable member which holds a substrate and which is movable in a predetermined two-dimensional plane;
a second movable member which moves in accordance with a reaction force generated by the movement of the first movable member such that the law of conservation of momentum with the first movable member is satisfied;
wherein a mass of the first movable member is not more than about ⅕ of a mass of the second movable member.

11. The stage apparatus according to claim 10, further comprising:
a first planar magnetically floating type linear actuator which is provided over a two-dimensional direction on the second movable member, whereby the first movable member moves in a non-contact manner with respect to the second movable member; and
a second planar magnetically floating type linear actuator which is provided over a two-dimensional direction on a guide plane which guides the second movable member, whereby the second movable member moves in a non-contact manner with respect to the guide plane in accordance with a reaction force generated by the movement of the first movable member.

12. An exposure apparatus for transferring a pattern formed on a mask onto a substrate, comprising:
a mask stage which holds the mask;
the stage apparatus defined in claim 11; and
a projection system which projects and transfers the pattern on the mask onto the substrate held on the stage apparatus.

13. A stage apparatus comprising:
a plurality of first movable members each of which holds a substrate and is movable in a predetermined two-dimensional plane, respectively; and
a second movable member which moves in accordance with a reaction force generated by the movement of the respective first movable members such that the law of conservation of momentum with the plurality of first movable members is satisfied;
wherein a mass of each of the plurality of first movable members is not more than about ⅕ of a mass of the second movable member.

14. The stage apparatus according to claim 13, further comprising:
a first planar magnetically floating type linear actuator which is provided over a two-dimensional direction on the second movable member, whereby each of the plurality of first movable members moves in a non-contact manner with respect to the second movable member, respectively; and
a second planar magnetically floating type linear actuator which is provided over a two-dimensional direction on a guide plane which guides the second movable member, whereby the second movable member moves in a non-contact manner with respect to the guide plane in accordance with a reaction force generated by the movement of the respective first movable members.

15. An exposure apparatus for transferring a pattern formed on a mask onto a substrate, comprising:
a mask stage which holds the mask;
the stage apparatus defined in claim 14; and
a projection system which projects and transfers the pattern on the mask onto the substrate held on the stage apparatus.

16. A stage apparatus comprising:
a first movable member which holds an object and is movable in a predetermined two-dimensional plane; and
a second movable member which moves in accordance with a reaction force generated by the movement of the first movable member such that the law of conservation of momentum with the first movable member is satisfied;
wherein a mass of the first movable member is not more than about ⅕ of a mass of the second movable member.

17. A stage apparatus comprising:
a plurality of first movable members each of which holds an object and is movable in a predetermined two-dimensional plane, respectively; and
a second movable member which moves in accordance with a reaction force generated by the movement of the respective first movable members such that the law of conservation of momentum with the plurality of first movable members is satisfied;
wherein a mass of each of the plurality of first movable members is not more than about ⅕ of a mass of the second movable member.

18. A stage apparatus comprising:
a base board;
a first movable member which is movable relative to the base board and holds a substrate;
a second movable member which arranges the first movable member thereon, the second movable member being arranged on the base board and being movable relative to the base board and the first movable member respectively; and
a driving unit which is provided on the second movable member and which moves the first movable member in a two-dimensional plane, wherein:
a mass of the first movable member is not more than about ⅕ of a mass of the second movable member, and the second movable member is moved in accordance with a reaction force generated by the movement of the first movable member.

19. The stage apparatus according to claim 18, wherein:
the driving unit includes a linear actuator which drives the first movable member on the second movable member; and
the first movable member and the second movable member are supported in a non-contact maimer by the second movable member and the base board respectively.

20. The stage apparatus according to claim 18, wherein:
the first movable member has a first reflecting surface which extends in a direction intersecting first and second axes respectively orthogonal to one another in the two-dimensional plane, a second reflecting surface which extends in the second axis direction, and a third reflecting surface which is arranged substantially symmetrically to the first reflecting surface with respect to the first axis; and
the apparatus further comprises three interferometers which radiate measuring beams to the first, second, and third reflecting surfaces respectively.

21. The stage apparatus according to claim 18, wherein the first movable member includes:
a first plate which places the substrate thereon;
a driving mechanism which moves the first plate in a direction perpendicular to the two-dimensional plane, and inclines the first plate relative to the two-dimensional plane; and a second plate which places the driving mechanism thereon.

22. The stage apparatus according to claim 18, wherein the first movable member is composed of a plurality of movable sections, the respective movable sections are arranged on the second movable member, the driving unit drives the respective movable sections in the two-dimensional plane, and the second movable member is moved in accordance with the reaction force brought about when the respective movable sections are driven.

23. The stage apparatus according to claim 21, wherein the first movable member is composed of a plurality of movable sections, the respective movable sections are arranged on the second movable member, the driving unit drives the respective movable sections in the two-dimensional plane, and the second movable member is moved in accordance with the reaction force brought about when the respective movable sections are driven.

24. The stage apparatus according to claim 18, wherein:
the apparatus further comprises a second driving unit which drives the second movable member at a low response frequency on the base board.

25. The stage apparatus according to claim 21, wherein:
the apparatus further comprises a second driving unit which drives the second movable member at a low response frequency on the base board.

26. The stage apparatus according to claim 22, wherein:
the apparatus further comprises a second driving unit which drives the second-movable member at a low response frequency on the base board.

27. An exposure apparatus comprising the stage apparatus as defined in claim 18, wherein a pattern on a mask is transferred to a photosensitive substrate held by the stage apparatus.

28. An exposure apparatus comprising the stage apparatus as defined in claim 18, wherein a pattern on a mask is transferred to a photosensitive substrate held by the first movable member.

29. The exposure apparatus according to claim 28, further comprising a second driving unit for driving the second movable member on the base board, and a control unit which varies control response of the second driving unit in a plurality of operations including an exposure operation for the photosensitive substrate.

30. The exposure apparatus according to claim 29, wherein the control unit moves the second movable member by the aid of the second driving unit after moving the first movable member, and a response frequency of the second driving unit is increased during the movement of the second movable member as compared with the movement of the first movable member.

31. A scanning type exposure apparatus comprising:
a stage apparatus including a base board; a first movable member which is movable relative to the base board and holds a substrate; a second movable member which arranges the first movable member thereon, the second movable member being arranged on the base board and being movable relative to the base board and the first movable member respectively; and a driving unit which is provided on the second movable member and which moves the first movable member in a two-dimensional plane; wherein a mass of the first movable member is not more than about ⅕ of a mass of the second movable member; and the second movable member is moved in accordance with a reaction force generated by the movement of the first movable member;

a mask stage which holds a mask;

a projection optical system having an optical axis perpendicular to the mask and the substrate respectively;

a first pedestal which supports the projection optical system and suspends the base board thereby; and a vibration-preventive apparatus which supports the first pedestal, wherein:

a pattern on the mask is transferred onto the substrate via the projection optical system by synchronously moving the mask and the substrate by the aid of the mask stage and the stage apparatus.

32. The scanning type exposure apparatus according to claim 31, further comprising:

a second pedestal which places the mask stage thereon; and a frame provided on a floor on which the vibration-preventive apparatus is arranged, and the frame having an actuator which applies a force corresponding to a reaction force generated by movement of the mask stage, to the mask stage or the second pedestal.

33. The scanning type exposure apparatus according to claim 32, further comprising:

a base plate which places the vibration-preventive apparatus thereon; and an elastic member which connects the base plate and the frame.

34. The scanning type exposure apparatus according to claim 31, wherein:

the first movable member has a first reflecting surface which extends in a direction intersecting a scanning direction for the substrate and a non-scanning direction orthogonal thereto respectively on the two-dimensional plane, a second reflecting surface which extends in the non-scanning direction, and a third reflecting surface which is arranged substantially symmetrically to the first reflecting surface in relation to the scanning direction; and the apparatus further comprises three sets of interferometers which radiate measuring beams to the first, second, and third reflecting surfaces respectively.

35. The scanning type exposure apparatus according to claim 31, further comprising:

a position-measuring unit which detects a relative position of the second movable member with respect to the base board; and a second driving unit which positions the second movable member at a predetermined point on the base board on the basis of an output of the position-measuring unit during operation other than exposure operation for the substrate and alignment operation.

36. The scanning type exposure apparatus according to claim 31, wherein the first movable member is composed of a plurality of movable sections, the respective movable sections are arranged on the second movable member, the driving unit drives the respective movable sections in the two-dimensional plane, and the second movable member is moved in accordance with the reaction force brought about when the respective movable sections are driven.

37. The scanning type exposure apparatus according to claim 34, further comprising:

a position-measuring unit which detects a relative position of the second movable member to the base board; and a second driving unit which positions the second movable member at a predetermined point on the base board on the basis of an output of the position-measuring unit during operation other than exposure operation for the substrate and alignment operation.

38. The scanning type exposure apparatus according to claim 31, wherein the first movable member is a substrate stage.

39. The scanning type exposure apparatus according to claim 31, further comprising a plurality of corner cubes attached to the mask stage in a direction intersecting a direction in which the mask is moved, and an interferometer system which radiates the light beam onto one of the plurality of corner cubes and receives a reflected light beam therefrom.

40. An exposure apparatus for transferring a pattern on a mask onto a substrate, comprising:

a base board;

at least two first movable members each of which is movable relative to the base board and holds the substrate to which the pattern of the mask is transferred, respectively;

a second movable member which places the respective first movable members thereon, the second movable member being arranged on the base board and being movable relative to the base board and each of the first movable members respectively; and a driving unit which is provided on the second movable member and which drives the respective first movable members in a two-dimensional plane, wherein:

a mass of each of the first movable members is not more than about ⅕ of a mass of the second movable member; and the second movable member is moved in accordance with a reaction force brought about when the respective first movable members are driven.

41. The exposure apparatus according to claim 40, wherein:

the apparatus further comprises a second driving unit which drives the second movable member at a low response frequency on the base board.

42. The exposure apparatus according to claim 41, further comprising:

a projection optical system which projects the pattern on the mask onto the substrate, wherein:

the driving unit drives the first movable member which holds the substrate to which the pattern is transferred, in a scanning direction with respect to the projection optical system in synchronization with the mask, when the pattern on the mask is transferred to the substrate held by each of the first movable members.

43. A method for producing a stage apparatus, comprising:

providing a base board;

providing a first movable member which is movable relative to the base board and which holds a substrate;

arranging, on the base board, a second movable member which arranges the first movable member thereon, the second movable member being movable relative to the base board and the first movable member respectively; and providing a driving unit which moves the first movable member in a two-dimensional plane, wherein:

the stage apparatus is constructed such that a mass of the first movable member is not more than about ⅕ of a mass of the second movable member; and the second movable member is moved in accordance with a reaction force generated by the movement of the first movable member.

44. A method for producing a scanning type exposure apparatus, comprising:

producing a stage apparatus by providing a base board; a first movable member which is movable relative to the base board and holds a substrate; a second movable member which arranges the first movable member thereon, the second movable member being arranged on the base board and being movable relative to the base board and the first movable member respectively; and a driving unit which is provided on the second movable member and which moves the first movable member in a two-dimensional plane respectively, and by setting a mass of the first movable member to be about ⅕ of a mass of the second movable member; whereby the second movable member is moved in accordance with a reaction force generated by the movement of the first movable member;

providing a mask stage which holds a mask;

providing a projection optical system having an optical axis perpendicular to the mask and the substrate respectively;

providing a first pedestal which supports the projection optical system and suspends the base board thereby; and providing a vibration-preventive apparatus which supports the first pedestal, wherein:

the scanning type exposure apparatus is operated such that a pattern on the mask is transferred onto the substrate via the projection optical system by synchronously moving the mask and the substrate by the aid of the mask stage and the stage apparatus.

* * * * *